United States Patent
Lee et al.

(10) Patent No.: US 9,972,638 B2
(45) Date of Patent: May 15, 2018

(54) METHODS OF FABRICATING THREE-DIMENSIONAL SEMICONDUCTOR DEVICES

(71) Applicant: SAMSUNG ELECTRONICS CO., LTD., Suwon-si, Gyeonggi-do (KR)

(72) Inventors: Sunghae Lee, Suwon-si (KR);
Daehong Eom, Hwaseong-si (KR);
JinGyun Kim, Yongin-si (KR);
Daehyun Jang, Seongnam-si (KR);
Kihyun Hwang, Seongnam-si (KR);
Seongsoo Lee, Seongnam-si (KR);
Kyunghyun Kim, Seoul (KR);
Chadong Yeo, Suwon-si (KR);
Jun-Youl Yang, Seoul (KR); Se-Ho Cha, Goyang-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 244 days.

(21) Appl. No.: 14/621,568

(22) Filed: Feb. 13, 2015

(65) Prior Publication Data
US 2015/0162344 A1 Jun. 11, 2015

Related U.S. Application Data

(62) Division of application No. 13/401,013, filed on Feb. 21, 2012, now Pat. No. 8,963,231.

(30) Foreign Application Priority Data

Mar. 29, 2011 (KR) .................. 10-2011-0028320
Mar. 31, 2011 (KR) .................. 10-2011-0029808

(51) Int. Cl.
*H01L 21/8238* (2006.01)
*H01L 27/11582* (2017.01)
(Continued)

(52) U.S. Cl.
CPC ...... *H01L 27/11582* (2013.01); *H01L 21/283* (2013.01); *H01L 21/311* (2013.01);
(Continued)

(58) Field of Classification Search
CPC ......... H01L 27/11551; H01L 27/11578; H01L 27/11582; H01L 27/11556; H01L 29/6653;
(Continued)

(56) References Cited

U.S. PATENT DOCUMENTS 7,696,559 B2 4/2010 Arai et al.
7,972,955 B2 7/2011 Choi et al.
(Continued)

FOREIGN PATENT DOCUMENTS

JP 2007-180389 A 7/2007
JP 2010-157734 A 7/2010
(Continued)

*Primary Examiner* — Kevin M Picardat
(74) *Attorney, Agent, or Firm* — Lee & Morse, P.C.

(57) ABSTRACT

Three dimensional semiconductor memory devices and methods of fabricating the same are provided. According to the method, sacrificial layers and insulating layers are alternately and repeatedly stacked on a substrate, and a cutting region penetrating an uppermost sacrificial layer of the sacrificial layers is formed. The cutting region is filled with a non sacrificial layer. The insulating layers and the sacrificial layers are patterned to form a mold pattern. The mold pattern includes insulating patterns, sacrificial patterns, and the non sacrificial layer in the cutting region. The sacrificial patterns may be replaced with electrodes. The related semiconductor memory device is also provided.

27 Claims, 108 Drawing Sheets

(51) Int. Cl.
   *H01L 29/78*      (2006.01)
   *H01L 21/283*     (2006.01)
   *H01L 21/311*     (2006.01)
   *H01L 27/11556*   (2017.01)
   *H01L 29/66*      (2006.01)

(52) U.S. Cl.
   CPC .... *H01L 27/11556* (2013.01); *H01L 29/6653* (2013.01); *H01L 29/66553* (2013.01); *H01L 29/7827* (2013.01)

(58) Field of Classification Search
   CPC ........... H01L 29/66553; H01L 29/7827; H01L 21/283; H01L 29/792–29/7926; H01L 29/788–29/7889; H01L 2924/145–2924/1453; H01L 27/112–27/11597; H01L 21/28282
   USPC ........................................................ 438/209
   See application file for complete search history.

(56) References Cited

U.S. PATENT DOCUMENTS

| | | | |
|---|---|---|---|
| 7,994,011 | B2 | 8/2011 | Park et al. |
| 8,138,551 | B2 | 3/2012 | Hamajima |
| 8,383,482 | B2 | 2/2013 | Kim et al. |
| 8,395,190 | B2 * | 3/2013 | Shim ................ H01L 27/11565 257/208 |
| 8,445,954 | B2 * | 5/2013 | Jang ................. H01L 27/11551 257/315 |
| 2007/0158736 | A1 | 7/2007 | Arai et al. |
| 2009/0310425 | A1 | 12/2009 | Sim et al. |
| 2010/0012999 | A1 | 1/2010 | Park |
| 2010/0155818 | A1 | 6/2010 | Cho et al. |
| 2010/0163968 | A1 | 7/2010 | Kim et al. |
| 2010/0200908 | A1 | 8/2010 | Lee et al. |
| 2010/0213527 | A1 | 8/2010 | Shim et al. |
| 2011/0233648 | A1 | 9/2011 | Seol et al. |
| 2012/0003828 | A1 * | 1/2012 | Chang ................ H01L 27/1157 438/591 |
| 2012/0112264 | A1 * | 5/2012 | Lee ................... H01L 27/11551 257/324 |
| 2012/0223380 | A1 | 9/2012 | Lee et al. |

FOREIGN PATENT DOCUMENTS

| | | |
|---|---|---|
| JP | 2010-187001 A | 8/2010 |
| JP | 2010-225694 A | 10/2010 |
| KR | 10-2009-0128776 A | 12/2009 |
| KR | 10-2010-0008120 A | 1/2010 |
| KR | 10-2010-0053393 A | 5/2010 |
| KR | 10-2010-0079393 A | 7/2010 |
| KR | 10-2010-0091835 A | 8/2010 |
| KR | 10-2010-0096865 A | 9/2010 |
| KR | 10-2010-0113364 A | 10/2010 |

* cited by examiner

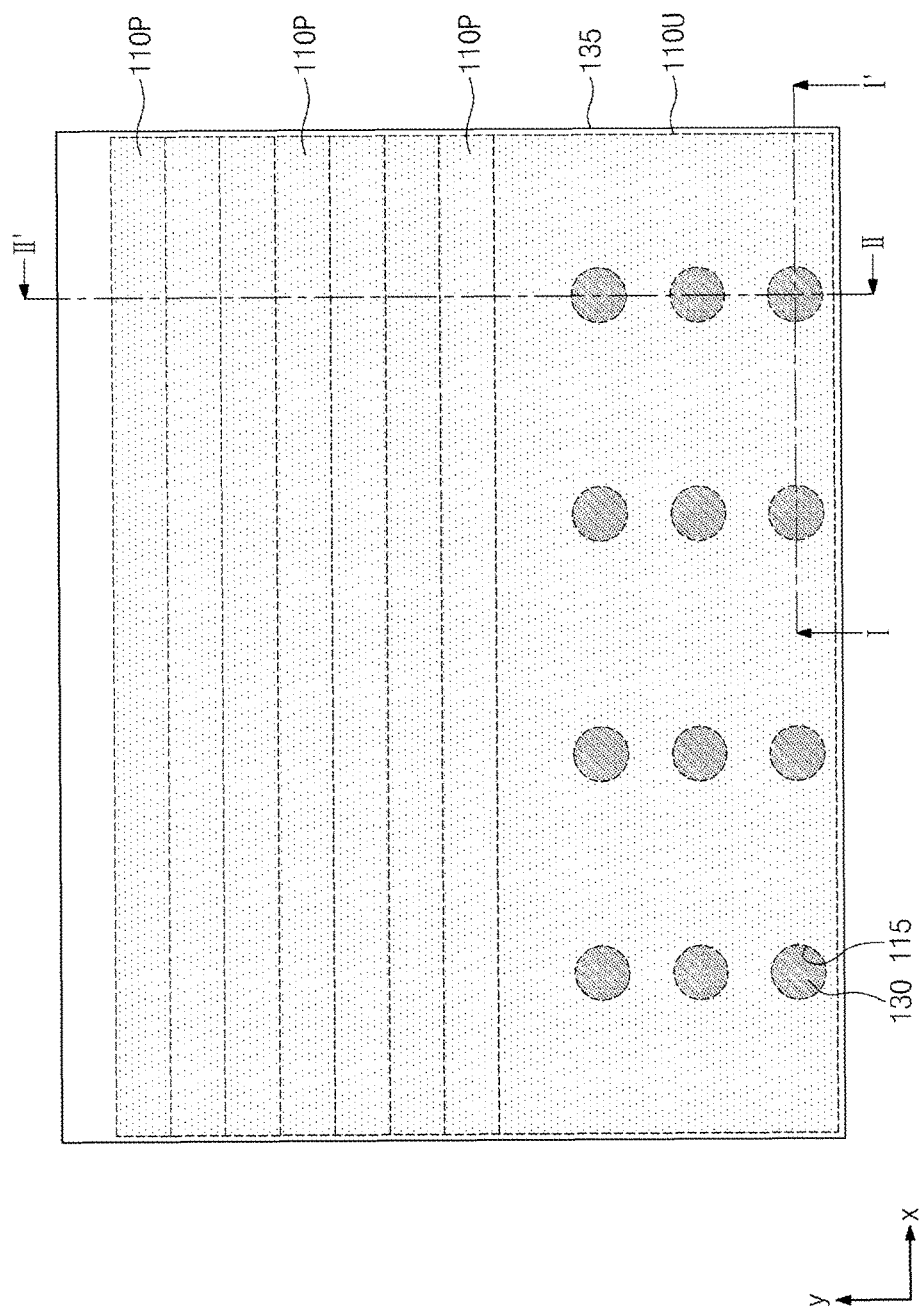

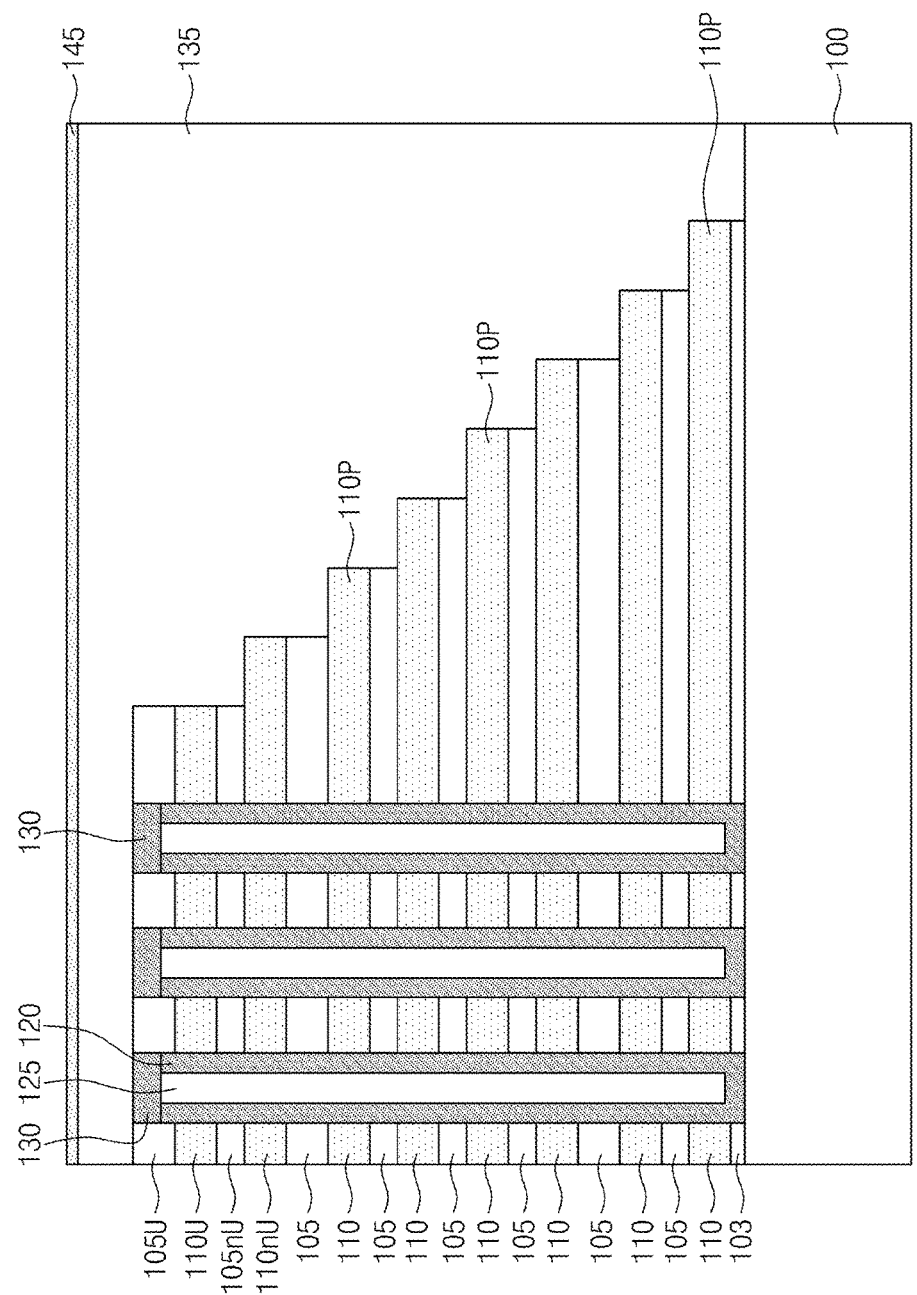

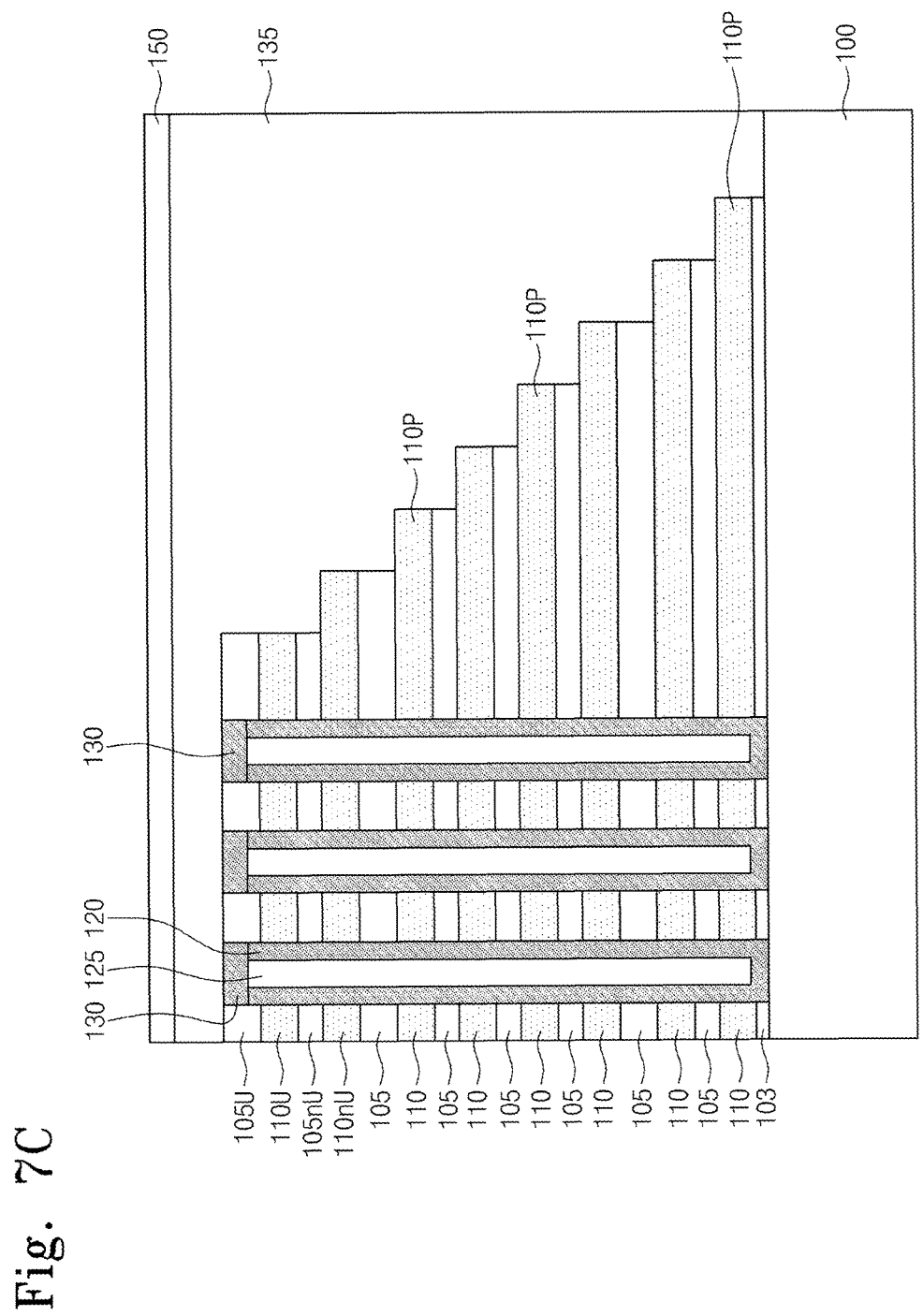

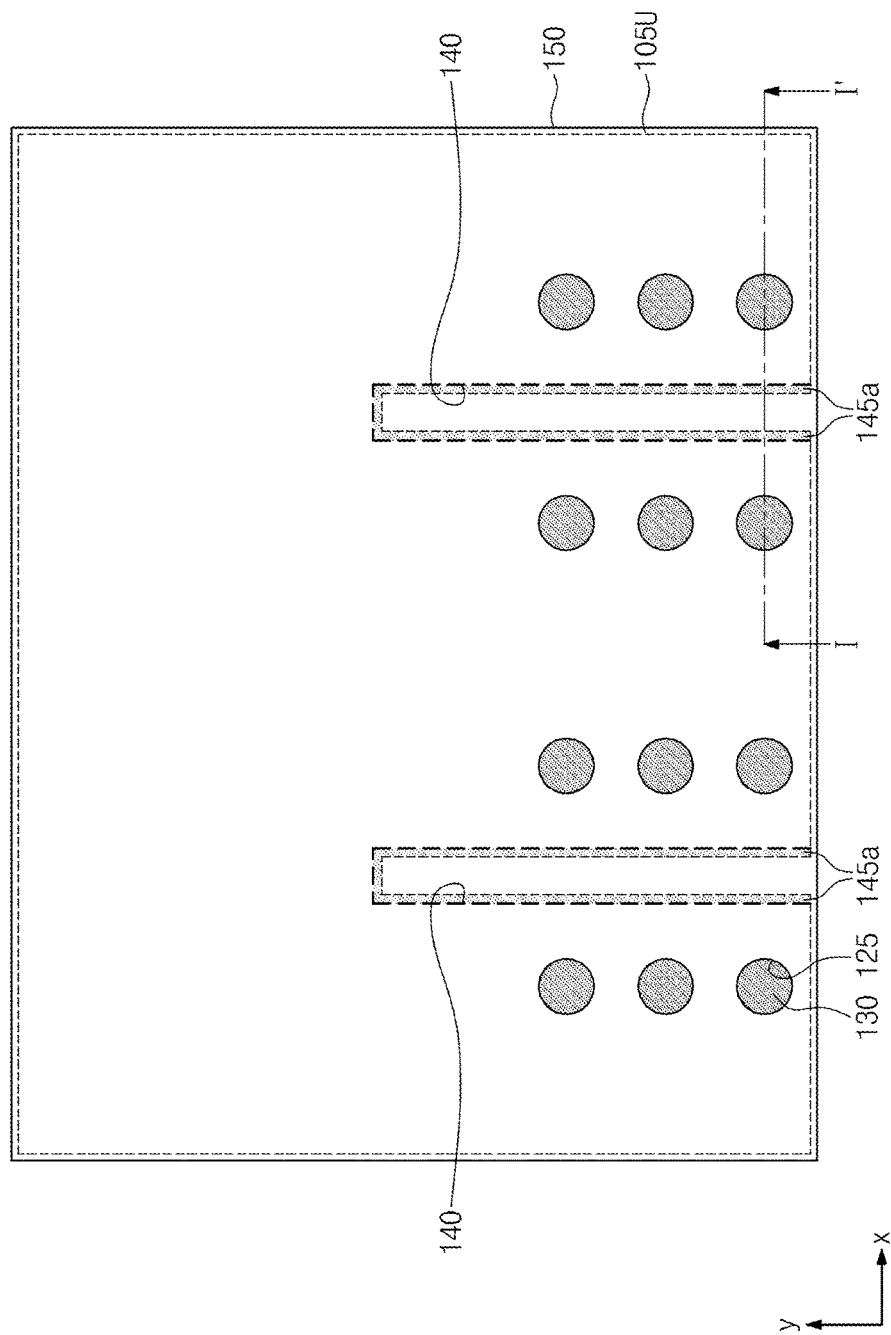

METHODS OF FABRICATING THREE-DIMENSIONAL SEMICONDUCTOR DEVICES

CROSS-REFERENCE TO RELATED APPLICATIONS

This is a divisional application based on pending application Ser. No. 13/401,013, filed Feb. 21, 2012, the entire contents of which is hereby incorporated by reference.

Korean Patent Applications Nos. 10-2011-0028320 and 10-2011-0029808, filed on Mar. 29, 2011, and Mar. 31, 2011, in the Korean Intellectual Property Office, and entitled: "Three Dimensional Semiconductor Memory Devices and Methods of Fabricating the Same," are incorporated by reference herein in their entirety.

BACKGROUND

1. Field

The present disclosure herein relates to semiconductor devices and, more particularly, to three dimensional semiconductor memory devices and methods of fabricating the same.

2. Description of the Related Art

Semiconductor devices are very attractive in an electronic industry because of small size, multi-function and/or low fabrication cost thereof. High performance semiconductor devices and/or low cost semiconductor devices have been increasingly demanded with the development of the electronic industry. The semiconductor devices have been more highly integrated in order to meet the above demands. In particular, there is a high demand to increase the integration density of semiconductor memory devices to store logic data.

In two dimensional semiconductor memory devices, a planar area that a unit memory cell occupies may directly affect the integration density of the two dimensional semiconductor memory devices. That is, the integration density of the two dimensional semiconductor memory devices may be influenced by a minimum feature size which relates to a process technology for forming fine patterns. However, there may be limitations in improving the process technology for forming the fine patterns. In addition, high cost equipments or apparatus may be required to form the fine patterns. Thus, cost for fabricating the highly integrated semiconductor memory devices may be increased.

Recently, three dimensional semiconductor memory devices have been proposed to solve the above limitations. The three dimensional semiconductor memory devices include a plurality of memory cells arrayed in three dimensions. However, in fabrication of three dimensional semiconductor memory devices, various problems may occur due to structural configurations thereof. As a result, reliability and/or electrical characteristics of the three dimensional semiconductor memory devices may be degraded.

SUMMARY

Embodiments of the inventive concept are directed to three dimensional semiconductor memory devices and methods of fabricating the same.

Embodiments are directed to a device including an electrode structure including an alternating stack of electrodes and insulating patterns on a semiconductor substrate, a vertical active pattern extending through the alternating stack, at least one specific electrode of the electrode structure having first and second outer sidewalls opposite respective inner sidewalls that face the vertical active pattern, and a recessed region penetrating at least the specific electrode and filled with an insulating material, and a material that extends to cover a bottom surface, a top surface, and the first outer sidewall of the specific electrode, the first outer sidewall being adjacent the recessed region.

The material may not cover the second outer sidewall.

The device may include a pair of isolation patterns on the semiconductor substrate, the isolation patterns being located at two sides of the electrode structure, wherein the second outer sidewall of the specific electrode is in contact with any one of the pair of isolation patterns.

The electrode structure may include another electrode which is different from the specific electrode, wherein the another electrode has two outer sidewalls contacting the pair of isolation patterns, respectively.

The material covering the first outer sidewall may extend in a vertical direction beyond the first outer sidewall adjacent at least one of an upper insulation layer and a next upper insulation layer.

The device may include an electrode-dielectric material between a sidewall of the vertical active pattern and the electrodes.

The material may be an extension of the electrode-dielectric material.

The electrode-dielectric material may extend continuously along the sidewall of the vertical active pattern.

All sidewalls of the vertical active pattern may have a same electrode-dielectric layer.

The material may extend around the bottom surface, the top surface, and the first outer sidewall of the specific electrode forms a continuous layer.

The specific electrode may have a portion extending vertically and adjacent at least one of an upper insulation layer and a next upper insulation layer.

The specific electrode may have a portion extending laterally into the recessed region.

Each of the electrodes may have a metal pattern and a barrier conductive pattern, and the material may be an extension of the barrier conductive pattern.

The specific electrode may correspond to an uppermost electrode of the electrode structure.

A next uppermost electrode disposed directly under the uppermost electrode may have first and second outer sidewalls facing each other, wherein the first and second outer sidewalls of the next uppermost electrode are vertically aligned with the first and second outer sidewalls of the uppermost electrode, respectively, wherein the material includes an electrode-dielectric layer, and wherein at least a portion of the electrode-dielectric layer between the next uppermost electrode and the sidewall of the vertical active pattern extends to cover a bottom surface, a top surface, and the first outer sidewall of the next uppermost electrode.

The electrode-dielectric layer covering the first outer sidewall of the uppermost electrode may extend downwardly along an outer sidewall of the insulating pattern between the uppermost electrode and the next uppermost electrode, thereby being connected to the extension of the electrode-dielectric layer covering the first outer sidewall of the next uppermost electrode.

The uppermost electrode and the next uppermost electrode may be separated from each other.

The device may include a non sacrificial pattern disposed adjacent to the outer sidewall of the insulating pattern between the uppermost electrode and the next uppermost electrode, and adjacent to the first outer sidewalls of the uppermost electrode and the next uppermost electrode, wherein a horizontal distance between the outer sidewall of the insulating pattern and the non sacrificial pattern is equal to or less than twice a thickness of the extension of the electrode-dielectric layer on the top surface of the uppermost electrode, and wherein the outer sidewall of the insulating pattern is located between the uppermost electrode and the next uppermost electrode.

The uppermost electrode extends downwardly along an outer sidewall of the insulating pattern between the uppermost electrode and the next uppermost electrode, thereby being connected to the next uppermost electrode.

The device may include a non sacrificial pattern disposed adjacent to the outer sidewall of the insulating pattern between the uppermost electrode and the next uppermost electrode, and adjacent to the first outer sidewalls of the uppermost electrode and the next uppermost electrode, wherein a horizontal distance between the outer sidewall of the insulating pattern and the non sacrificial pattern is greater than twice a thickness of the extension of the electrode-dielectric layer on the top surface of the uppermost electrode, and wherein the outer sidewall of the insulating pattern is located between the uppermost electrode and the next uppermost electrode.

The extension of the electrode-dielectric layer covering the first outer sidewall of the uppermost electrode may be separated from the extension of the electrode-dielectric layer covering the first outer sidewall of the next uppermost electrode, and wherein the uppermost electrode and the next uppermost electrode are separated from each other.

The device may include a non sacrificial pattern disposed adjacent to an outer sidewall of the insulating pattern between the uppermost electrode and the next uppermost electrode, and adjacent to the first outer sidewalls of the uppermost electrode and the next uppermost electrode, wherein the non sacrificial pattern is in contact with the outer sidewall of the insulating pattern between the uppermost electrode and the next uppermost electrode.

The electrode structure may include a single lowermost electrode, wherein the uppermost electrode is in a plural number over the single lowermost electrode, wherein the plurality of the uppermost electrodes are horizontally separated from each other and located at a same level from a top surface of the substrate, wherein the vertical active pattern is in a plural number, and wherein each of the vertical active patterns penetrates the respective uppermost electrodes and the electrodes under the respective uppermost electrodes.

The insulating patterns may include an uppermost insulating pattern, wherein the device further comprises a residual sacrificial spacer on an outer sidewall of the uppermost insulating pattern on the uppermost electrode, and wherein the residual sacrificial spacer includes a dielectric material having an etch selectivity with respect to the insulating patterns.

The insulating patterns may include an uppermost insulating pattern and the first outer sidewall of the uppermost electrode may laterally protrude more than an outer sidewall of the uppermost insulating pattern on the uppermost electrode.

The material may be an electrode-dielectric layer that includes a wall portion covering the first outer sidewall of the uppermost electrode, wherein the insulating patterns include an uppermost insulating pattern, and wherein the wall portion has a sidewall which is vertically aligned with an outer sidewall of the uppermost insulating pattern on the uppermost electrode.

The outer sidewall of the uppermost insulating pattern may be substantially and vertically coplanar with the sidewall of the wall portion.

The material may be an electrode-dielectric layer that includes a tunneling dielectric layer, a charge storing layer and a blocking dielectric layer, and wherein the extension of the electrode-dielectric layer covering the first outer sidewall of the specific electrode include a portion of at least the blocking dielectric layer.

The specific electrode may be an uppermost electrode and the recessed region penetrates the next uppermost electrode.

The recessed region may extend in parallel with the vertical active pattern.

Embodiments are directed to a three dimensional semiconductor memory device, including an electrode structure including electrodes and insulating patterns which are alternately and repeatedly stacked on a substrate, each of the electrodes having a metal pattern and a barrier conductive pattern, a vertical active pattern penetrating the electrode structure, and an electrode-dielectric layer between a sidewall of the vertical active pattern and the respective electrodes, wherein the metal pattern in a specific electrode of the electrodes has first and second outer sidewalls facing each other, and wherein the barrier conductive pattern in the specific electrode is in contact with the first outer sidewall of the metal pattern in the specific electrode.

The electrode-dielectric layer may extend vertically between the sidewall of the vertical active pattern and the insulating patterns.

The second outer sidewall of the metal pattern in the specific electrode may not contact the barrier conductive pattern in the specific electrode.

The specific electrode may correspond to an uppermost electrode in the electrode structure.

The metal pattern in a next uppermost electrode disposed directly under the uppermost electrode may have first and second outer sidewalls facing each other, wherein the barrier conductive pattern in the next uppermost electrode is in contact with the first outer sidewall of the metal pattern in the next uppermost electrode.

The metal pattern in the uppermost electrode may extend along an outer sidewall of the insulating pattern between the uppermost electrode and the next uppermost electrode, thereby being connected to the metal pattern in the next uppermost electrode.

The insulating patterns may include an uppermost insulating pattern, wherein a portion of the barrier conductive pattern in the uppermost electrode has a sidewall which is aligned with an outer sidewall of the uppermost insulating pattern on the uppermost electrode.

The outer sidewall of the uppermost insulating pattern may be substantially coplanar with a sidewall of the portion of the barrier conductive pattern in the uppermost electrode.

Embodiments are directed to a method of fabricating a three dimensional semiconductor memory device, the method including alternately and repeatedly stacking replacement layers and insulating layers on a substrate, forming a vertical active pattern penetrating the insulating layers and the replacement layers, forming a cutting region penetrating at least an uppermost replacement layer of the replacement layers, forming a non sacrificial layer in the cutting region, and replacing the replacement layers with electrodes, respectively, after forming the non sacrificial layer in the cutting region.

Forming the cutting region may be after forming the vertical active pattern.

Before forming the electrodes, an electrode-dielectric layer may be formed between a sidewall of the vertical active pattern and the electrodes.

Forming the electrode-dielectric layer may include conformally forming the electrode dielectric layer in the replacement layers and a sidewall of the non sacrificial layer in the cutting region exposed by an uppermost replacement layer.

Before forming the non sacrificial layer in the cutting region, a spacer may be formed on sidewalls of the cutting region.

Before forming the electrodes, a portion of the spacer extending from above the uppermost replacement layer to a bottom of the cutting region may be removed.

The method may include conformally forming an electrode-dielectric layer in the replacement layers and along a sidewall of the non sacrificial layer in the cutting region exposed due to removal of the spacer.

Forming the electrodes may include conformally forming a barrier conductive pattern in the replacement layers and along a sidewall of the non sacrificial layer in the cutting region exposed due to removal of the spacer.

Before forming the non sacrificial layer in the cutting region, the spacer may be etched so that an upper surface of the space is below an upper surface of the cutting region, the spacer remaining above the uppermost replacement layer.

After forming the non sacrificial layer in the cutting region and before forming the electrodes, the spacer may be removed.

The method may include conformally forming an electrode-dielectric layer in the replacement layers and along a sidewall of the non sacrificial layer in the cutting region exposed due to removal of the spacer.

Forming the electrodes may include conformally forming a barrier conductive pattern in the replacement layers and along a sidewall of the non sacrificial layer in the cutting region exposed due to removal of the spacer.

The cutting region may penetrate below an uppermost replacement layer.

The cutting region may penetrate a next uppermost replacement layer.

Forming the cutting region may include forming a guide opening in an uppermost insulating layer, the guide opening extending to an upper surface of the uppermost replacement layer, forming a spacer in the guide opening, and etching the guide opening with the spacer therein to form the cutting region and to remove the spacer such that an upper surface of the spacer is below an upper surface of the uppermost insulating layer.

The method may include, after forming the non sacrificial layer in the cutting region and before forming the electrodes, removing the spacer.

The method may include conformally forming an electrode-dielectric layer in the replacement layers and along a sidewall of the non sacrificial layer in the cutting region exposed due to removal of the spacer.

Forming the electrodes may include conformally forming a barrier conductive pattern in the replacement layers and along a sidewall of the non sacrificial layer in the cutting region exposed due to removal of the spacer.

Forming the alternately stacking replacement layers and insulating layers may include alternately and repeatedly stacking sacrificial layers and insulating layers on the substrate, and, before forming electrodes, removing the sacrificial layers to form empty regions.

Removing the sacrificial layers may include removing a portion of the non sacrificial layer adjacent an uppermost sacrificial layer.

Forming the vertical active pattern may include forming a hole penetrating the insulating layers and the replacement layers and forming the vertical active pattern in the hole.

The method may include, before forming the vertical active pattern, forming an electrode-dielectric layer on an inner sidewall of the hole.

Forming the electrodes may include conformally forming a barrier conductive pattern in the replacement layers.

The method may include forming another vertical active pattern penetrating the insulating layers and the replacement layers, the another vertical active pattern being in an opposite side of the cutting region to the vertical active pattern.

The cutting region may be centered between the vertical active pattern and the another vertical active pattern.

The cutting region may be closer to one of the vertical active pattern and the another vertical active pattern than to another of the vertical active pattern and the another vertical active pattern.

The cutting region extends in parallel to the vertical active pattern.

BRIEF DESCRIPTION OF THE DRAWINGS

The above and other features and advantages will become more apparent to those of ordinary skill in the art by describing in detail exemplary embodiments with reference to the attached drawings, in which:

FIGS. 5A to 10A illustrate plan views of a method of fabricating a three dimensional semiconductor memory device according to a first embodiment of the inventive concept;

FIGS. 5B to 10B illustrate cross sectional views taken along lines I-I' of FIGS. 5A to 10A, respectively;

FIGS. 5C to 10C illustrate cross sectional views taken along lines II-II' of FIGS. 5A to 10A, respectively;

FIGS. 11A and 12A illustrate plan views of a modified embodiment of a method of fabricating a three dimensional semiconductor memory device according to a first embodiment of the inventive concept;

FIGS. 19A to 24A illustrate plan views of a method of fabricating a three dimensional semiconductor memory device according to a second embodiment of the inventive concept;

FIGS. 19B to 24B illustrate cross sectional views taken along lines I-I' of FIGS. 19A to 24A, respectively;

FIGS. 31A to 35A illustrate plan views of a method of fabricating a three dimensional semiconductor memory device according to a third embodiment of the inventive concept;

FIGS. 31B to 35B illustrate cross sectional views taken along lines I-I' of FIGS. 31A to 35A, respectively;

FIGS. 46A to 50A illustrate plan views of a method of fabricating a three dimensional semiconductor memory device according to a fourth embodiment of the inventive concept;

FIGS. 46B to 50B illustrate cross sectional views taken along lines I-I' of FIGS. 46A to 50A, respectively;

DETAILED DESCRIPTION

Figure 1A:
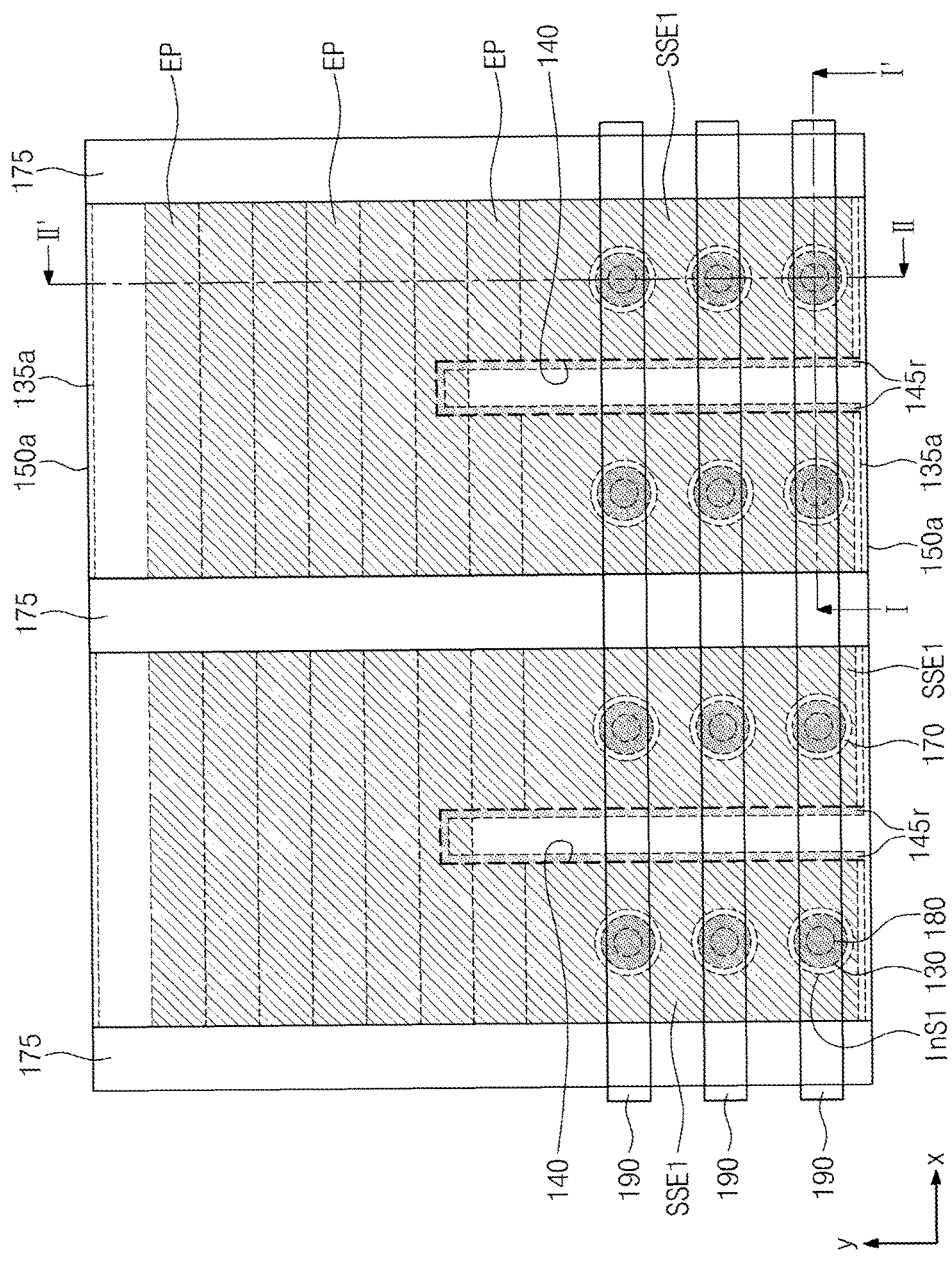
FIG. 1A illustrates a plan view of a three dimensional semiconductor memory device according to a first embodiment of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings herein. Exemplary embodiments of aspects of the present inventive concept explained and illustrated herein include their complementary counterparts. The same reference numerals or the same reference designators denote the same elements throughout the specification.

First Embodiment

Figure 1B:
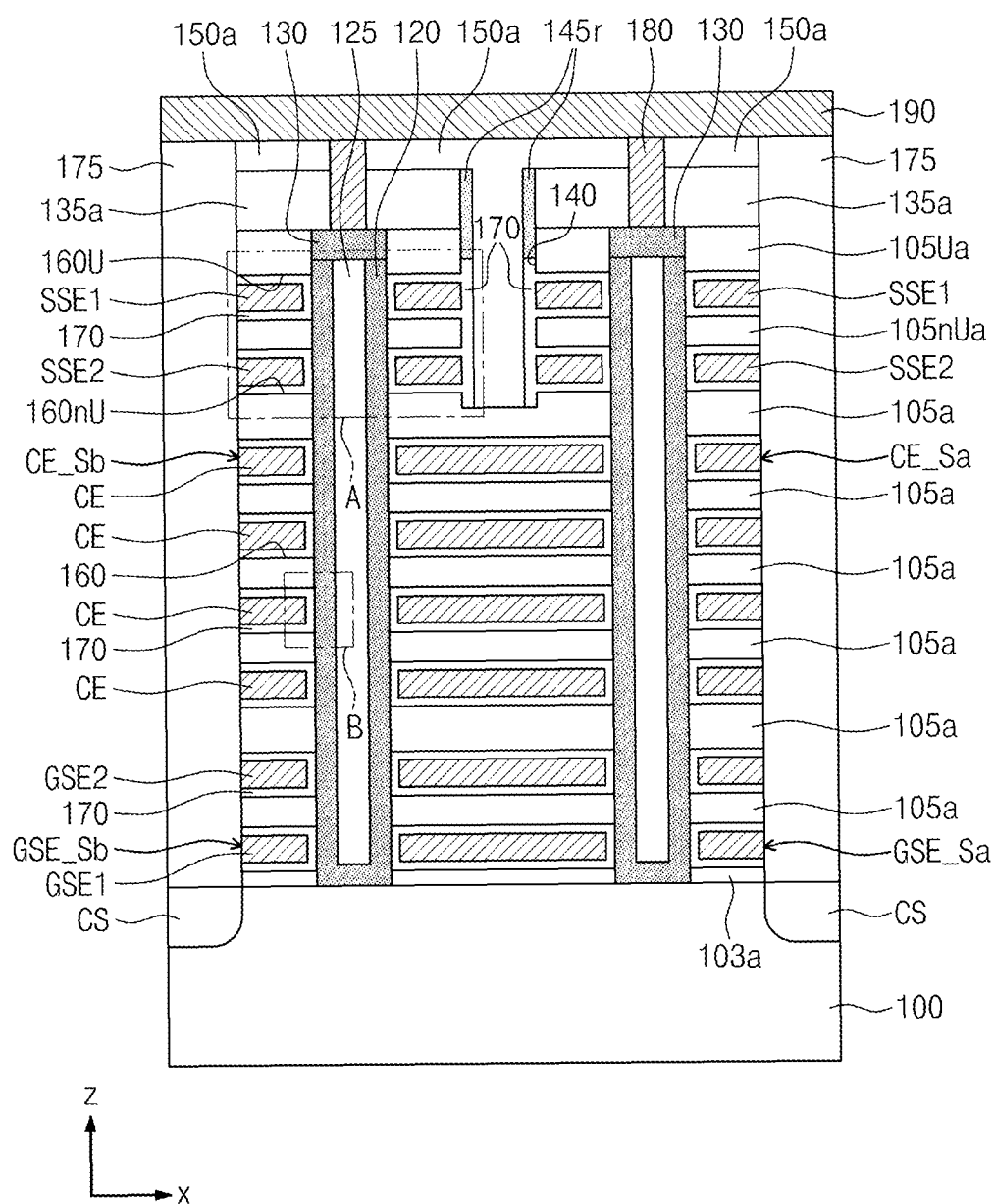
FIG. 1B illustrates a cross sectional view taken along a line I-I' of FIG. 1A.
Figure 1C:
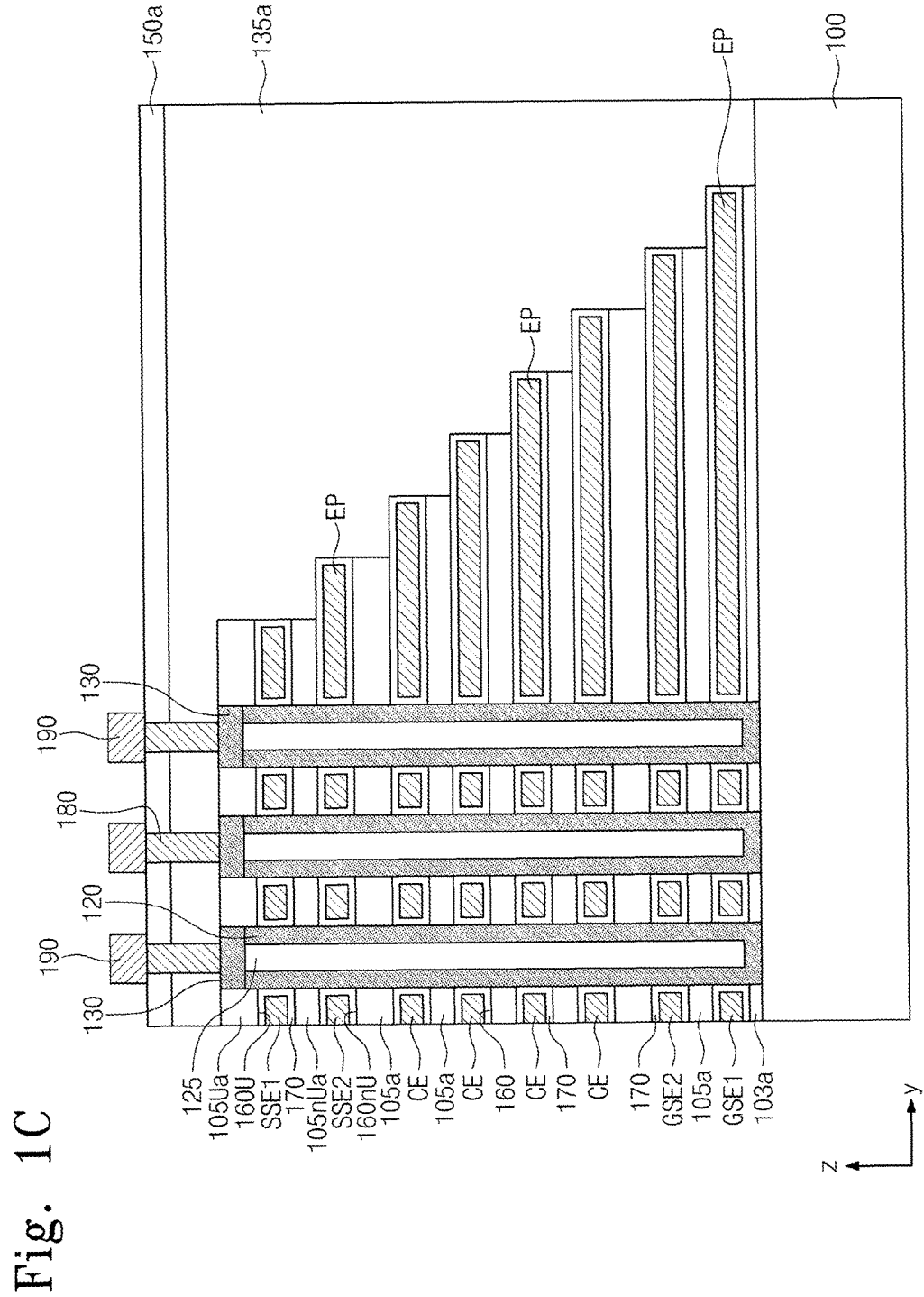
FIG. 1C illustrates a cross sectional view taken along a line II-IF of FIG. 1A.

FIG. 1A illustrates a plan view of a three dimensional semiconductor memory device according to a first embodiment of the inventive concept. FIG. 1B illustrates a cross sectional view taken along a line I-I' of FIG. 1A. FIG. 1C illustrates a cross sectional view taken along a line II-II' of FIG. 1A.

Referring to FIGS. 1A, 1B, and 1C, a plurality of electrode structures may be disposed on a substrate 100. Each of the electrode structures may include a plurality of electrodes GSE1, GSE2, CE, SSE1, SSE2 and a plurality of insulating patterns 105A, 105$n$Ua, 105Ua which are alternately and repeatedly stacked, e.g., along a z-axis direction. The electrode structures may extend in a first direction, e.g., a y-axis direction, and may be parallel with each other. The electrode structures may be arrayed to be spaced apart from each other in a second direction perpendicular to the first direction, e.g., an x-axis direction of FIG. 1A.

The substrate 100 may include a semiconductor substrate. For example, the substrate 100 may be a silicon substrate, a germanium substrate or a silicon germanium substrate. The substrate 100 may include a well region doped with dopants of a first conductivity type.

A pair of isolation patterns 175 may be disposed at both sides of the respective electrode structures, respectively. Further, the isolation patterns 175 may contact the substrate 100. That is, each of the isolation patterns 175 may be disposed to contact the substrate 100 between the pair of adjacent electrode structures. As illustrated in FIG. 1A, the isolation patterns 175 may extend in the first direction and be in parallel with each other when viewed from a plan view. The isolation patterns 175 may include an oxide layer, a nitride layer and/or an oxynitride layer.

Figure 1D:
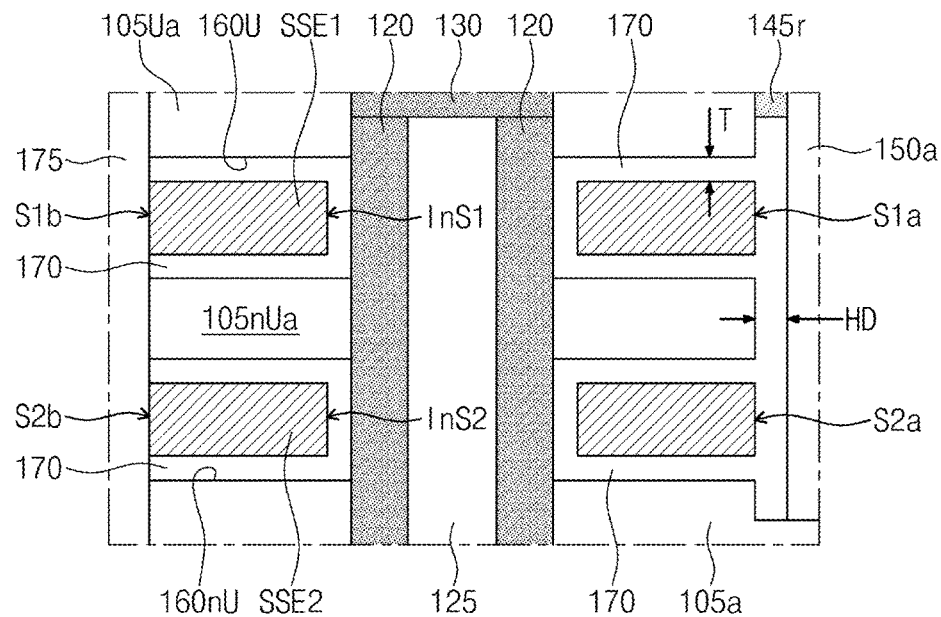
FIG. 1D illustrates an enlarged view of a portion 'A' of FIG. 1B.
Figure 1E:
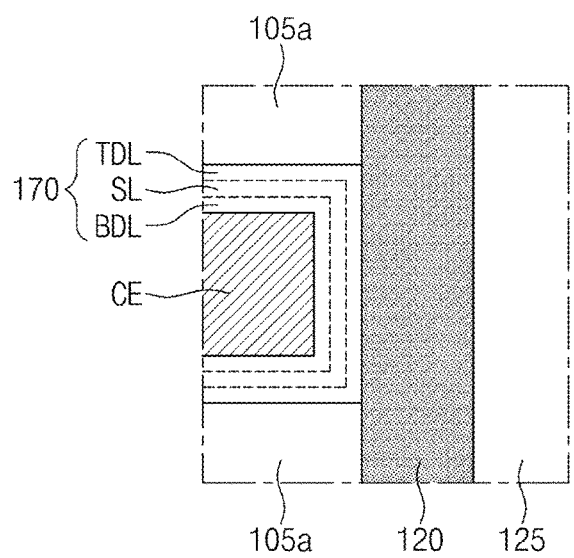
FIG. 1E illustrates an enlarged view of a portion 'B' of FIG. 1B.
Figure 1F:
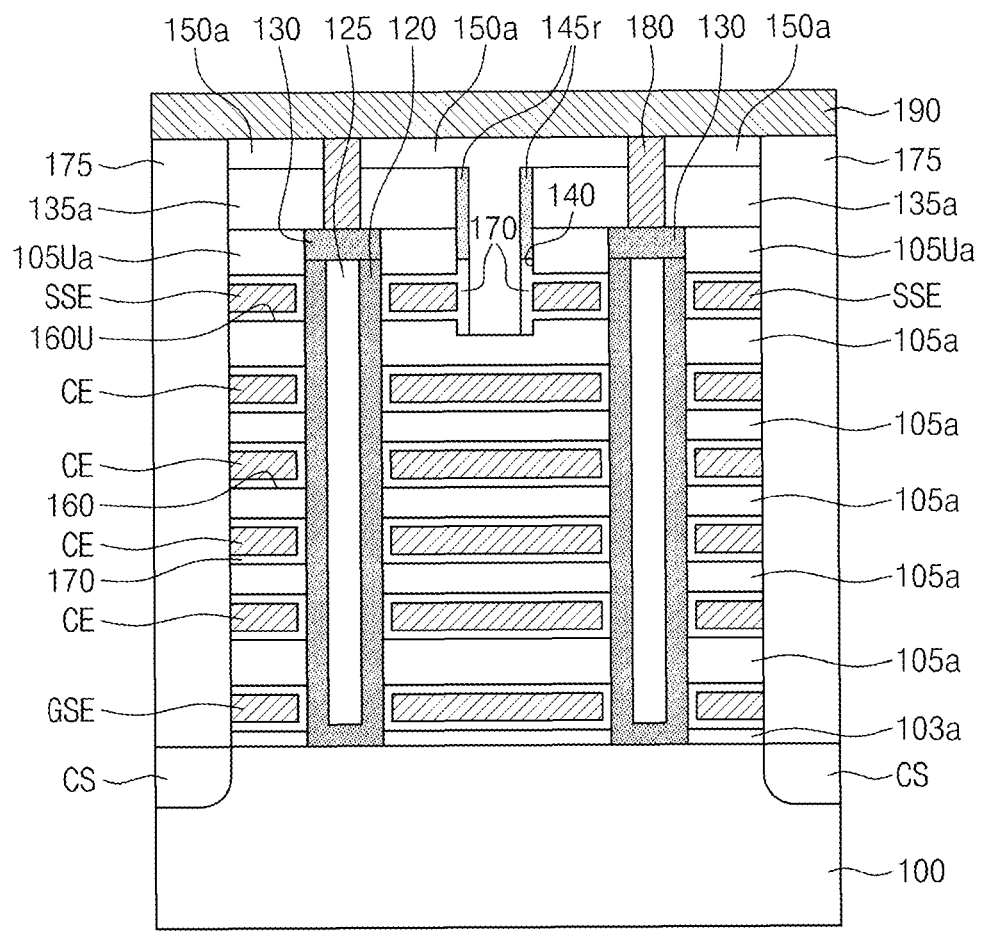
FIG. 1F illustrates a cross sectional view of a modified embodiment of a three dimensional semiconductor memory device according to a first embodiment of the inventive concept.

The electrodes in each of the electrode structures may include a plurality of cell electrodes CE sequentially stacked, e.g., along a z-axis direction. In addition, the electrodes in each of the electrode structures may include at least one floor of ground selection electrode GSE1 and/or GSE2 disposed between the substrate 100 and a lowermost cell electrode CE. In an embodiment, two ground selection electrodes GSE1 and GSE2 may be disposed between the substrate 100 and the lowermost cell electrode CE, as illustrated in FIGS. 1B and 1C. For example, a first ground selection electrode GSE1 may be disposed between the substrate 100 and the lowermost cell electrode CE, and a second ground selection electrode GSE2 may be disposed between the first ground selection electrode GSE1 and the lowermost cell electrode CE. However, the inventive concept is not limited to the above descriptions. For example, only a single floor of ground selection electrode GSE may be disposed between the substrate 100 and the lowermost cell electrode CE, as illustrated in FIG. 1F. Alternatively, three or more floors of ground selection electrodes may be disposed between the substrate 100 and the lowermost cell electrode CE.

Referring again to FIGS. 1A, 1B, and 1C, the electrodes in each of the electrode structures may include a plurality of first string selection electrodes SSE1 disposed at a same level, e.g., along a z-axis direction, from a top surface of the substrate 100. That is, the plurality of first string selection electrodes SSE1 may be coplanar to each other. The plurality of first string selection electrodes SSE1 may be laterally separated from each other. The plurality of first string selection electrodes SSE1 may extend in parallel along the first direction. The first string selection electrodes SSE1 may be disposed over an uppermost cell electrode of the cell electrodes CE. In more detail, the plurality of first string selection electrodes SSE1 may be disposed over a single uppermost cell electrode CE in each of the electrode structures. Each of the electrode structures may include a single first ground selection electrode GSE1. In this case, the plurality of first string selection electrodes SSE1 may be disposed over the single first ground selection electrode GSE1.

Each of the electrode structures may include at least one floor of string selection electrode SSE1. In an embodiment, the electrode structure may include a plurality of string selection electrodes that are sequentially stacked and separated from each other. For example, a plurality of second string selection electrodes SSE2 may be additionally disposed between the first string selection electrodes SSE1 and the uppermost cell electrode CE. The second string selection electrodes SSE2 under the first string selection electrodes SSE1 may be disposed at a same level from the top surface of the substrate 100. That is, the second string selection electrodes SSE2 may be coplanar with each other. The second string selection electrodes SSE2 may be laterally separated from each other. However, the inventive concept is not limited to the above embodiment. For example, each of the electrode structures may include a single floor of string selection electrode SSE, as illustrated in FIG. 1F. Alternatively, the electrode structure may include three or more string selection electrodes that are sequentially stacked.

Referring again to FIGS. 1A, 1B, and 1C, the first ground selection electrode GSE1 may correspond to a lowermost electrode among the electrodes GSE1, GSE2, CE, SSE2, SSE1 that are stacked in each of the electrode structures. Further, the first string selection electrode SSE1 may correspond to an uppermost electrode among the electrodes GSE1, GSE2, CE, SSE2, SSE1 stacked in each of the electrode structures. The second string selection electrode SSE2 may correspond to a next uppermost electrode among the electrodes GSE1, GSE2, CE, SSE2, SSE1.

The electrodes GSE1, GSE2, CE, SSE2, SSE1 may include a conductive material. For example, the electrodes GSE1, GSE2, CE, SSE2, SSE1 may include at least one of a doped semiconductor layer (e.g., a doped silicon layer), a metal layer (e.g., a tungsten layer, a copper layer or an aluminum layer), a conductive metal nitride layer (e.g., a titanium nitride layer, a tantalum nitride layer or a tungsten nitride layer), a conductive metal-semiconductor compound layer (e.g., a metal silicide layer) and a transition metal layer (e.g., a titanium layer or a tantalum layer).

Insulating patterns 105a, 105nUa, 105Ua may include an uppermost insulating pattern 105Ua, a next uppermost insulating pattern 105nUa between the first and second string selection electrodes SSE1 and SSE2, and a plurality of insulating patterns 105a between the cell electrodes CE and the ground selection electrode GSE1 and GSE2. The uppermost insulating pattern 105Ua may be plural. The plurality of uppermost insulating patterns 105Ua may be disposed over the plurality of first string selection electrodes SSE1, respectively. The plurality of uppermost insulating patterns 105Ua may be disposed at the same level from the top surface of the substrate 100. Also, the next uppermost insulating pattern 105nUa may be plural. The plurality of next uppermost insulating pattern 105nUa may be disposed directly on the plurality of second string selection electrodes SSE2, respectively. The next uppermost insulating patterns 105nUa may also be disposed at the same level from the top surface of the substrate 100. The insulating patterns 105a, 105nUa, 105Ua may include an oxide layer, for example, a high density plasma (HDP) oxide layer and/or a high temperature oxide (HTO) layer.

The electrode structure may further include a buffer dielectric pattern 103a disposed between the first ground selection electrode GSE1 and the substrate 100. The buffer dielectric pattern 103a may be thinner than the insulating patterns 105a, 105nUa, 105Ua. The insulating patterns 105a, 105nUa, 105Ua may include an oxide layer or the like. The buffer dielectric pattern 103a may also include an oxide layer or the like.

A plurality of vertical active patterns 120 may vertically penetrate, e.g., along a z-axis direction each of the electrode structures. Each of the vertical active patterns 120 may successively penetrate each of the first string selection electrodes SSE1 as well as the electrodes SSE2, CE, GSE2, GSE1 below the first string selection electrode SSE1. Each of the vertical active patterns 120 may have a hollow cylinder shape. In this case, the hollow space in the vertical active pattern 120 may be filled with a filling dielectric pattern 125. A landing pad 130 may be disposed on the respective vertical active patterns 120 and the filling dielectric pattern 125 in the respective vertical active patterns 120. The filling dielectric patterns 125 may include an oxide layer, a nitride layer, and/or an oxynitride layer. The landing pad 130 may be in contact with the vertical active pattern 120.

The vertical active patterns 120 may contact the substrate 100. In more detail, the vertical active patterns 120 may contact the well region in the substrate 100. The vertical active patterns 120 may be formed of the same semiconductor material as the substrate 100. For example, when the substrate 100 is a silicon substrate, the vertical active patterns 120 may be silicon. The vertical active patterns 120 may have a crystalline state. The vertical active patterns 120 may be doped with dopants having the same conductivity type (e.g., the first conductivity type) as the well region. Alternatively, the vertical active patterns 120 may be undoped. The landing pads 130 may be formed of the same semiconductor material as the vertical active patterns 120, e.g., silicon. In an embodiment, drain regions may be formed in the landing pads 130, respectively. The drain regions may have a second conductivity type opposite to the first conductivity type.

As illustrated in FIGS. 1A and 1C, some of the vertical active patterns 120 may successively penetrate each of the first string selection electrodes SSE1 as well as the electrodes SSE2, CE, GSE2, GSE1 below the first string selection electrode SSE1. In a plan view, the vertical active patterns 120 penetrating each of the first string selection electrodes SSE1 may be arrayed in the first direction to form columns. However, the inventive concept is not limited to the above embodiment. For example, the vertical active patterns 120 penetrating the first string selection electrode SSE1 may be arrayed in different forms when viewed in a plan view.

An electrode-dielectric layer 170 may be disposed between a sidewall of the respective vertical active patterns 120 and the respective electrodes GSE1, GSE2, CE, SSE2, SSE1. In an embodiment, at least a portion of the electrode-dielectric layer 170 may extend to cover top and bottom surfaces of the respective electrodes GSE1, GSE2, CE, SSE2, SSE1. In this case, at least a portion of the electrode-dielectric layer 170 between the respective vertical active patterns 120 and the first string selection electrode SSE1 may further extend to cover the top surface, the bottom surface and an outer sidewall of the first string selection electrode SSE1. In an embodiment, the entire electrode-dielectric layers 170 between the respective vertical active patterns 120 and the respective electrodes GSE1, GSE2, CE, SSE2, SSE1 may extend to cover the top and bottom surfaces of the respective electrodes GSE1, GSE2, CE, SSE2, SSE1.

The first string selection electrodes SSE1 and the electrode-dielectric layers 170 will now be described with reference to FIG. 1D in more detail. FIG. 1D is an enlarged view illustrating a portion 'A' of FIG. 1B.

Referring to FIGS. 1B and 1D, at least one specific electrode among the electrodes GSE1, GSE2, CE, SSE2, SSE1 may include first and second outer sidewalls that face each other. For example, the first string selection electrode SSE1 may have a first outer sidewall S1$a$ and a second outer sidewall S1$b$ that face each other. In this case, the electrode-dielectric layer 170 between the vertical active pattern 120 and the first string selection electrode SSE1 may extend to cover the top surface, the bottom surface, and the first outer sidewall S1$a$ of the first string selection electrode SSE1. The extension of the electrode-dielectric layer 170 may be in contact with the top surface, the bottom surface, and the first outer sidewall S1$a$ of the first string selection electrode SSE1. The second outer sidewall S1$b$ of the first string selection electrode SSE1 may not be covered with the extension of the electrode-dielectric layer 170. In an embodiment, the second outer sidewall S1$b$ of the first string selection electrode SSE1 may be in contact with the isolation pattern 175.

The first string selection electrode SSE1 may have an inner sidewall InS1 adjacent to the sidewall of the vertical active pattern 120. As illustrated in FIGS. 1A to 1D, the inner sidewall InS1 of the first string selection electrode SSE1 may continuously surround the sidewall of the vertical active pattern 120, e.g., may be annular when the sidewall of the vertical active pattern 120 is a hollow cylinder. The electrode-dielectric layer 170 between the vertical active pattern 120 and the first string selection electrode SSE1 may be disposed between the sidewall of the vertical active pattern 120 and the inner sidewall InS1 of the first string selection electrode SSE1.

Similarly, the second string selection electrode SSE2 may have a first outer sidewall S2$a$ and a second outer sidewall S2$b$ that face each other. The first outer sidewall S2$a$ and the second outer sidewall S2$b$ of the second string selection electrode SSE2 may be vertically aligned, e.g., along a z-axis direction, with the first outer sidewall S1$a$ and the second outer sidewall S1$b$ of the first string selection electrode SSE1, respectively. The electrode-dielectric layer 170 between the vertical active pattern 120 and the second string selection electrode SSE2 may extend to cover the bottom surface, the top surface, and the first outer sidewall S2$a$ of the second string selection electrode SSE2. An extension of the electrode-dielectric layer 170 between the vertical active pattern 120 and the second string selection electrode SSE2 may be in contact with the bottom surface, the top surface, and the first outer sidewall S2$a$ of the second string selection electrode SSE2.

The extension of the electrode-dielectric layer 170 between the vertical active pattern 120 and the second string selection electrode SSE2 may not cover the second outer sidewall S2$b$ of the second string selection electrode SSE2. In an embodiment, the second outer sidewall S2$b$ of the second string selection electrode SSE2 may be in contact with the isolation pattern 175. As illustrated in FIGS. 1A to 1D, the second string selection electrode SSE2 may also have an inner sidewall InS2 that surrounds the sidewall of the vertical active pattern 120.

In an embodiment, the next uppermost insulating pattern 105$n$Ua may have a first outer sidewall and a second outer sidewall that face each other. The first and second outer sidewalls of the next uppermost insulating pattern 105$n$Ua may be adjacent to the first and second outer sidewalls S1$a$ and S1$b$ of the first string selection electrode SSE1, respectively. The extension of the electrode-dielectric layer 170 covering the first outer sidewall S1$a$ of the first string selection electrode SSE1 may extend downwardly along the first outer sidewall of the next uppermost insulating pattern 105$n$Ua to contact the extension of the electrode-dielectric layer 170 covering the first outer sidewall S2$a$ of the second string selection electrode SSE2.

Non sacrificial pattern 150$a$ may be disposed at one side of the first and second string selection electrodes SSE1 and SSE2. That is, the non sacrificial pattern 150$a$ may be disposed in a cutting region 140 which is defined between the uppermost insulating patterns 105Ua, between the first string selection electrodes SSE1, between the next uppermost insulating patterns 105$n$Ua, and between the second string selection electrodes SSE2 in each of the electrode structures. The non sacrificial pattern 150$a$ may be disposed on the uppermost cell electrode CE.

As illustrated in FIG. 1D, a horizontal distance HD, e.g., along an x-axis direction, between the non sacrificial pattern 150$a$ and the next uppermost insulating pattern 105$n$Ua may be equal to or less than twice a thickness T, along a z-axis direction, of the electrode-dielectric layer 170 on the top surface of the first string selection electrode SSE1. Thus, the electrode-dielectric layer 170 may fill a space between the non sacrificial pattern 150$a$ and the next uppermost insulating pattern 105$n$Ua. The first string selection electrode SSE1 may be separated from the second string selection electrode SSE2 thereunder.

The first string selection electrode SSE1 may be disposed in an uppermost empty region 160U between the uppermost insulating pattern 105Ua and the next uppermost insulating pattern 105$n$Ua. The second string selection electrode SSE2 may be disposed in a next uppermost empty region 160$n$U between the next uppermost insulating pattern 105$n$Ua and the insulating pattern 105$a$ under the next uppermost insulating pattern 105$n$Ua. In this case, a portion of the electrode-dielectric layer 170 covering the first outer sidewalls S1$a$ and S2$a$ of the first and second string selection electrodes SSE1 and SSE2 may be disposed outside the uppermost empty region 160U and the next uppermost empty region 160$n$U. As such, lateral widths, e.g., along an x-axis direction, of the first and second string selection electrodes SSE1 and SSE2 may be increased, thereby lowering the electrical resistance of the first and second string selection electrodes SSE1 and SSE2.

A residual sacrificial spacer 145r may be disposed on one outer sidewall of the uppermost insulating pattern 105Ua. The residual sacrificial spacer 145r may be disposed between the uppermost insulating patterns 105Ua and the non sacrificial pattern 150a. The residual sacrificial spacer 145r may be disposed on the extension of the electrode-dielectric layer 170 covering the first outer sidewall S1a of the first string selection electrode SSE1. In an embodiment, a lateral width, e.g., along an x-axis direction, of the residual sacrificial spacer 145r may be substantially equal to the horizontal distance HD.

The residual sacrificial spacer 145r may include a dielectric material having an etch selectivity with respect to the insulating patterns 105a, 105nUa, 105Ua and to the non sacrificial pattern 150a. For example, in the event that the insulating patterns 105a, 105nUa, 105Ua and the non sacrificial spacers 150a are formed of a high density plasma (HDP) oxide layer and/or a high temperature oxide (HTO) layer, the residual sacrificial spacers 145r may be formed of a nitride layer, an oxynitride layer, a plasma enhanced chemical vapor deposition (PE-CVD) oxide layer, and/or a low temperature oxide (LTO) layer. The LTO layer may correspond to an oxide layer which is formed at a process temperature within the range of about room temperature to about 600° C.

Subsequently, referring to FIGS. 1A and 1B, a pair of the residual sacrificial spacers 145r may be disposed on both inner sidewalls of the cutting region 140, respectively. As described above, each of the residual sacrificial spacers 145r may be disposed between the non sacrificial pattern 150a and the inner sidewall of the cutting region 140. As illustrated in FIG. 1A, the pair of residual sacrificial spacers 145r may extend in parallel in the first direction, e.g., a y-axis direction. In an embodiment, end portions of the pair of residual sacrificial spacers 145r may extend to contact each other at an end portion of the cutting region 140. The end portions of the pair of residual sacrificial spacers 145r may be connected to each other at the end portion of the cutting region 140, as illustrated in the plan view of FIG. 1A. In an embodiment, the residual sacrificial spacers 145r may be absent, i.e., sacrificial spacers used during manufacturing may be completely removed.

As illustrated in FIG. 1B, according to an embodiment, both outer sidewalls CE_Sa and CE_Sb (e.g., first and second outer sidewalls) of the respective cell electrodes CE may not be covered with the electrode-dielectric layer 170, in contrast to the first and second string selection electrodes SSE1 and SSE2. Similarly, both outer sidewalls GSE_Sa and GSE_Sb of each of the ground selection electrodes GSE1 and GSE2 may not be covered with the electrode-dielectric layer 170. In an embodiment, the first and second outer sidewalls CE_Sa and CE_Sb of the respective cell electrodes CE may be in contact with the pair of isolation patterns 175 disposed at both sides of each of the electrode structures, respectively. Further, the first and second outer sidewalls GSE_Sa and GSE_Sb of each of the respective ground selection electrodes GSE1 and GSE2 may be in contact with the pair of isolation patterns 175 disposed at both sides of each of the electrode structures, respectively. Each of the cell electrodes CE may include a plurality of inner sidewalls surrounding the sidewalls of the vertical active patterns 120 that penetrate the first string selection electrodes SSE1 in each of the electrode structures. Each of the ground selection electrodes GSE1 and GSE2 may also include a plurality of inner sidewalls surrounding the sidewalls of the vertical active patterns 120 that penetrate the first string selection electrodes SSE1 in each of the electrode structures.

Now, the electrode-dielectric layer 170 will be described in more detail with reference to FIG. 1E. FIG. 1E is an enlarged view illustrating a portion 'B' of FIG. 1B.

Referring to FIGS. 1B and 1E, the electrode-dielectric layer 170 may include a tunneling dielectric layer TDL, a charge storing layer SL, and a blocking dielectric layer BDL. The tunneling dielectric layer TDL may be adjacent the vertical active patterns 120. The blocking dielectric layer BDL may be adjacent to the respective electrodes GSE1, GSE2, CE, SSE2, SSE1. The charge storing layer SL may be disposed between the tunneling dielectric layer TDL and the blocking dielectric layer BDL. The tunneling dielectric layer TDL may include an oxide layer and/or an oxynitride layer. The charge storing layer SL may include a dielectric layer having traps capable of storing charges. For example, the charge storing layer SL may include a nitride layer and/or a metal oxide layer (e.g., a hafnium oxide layer). The blocking dielectric layer BDL may include a high-k dielectric layer having a dielectric constant which is higher than that of the tunneling dielectric layer TDL. In an embodiment, the high-k dielectric layer may include a metal oxide layer such as a hafnium oxide layer and/or an aluminum oxide layer. Moreover, the blocking dielectric layer BDL may further include a barrier dielectric layer (e.g., an oxide layer) having an energy band gap which is greater than that of the high-k dielectric layer. The barrier dielectric layer may be disposed between the high-k dielectric layer and the charge storing layer SL.

In an embodiment, all of the tunneling dielectric layers TDL, the charge storing layers SL and the blocking dielectric layers BDL in each of the electrode structures may extend to cover top and bottom surfaces of the electrodes GSE1, GSE2, CE, SSE2, SSE1, as illustrated in FIGS. 1A to 1E. In addition, each of the extensions of the electrode-dielectric layers 170 covering the first outer sidewalls S1a and S2a of the string selection electrodes SSE1 and SSE2 may include extensions of the tunneling dielectric layer TDL, the charge storing layer SL, and the blocking dielectric layer BDL.

Subsequently, referring to FIGS. 1A, 1B, and 1C, common source regions CS may be disposed in the substrate 100 between the electrode structures. The common source regions CS may be doped with dopants of the second conductivity type. The common source regions CS may be formed in the well region of the substrate 100. The isolation patterns 175 may be disposed on the common source regions CS, respectively.

As illustrated in FIGS. 1A and 1C, each of the electrodes GSE1, GSE2, CE, SSE2, SSE1 stacked in each of the electrode structures may include an electrode pad EP at an edge thereof. The electrode pads EP of the electrodes GSE1, GSE2, CE, SSE2, SSE1 stacked in each of the electrode structures may constitute a stepped structure. The electrode pads EP of the electrodes GSE1, GSE2, CE, SSE2, SSE1 stacked in each of the electrode structures may exhibit a configuration stepped down in the first direction (e.g., a positive y-axis direction). Electrical signals, such as operating voltages, may be applied to the electrodes GSE1, GSE2, CE, SSE2, SSE1 through the electrode pads EP. For example, the electrical signals may be applied to the electrodes GSE1, GSE2, CE, SSE2, SSE1 through conductive plugs contacting the electrode pads EP.

Each of the vertical active patterns 120 and the electrodes GSE1, GSE2, CE, SSE2, SSE1 adjacent thereto may constitute a single vertical cell string. That is, the vertical cell string may include a plurality of cell transistors serially connected to each other. Moreover, the vertical cell string may further include at least one ground selection transistor and at least one string selection transistor. The at least one ground selection transistor may be serially connected to one end of the cell transistors that are serially connected and the at least one string selection transistor may be serially connected to the other end of the cell transistors that are serially connected. That is, the at least one ground selection transistor may be serially connected to the lowermost cell transistor and the at least one string selection transistor may be serially connected to the uppermost cell transistor. In the event that the at least one ground selection transistor includes a plurality of ground selection transistors, the plurality of ground selection transistors in the vertical cell string may be serially connected to each other. Similarly, in the event that the at least one string selection transistor includes a plurality of string selection transistors, the plurality of string selection transistors in the vertical cell string may be serially connected to each other.

The cell transistors may be defined at intersections of the vertical active patterns 120 and the cell electrodes CE, respectively. Further, the ground selection transistors may be defined at intersections of the vertical active patterns 120 and the ground section electrodes GSE1 and GSE2, respectively. Similarly, the string selection transistors may be defined at intersections of the vertical active patterns 120 and the string section electrodes SSE1 and SSE2, respectively. The electrode-dielectric layer 170 between the respective cell electrodes CE and the respective vertical active patterns 120 may correspond to a data storage layer of the cell transistor. The electrode-dielectric layer 170 between the respective string selection electrodes SSE1 or SSE2 and the respective vertical active patterns 120 may correspond to a gate dielectric layer of the string selection transistor. The electrode-dielectric layer 170 between the respective ground selection electrodes GSE1 or GSE2 and the respective vertical active patterns 120 may correspond to a gate dielectric layer of the ground selection transistor.

The ground selection transistors, the cell transistors, and the string selection transistors in each of the vertical cell strings may be sequentially stacked. Therefore, the ground selection transistors, the cell transistors, and the string selection transistors in each of the vertical cell strings may include vertical channel regions defined at the sidewall of the respective vertical active patterns 120. During operation of the three dimensional semiconductor memory device, inversion layers may be generated at portions of the sidewalls of the vertical active patterns 120 adjacent to the insulating patterns 105a, 105nUa, 105Ua. This may be due to the fringe field of the electrodes GSE1, GSE2, CE, SSE2, SSE1. The inversion layers may act as source/drain regions of the cell transistors, the string selection transistors and the ground selection transistors.

Referring again to FIGS. 1A to 1C, capping dielectric patterns 135a may be disposed on the electrode structures including the electrode pads EP, respectively. Further, the capping dielectric patterns 135a may be disposed on the uppermost insulating patterns 105Ua of the electrode structures. In this case, each of the capping dielectric patterns 135a may have sidewalls that are vertically aligned, e.g., along a z-axis direction, with both outer sidewalls of the respective uppermost insulating patterns 105Ua. In an embodiment, the residual sacrificial spacers 145r may extend upwardly, e.g., along a z-axis away from the substrate 100, to cover the sidewalls of the capping dielectric patterns 135a, as shown in FIG. 1B. Each of the capping dielectric patterns 135a may include a dielectric material having an etch selectivity with respect to the residual sacrificial spacers 145r. For example, the capping dielectric patterns 135a may include an oxide layer, e.g., a high density plasma (HDP) oxide layer and/or a high temperature oxide (HTO) layer.

The non sacrificial patterns 150a may extend upwardly between the sidewalls of the capping dielectric patterns 135a. In addition, the non sacrificial patterns 150a may further extend, e.g., along a x-axis direction, to cover top surfaces of the capping dielectric patterns 135a. In this case, each of the non sacrificial patterns 150a may have sidewalls that vertically aligned, e.g., along a z-axis direction, with both outer sidewalls CE_Sa and CE_Sb of the uppermost cell electrode CE respectively. Alternatively, the non sacrificial patterns 150a may not cover the top surfaces of the capping dielectric patterns 135a. The isolation patterns 175 may extend upwardly so that the capping dielectric pattern 135a and the non sacrificial pattern 150a may be disposed between adjacent isolation patterns 175.

Interconnections 190 may extend in the second direction, e.g., an x-axis direction, and be parallel with each other. The interconnections 190 may be electrically connected to the vertical active patterns 120. For example, the interconnections 190 may be electrically connected to the vertical active patterns 120 through contact plugs 180 penetrating the non sacrificial patterns 150a and the capping dielectric patterns 135a. The contact plugs 180 may be in contact with respective landing pads 130. Each of the interconnections 190 may be electrically connected to a plurality of the vertical active patterns 120 arrayed in the second direction. In an embodiment, the interconnections 190 may correspond to bit lines.

Each of the interconnections 190 may include at least one of a metal layer (e.g., a tungsten layer, a copper layer, or an aluminum layer), a conductive metal nitride layer (e.g., a titanium nitride layer, a tantalum nitride layer, or a tungsten nitride layer), and a transition metal layer (e.g., a titanium layer or a tantalum layer). Each of the contact plugs 180 may also include at least one of a metal layer (e.g., a tungsten layer, a copper layer, or an aluminum layer), a conductive metal nitride layer (e.g., a titanium nitride layer, a tantalum nitride layer, or a tungsten nitride layer), and a transition metal layer (e.g., a titanium layer or a tantalum layer).

According to the three dimensional semiconductor memory device as set forth above, the first outer sidewalls S1a and S2a of the string selection electrodes SSE1 and SSE2 may be covered with the electrode-dielectric layer 170. As such, the first outer sidewalls S1a and S2a of the string selection electrodes SSE1 and SSE2 may be protected from an etching process. Further, at least a portion of the electrode-dielectric layer 170 covering the first outer sidewalls S1a and S2a may be disposed outside the uppermost empty region 160U and the next uppermost empty region 160nU. This may allow an increase in the lateral widths, e.g., along an x-axis direction, of the string selection electrodes SSE1 and SSE2. With this increase, the electrical resistance of the string selection electrodes SSE1 and SSE2 may be reduced. As a result, a high reliable and highly integrated three dimensional semiconductor memory device may be realized.

Figure 2A:
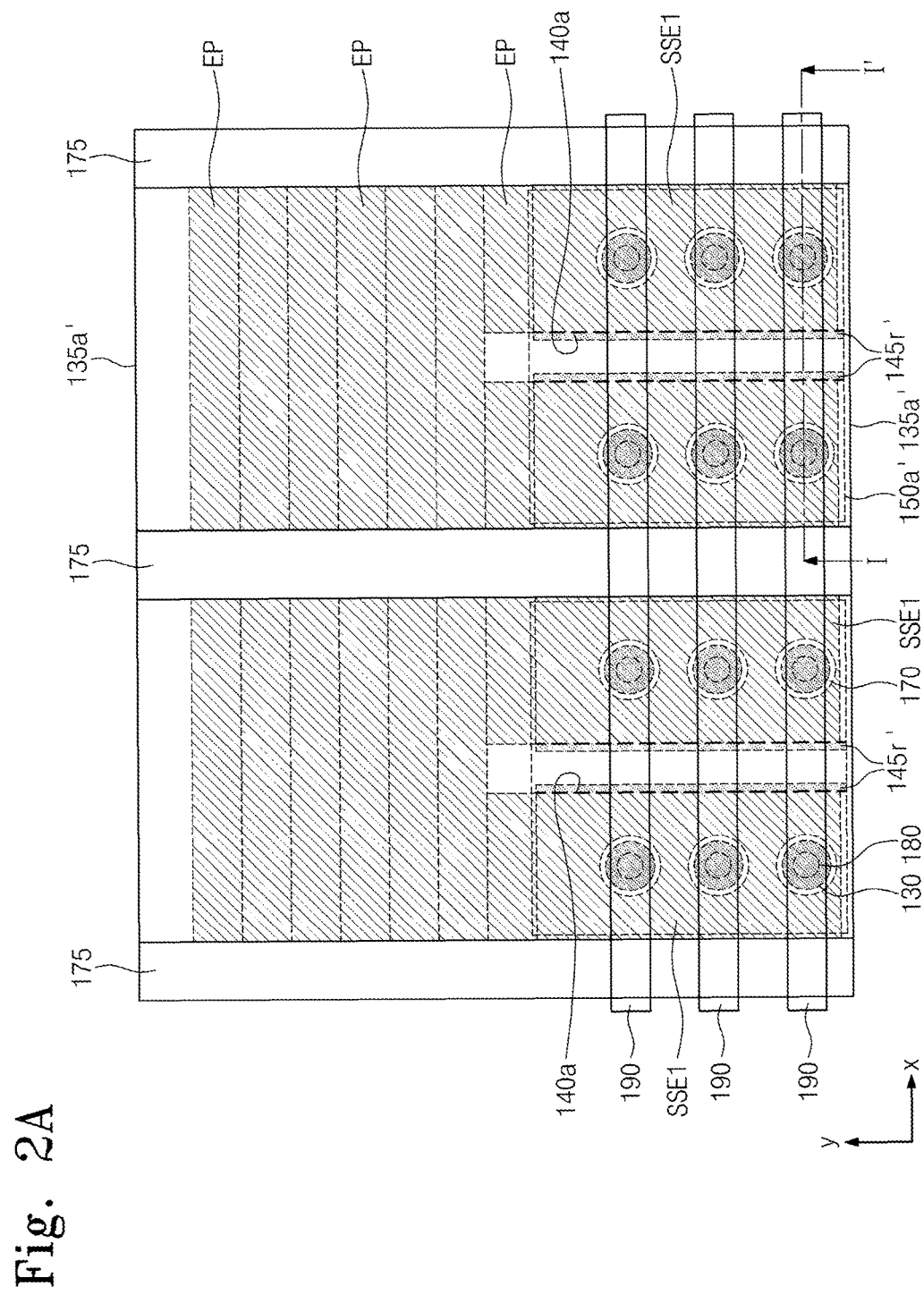
FIG. 2A illustrates a plan view of another modified embodiment of a three dimensional semiconductor memory device according to a first embodiment of the inventive concept.
Figure 2B:
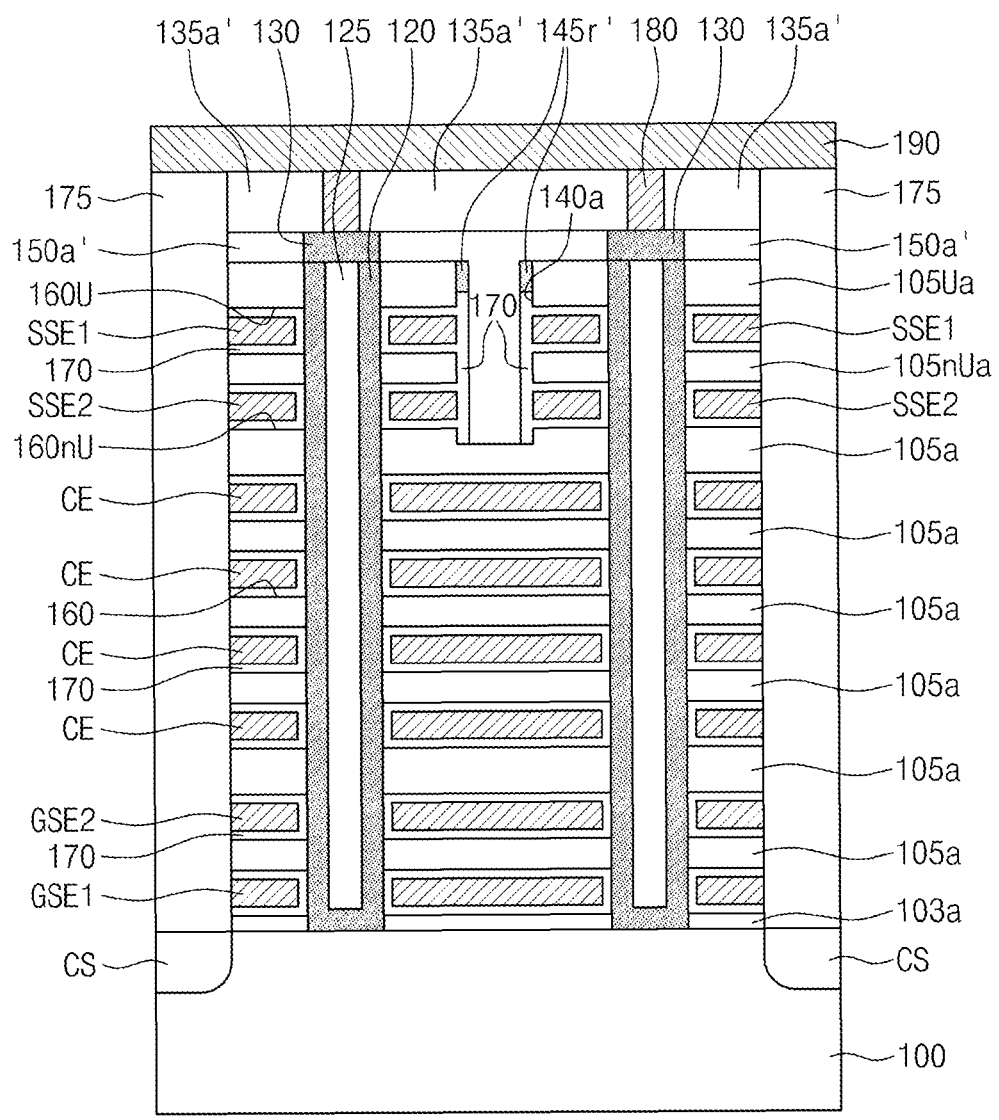
FIG. 2B illustrates a cross sectional view taken along a line I-I' of FIG. 2A.

FIG. 2A illustrates a plan view of another modified embodiment of a three dimensional semiconductor memory device according to a first embodiment of the inventive concept. FIG. 2B is a cross sectional view taken along a line I-I' of FIG. 2A.

Referring to FIGS. 2A and 2B, an end portion of the cutting region 140 and a connection between the adjacent residual sacrificial spacers 145r in the cutting region 140 illustrated in FIG. 1A may be removed to form residual sacrificial spacers 145r' in a cutting region 140a of FIGS. 2A and 2B. The adjacent residual sacrificial spacers 145r' in the cutting region 140a may be separated from each other, as illustrated in FIGS. 2A and 2B. In this case, a non sacrificial pattern 150a' may be disposed under a capping dielectric pattern 135a'. The capping dielectric pattern 135a' may be disposed outside the cutting region 140a. As illustrated in FIG. 2A, the non sacrificial pattern 150a' may be disposed only on the first string selection electrodes SSE1 and in the cutting region 140a. That is, the non sacrificial pattern 150a' may not cover the electrode pads EP of the electrodes SSE2, CE, GSE2, GSE1 located under the first string selection electrodes SSE1. The capping dielectric pattern 135a' may cover the first string selection electrodes SSE1 and the electrode pads EP of the electrodes SSE2, CE, GSE2, GSE1 located under the first string selection electrodes SSE1.

In an embodiment, top surfaces of the landing pads 130 on the vertical active patterns 120 may be coplanar with a top surface of the non sacrificial pattern 150a'. Alternatively, the top surfaces of the landing pads 130 may be coplanar with a top surface of the uppermost insulating pattern 105Ua.

Figure 3A:
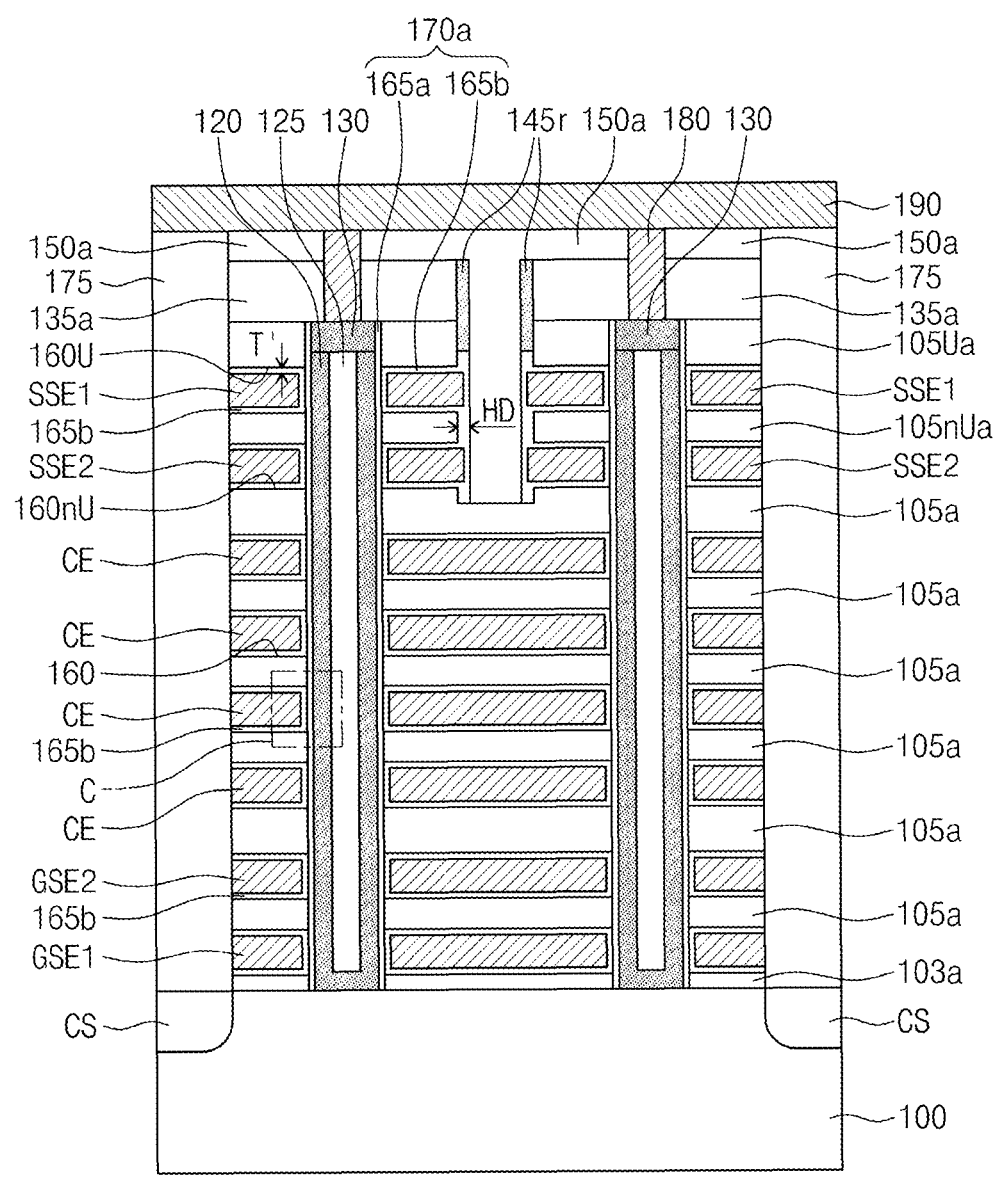
FIG. 3A illustrates a cross sectional view taken along a line I-I' of FIG. 1A to illustrate still another modified embodiment of a three dimensional semiconductor memory device according to a first embodiment of the inventive concept.
Figure 3B:
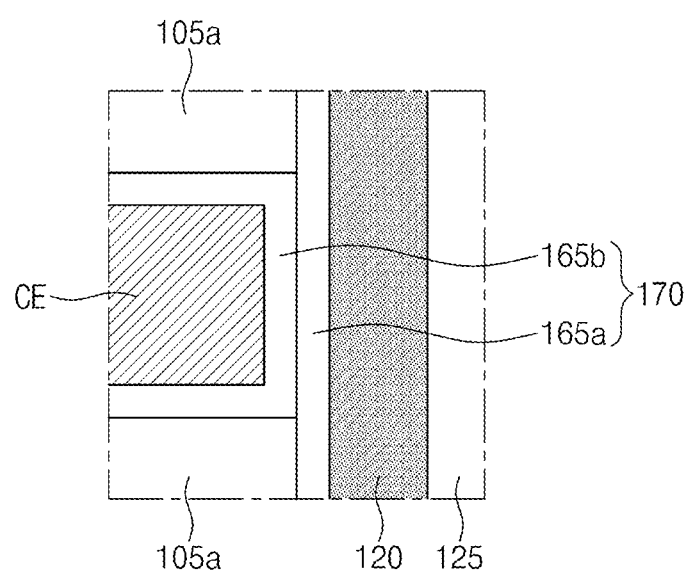
FIG. 3B illustrates an enlarged view of a portion 'C' of FIG. 3A.

FIG. 3A is a cross sectional view taken along a line I-I' of FIG. 1A to illustrate still another modified embodiment of a three dimensional semiconductor memory device according to a first embodiment of the inventive concept. FIG. 3B is an enlarged view illustrating a portion 'C' of FIG. 3A.

Referring to FIGS. 3A and 3B, an electrode-dielectric layer 170a between the vertical active pattern 120 and the respective electrodes GSE1, GSE2, CE, SSE2, SSE1 may include a first portion 165a and a second portion 165b. In this case, the first portion 165a of the electrode-dielectric layer 170a may extend vertically between the vertical active pattern 120 and the insulating patterns 105a, 105nUa, 105Ua. The second portion 165b of the electrode-dielectric layer 170a may extend horizontally to cover top and bottom surfaces of the respective electrodes GSE1, GSE2, CE, SSE2, SSE1. The second portion 165b of the electrode-dielectric layer 170a between the vertical active pattern 120 and the first string selection electrode SSE1 may extend to cover the first outer sidewall of the first string selection electrode SSE1. Similarly, the second portion 165b of the electrode-dielectric layer 170a between the vertical active pattern 120 and the second string selection electrode SSE2 may extend to cover the first outer sidewall of the second string selection electrode SSE2. In this case, a horizontal distance HD between the non sacrificial pattern 150a and the first outer sidewall of the next uppermost insulating pattern 105nUa may be equal to or less than twice a thickness T' of the second portion 165b on the top surface of the first string selection electrode SSE1.

The first portion 165a of the electrode-dielectric layer 170a may include at least a portion of the tunneling dielectric layer TDL described with reference to FIG. 1E. The second portion 165b of the electrode-dielectric layer 170a may include at least a portion of the blocking dielectric layer BDL described with reference to FIG. 1E. Any one of the first and second portions 165a and 165b may include the charge storing layer SL described with reference to FIG. 1E. For example, the first portion 165a may include the tunneling dielectric layer TDL, the charge storing layer SL, and a barrier dielectric layer of the blocking dielectric layer BDL, and the second portion 165b may include a high-k dielectric layer of the blocking dielectric layer BDL. Alternatively, the first and second portions 165a and 165b may be embodied in different forms.

Figure 4:
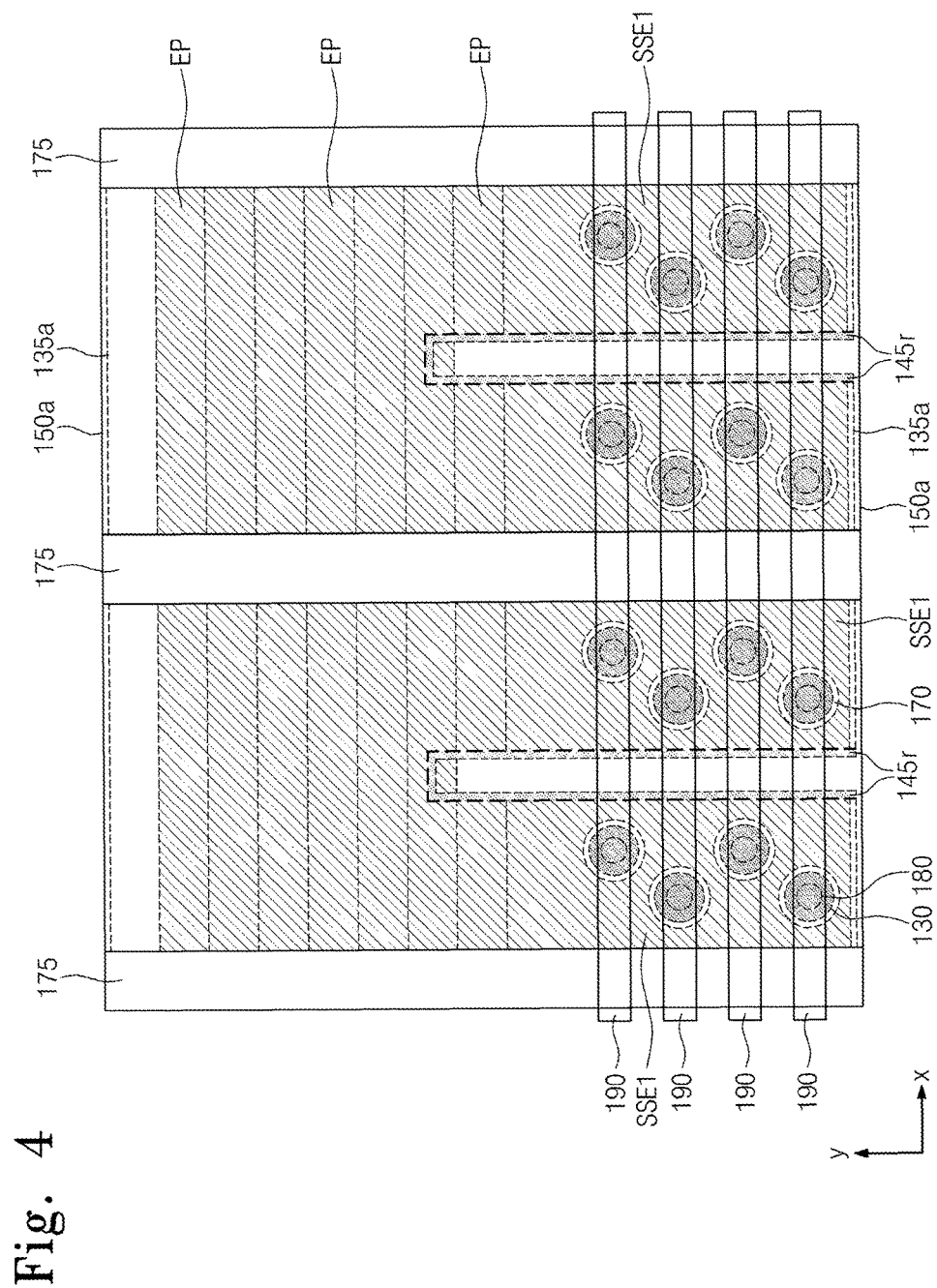
FIG. 4 illustrates a plan view of yet another modified embodiment of a three dimensional semiconductor memory device according to a first embodiment of the inventive concept.

FIG. 4 illustrates a plan view of yet another modified embodiment of a three dimensional semiconductor memory device according to a first embodiment of the inventive concept.

Referring to FIG. 4, the odd-numbered landing pads 130 of the landing pads 130 on the vertical active patterns 120 penetrating each of the first string selection electrodes SSE1 may be offset from the even-numbered landing pads 130 in the second direction, e.g., along an x-axis direction. The vertical active patterns 120 may be disposed under respective landing pads 130. Further, the vertical active patterns 120 may be vertically aligned with respective landing pads 130. As such, the vertical active patterns 120 penetrating the respective first string selection electrodes SSE1 may be arrayed in a zigzag pattern in the first direction.

Figure 44:
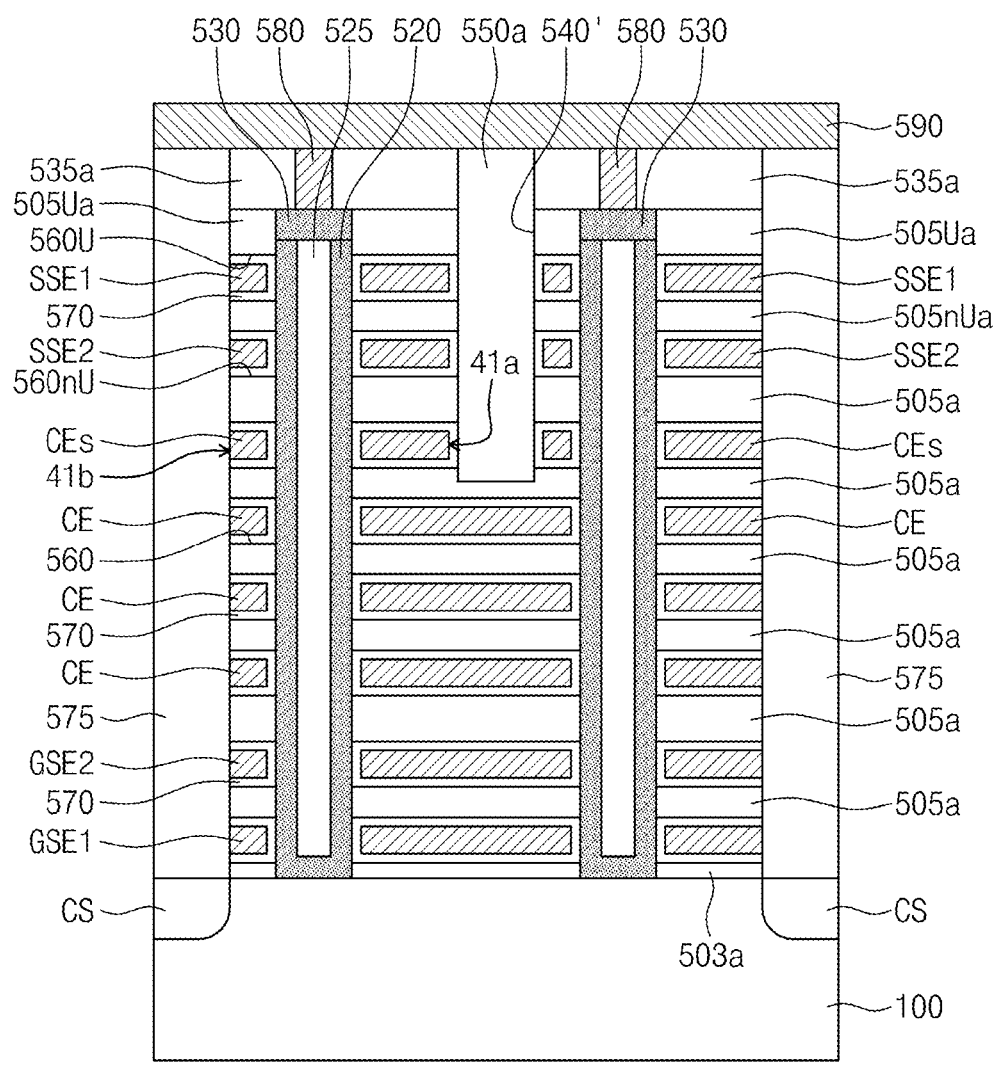
FIG. 44 illustrates a cross sectional view of still yet another modified embodiment of a three dimensional semiconductor memory device according to a fourth embodiment of the inventive concept.

Meanwhile, in FIG. 1B, a bottom surface of the cutting region 140 and a bottom surface of the non sacrificial pattern 150a in the cutting region 140 may extend further downwardly, e.g., along a z-axis direction towards the substrate 100. Thus, the cutting region 140 and the non sacrificial pattern 150a may penetrate at least the uppermost cell electrode CE, as illustrated in FIG. 44 (fourth embodiment). In this case, each of the electrode structures may include a plurality of uppermost cell electrodes, for example, a pair of uppermost cell electrodes which are horizontally separated from each other. The plurality of uppermost cell electrodes in each of the electrode structure may be located at a same level from the top surface of the substrate 100. In this case, an outer sidewall of each of the uppermost cell electrodes adjacent to the non sacrificial pattern 150a may be covered with an extension of the electrode-dielectric layer 170 between the sidewall of the vertical active pattern and the uppermost cell electrode. In an embodiment, the cutting region 140 and the non sacrificial pattern 150a may extend further downwardly, thereby penetrating the uppermost cell electrode and the next uppermost cell electrode.

FIGS. 5A to 10A illustrate plan views of a method of fabricating a three dimensional semiconductor memory device according to a first embodiment of the inventive concept. FIGS. 5B to 10B are cross sectional views taken along lines I-I' of FIGS. 5A to 10A, respectively. In addition, FIGS. 5C to 10C are cross sectional views taken along lines II-II' of FIGS. 5A to 10A, respectively.

Figure 5B:
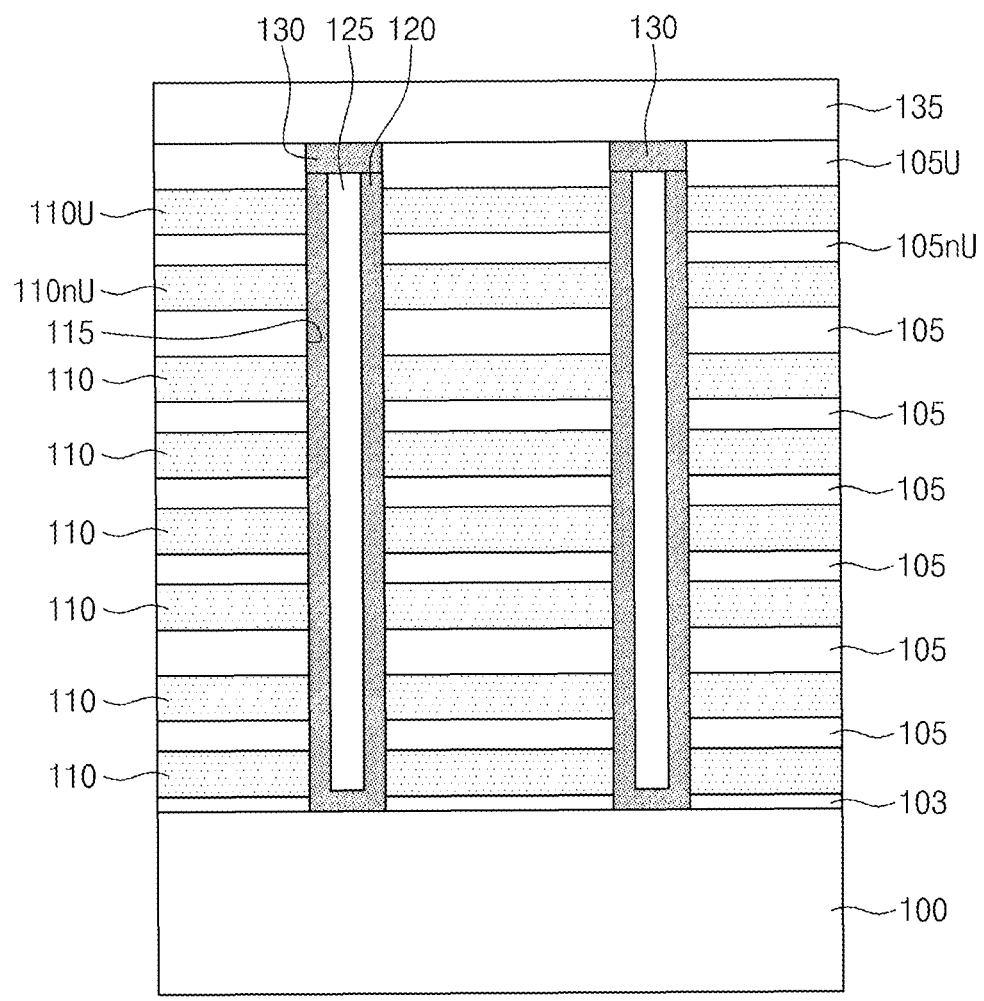
Figure 5C:
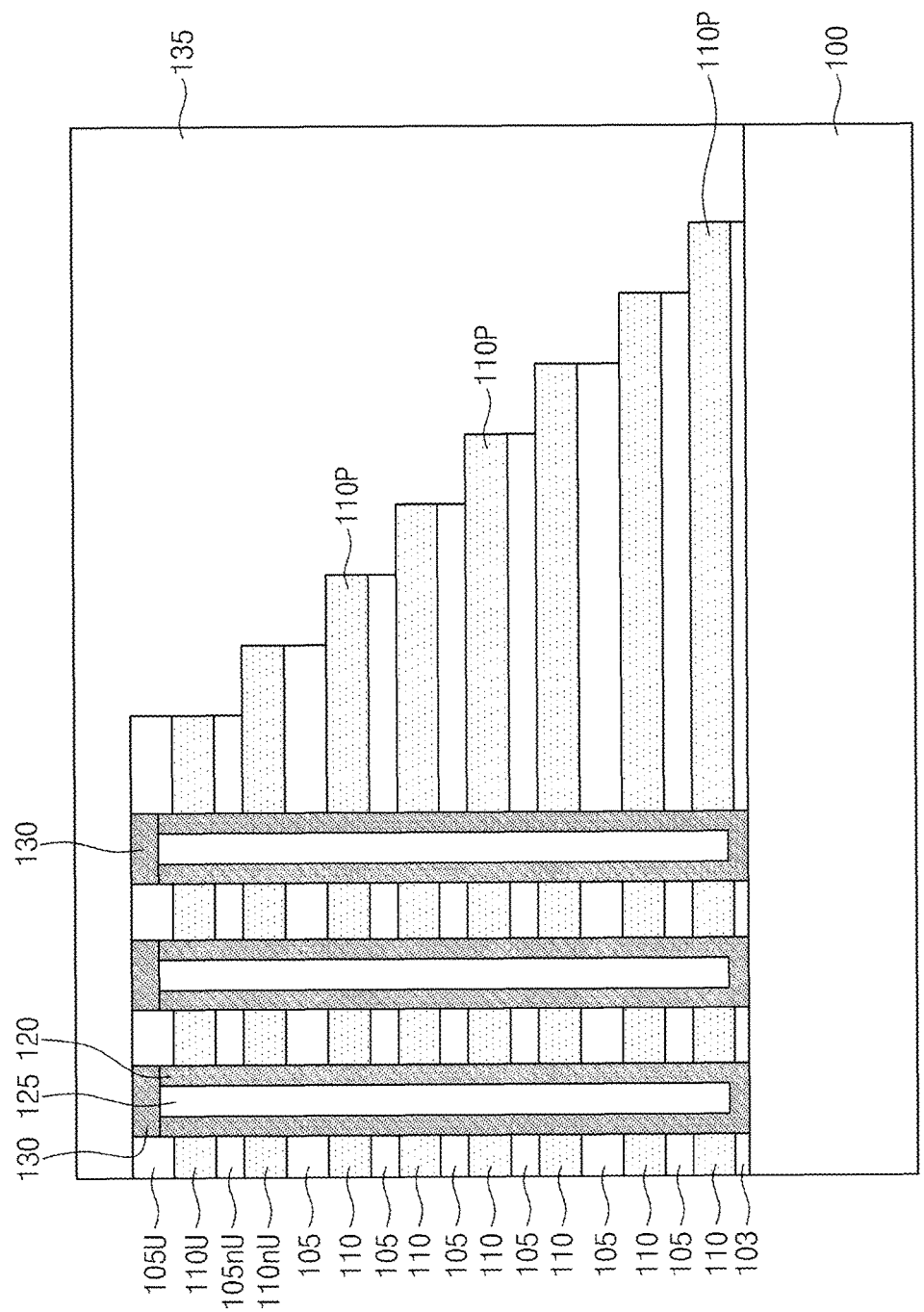

Referring to FIGS. 5A, 5B, and 5C, a buffer dielectric layer 103 may be formed on a substrate 100. A plurality of sacrificial layers 110, 110nU, 110U and a plurality of insulating layers 105, 105nU, 105U may be alternately and repeatedly stacked on the buffer dielectric layer 103. The sacrificial layers 110, 110nU, 110U may be formed of a material layer having an etching selectivity with respect to the insulating layers 105, 105nU, 105U. For example, each of the insulating layers 105, 105nU, 105U may be formed of an oxide layer such as a high density plasma (HDP) oxide layer and/or a high temperature oxide (HTO) layer, and each of the sacrificial layers 110, 110nU, 110U may be formed of a nitride layer.

The insulating layers 105, 105nU, 105U and the sacrificial layers 110, 110nU, 110U may be patterned to form sacrificial pads 110P of the sacrificial layers 110, 110nU, 110U. During formation of the sacrificial pads 110P, the insulating layers 105, 105nU, 105U and the sacrificial layers 110, 110nU, 110U may be etched using a consumption etch mask. For example, a mask pattern may be formed to define the sacrificial pad 110P of the lowermost sacrificial layer 110 among the sacrificial layers 110, 110nU, 110U. The insulating layers 105, 105nU, 105U and the sacrificial layers 110, 110nU, 110U may be etched using the mask pattern as an etch mask. As such, the sacrificial pad 110P of the lowermost sacrificial layer 110 may be formed. The mask pattern may be recessed or shrunken to reduce a width of the mask pattern. The insulating layers 105, 105nU, 105U and the sacrificial layers 110, 110nU, 110U on the lowermost sacrificial layer may be etched using the recessed mask pattern as an etch mask. As such, the sacrificial pad 110P of the next lowermost sacrificial layer 110 may be formed, and the sacrificial pad 110P of the lowermost sacrificial layer 110 may be exposed. The recess process of the mask pattern and the etch process of the insulating layers 105, 105nU, 105U and the sacrificial layers 110, 110nU, 110U may be repeatedly performed to form the sacrificial pads 110P constituting a stepped shape. Alternatively, the sacrificial pads 110P constituting the stepped shape may be formed by different methods from the above descriptions.

The insulating layers 105, 105nU, 105U, the sacrificial layers 110, 110nU, 110U, and the buffer dielectric layer 103 may be patterned to form a plurality of holes 115 penetrating the insulating layers 105, 105nU, 105U, the sacrificial layers 110, 110nU, 110U, and the buffer dielectric layer 103. A vertical active pattern 120, a filling dielectric pattern 125, and a landing pad 130 may be formed in each of the holes 115. A capping dielectric layer 135 may be formed to cover an entire surface of the substrate having the vertical active patterns 120, the filling dielectric patterns 125, and the landing pads 130. The capping dielectric layer 135 may include a dielectric material having an etching selectivity with respect to the sacrificial layers 110, 110nU, 110U. For example, the capping dielectric layer 135 may be formed of an oxide layer. In FIGS. 5A, 5B, and 5C, '105U' indicates an uppermost insulating layer of the insulating layers and '105nU' indicates a next uppermost insulating layer of the insulating layers. Similarly, '110U' indicates an uppermost sacrificial layer of the sacrificial layers and '110nU' indicates a next uppermost sacrificial layer of the insulating layers.

Figure 6A:
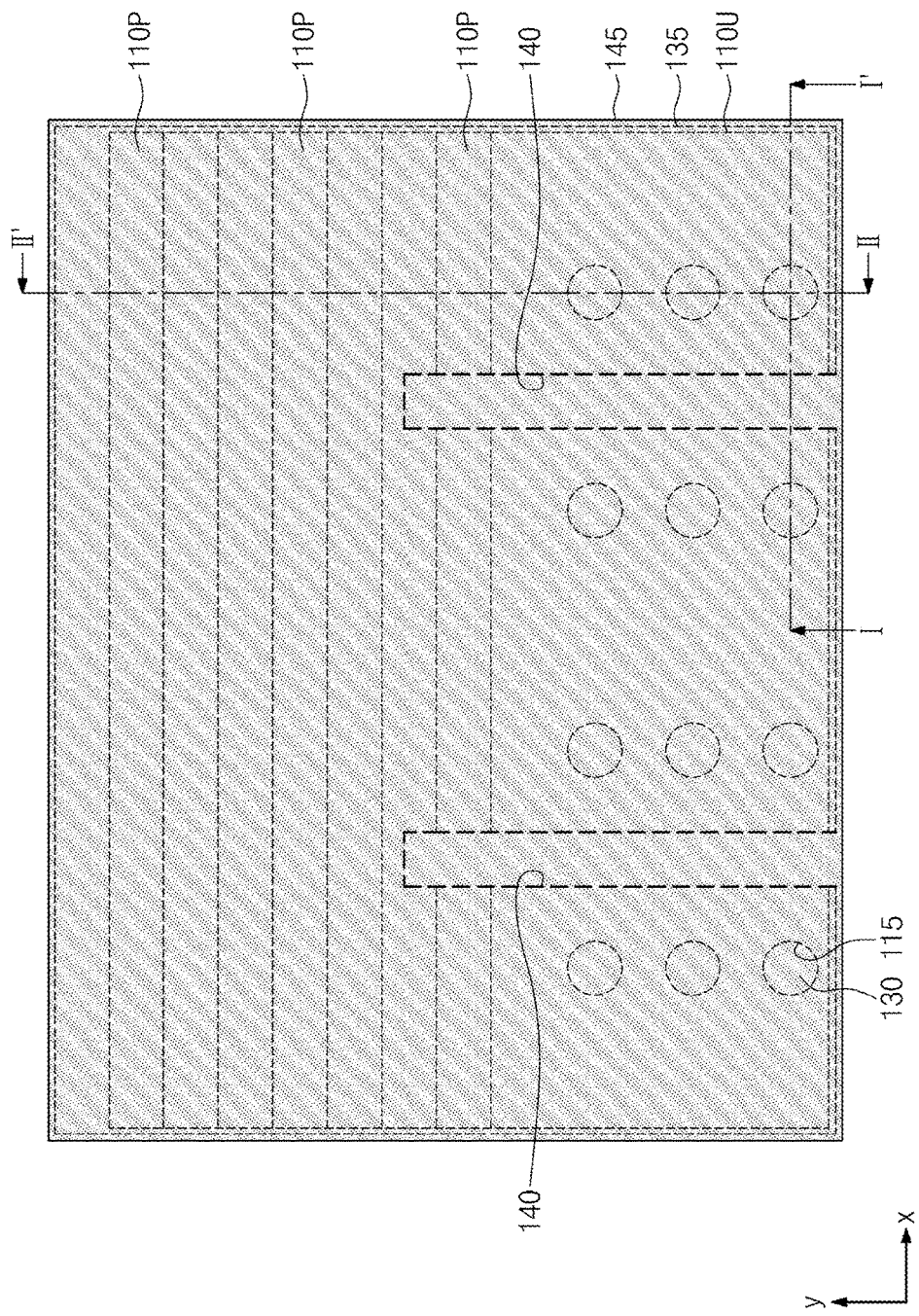
Figure 6B:
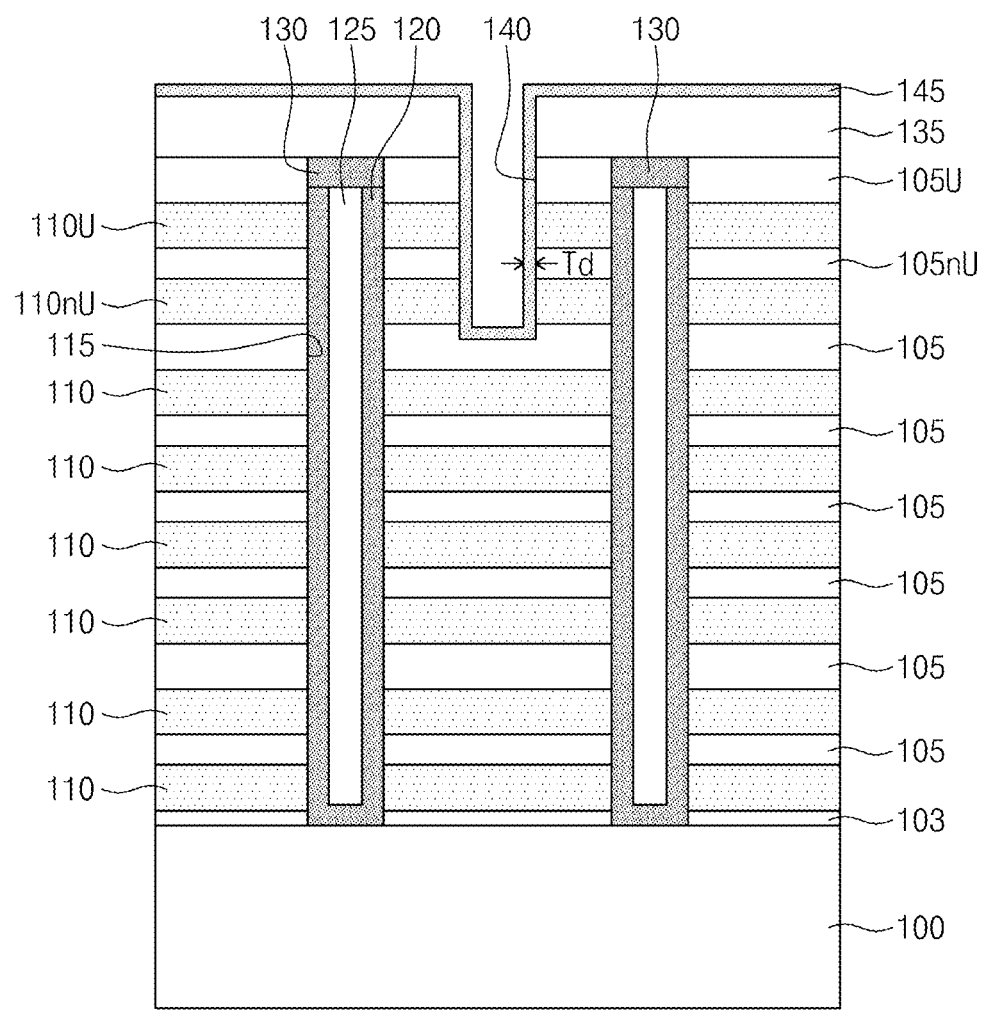

Referring to FIGS. 6A, 6B, and 6C, the capping dielectric layer 135, the uppermost insulating layer 105U, the uppermost sacrificial layer 110U, the next uppermost insulating layer 105nU, and the next uppermost sacrificial layer 110nU may be patterned to form a cutting region 140. As illustrated in FIG. 6A, the cutting region 140 may have a groove shape extending in a first direction, e.g., a y-axis direction. The cutting region 140 may cross the sacrificial pads 11 OP of the uppermost sacrificial layer 110U and the next uppermost sacrificial layer 110nU. Alternatively, the cutting region 140 may cross the sacrificial pads 110P of all the sacrificial layers 110, 110nU, 110U which are sequentially stacked.

A spacer layer 145 may be conformably formed on the substrate having the cutting region 140. As such, the spacer layer 145 may be formed to a substantially uniform thickness on an inner surface of the cutting region 140 and a top surface of the capping dielectric layer 135. The spacer layer 145 may be formed to have a first thickness Td, e.g., along a z-axis direction.

The spacer layer 145 may include a dielectric material having an etch rate which is higher than that of the insulating layers 105, 105nU, 105U. In an embodiment, the etch rate of the spacer layer 145 may be equal to or higher than 10% of the etch rate of the sacrificial layers 110, 110nU, 110U. In addition, the etch rate of the spacer layer 145 may be lower than 200% of the etch rate of the sacrificial layers 110, 110nU, 110U. For example, the spacer layer 145 may be formed of a nitride layer, an oxynitride layer, a plasma enhanced chemical vapor deposition (PE-CVD) oxide layer and/or a low temperature oxide (LTO) layer. The LTO layer may correspond to an oxide layer which is formed at a temperature within the range of about room temperature to about 600° C.

Figure 7A:
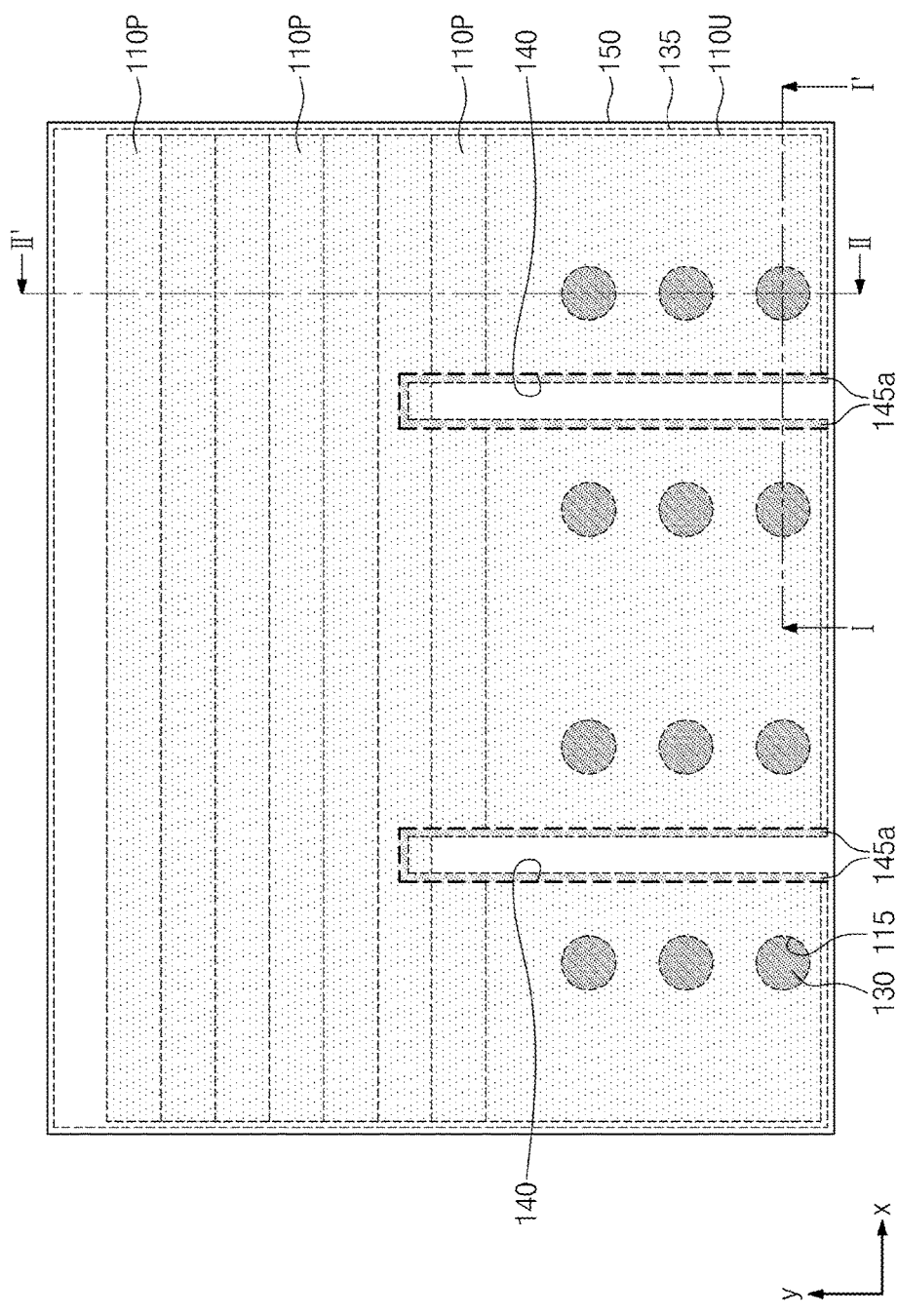
Figure 7B:
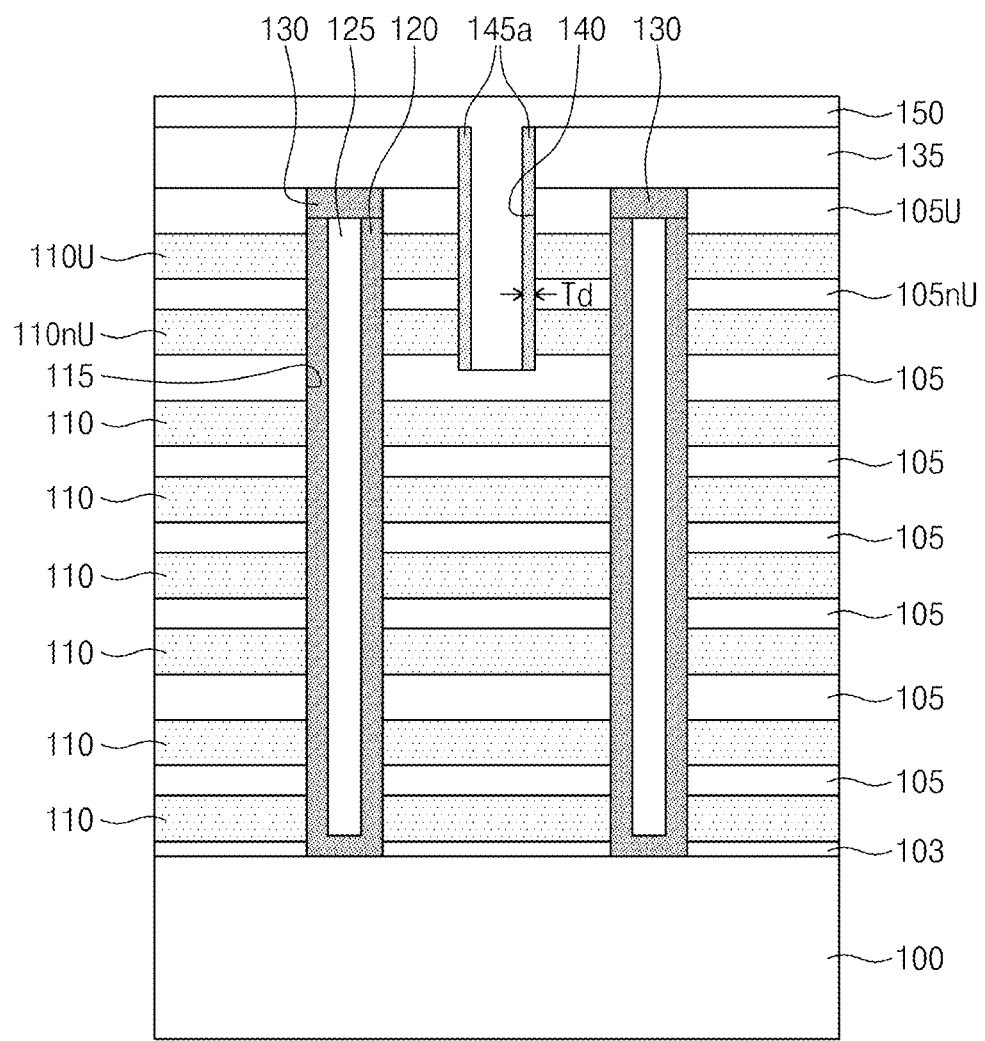

Referring to FIGS. 7A, 7B, and 7C, the spacer layer 145 may be etched using a blanket anisotropic etch technique, thereby forming a pair of sacrificial spacers 145a on both inner sidewalls of the cutting region 140, respectively. As illustrated in FIG. 7A, the pair of sacrificial spacers 145a may be connected to each other at an end portion of the cutting region 140.

A non sacrificial layer 150 filling the cutting region 140 may be formed on the substrate 100 having the sacrificial spacers 145a. The non sacrificial layer 150 may be formed of a dielectric material having an etch rate which is lower than that of the sacrificial spacers 145a. In an embodiment, the non sacrificial layer 150 may include a dielectric material having an etch rate which is lower than 10% of the etch rate of the sacrificial layers 110, 110nU, 110U. For example, the non sacrificial layer 150 may be formed of an oxide layer such as a high density plasma (HDP) oxide layer and/or a high temperature oxide (HTO) layer. In an embodiment, the non sacrificial layer 150 may be planarized. In this case, the planarized non sacrificial layer may be disposed only in the cutting region 140. In the following descriptions, the planarization process of the non sacrificial layer 150 will be omitted for the ease and convenience of explanation.

According to the above descriptions, after formation of the holes 115 and the vertical active patterns 120, the cutting region 140, the sacrificial spacers 145a, and the non sacrificial layer 150 may be formed. However, the inventive concept is not limited to the above descriptions. For example, the holes 115 and the vertical active patterns 120 may be formed after formation of the cutting region 140, the sacrificial spacers 145a and the non sacrificial layer 150.

Figure 8A:
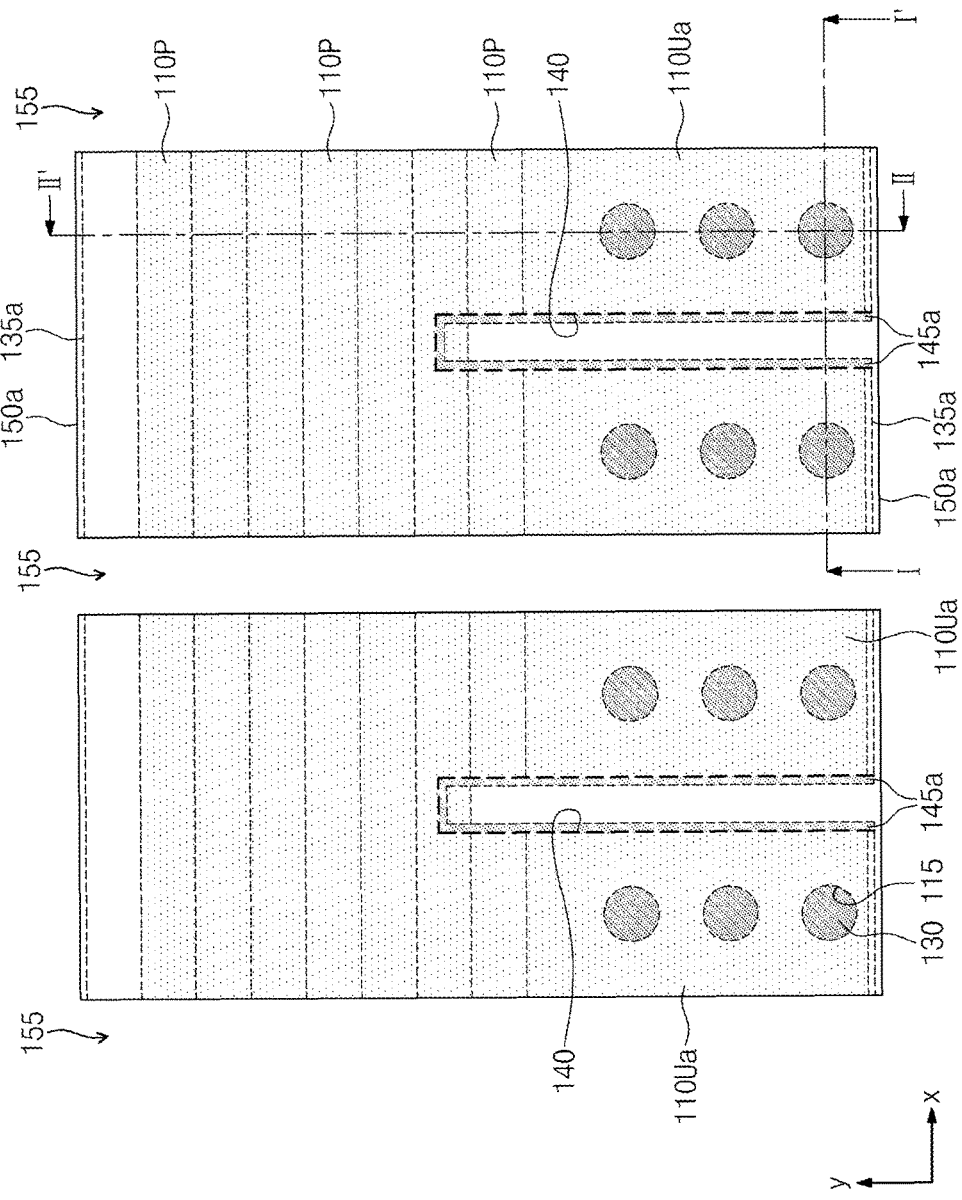
Figure 8B:
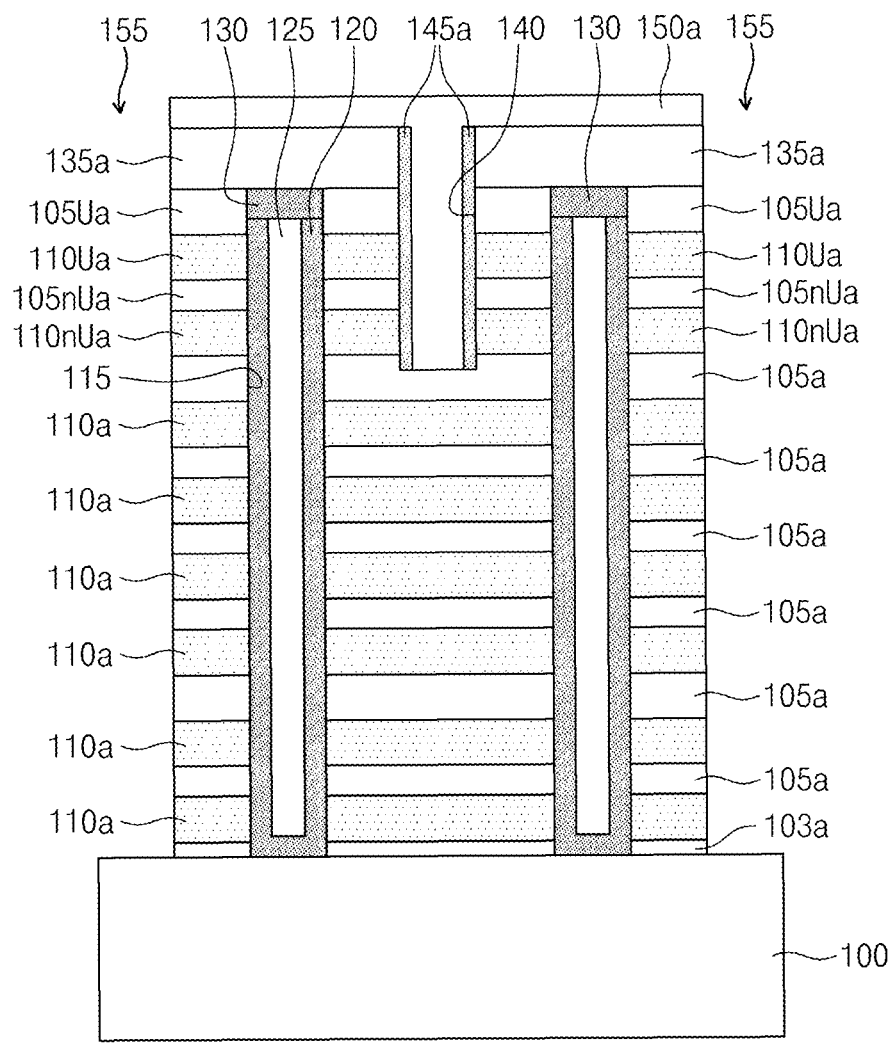
Figure 8C:
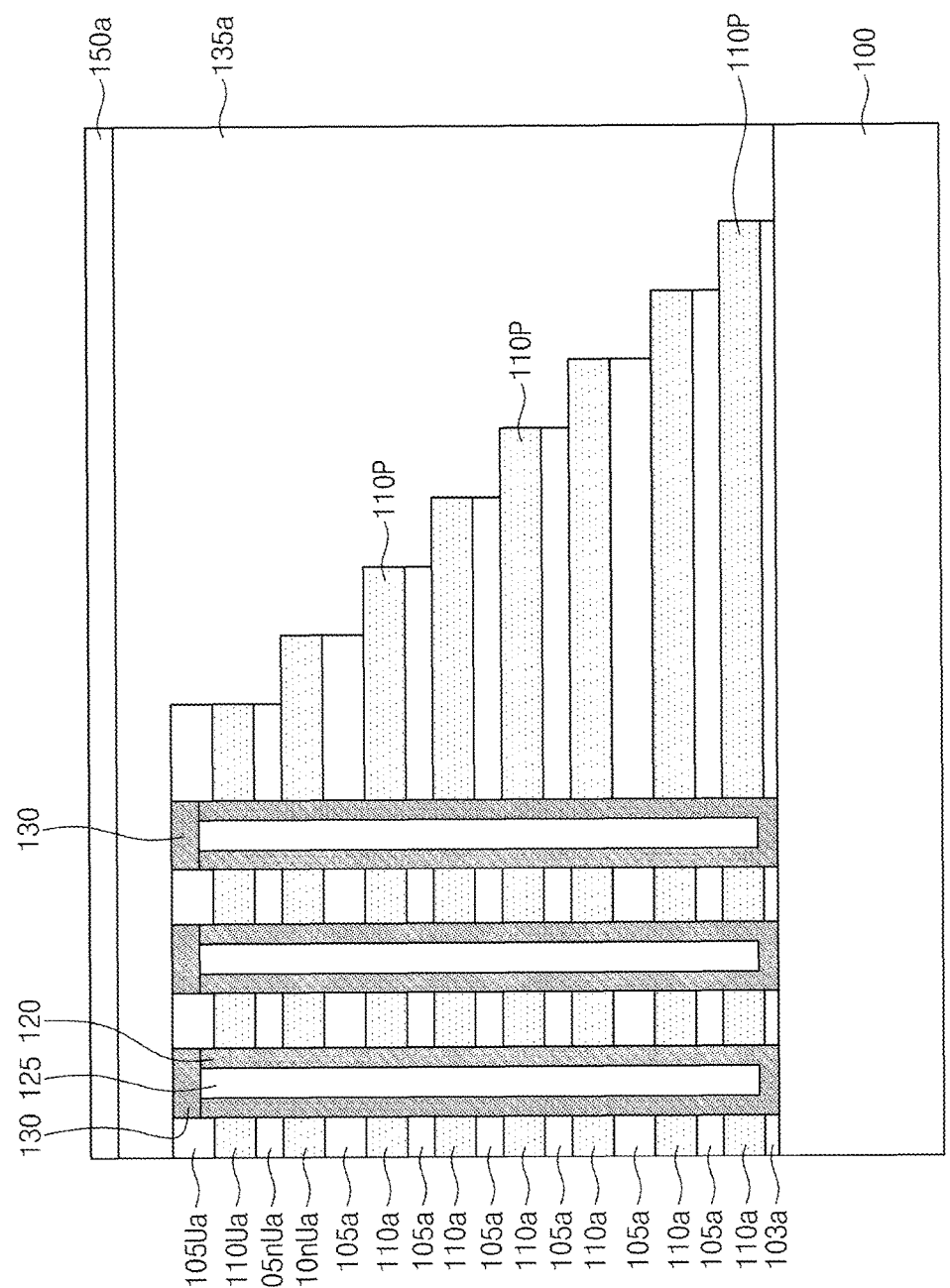

Referring to FIGS. 8A, 8B and 8C, the non sacrificial layer 150, the capping dielectric layer 135, the insulating layers 105U, 105nU and 105, the sacrificial layers 110U, 110nU and 110, and the buffer dielectric layer 103 may be patterned to form trenches 155. The cutting region 140 may be located between the pair of adjacent trenches 155. A mold pattern may be defined between the pair of adjacent trenches 155. That is, a plurality of mold patterns may be separated from each other by the trenches 155. Each of the mold patterns may include sacrificial patterns 110a, 110nUa, 110Ua and insulating patterns 105a, 105nUa, 105Ua which are alternately stacked. Each of the mold patterns may further include a capping dielectric pattern 135a, the cutting region 140, the sacrificial spacers 145a and a non sacrificial pattern 150a filling the cutting region 140. Moreover, each of the mold patterns may further include a buffer dielectric pattern 103a disposed between the lowermost sacrificial pattern 110a and the substrate 100.

After forming the cutting regions 140 and the trenches 155, each of the mold patterns may include a plurality of uppermost insulating patterns 105Ua, e.g., a pair of uppermost insulating patterns 105Ua, located at a same level, e.g., along a z-axis direction, from the top surface of the substrate 100. Similarly, each of the mold patterns may include a plurality of uppermost sacrificial patterns 110Ua, a plurality of next uppermost insulating patterns 105nUa and a plurality of next uppermost sacrificial patterns 110nUa. Each of the mold patterns may also include a single sacrificial pattern 110a in each floor under the cutting region 140.

As illustrated in FIG. 8A, the trenches 155 may extend in parallel in the first direction. Further, the trenches 155 may expose the sacrificial patterns 110a, 110nUa, 110Ua. The sacrificial pads 110P of the sacrificial patterns 110a, 110nUa, 110Ua in each mold pattern may be separated from the sacrificial pads 110P of the sacrificial patterns 110a, 110nUa, 110Ua in the adjacent mold pattern.

Figure 9A:
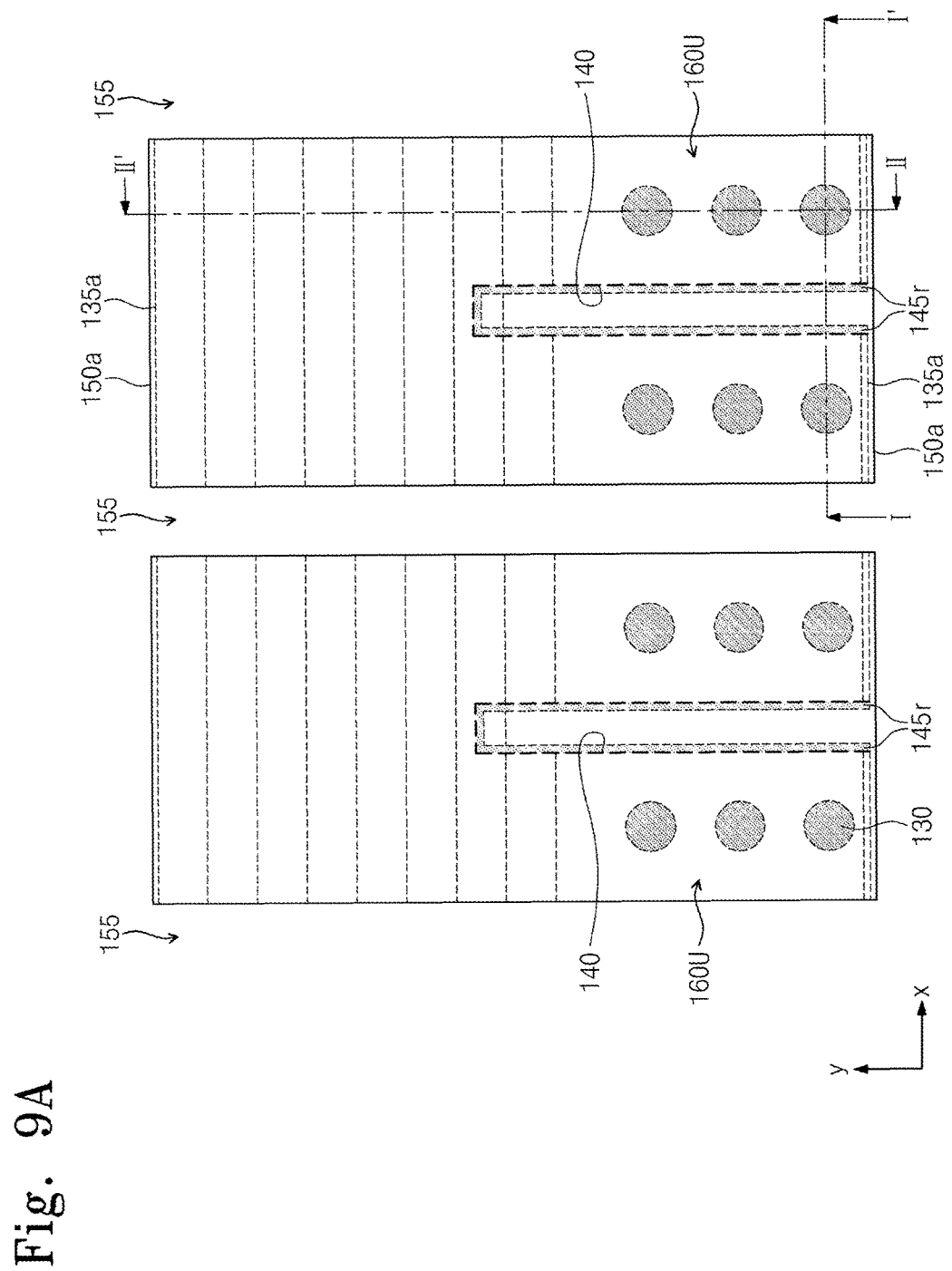
Figure 9B:
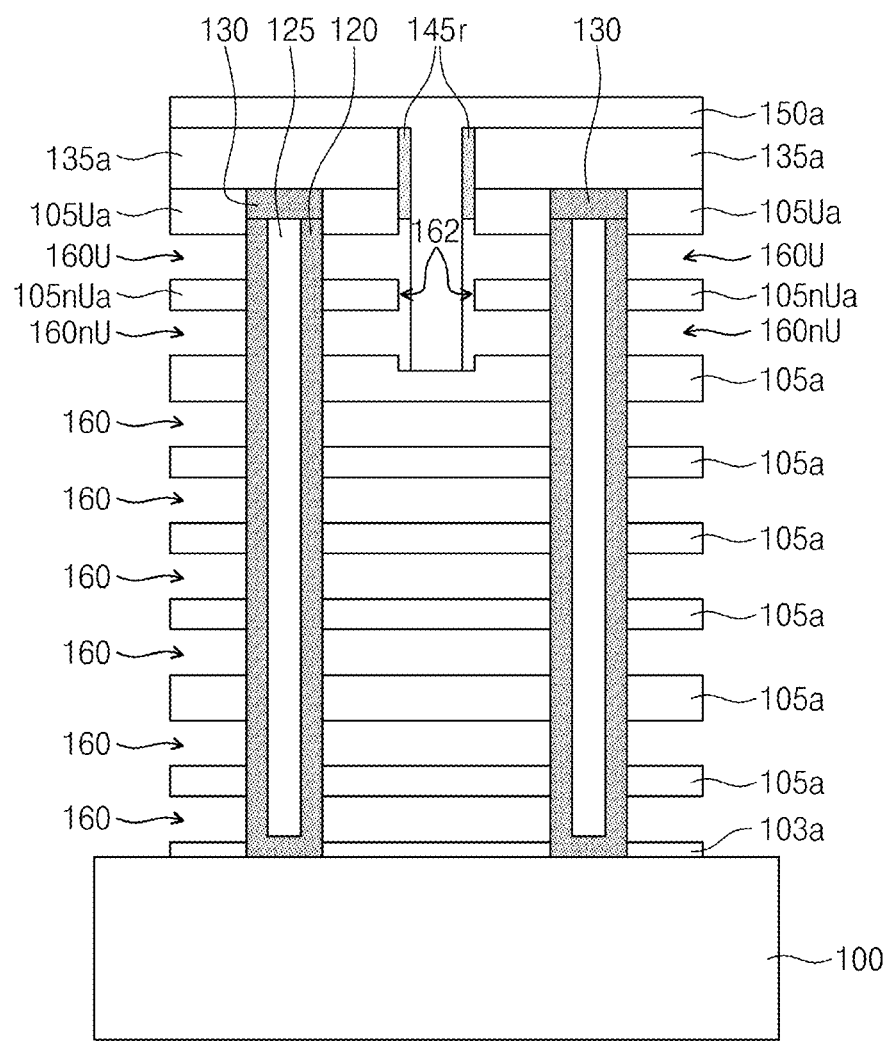
Figure 9C:
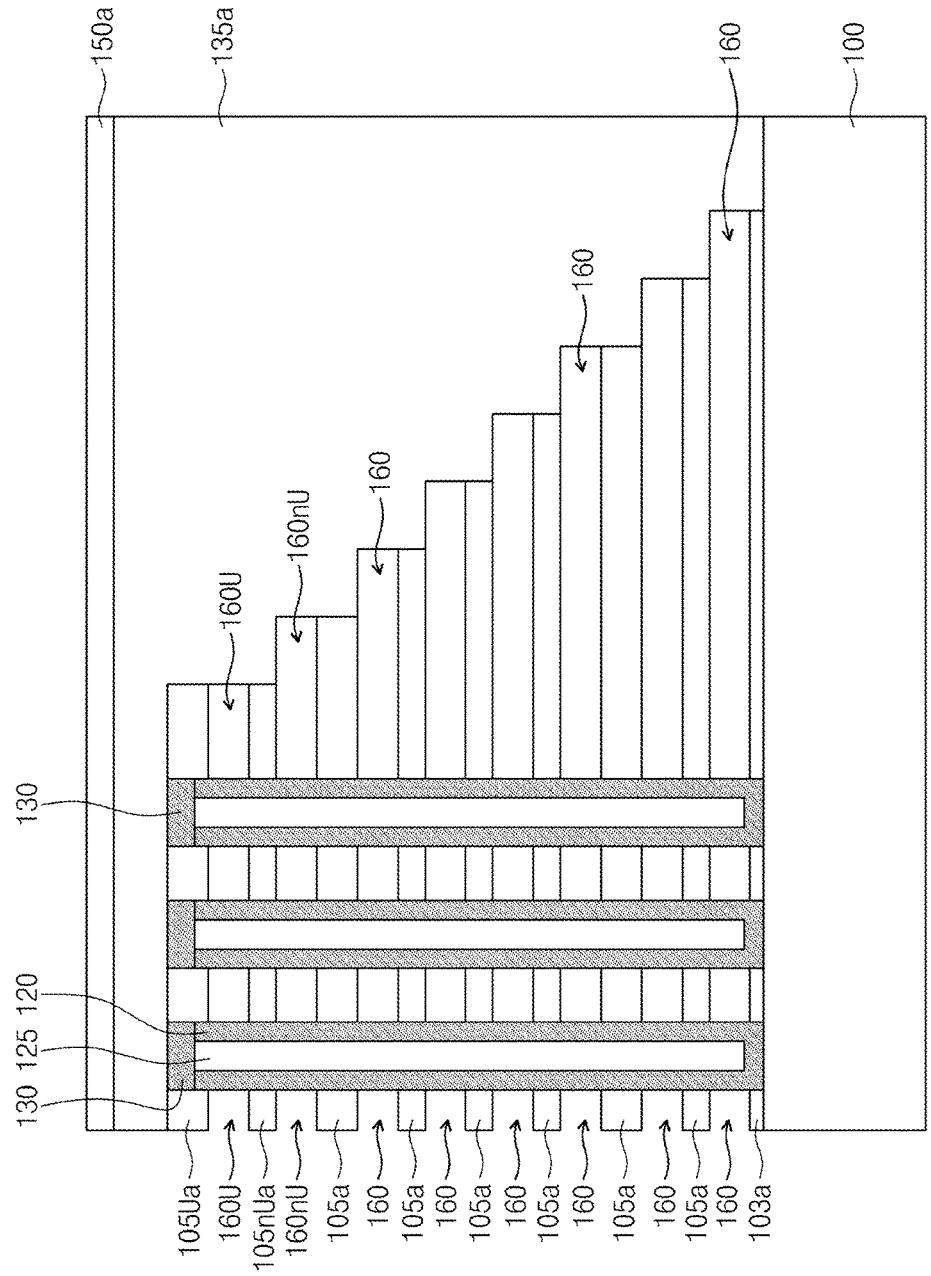

Referring to FIGS. 9A, 9B, and 9C, the sacrificial patterns 110a, 110nUa, 110Ua exposed by the trenches 155 may be removed to form empty regions 160, 160nU, 160U. During removal of the sacrificial patterns 110a, 110nUa, 110Ua, portions of the sacrificial spacers 145a contacting the uppermost sacrificial patterns 110Ua and the next uppermost sacrificial patterns 110nUa may also be removed. As a result, recessed regions 162 may be formed at both sides of the non sacrificial pattern 150a in each of the cutting regions 140, while upper portions 145r of the sacrificial spacers 145a may remain on upper sidewalls of the cutting regions 140. The non sacrificial pattern 150a may have an etch selectivity with respect to the sacrificial spacers 145a and the sacrificial patterns 110a, 110nUa, 110Ua. Thus, the non sacrificial pattern 150a may remain while the sacrificial patterns 110a, 110nUa, 110Ua are removed.

Removal of the uppermost sacrificial patterns 110Ua may provide uppermost empty regions 160U separated from each other by the non sacrificial pattern 150a. Similarly, removal of the next uppermost sacrificial patterns 110nUa may provide next uppermost empty regions 160nU separated from each other by the non sacrificial pattern 150a. Each of the recessed regions 162 may be physically connected to the uppermost empty region 160U and the next uppermost empty region 160nU adjacent thereto. That is, the uppermost empty region 160U and the next uppermost empty region 160nU may be spatially connected to each other by the recessed region 162 therebetween.

According to the above embodiment, the residual sacrificial spacers 145r may exist on the recessed regions 162. However, the inventive concept is not limited to the above embodiment. For example, all the sacrificial spacers 145a may be completely removed while the recessed regions 162 are formed.

Figure 10A:
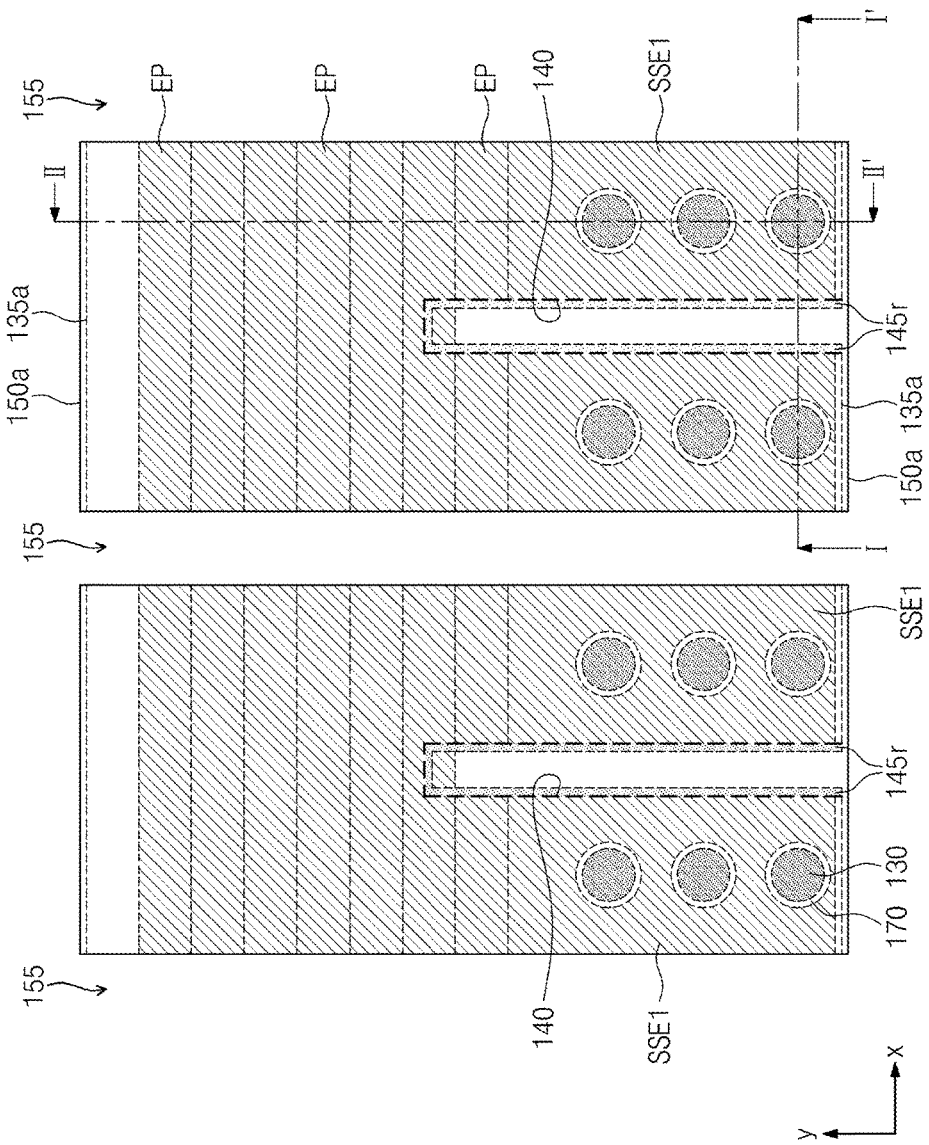
Figure 10B:
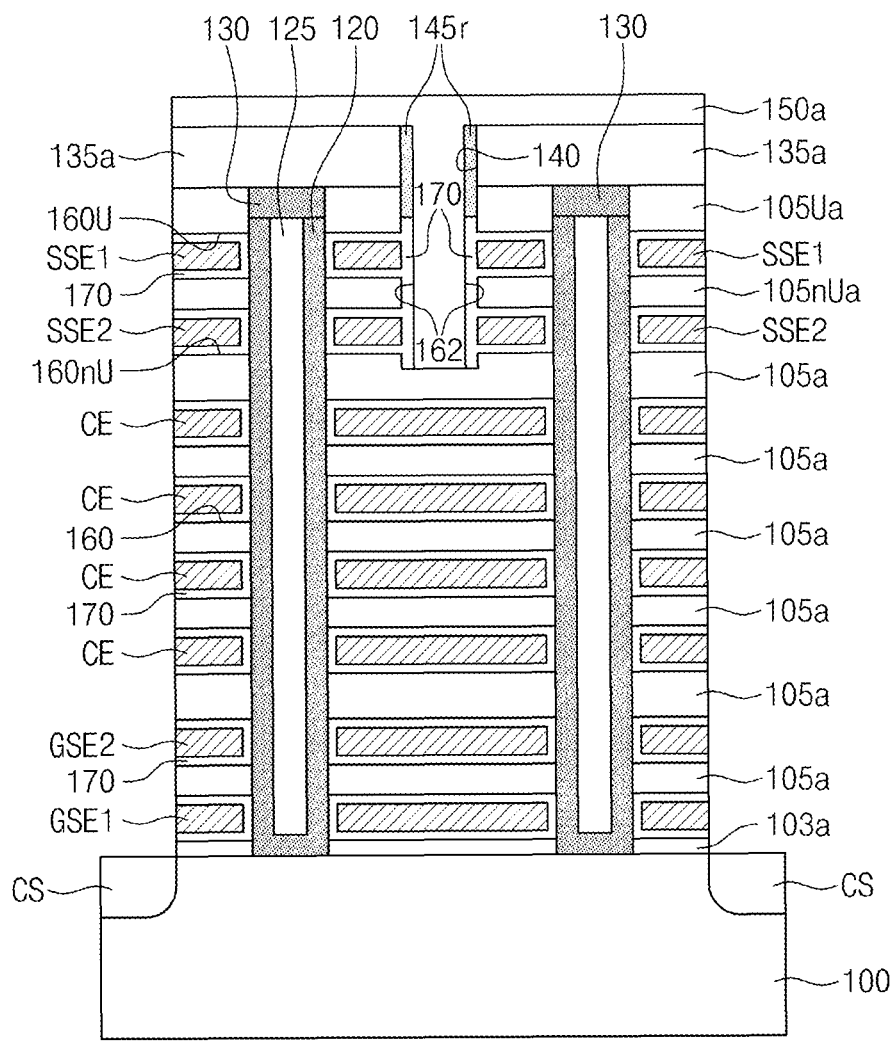
Figure 10C:
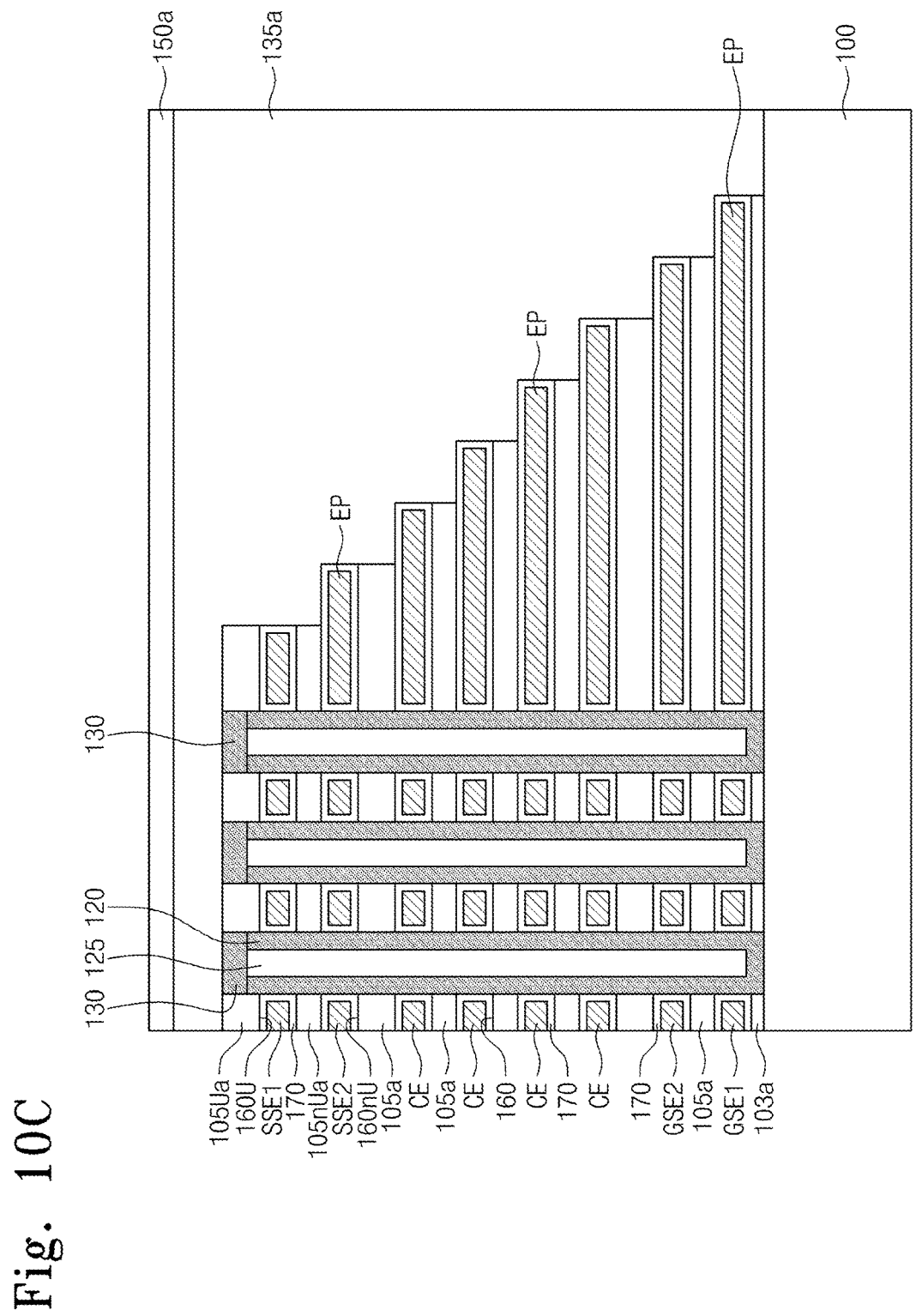

Referring to FIGS. 10A, 10B, and 10C, an electrode-dielectric layer 170 may be conformably formed on the substrate having the empty regions 160, 160nU, 160U and the recessed regions 162. Thus, the electrode-dielectric layer 170 may be formed to a uniform thickness on inner surfaces of the empty regions 160, 160nU, 160U. Further, the electrode-dielectric layer 170 may be formed even in the recessed regions 162.

According to an embodiment, the thickness Td of the spacer layer 145 illustrated in FIGS. 7A to 7C may be substantially equal to or less than twice the thickness of the electrode-dielectric layer 170. As such, the electrode-dielectric layer 170 may fill at least a portion of the recessed region 162 contacting a sidewall of each of the next uppermost insulating patterns 105nUa. Moreover, the electrode-dielectric layer 170 may also fill the recessed region 162 contacting a sidewall of each of the uppermost insulating patterns 105Ua.

A conductive layer may be then formed to fill the empty regions 160, 160nU, 160U on the substrate having the electrode-dielectric layer 170. The conductive layer may be etched to form electrodes GSE1, GSE2, CE, SSE2, SSE1 filling the empty regions 160, 160nU, 160U. The electrode-dielectric layer 170 disposed on inner sidewalls of the trenches 155 may be removed. Since each of the recessed regions 162 contacting the sidewalls of the next uppermost insulating patterns 105nUa can be filled with the electrode-dielectric layer 170, first string selection electrodes SSE1 filling the uppermost empty regions may be separated from second string selection electrodes SSE2 filling the next uppermost empty regions. In addition, since each of the recessed regions 162 contacting the sidewalls of the uppermost insulating patterns 105Ua can be filled with the electrode-dielectric layer 170, the first string selection electrodes SSE1 disposed at both sides of each of the cutting regions 140 may also be separated from each other. Formation of the electrodes GSE1, GSE2, CE, SSE2, SSE1 completes the electrode structure described with reference to FIGS. 1A to 1E.

Dopants of a second conductivity type may be provided into the substrate 100 under the trenches 155 to form common source regions CS. The common source regions CS may be formed after formation of the electrodes GSE1, GSE2, CE, SSE2, SSE1. Alternatively, the common source regions CS may be formed after formation of the mold patterns and prior to formation of the empty regions 160, 160nU, 160U. Still alternatively, the common source regions CS may be formed after formation of the empty regions 160, 160nU, 160U and prior to formation of the electrodes GSE1, GSE2, CE, SSE2, SSE1.

Subsequently, the isolation patterns 175 illustrated in FIGS. 1A to 1E may be formed in the trenches 155, respectively. The contact plugs 180 and the interconnections 190 illustrated in FIGS. 1A to 1E may then be formed. As such, the three dimensional semiconductor memory device disclosed in FIGS. 1A to 1E may be realized.

According to the above methods of fabricating the three dimensional semiconductor memory device, the uppermost sacrificial layer 110U and the next uppermost sacrificial layer 110nU are patterned to form the cutting regions 140, and the non sacrificial layer 150 is then formed. Subsequently, the trenches 155 are formed to expose the sacrificial patterns 110a, 110nUa, 110Ua, and the exposed sacrificial patterns 110a, 110nUa, 110Ua are removed to form the empty regions 160, 160nU, 160U. Thus, the uppermost empty regions 160U in each of the mold patterns are separated from each other by the non sacrificial pattern 150a filling the cutting region 140. Further, the next uppermost empty regions 160nU in each of the mold patterns may also be separated from each other by the non sacrificial pattern 150a filling the cutting region 140. As such, in each of the electrode structures, the first string selection electrodes SSE1 separated from each other and the second string selection electrodes SSE2 separated from each other may be formed at substantially the same time as the cell electrodes CE and the ground selection electrodes GSE1 and GSE2. As a result, first outer sidewalls (S1a and S2a of FIG. 1D) of the first and second string selection electrodes SSE1 and SSE2 adjacent to the non sacrificial pattern 150a may be protected from an etching process. Thus, etch damage to the first and second string selection electrodes SSE1 and SSE2 may be minimized, thereby reducing the electrical resistance of the first and second string selection electrodes SSE1 and SSE2.

Furthermore, the sacrificial spacers 145a are formed on both inner sidewalls of the cutting region 140, and at least a portion of the respective sacrificial spacers 145a may be removed to form the recessed regions 162 during formation of the empty regions 106, 106nU and 106U. Thus, the electrode-dielectric layer 170 may be formed in the recessed regions 162, thereby increasing horizontal widths of the string selection electrodes SSE1 and SSE2. As a result, the electrical resistance of the string selection electrodes SSE1 and SSE2 may further lowered.

Meanwhile, according to the above fabrication methods, the cutting regions 140 may be formed after forming the sacrificial pads 110P. Alternatively, the sacrificial pads 110P may be formed after forming the cutting regions 140. This method will be hereinafter described with reference to the drawings.

Figure 11B:
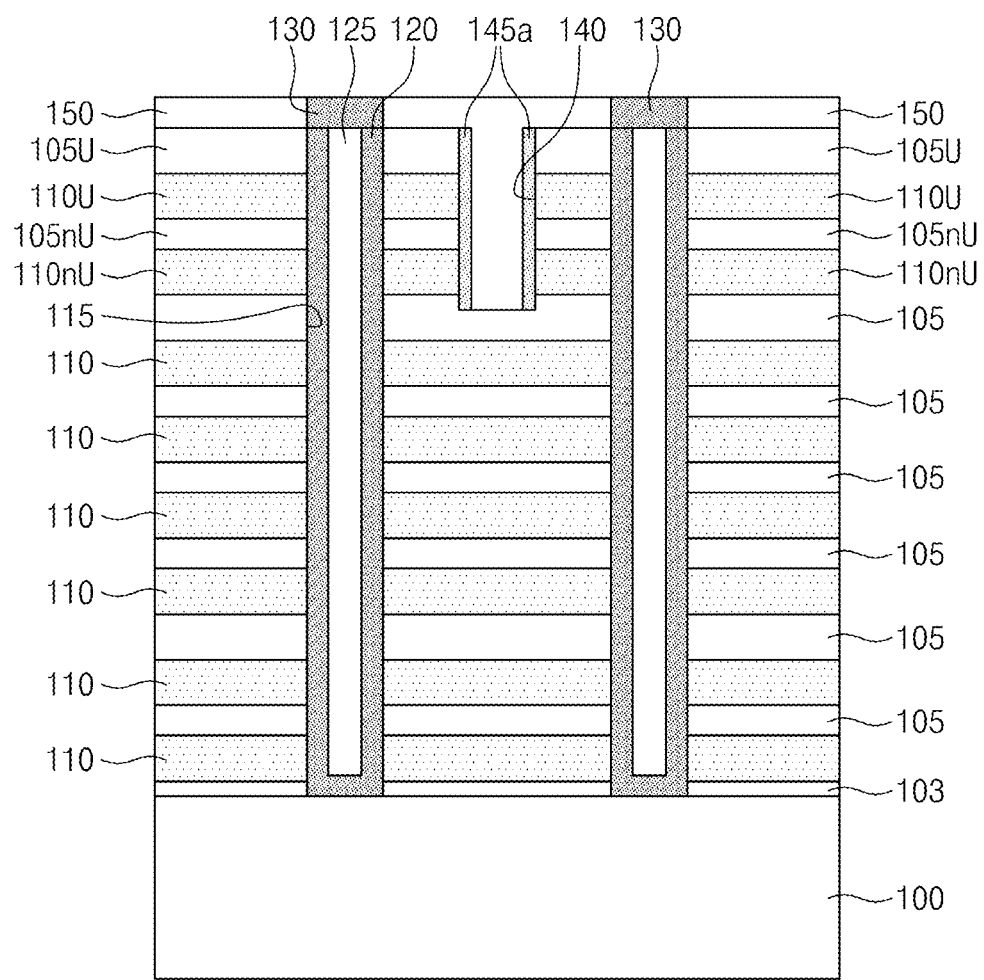
FIGS. 11B and 12B illustrate cross sectional views taken along lines I-I' of FIGS. 11A to 12A, respectively.
Figure 12A:
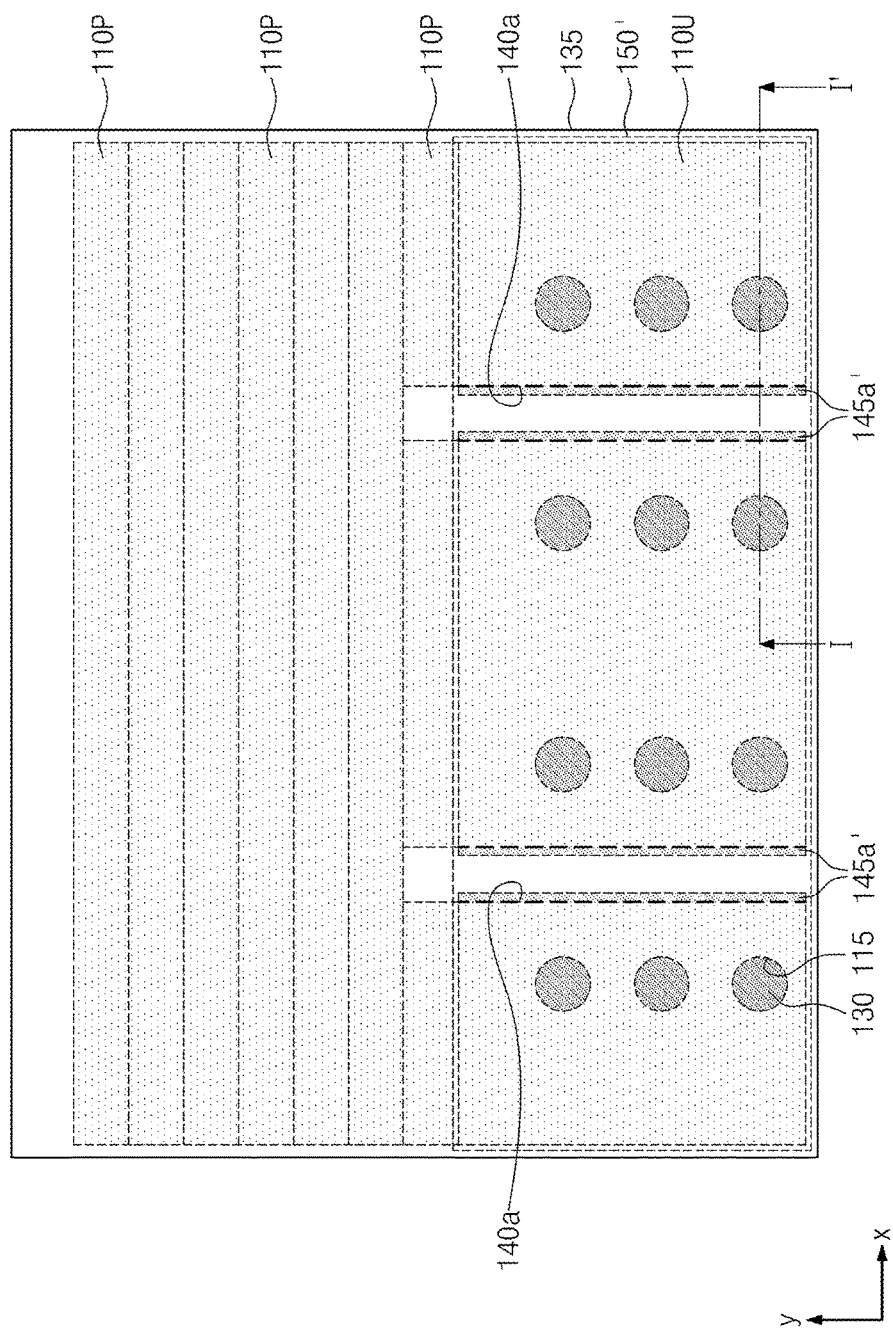
Figure 12B:
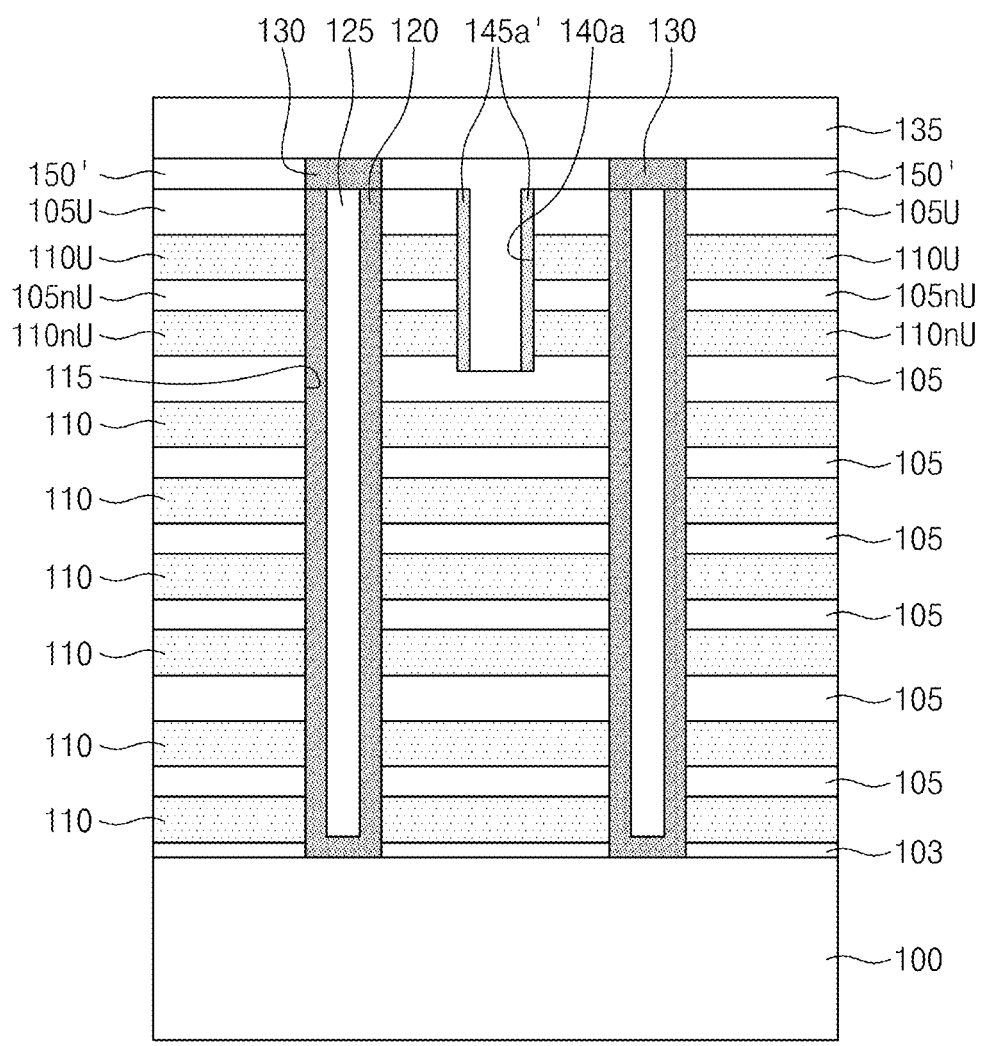

FIGS. 11A and 12A illustrate plan views of a modified embodiment of a method of fabricating a three dimensional semiconductor memory device according to a first embodiment of the inventive concept. FIGS. 11B and 12B are cross sectional views taken along lines I-I' of FIGS. 11A to 12A, respectively.

Referring to FIGS. 11A and 11B, the uppermost insulating layer 105U, the uppermost sacrificial layer 110U, the next uppermost insulating layer 105nU, and the next uppermost sacrificial layer 110nU may be patterned to form cutting regions 140. A pair of sacrificial spacers 145a may be formed on both inner sidewalls of each of the cutting regions 140, respectively. In this case, end portions of the pair of sacrificial spacers 145a may be connected to each other at an end portion of each of the cutting regions 140, as illustrated in FIG. 11A. A non sacrificial layer 150 may be then formed to fill the cutting regions 140.

A plurality of holes 115 may be formed to penetrate the non sacrificial layer 150, the insulating layers 105U, 105nU, 105, the sacrificial layers 110U, 110nU, 110, and the buffer dielectric layer 103. A vertical active pattern 120, a filling dielectric pattern 125, and a landing pad 130 may be formed in each of the holes 115. In an embodiment, the cutting regions 140 and the non sacrificial layer 150 may be formed after formation of the holes 115, the vertical active patterns 120, the filling dielectric patterns 125, and the landing pads 130. In this case, the non sacrificial layer 150 may cover the landing pads 130 on the vertical active patterns 120.

Referring to FIGS. 12A and 12B, after forming the cutting regions 140 and the non sacrificial layer 150, the non sacrificial layer 150, the insulating layers 105U, 105nU, 105, and the sacrificial layers 110U, 110n, U110 may be patterned to form sacrificial pads 110P exhibiting a stepped structure. While the sacrificial pads 110P are formed, the end portions of the cutting regions 140 and connections between the sacrificial spacers 145a in the respective cutting regions 140 may also be removed to form a pair of separate sacrificial spacers 145a' in each of the cutting regions 140. After the sacrificial pads 110P are formed, the patterned non sacrificial layer 150' may not cover the sacrificial pads 110P of the sacrificial layers 110nU and 110 disposed under the uppermost sacrificial layer 110U.

After forming the sacrificial pads 110P, a capping dielectric layer 135' may be formed on an entire surface of the substrate. Subsequently, a formation process of the trenches 155 described with reference to FIGS. 8A to 8C, a formation process of the empty regions 160, 160nU, 160U and the recessed regions 162 described with reference to FIGS. 9A to 9C, and a formation process of the electrode-dielectric layer 170 and the electrodes GSE1, GSE2, CE, SSE2, SSE1 described with reference to FIGS. 10A to 10C may be sequentially performed. As such, the three dimensional semiconductor memory device illustrated in FIGS. 2A and 2B may be realized.

Figure 13:
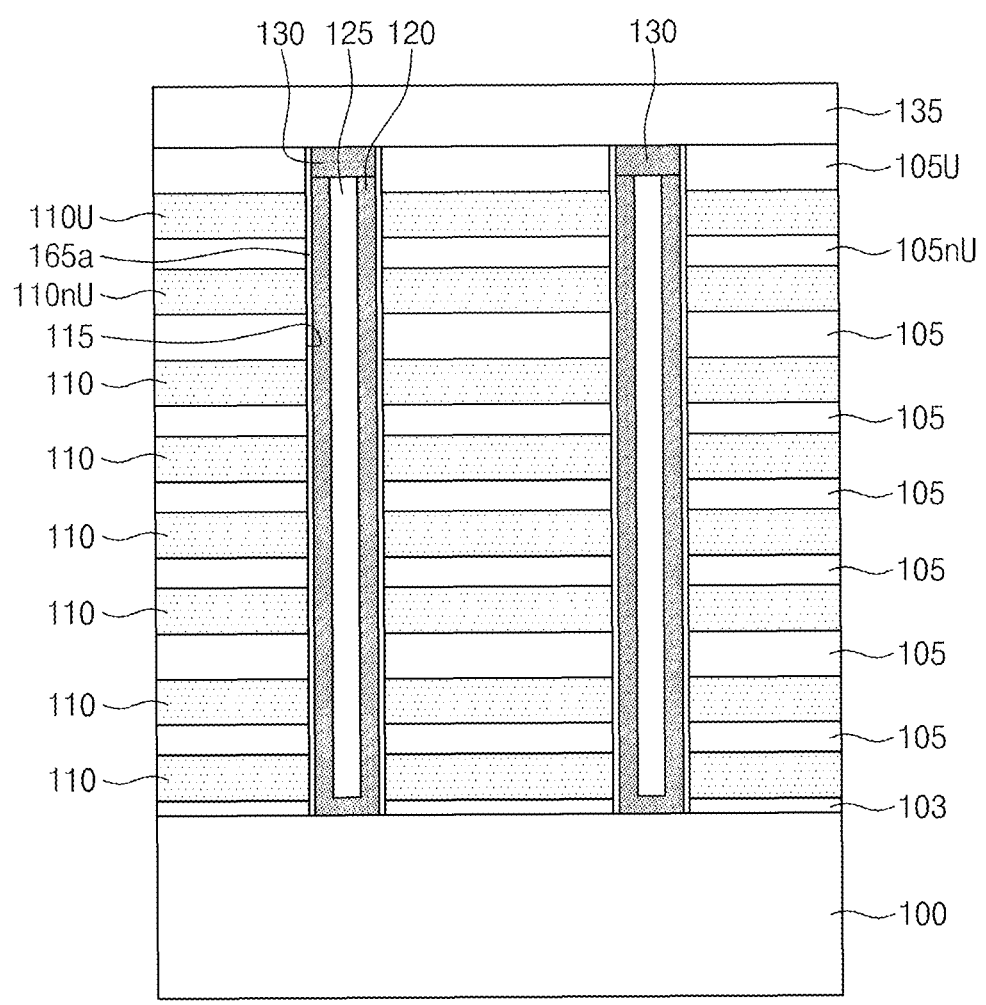
FIGS. 13 to 15 illustrate cross sectional views of another modified embodiment of a method of fabricating a three dimensional semiconductor memory device according to a first embodiment of the inventive concept.
Figure 14:
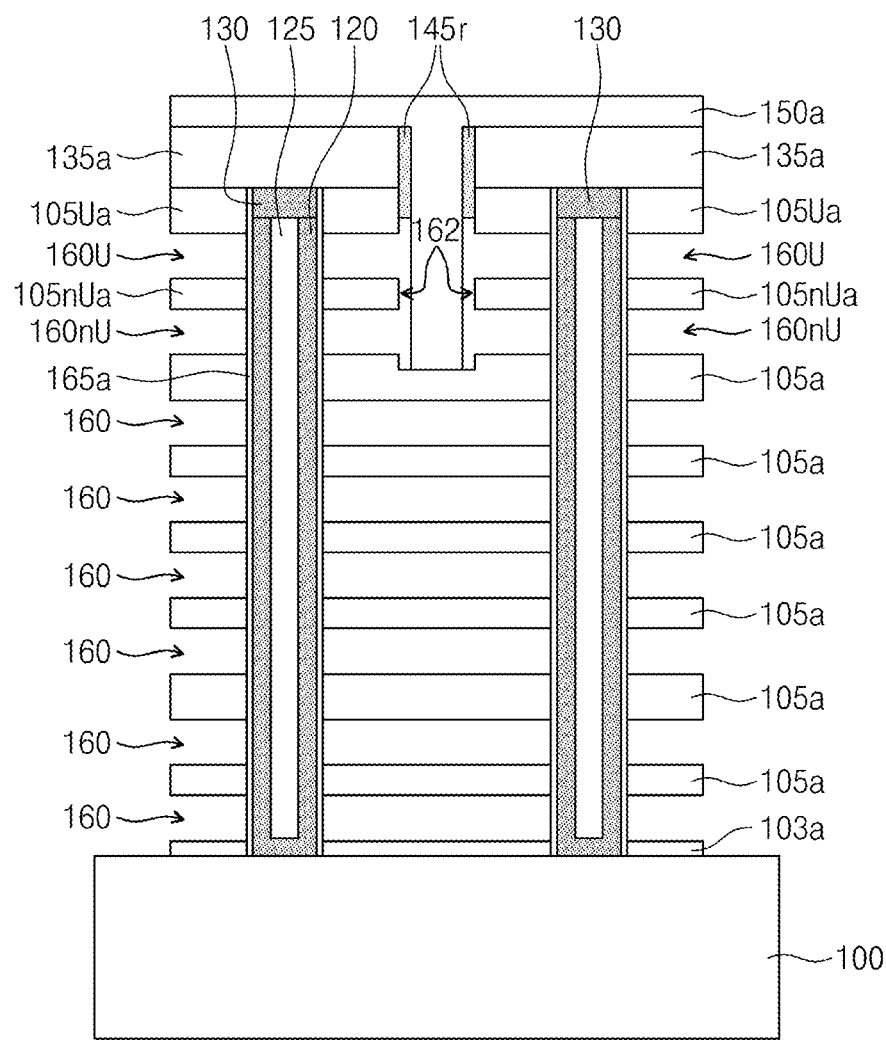
Figure 15:
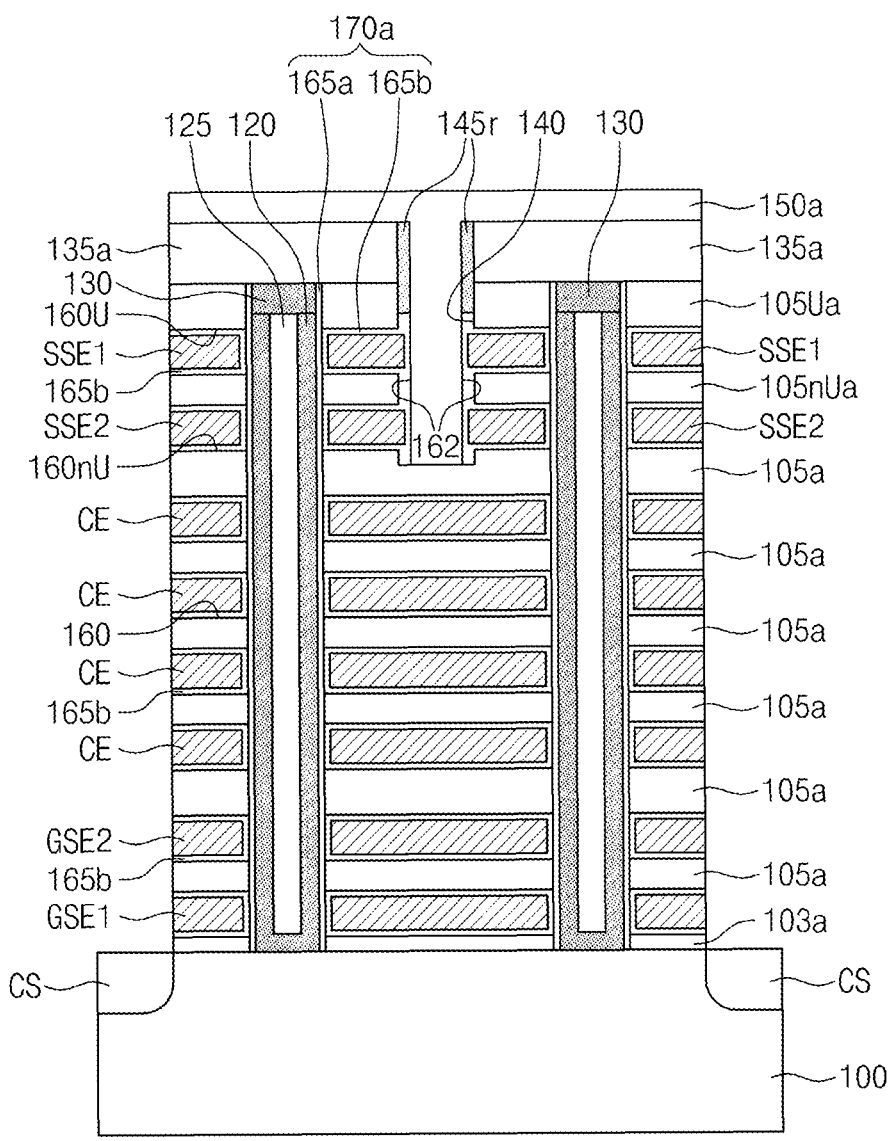

FIGS. 13 to 15 illustrate cross sectional views of another modified embodiment of a method of fabricating a three dimensional semiconductor memory device according to a first embodiment of the inventive concept.

Referring to FIGS. 13 and 14, prior to formation of the vertical active patterns 120, first portions 165a of the electrode-dielectric layers may be formed on inner walls of the holes 115, respectively. The first portions 165a on the bottom surfaces of the holes 115 may be selectively removed. As such, the vertical active patterns 120, formed after formation of the first portions 165a, may be in contact with the substrate 100. A capping dielectric layer 135 may be then formed on the substrate having the vertical active patterns 120, the filling dielectric patterns 125 and the landing pads 130. In this case, the capping dielectric layer 135 may cover the landing pads 130. The same processes as described with reference to FIGS. 6A to 6C, FIGS. 7A to 7C, FIGS. 8A to 8C, and FIGS. 9A to 9C may be performed after forming the capping dielectric layer 135. As a result, empty regions 160U, 160nU and 160 and recessed regions 162 may be formed.

Referring again to FIG. 14, the empty regions 160U, 160nU, 160 may expose portions of the first portion 165a disposed on the sidewall of each of the vertical active patterns 120.

Referring to FIG. 15, a second portion 165b of the electrode-dielectric layer may be conformably formed on the substrate having the empty regions 160U, 160nU, 160 and the recessed regions 162. In this case, a lateral width of the sacrificial spacer 145r may be equal to or less than twice the thickness of the second portion 165b of the electrode-dielectric layer 170a.

Subsequently, a conductive layer filling the empty regions 160U, 160nU, 160 may be formed, and the conductive layer may be etched to form electrodes GSE1, GSE2, CE, SSE2, SSE1 in the empty regions 160U, 160nU, 160. Subsequent processes may be performed as described with reference to FIGS. 10A to 10C. As such, the three dimensional semiconductor memory device illustrated in FIGS. 3A and 3B may be realized.

Second Embodiment

In the present embodiment, the same elements as described in the first embodiment will be indicated by the same reference numerals or the same reference designators. For the ease and convenience of explanation, the descriptions to the same elements as in the first embodiment will be omitted or mentioned briefly. That is, differences between the present embodiment and the first embodiment will be mainly described hereinafter.

Figure 16A:
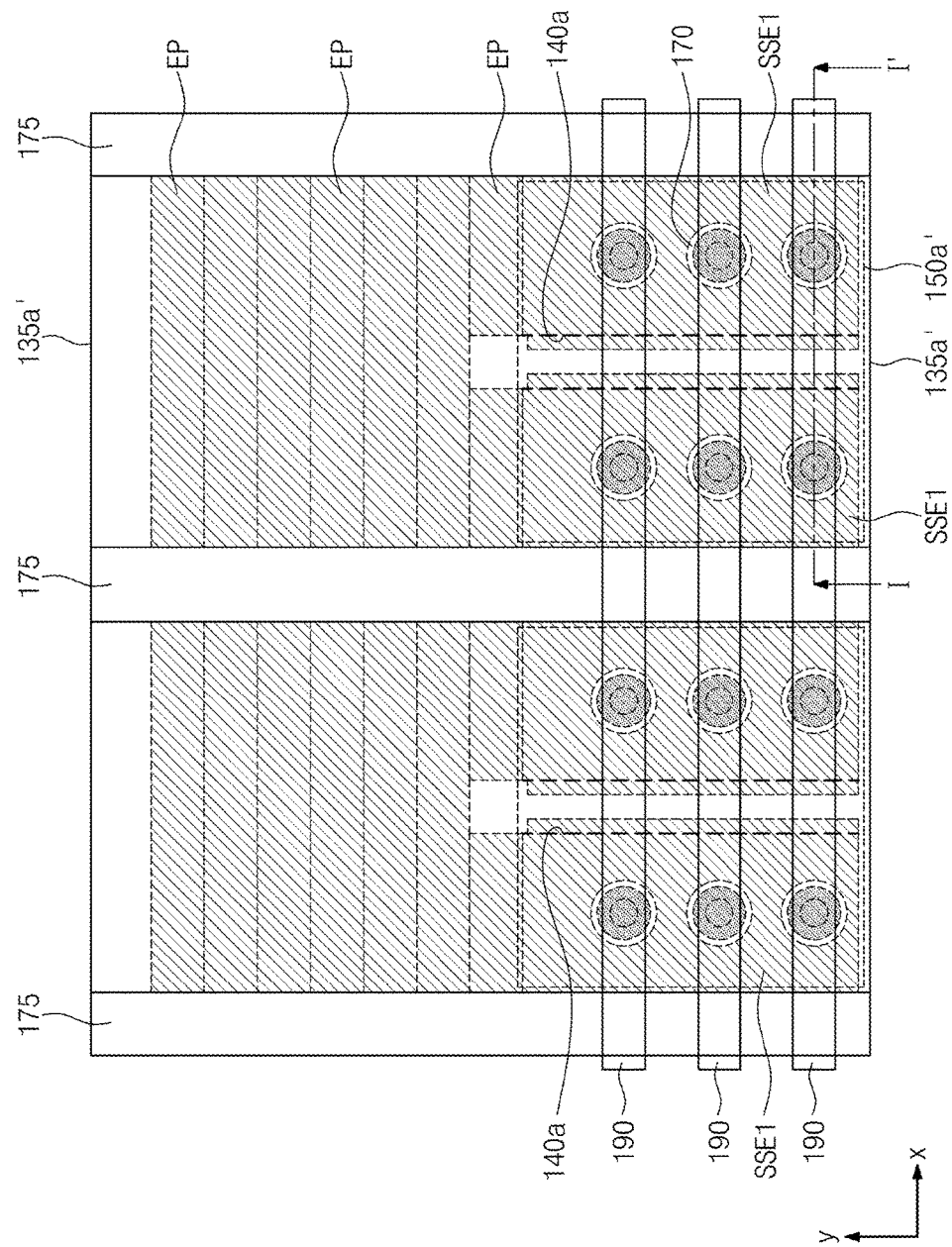
FIG. 16A illustrates a plan view of a three dimensional semiconductor memory device according to a second embodiment of the inventive concept.
Figure 16B:
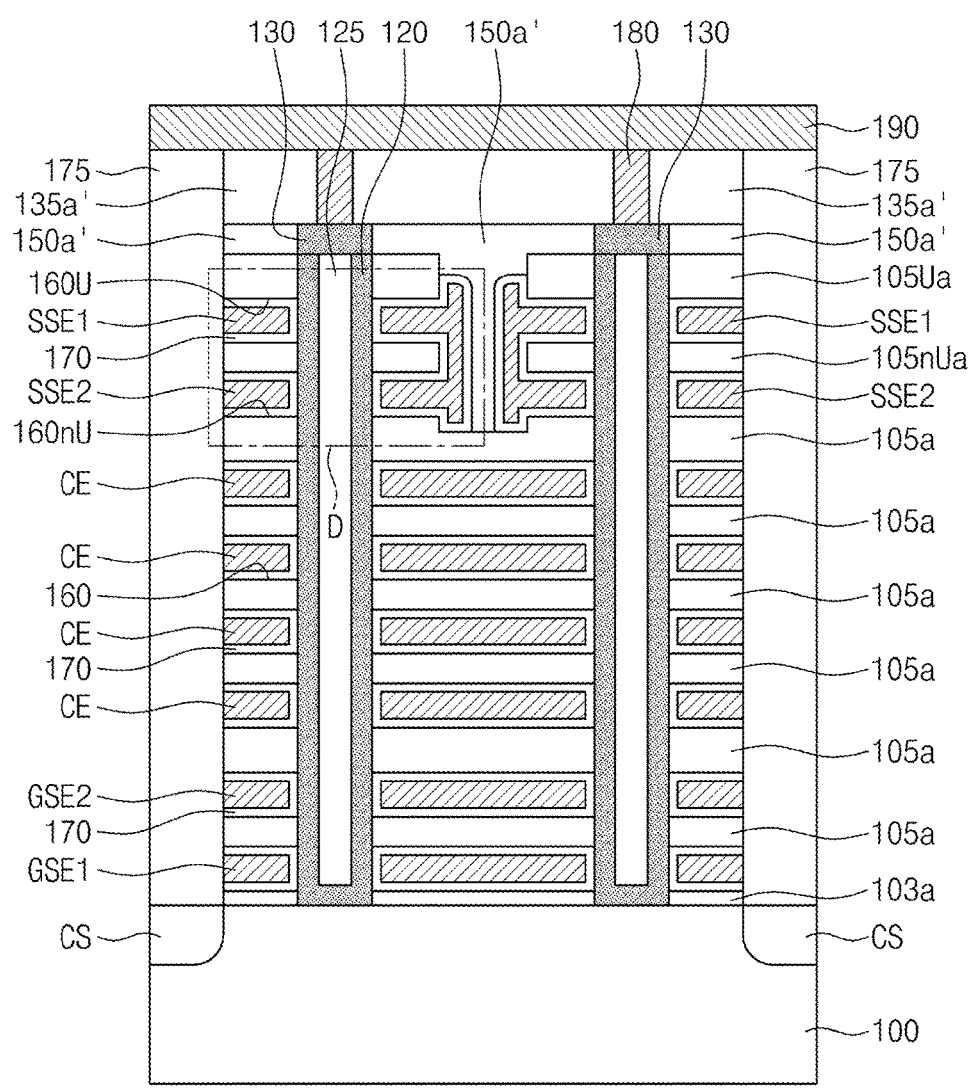
FIG. 16B illustrates a cross sectional view taken along a line I-I' of FIG. 16A.
Figure 16C:
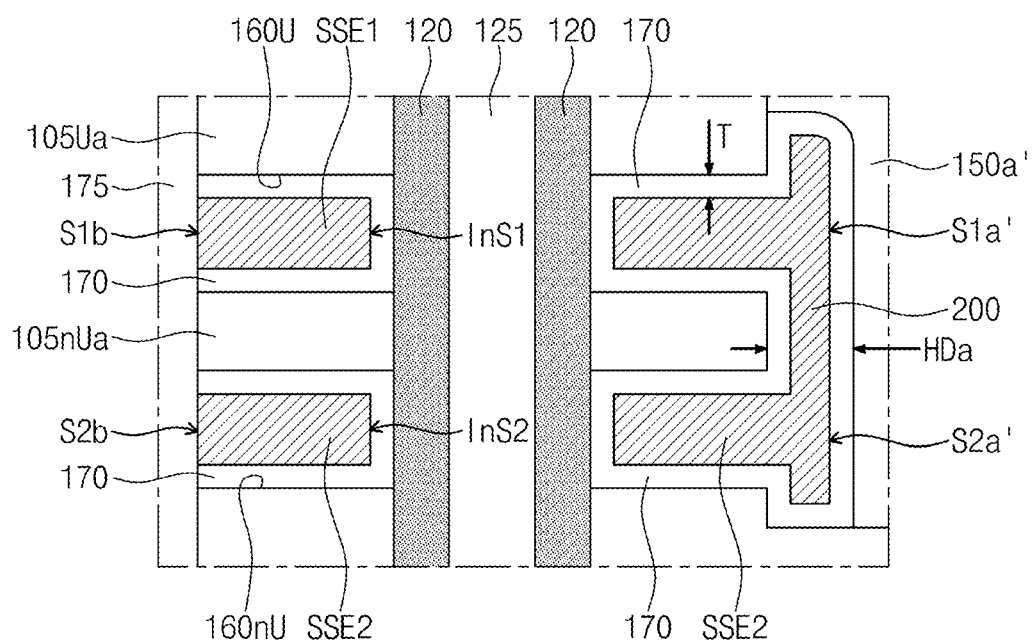
FIG. 16C illustrates an enlarged view of a portion 'D' of FIG. 16A.

FIG. 16A illustrates a plan view of a three dimensional semiconductor memory device according to a second embodiment. FIG. 16B is a cross sectional view taken along a line I-I' of FIG. 16A. FIG. 16C is an enlarged view illustrating a portion 'D' of FIG. 16A.

Referring to FIGS. 16A, 16B, and 16C, a first outer sidewall S1a' of the first string selection electrode SSE1 may laterally, e.g., along an x-axis direction, protrude further than a first outer sidewall of the uppermost insulating pattern 105Ua on the first string selection electrode SSE1. Similarly, a first outer sidewall S2a' of the second string selection electrode SSE2 may laterally protrude more than a first outer sidewall of the next uppermost insulating pattern 105nUa between the first and second string selection electrodes SSE1 and SSE2. The electrode-dielectric layer 170 disposed between the vertical active pattern 120 and inner sidewalls InS1 and InS2 of the first and second string selection electrodes SSE1 and SSE2 may extend to cover the first and second outer sidewalls S1a' and S2a' of the first and second string selection electrodes SSE1 and SSE2.

The first string selection electrodes SSE1 may extend downwardly, e.g., along a z-axis direction, along the first outer sidewall of the next uppermost insulating pattern 105nUa, thereby being connected to the second string selection electrodes SSE2 located under the first string selection electrodes SSE1. A connection 200 between the first and second string selection electrodes SSE1 and SSE2 may be interposed between the first outer sidewall of the next uppermost insulating pattern 105nUa and the non sacrificial pattern 150a' in the cutting region 140a. In addition, the connection 200 between the first and second string selection electrodes SSE1 and SSE2 may be disposed between the extensions of the electrode-dielectric layer 170.

According to the present embodiment, a horizontal distance HDa, e.g., along an x-axis direction, between the non sacrificial pattern 150a' and the next uppermost insulating pattern 105nUa may greater than twice the thickness of the electrode-dielectric layer 170. Thus, a space which is capable of accommodating the connection 200 may be provided between the non sacrificial pattern 150a' and the first outer sidewall of the next uppermost insulating pattern 105nUa.

As described above, the first and second string selection electrodes SSE1 and SSE2, which are stacked, may be connected to each other. The connected first and second string selection electrodes SSE1 and SSE2 disposed at one side of the non sacrificial pattern 150a in the cutting region 140a may be separated from the connected first and second string selection electrodes SSE1 and SSE2 disposed at the other side of the non sacrificial pattern 150a in the cutting region 140a.

According to an embodiment, a portion of the first string selection electrode SSE1, which is adjacent to the first outer sidewall S1a' of the first string selection electrode SSE1, may upwardly protrude, e.g., along a z-axis direction away from the substrate 100, to cover the first outer sidewall of the uppermost insulating pattern 105Ua.

According to the three dimensional semiconductor memory device as described above, the first outer sidewalls S1a' and S2a' of the first and second string selection electrodes SSE1 and SSE2 may laterally protrude more than the first outer sidewalls of the uppermost insulating pattern 105Ua and the next uppermost insulating pattern 105nUa, respectively. As such, lateral widths of the first and second string selection electrodes SSE1 and SSE2 may be increased to reduce the electrical resistance of the first and second string selection electrodes SSE1 and SSE2. Moreover, the stacked first and second string selection electrodes SSE1 and SSE2 may be electrically connected to further reduce the electrical resistance of the first and second string selection electrodes SSE1 and SSE2. As a result, it may be possible to optimize the three dimensional semiconductor memory device with high reliability and high integration density.

Figure 17:
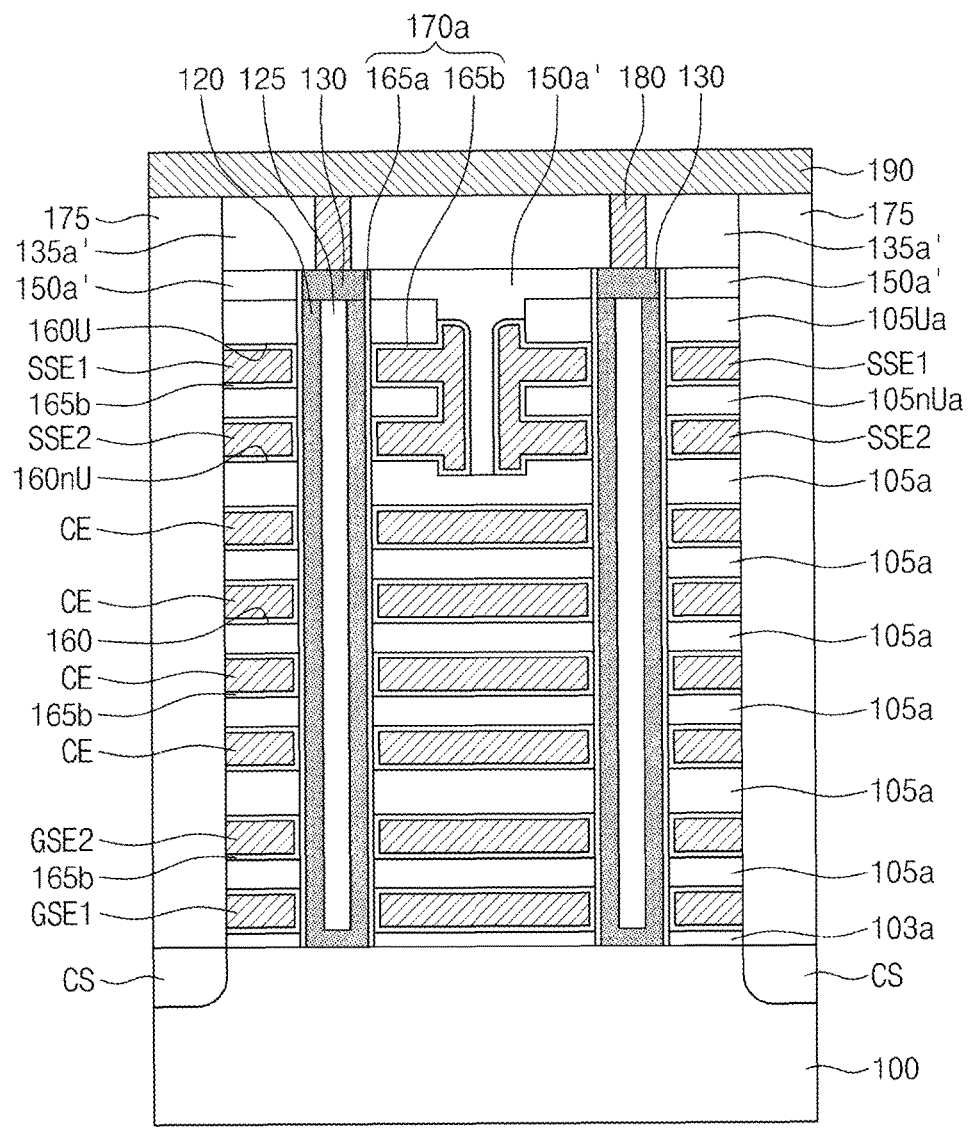
FIG. 17 illustrates a cross sectional view taken along a line I-I' of FIG. 16A to illustrate a modified embodiment of a three dimensional semiconductor memory device according to a second embodiment of the inventive concept.

FIG. 17 is a cross sectional view taken along a line I-I' of FIG. 16A to illustrate a modified embodiment of a three dimensional semiconductor memory device according to a second embodiment of the inventive concept.

Referring to FIG. 17, the electrode-dielectric layer 170a between the vertical active pattern 120 and the respective electrodes GSE1, GSE2, CE, SSE2, SSE1 may include a first portion 165a and a second portion 165b. The first portions 165a may vertically extend between the sidewall of the vertical active pattern 120 and the insulating patterns 105a, 105nUa, 105Ua. The second portions 165b may extend to cover bottom surfaces and top surfaces of the electrodes GSE1, GSE2, CE, SSE2, SSE1. Moreover, the second portions 165b may further extend to cover first outer sidewalls of the first and second string selection electrodes SSE1 and SSE2. In the present modified embodiment, a horizontal distance between the next uppermost insulating pattern 105nUa and the non sacrificial pattern 150a' in the cutting region may be greater than twice a thickness of the second portion 165b on a top surface of the first string selection electrode SSE1.

Figure 18A:
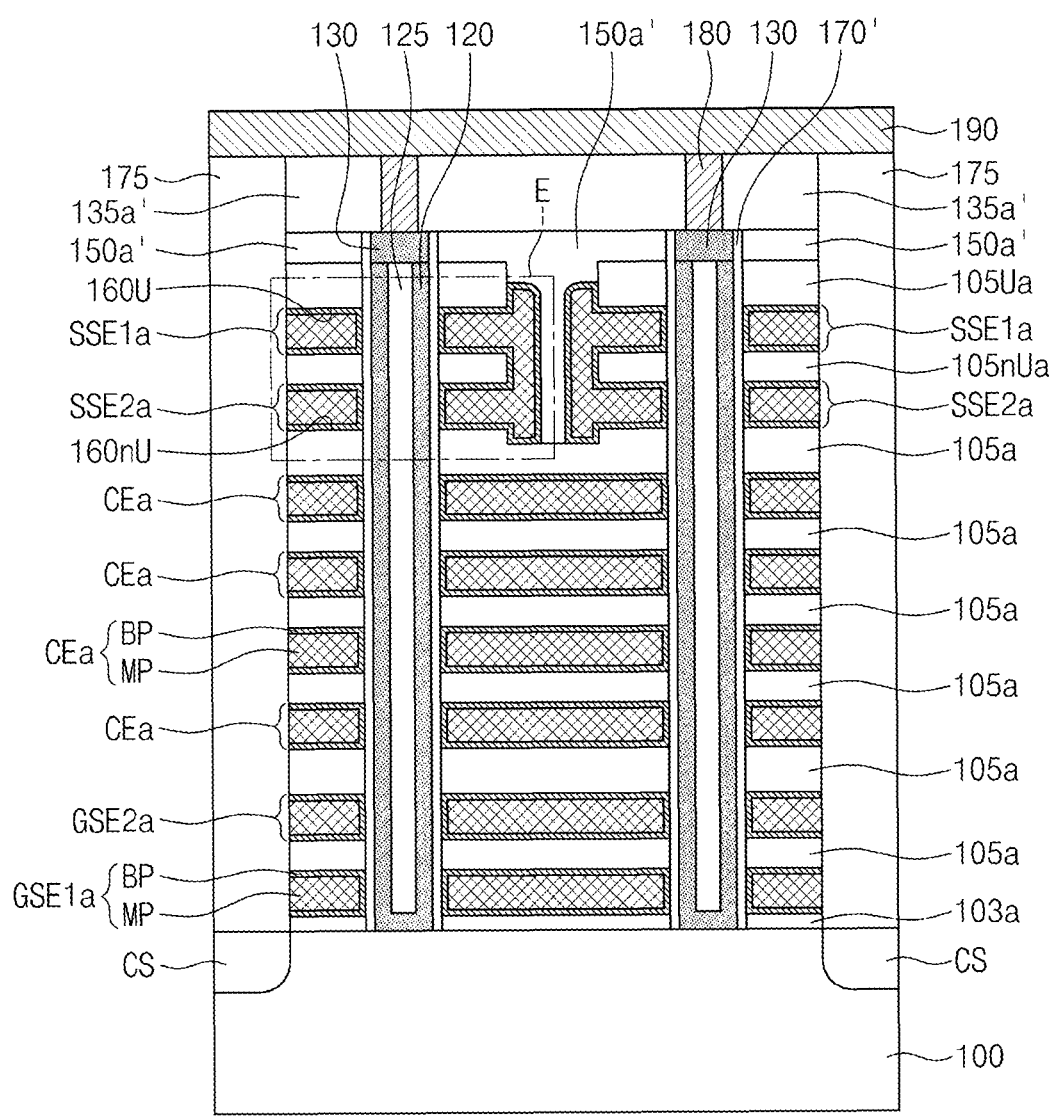
FIG. 18A illustrates a cross sectional view taken along a line I-I' of FIG. 16A to illustrate another modified embodiment of a three dimensional semiconductor memory device according to a second embodiment of the inventive concept.
Figure 18B:
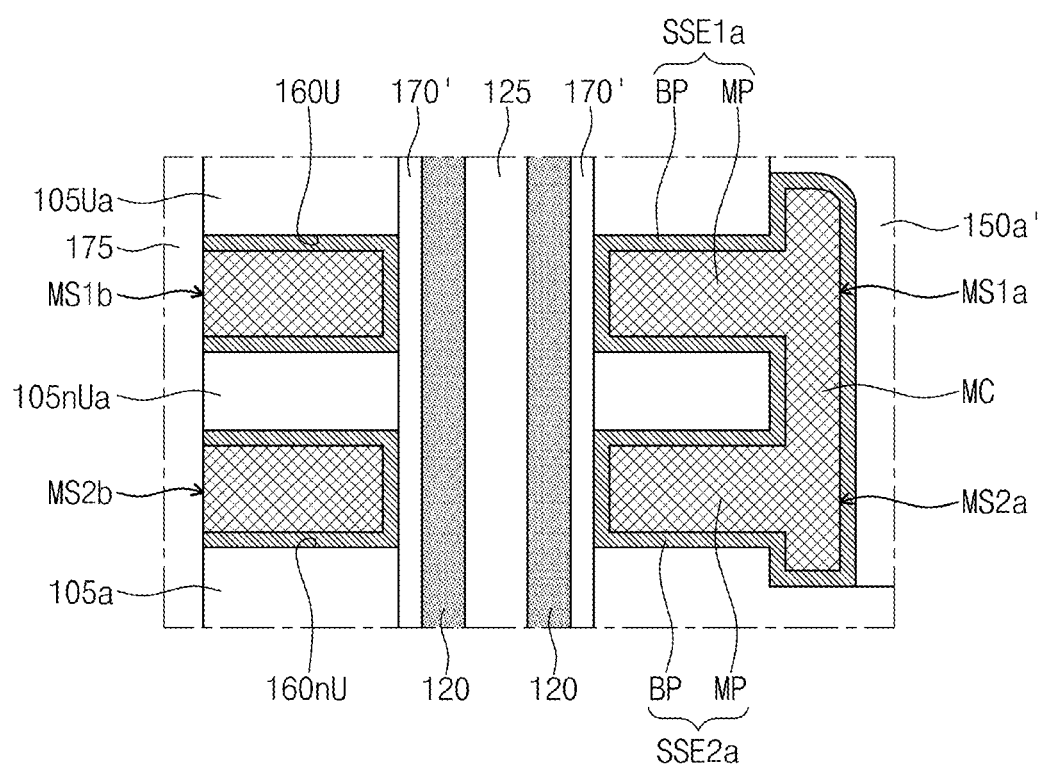
FIG. 18B illustrates an enlarged view of a portion 'E' of FIG. 18A.

FIG. 18A is a cross sectional view taken along a line I-I' of FIG. 16A to illustrate another modified embodiment of a three dimensional semiconductor memory device according to a second embodiment of the inventive concept. FIG. 18B is an enlarged view illustrating a portion 'E' of FIG. 18A.

Referring to FIGS. 18A and 18B, in the present modified embodiment, a electrode-dielectric layer 170' between the sidewall of the vertical active pattern 120 and the respective electrodes GSE1a, GSE2a, CEa, SSE2a, SSE1a may extend vertically between the sidewall of the vertical active pattern 120 and the insulating patterns 105a, 105nUa, 105Ua. In this case, each of the electrodes GSE1a, GSE2a, CEa, SSE2a, SSE1a may include a metal pattern MP and a barrier conductive pattern BP. The barrier conductive pattern BP may be disposed between the metal pattern MP and the insulating pattern adjacent to each other, and between the metal pattern MP and the electrode-dielectric layer 170' adjacent to each other.

As disclosed in FIG. 18B, the metal pattern MP of the first string selection electrode SSE1a may have a first outer sidewall MS1a and a second outer sidewall MS1b which face each other. The first outer sidewall MS1a may be adjacent to the non sacrificial pattern 150a' and the second outer sidewall MS1b may be adjacent to the isolation pattern 175a. The barrier conductive pattern BP in the first string selection electrode SSE1a may be in contact with the first outer sidewall MS1a of the metal pattern MP in the first string selection electrode SSE1a. In an embodiment, the second outer sidewall MS1b of the metal pattern MP in the first string selection electrode SSE1a may not be in contact with the barrier conductive pattern BP in the first string selection electrode SSE1a.

Similarly, the metal pattern MP of the second string selection electrode SSE2a may have a first outer sidewall MS2a and a second outer sidewall MS2b that face each other. The first and second outer sidewalls MS2a and MS2b of the metal pattern MP in the second string selection electrode SSE2a may be vertically aligned with the first and second outer sidewalls MS1a and MS1b of the metal pattern MP in the first string selection electrode SSE1a, respectively. The barrier conductive pattern BP in the second string selection electrode SSE2a may be in contact with the first outer sidewall MS2a of the metal pattern MP in the second string selection electrode SSE2a. In an embodiment, the second outer sidewall MS2b of the metal pattern MP in the second string selection electrode SSE2a may not be in contact with the barrier conductive pattern BP in the second string selection electrode SSE2a. In an embodiment, the second outer sidewalls MS1b and MS2b of the metal patterns MP of the first and second string selection electrodes SSE1a and SSE2a may be in contact with the isolation pattern 175. In this case, the isolation pattern 175 may include a dielectric material (e.g., a nitride material and/or an oxynitride material) having a barrier characteristic.

The first outer sidewall MS1a of the metal pattern MP in the first string selection electrode SSE1a may laterally protrude more than the first outer sidewall of the uppermost insulating pattern 105Ua. The first outer sidewall MS2a of the metal pattern MP in the second string selection electrode SSE2a may laterally protrude more than the first outer sidewall of the next uppermost insulating pattern 105nUa. The metal pattern MP in the first string selection electrode SSE1a may extend downwardly along the first outer sidewall of the next uppermost insulating pattern 105nUa, thereby being connected to the metal pattern MP in the second string selection electrode SSE2a located under the first string selection electrode SSE1a. A connection MC between the metal patterns MP in the first and second string selection electrodes SSE1a and SSE2a may be interposed between the next uppermost insulating pattern 105nUa and the non sacrificial pattern 150a' in the cutting region. In addition, the barrier conductive patterns BP in the first and second string selection electrodes SSE1a and SSE2a may be disposed between the connection MC and the next uppermost insulating pattern 105nUa, and between the connection MC and the non sacrificial pattern 150a' in the cutting region.

As illustrated in FIG. 18A, both sidewalls of the metal pattern MP in each of the cell electrodes CEa may not be in contact with the barrier conductive pattern BP thereof. Similarly, both sidewalls of the metal pattern MP in each of the ground selection electrodes GSE1a and GSE2a may not be in contact with the barrier conductive pattern BP thereof.

The electrode-dielectric layer 170' may include the tunneling dielectric layer TDL, the charge storing layer SL, and a blocking dielectric layer BDL as described with the reference to FIG. 1D. The metal pattern MP may include a tungsten layer, a copper layer, or an aluminum layer. The barrier conductive pattern BP may include a conductive metal nitride layer (e.g., a titanium nitride layer, a tantalum nitride layer, a tungsten nitride layer, or the like) and/or a transition metal layer (e.g., a titanium layer, a tantalum layer, or the like).

FIGS. 19A to 24A illustrate plan views of a method of fabricating a three dimensional semiconductor memory device according to a second embodiment of the inventive concept. FIGS. 19B to 24B are cross sectional views taken along lines I-I' of FIGS. 19A to 24A, respectively.

Figure 19A:
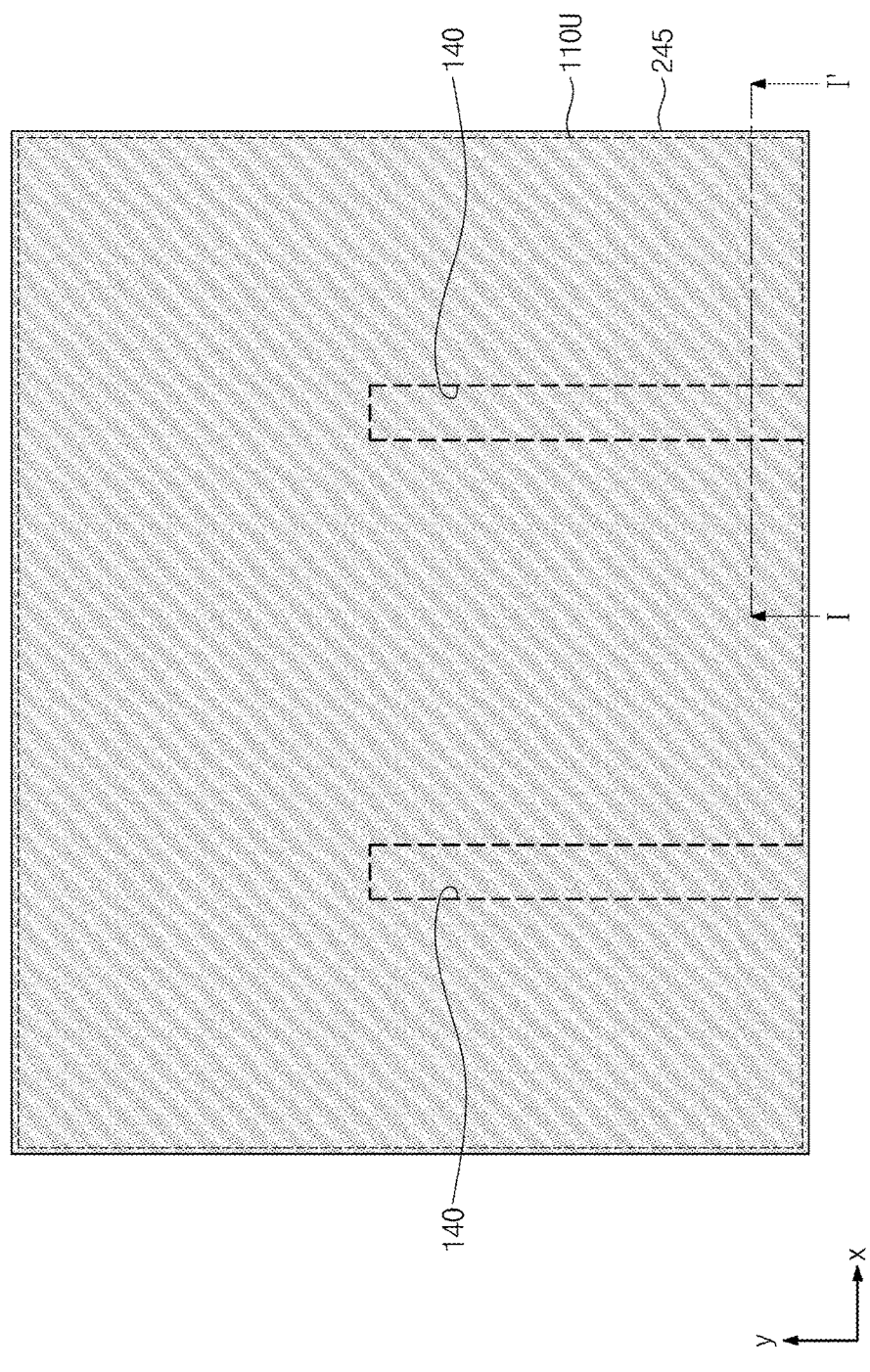
Figure 19B:
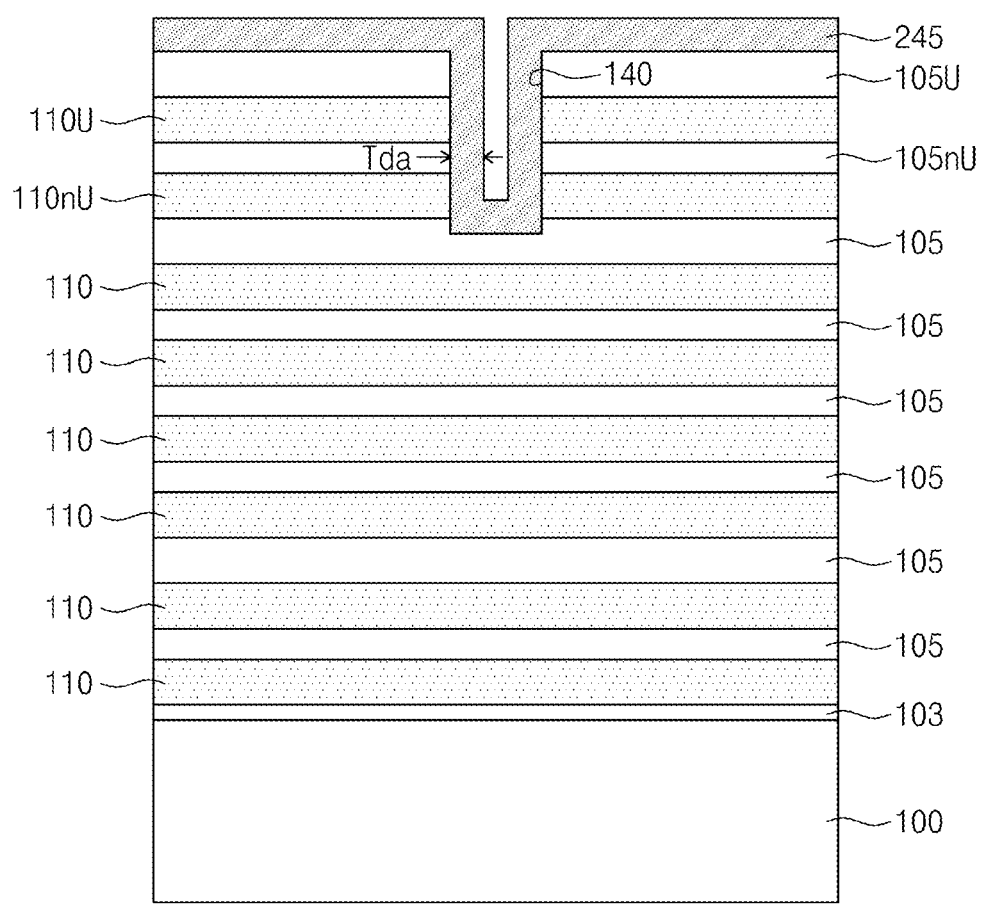

Referring to FIGS. 19A and 19B, sacrificial layers 110, 110nU, 110U and insulating layers 105, 105nU, 105U may be alternately and repeatedly stacked on a substrate 100. The uppermost insulating layer 105U, the uppermost sacrificial layer 110U, the next uppermost insulating layer 105nU, and the next uppermost sacrificial layer 110nU may be patterned to form cutting regions 140.

A spacer layer 245 having a thickness Tda may be conformably formed on the substrate having the cutting regions 140. The spacer layer 245 may be formed of the same material layer as the spacer layer 145 of the first embodiment.

Figure 20A:
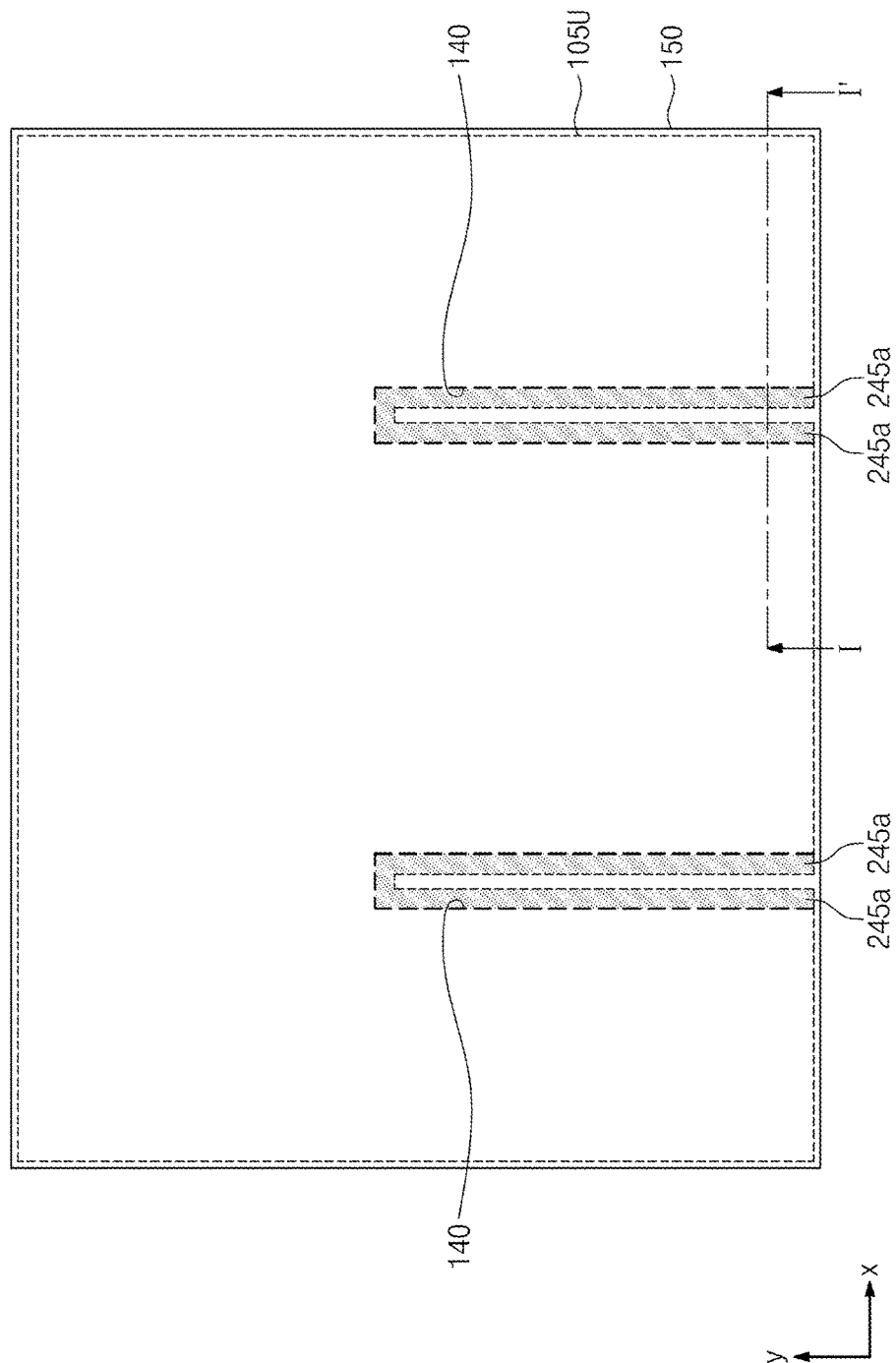
Figure 20B:
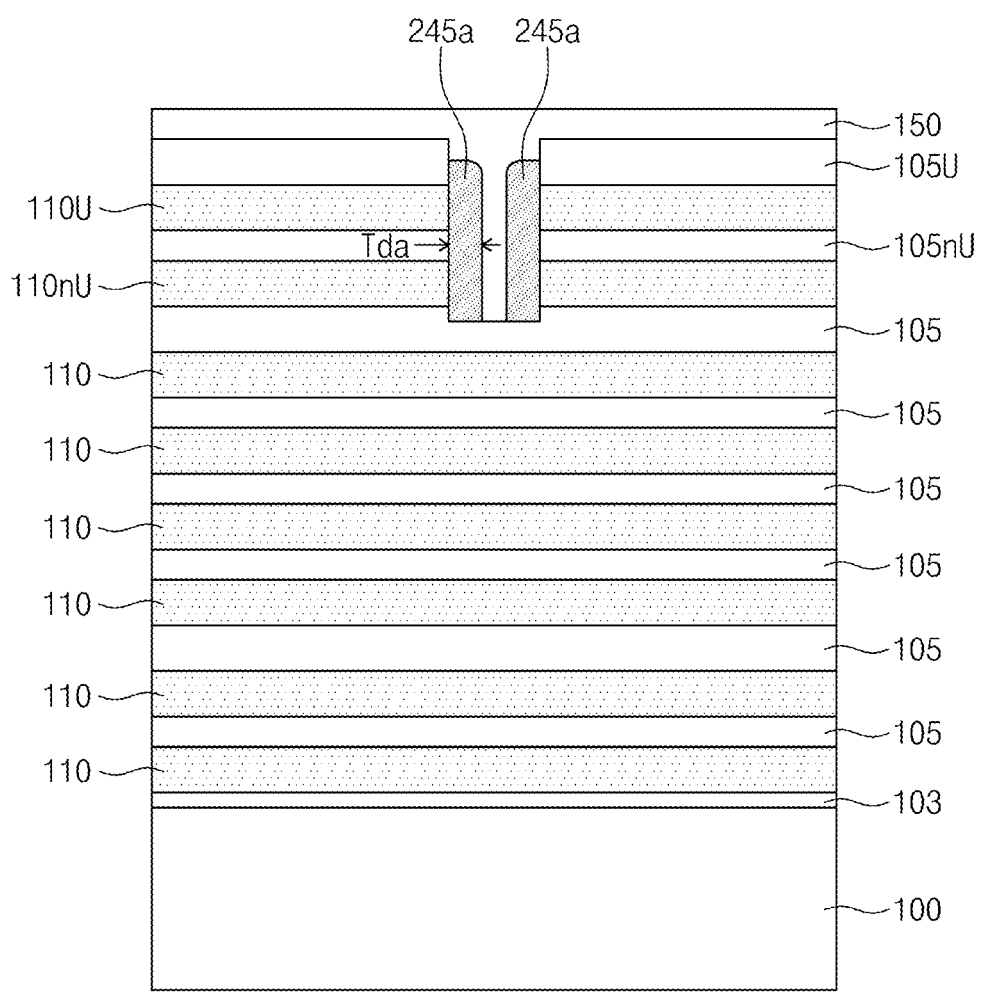

Referring to FIGS. 20A and 20B, the spacer layer 245 may be etched using an anisotropic etching technique, thereby forming sacrificial spacers 245a on inner sidewalls of the cutting regions 140. As illustrated in FIG. 20A, the sacrificial spacers 245a respectively formed on both inner sidewalls of each of the cutting regions 140 may be connected to each other at an end portion of each cutting region 140. A non sacrificial layer 150 filling the cutting regions 140 may be then formed on the substrate having the sacrificial spacers 245a.

Figure 21A:
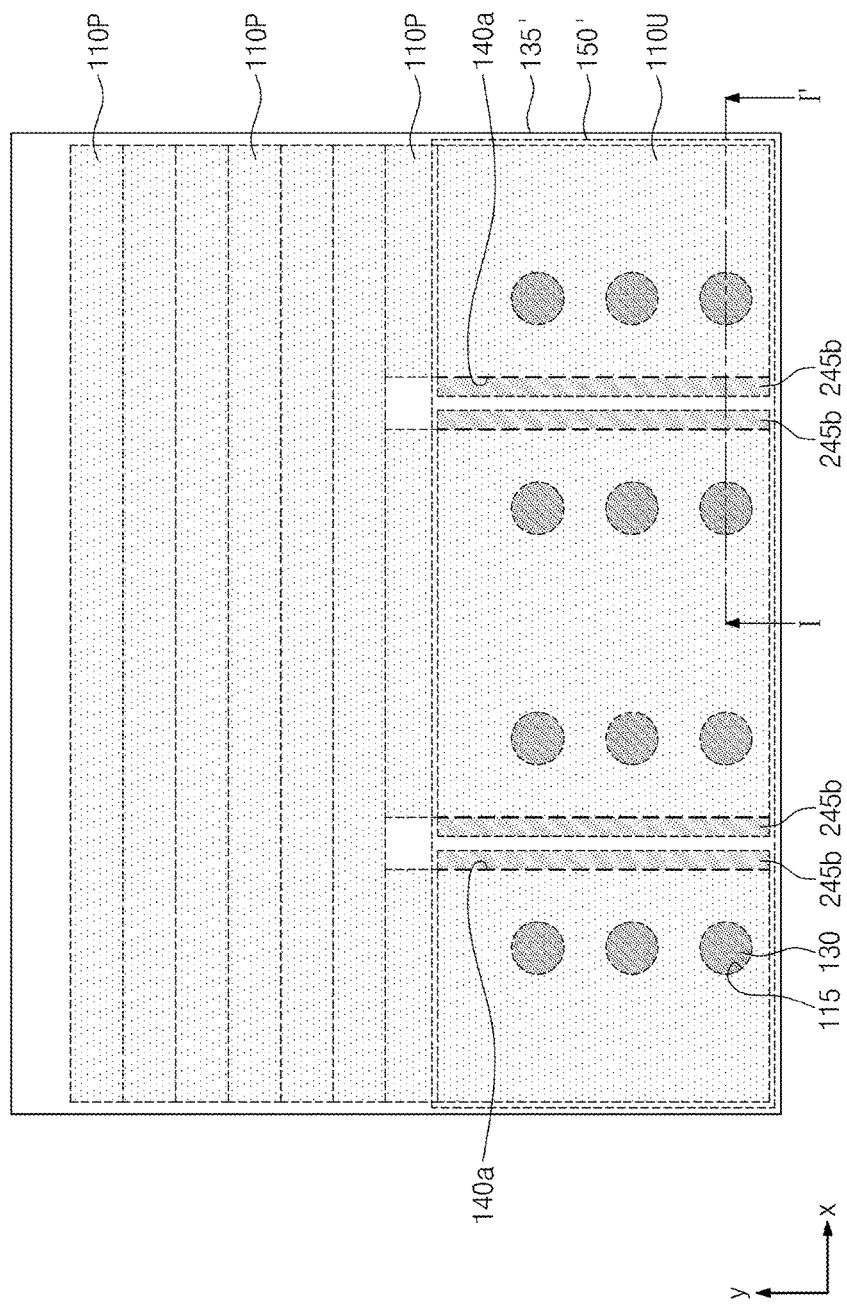
Figure 21B:
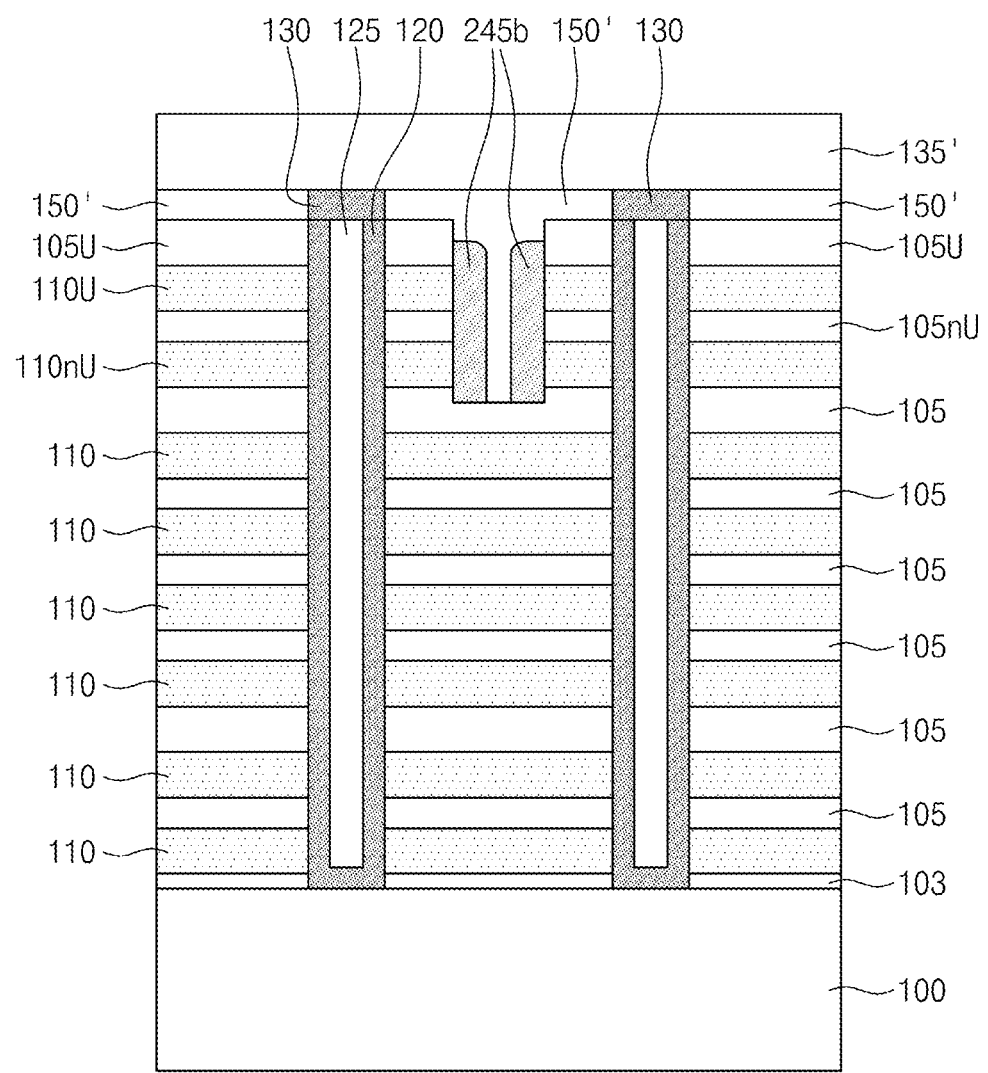

Referring to FIGS. 21A and 21B, the non sacrificial layer 150, the insulating layers 105U, 105nU, 105, and the sacrificial layers 110U, 110nU, 110 may be patterned to form sacrificial pads 110P constituting a stepped structure. While the sacrificial pads 110P are formed, the end portions of the cutting regions 140 and connections of the end portions of the sacrificial spacers 245a may be removed to form sacrificial spacers 245b on inner sidewalls of the cutting regions 140 and separated from each other. After the sacrificial pads 110P are formed, the patterned non sacrificial layer 150' may not cover the sacrificial pads 110P located at levels below the uppermost sacrificial layer 110U.

A plurality of holes 115 may be formed to penetrate the non sacrificial layer 150', the insulating layers 105U, 105nU and 105, the sacrificial layers 110U, 110nU and 110, and the buffer dielectric layer 103. A plurality of vertical active patterns 120 may be formed in the holes 115, respectively. Further, a filling dielectric pattern and a landing pad 130 may be formed in each of the holes 115.

The holes 115 and the vertical active patterns 120 may be formed after formation of the sacrificial pads 110P. However, the inventive concept is not limited to the above descriptions. For example, the holes 115 and the vertical active patterns 120 may be formed prior to formation of the sacrificial pads 110P or the cutting regions 140.

A capping dielectric layer 135' may be formed on an entire surface of the substrate including the sacrificial pads 110P.

Figure 22A:
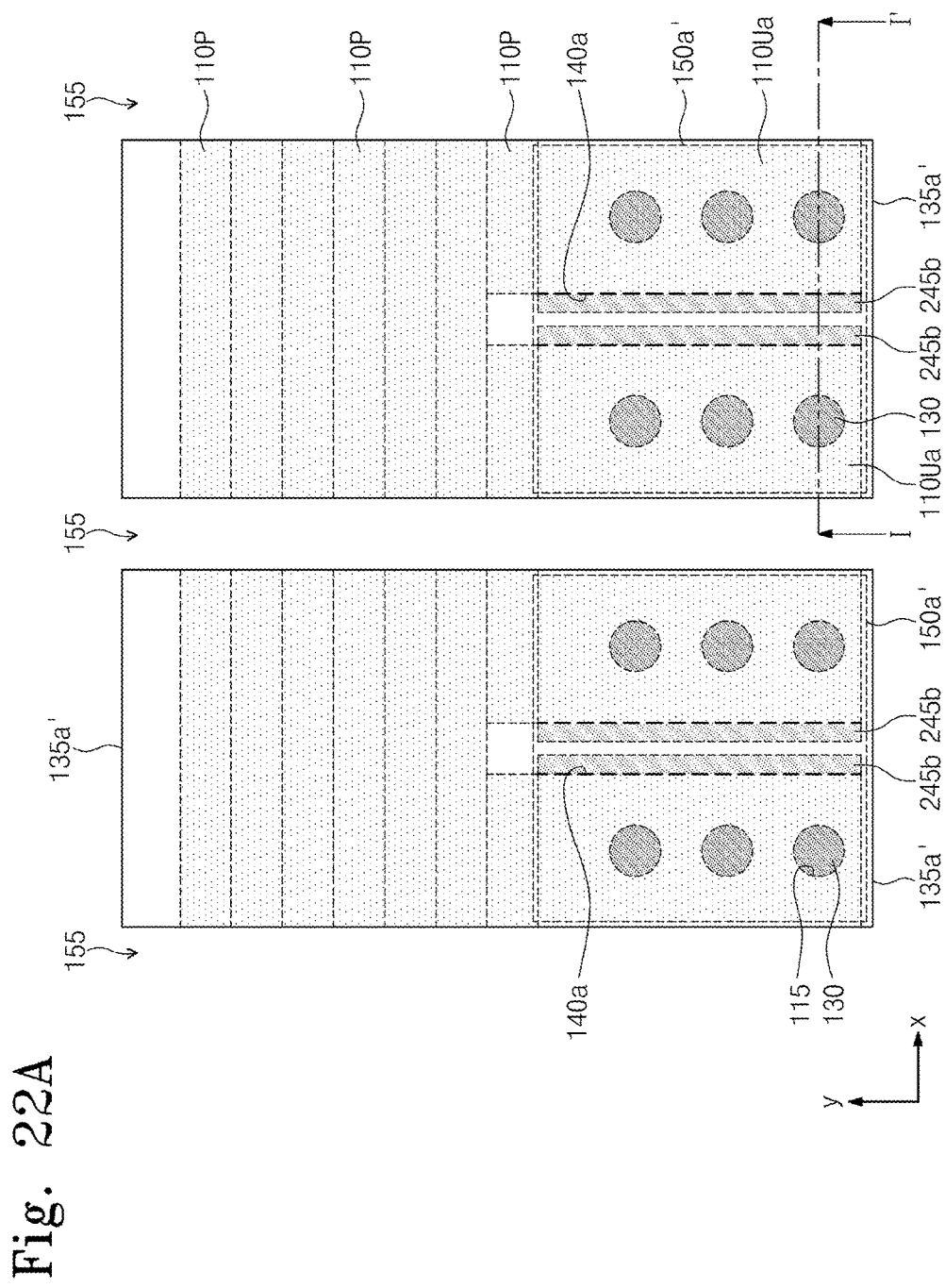
Figure 22B:
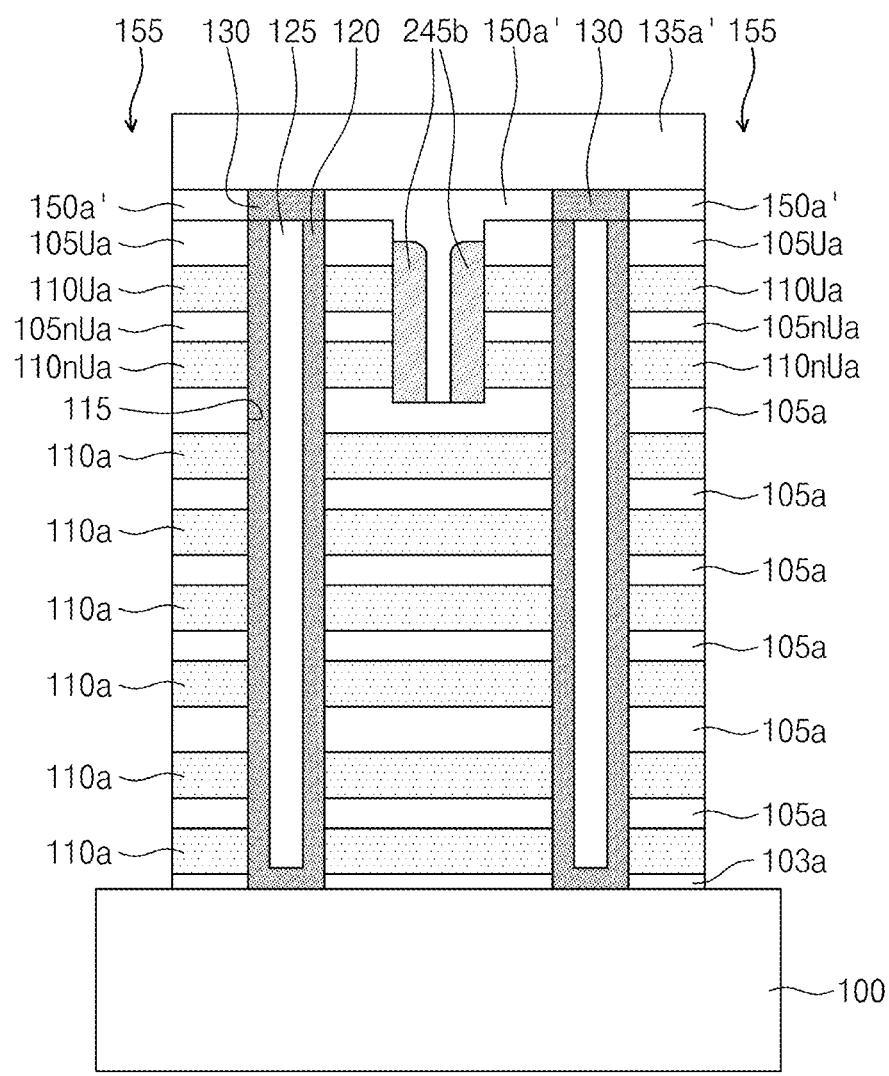

Referring to FIGS. 22A and 22B, the capping dielectric layer 135', the non sacrificial layer 150', the insulating layers 105U, 105nU and 105, the sacrificial layers 110U, 110nU and 110, and the buffer dielectric layer 103 may be patterned to form trenches 155 defining a plurality of mold patterns. Each of the mold patterns may include sacrificial patterns 110a, 110nUa, 110Ua, insulating patterns 105a, 105nUa, 105Ua, the cutting region 140, the sacrificial spacers 245b, a non sacrificial pattern 150a' and a capping dielectric pattern 135a'.

Figure 23A:
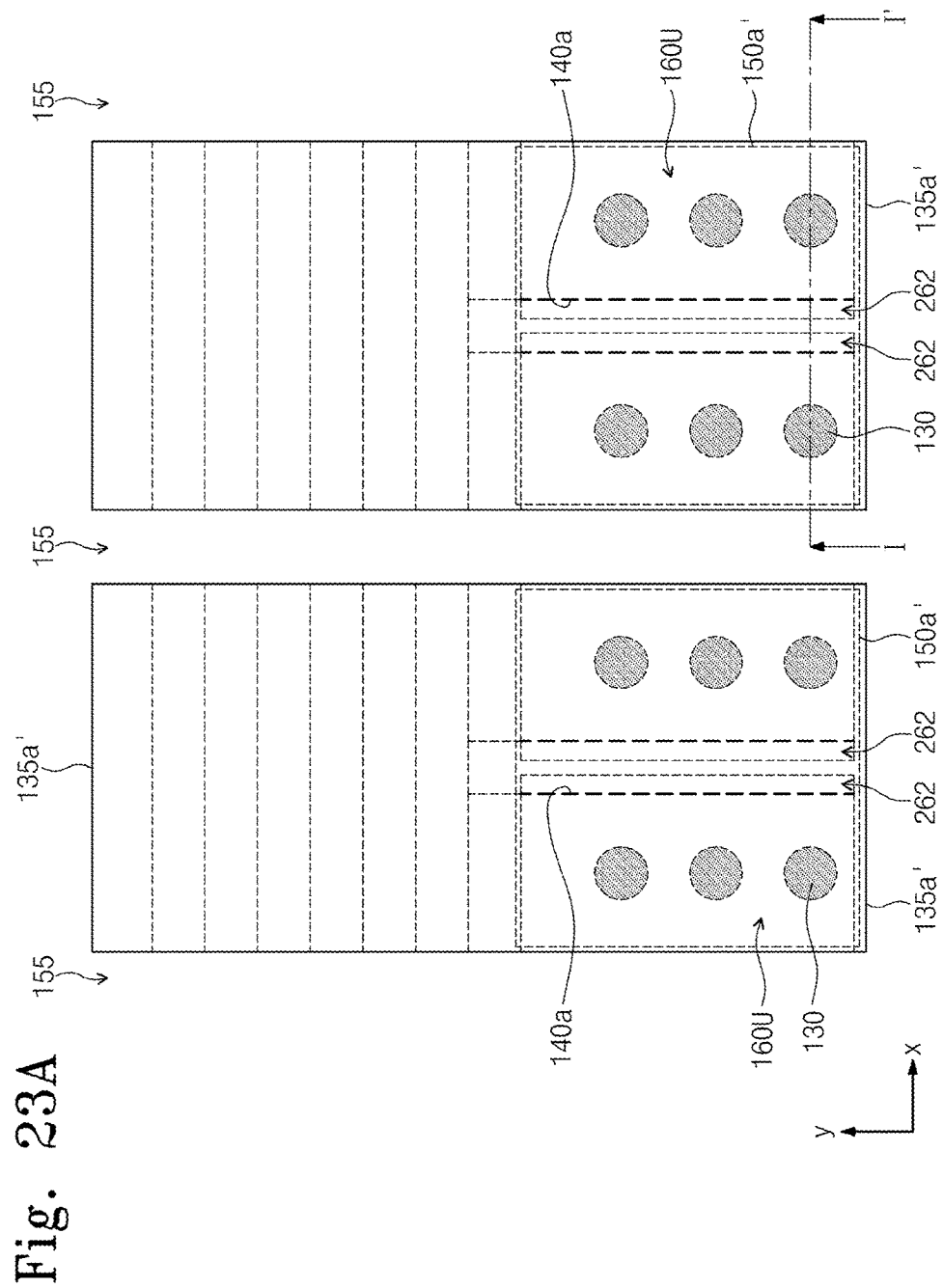
Figure 23B:
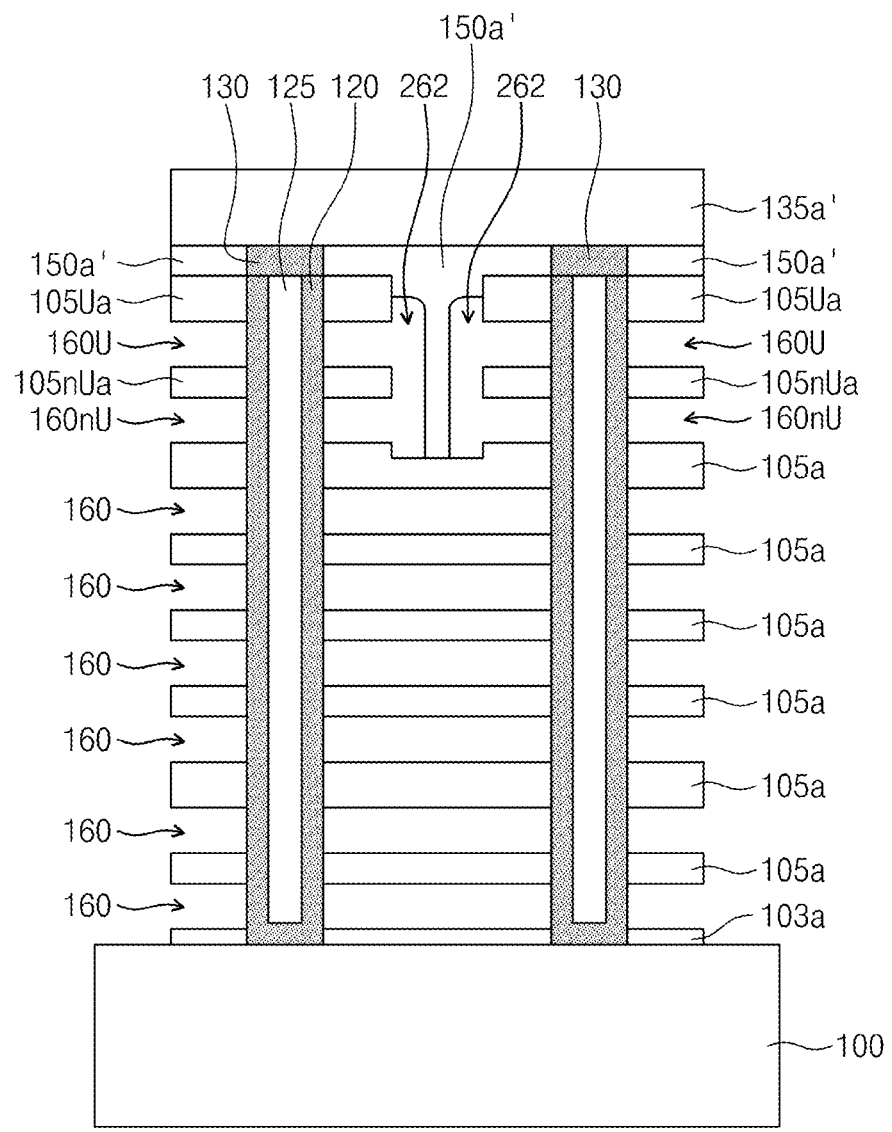

Referring to FIGS. 23A and 23B, the sacrificial patterns 110a, 110nUa, 110Ua exposed by the trenches 155 may be removed to form empty regions 160, 160nU, 160U. During formation of the empty regions 160, 160nU, 160U, the sacrificial spacers 245b may be etched to form recessed regions 262. The sacrificial spacers 245b may be completely removed during formation of the empty regions 160, 160nU, 160U. Alternatively, portions of the sacrificial spacers 245b at a level higher, e.g., further from the substrate 1000 along a z-axis direction, than the uppermost empty regions 160U, may remain even after the empty regions 160, 160nU, 160U are formed.

Figure 24A:
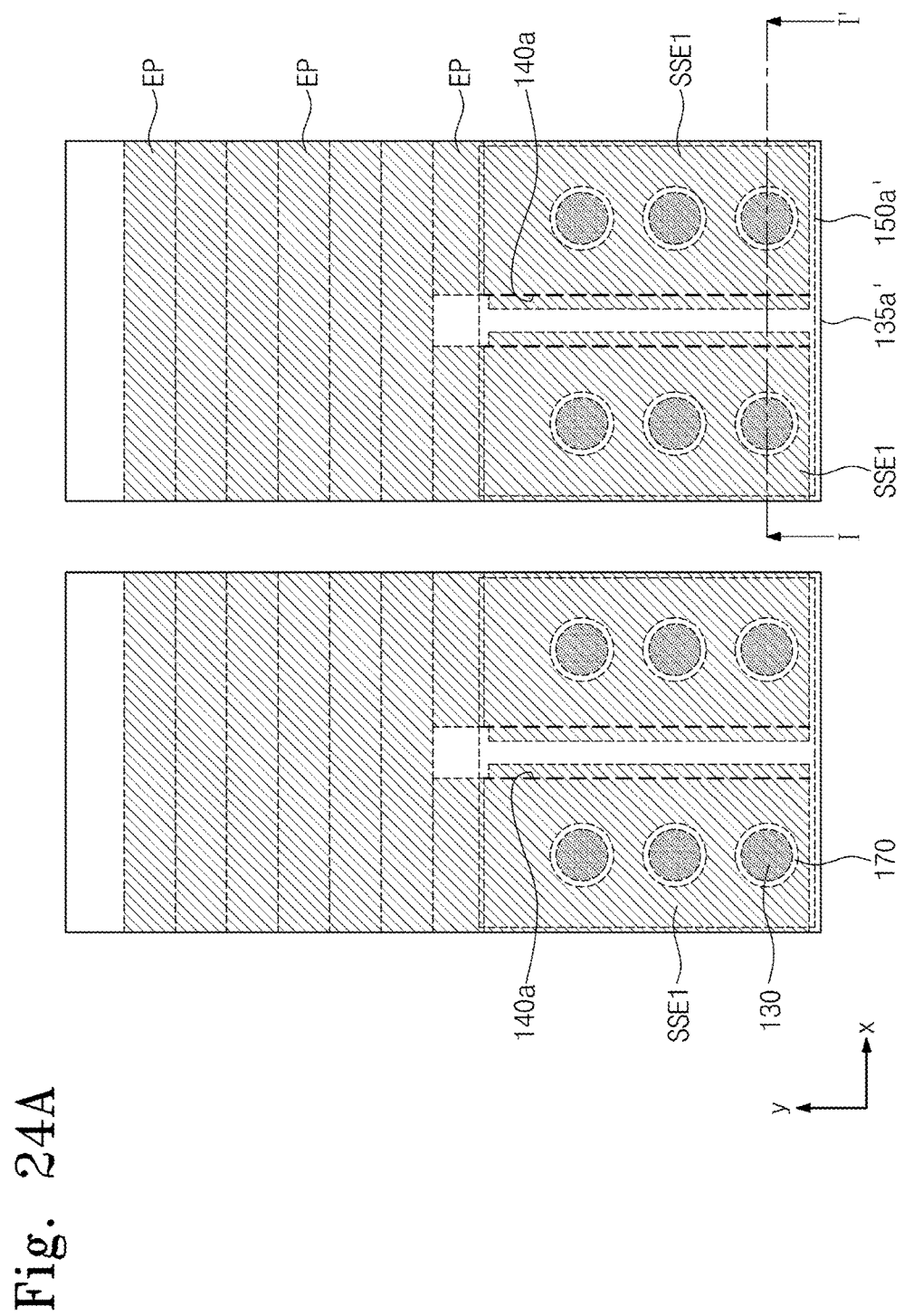
Figure 24B:
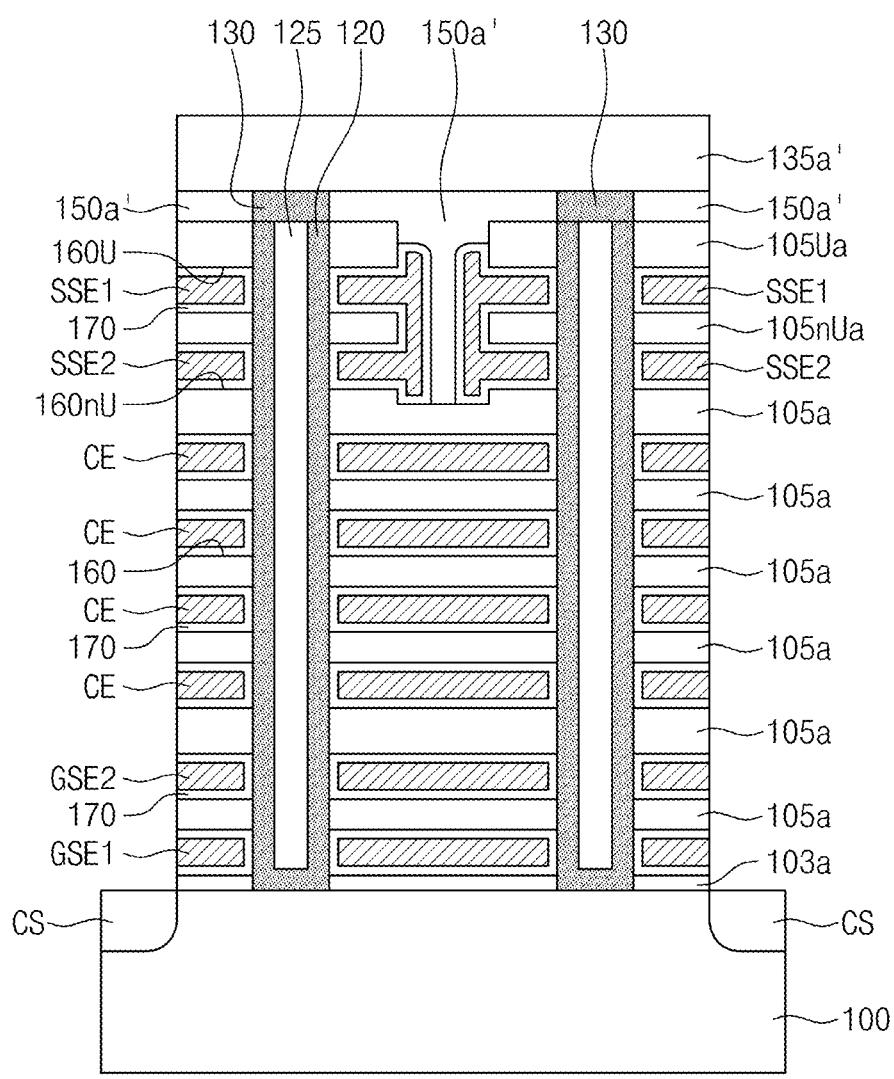

Referring to FIGS. 24A and 24B, an electrode-dielectric layer 170 may be conformably formed on the substrate having the empty regions 160, 160nU, 160U and the recessed regions 262. In this case, the thickness Tda (see FIG. 20B) of the spacer layer 245 may be greater than twice the thickness of the electrode-dielectric layer 170. Thus, the electrode-dielectric layer 170 may be formed to a substantially uniform thickness on inner walls of the empty regions 160, 160nU, 160U and the recessed regions 262. Further, portions of the recessed regions 162 may still be empty even after the electrode-dielectric layer 170 is formed.

Subsequently, a conductive layer may be formed on the substrate having the electrode-dielectric layer 170. The conductive layer may fill the empty regions 160, 160nU, 160U and the recessed regions 262. The conductive layer may be etched to form electrodes GSE1, GSE2, CE, SSE2, SSE1 in the empty regions 160, 160nU, 160U. Portions of the conductive layer filling the recessed regions 262 may correspond to the connection 200 illustrated in FIG. 16C. In addition, a lateral width of the sacrificial spacer 245b may be greater than twice the thickness of the electrode-dielectric layer 170, as mentioned above. Thus, the first outer sidewalls of the first and second string selection electrodes SSE1 and SSE2 may laterally protrude more than the first outer sidewalls of the uppermost insulating pattern 105Ua and the next uppermost insulating pattern 105nUa.

The connections of the sacrificial spacers (245a of FIG. 20A) may be removed prior to formation of the recessed regions 262. In this case, the first string selection electrode SSE1 disposed at one side of the cutting region 140 may be completely separated from the first string selection electrode SSE1 disposed at the other side of the cutting region 140.

After forming the electrodes GSE1, GSE2, CE, SSE2, SSE1, the electrode-dielectric layer 170 formed on inner sidewalls of the trenches 155 may be removed. Common source regions CS may be formed in the substrate 100 under the trenches 155. Subsequently, the isolation patterns 175, the contact plugs 180 and the interconnections 190 illustrated in FIGS. 16A to 16C may be formed on the substrate having the common source regions CS. As such, the three dimensional semiconductor memory device illustrate in FIGS. 16A to 16C may be realized.

According to the fabrication methods described above, after forming the cutting regions 140 and the non sacrificial layer 150, the trenches 155 and the empty regions 160, 160nU, 160U may be formed. As such, the effects described in the first embodiment may be obtained through the present embodiment. Further, the lateral width of the sacrificial spacers 245b may be greater than twice the thickness of the electrode-dielectric layer 170. Thus, the lateral widths of the first and second string selection electrodes SSE1 and SSE2 may be increased, and the first and second string selection electrodes SSE1 and SSE2 which are stacked may be connected to each other. As a result, the electrical resistance of the first and second string selection electrodes SSE1 and SSE2 may be significantly reduced, thereby realizing a high reliable and highly integrated three dimensional semiconductor memory device.

Figure 25:
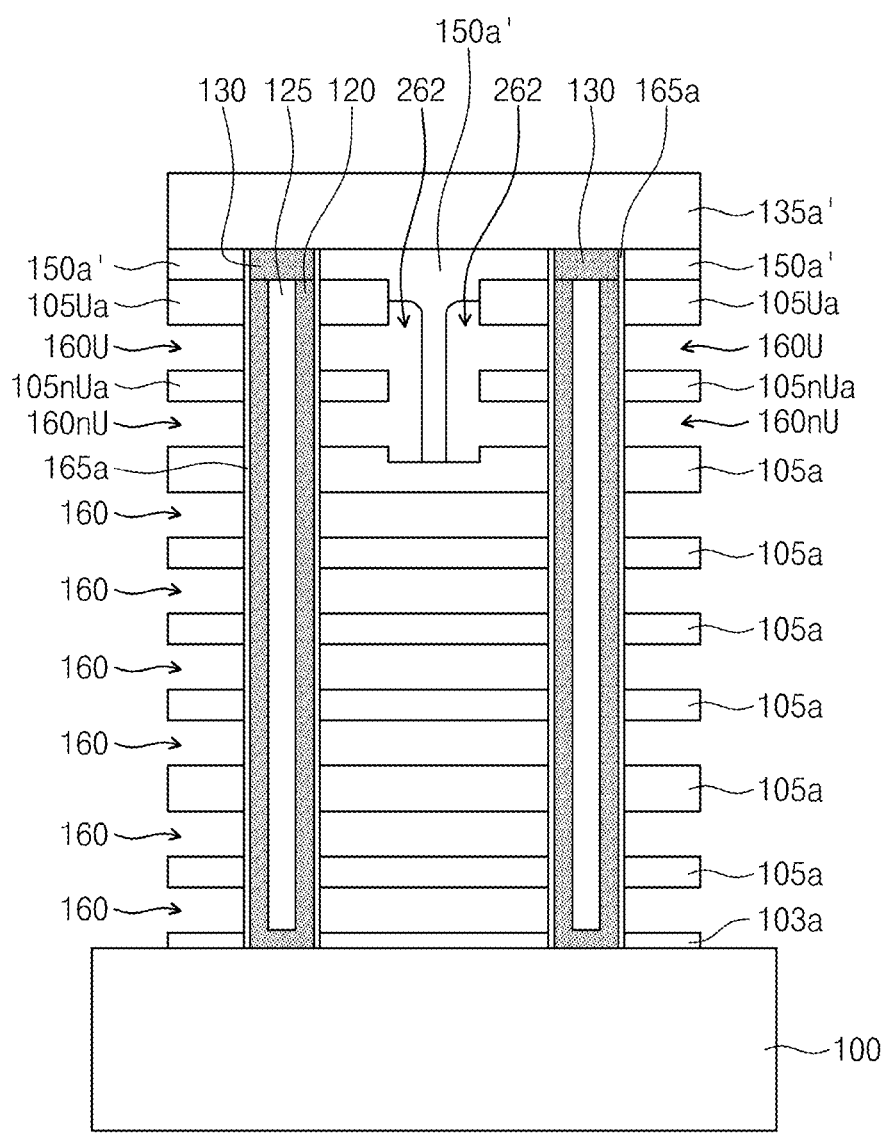
FIG. 25 illustrates a cross sectional view of a modified embodiment of a method of fabricating a three dimensional semiconductor memory device according to a second embodiment of the inventive concept.

FIG. 25 is a cross sectional view illustrating a modified embodiment of a method of fabricating a three dimensional semiconductor memory device according to a second embodiment of the inventive concept.

First, prior to formation of the vertical active patterns 120 described with reference to FIGS. 21A and 21B, a first portion 165a of an electrode-dielectric layer may be formed on inner sidewalls of the holes 115. Subsequently, the processes described with reference to FIGS. 22A, 22B, 23A, and 23B may be performed. As a result, empty regions 160, 160nU and 160U illustrated in FIG. 25 may be formed. In this case, the empty regions 160, 160nU, 160U may expose the first portion 165a located on the sidewalls of the vertical active patterns 120. A second portion 165b of the electrode-dielectric layer may be then conformably formed on the substrate having the empty regions 160, 160nU, 160U and the recessed regions 262. In an embodiment, the thickness of the sacrificial spacer 245b may be greater than twice the thickness of the second portion 165b of the electrode-dielectric layer. A conductive layer may be then formed to fill the empty regions 160, 160nU, 160U and the recessed regions 262, and the conductive layer may be etched to form electrodes GSE1, GSE2, CE, SSE2, SSE1 filling the empty regions 160, 160nU, 160U. Subsequent processes may be the same as the previous embodiments described above. As such, the three dimensional semiconductor memory device illustrated in FIG. 17 may be realized.

Figure 26:
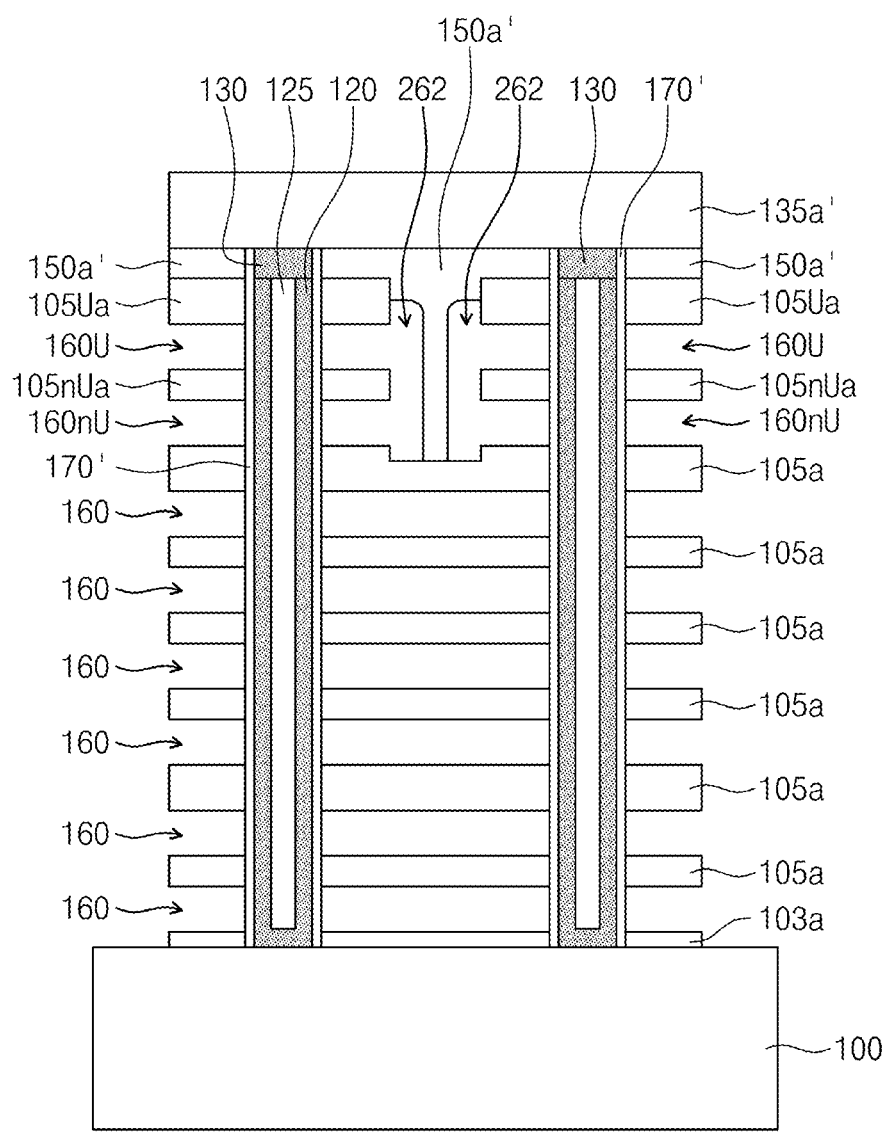
FIG. 26 illustrates a cross sectional view of another modified embodiment of a method of fabricating a three dimensional semiconductor memory device according to a second embodiment of the inventive concept.

FIG. 26 is a cross sectional view illustrating another modified embodiment of a method of fabricating a three dimensional semiconductor memory device according to a second embodiment of the inventive concept.

First, prior to formation of the vertical active patterns 120 described with reference to FIGS. 21A and 21B, an electrode-dielectric layer 170' may be formed on inner sidewalls of the holes 115. Subsequently, the processes described with reference to FIGS. 22A, 22B, 23A and 23B may be performed. As a result, empty regions 160, 160nU, 160U exposing the electrode-dielectric layer 170' on the sidewalls of the vertical active patterns 120 may be formed, as illustrated in FIG. 26. A conductive layer may be then formed to fill the empty regions 160, 160nU, 160U and the recessed regions 262, and the conductive layer may be etched to form electrodes filling the empty regions 160, 160nU, 160U. In this case, the electrode-dielectric layer 170' may not be formed in the empty regions 160, 160nU, 160U and the recessed regions 262 after the electrodes are formed.

In an embodiment, the conductive layer may include a barrier conductive layer and a metal layer. For example, the barrier conductive layer may be conformably formed on the substrate including the empty regions 160, 160nU, 160U exposing the electrode-dielectric layer 170' and the recessed regions 262. Subsequently, the metal layer filing at least the empty regions 160, 160nU, 160U may be formed on the barrier conductive layer. The metal layer and the barrier conductive layer may be etched to form electrodes (GSE1a, GSE2a, CEa, SSE2a, SSE1a of FIGS. 18A and 18B) in the empty regions 160, 160nU, 160U. The following processes may be performed using the same manners as described in the previous embodiments. As such, the three dimensional semiconductor memory device illustrated in FIGS. 18A and 18B may be realized.

Third Embodiment

In the present embodiment, the same elements as described in the previous embodiments will be indicated by the same reference numerals or the same reference designators. For the purpose of ease and convenience in explanation, the descriptions to the same elements as in the previous embodiments will be omitted or mentioned briefly. That is, differences between the present embodiment and the previous embodiments will be mainly described hereinafter.

Figure 27A:
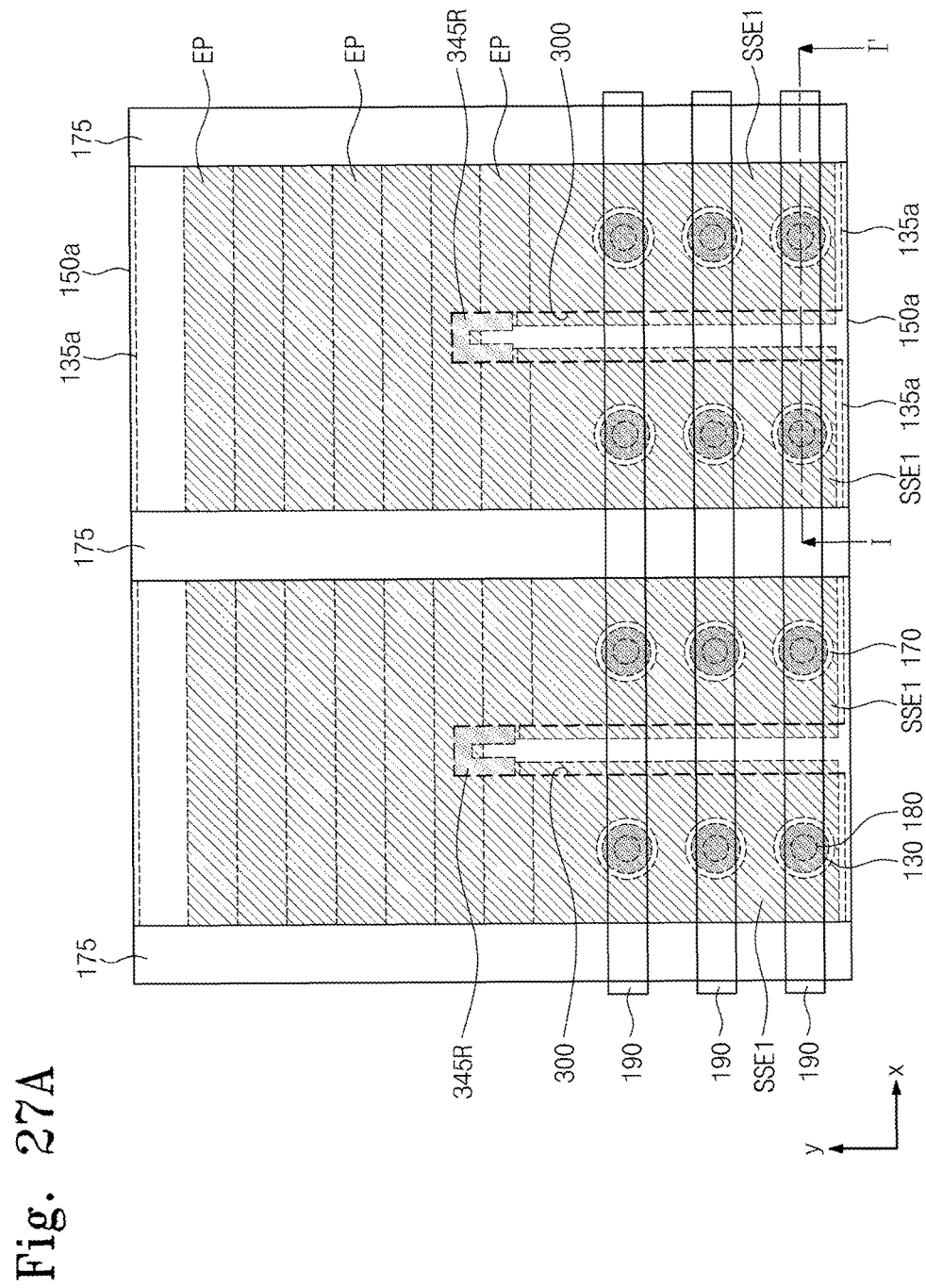
FIG. 27A illustrates a plan view of a three dimensional semiconductor memory device according to a third embodiment of the inventive concept.
Figure 27B:
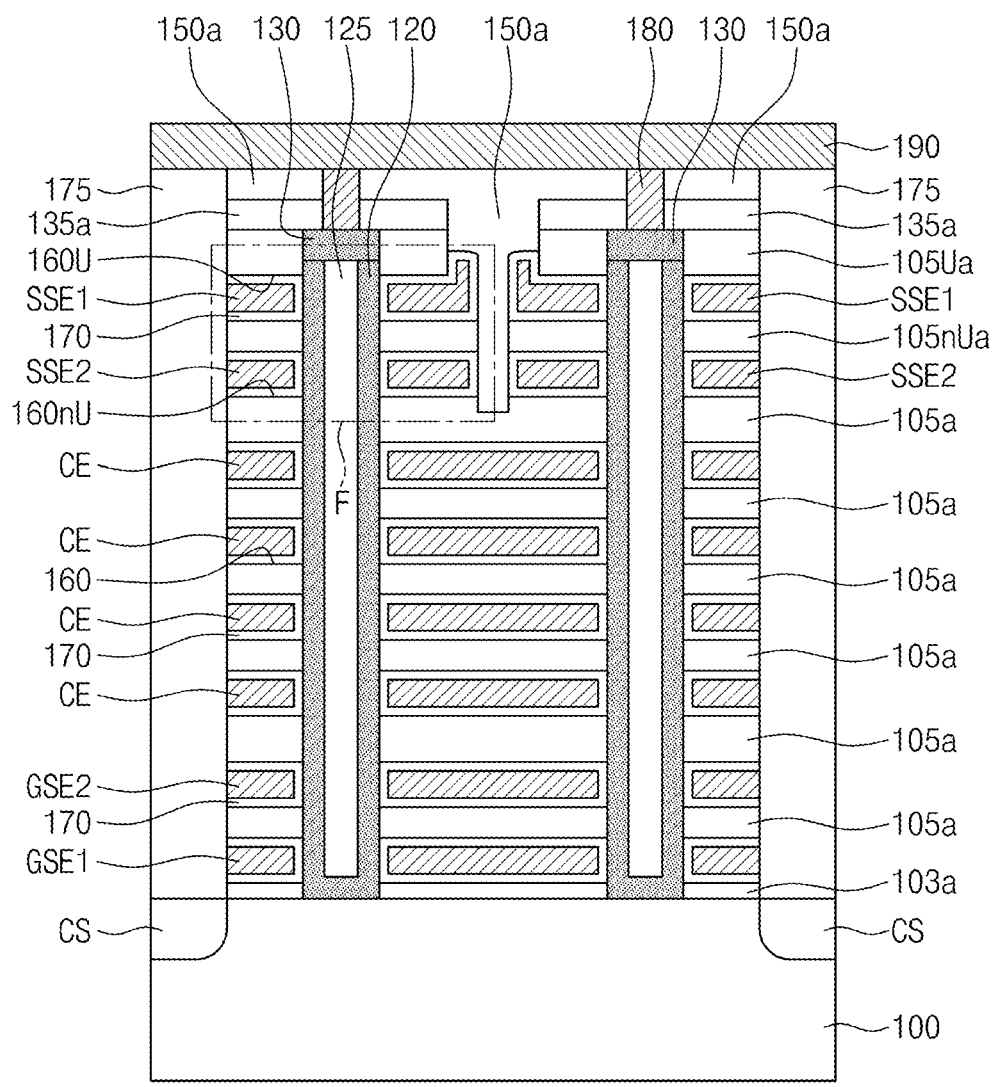
FIG. 27B illustrates a cross sectional view taken along a line I-I' of FIG. 27A.
Figure 27C:
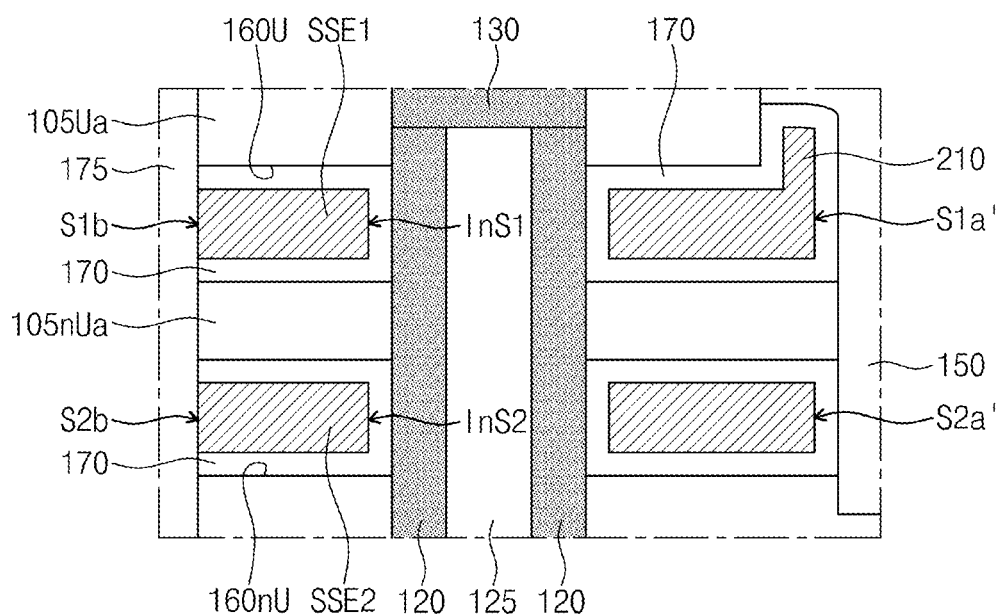
FIG. 27C illustrates an enlarged view of a portion 'F' of FIG. 27B.

FIG. 27A illustrates a plan view of a three dimensional semiconductor memory device according to a third embodiment of the inventive concept. FIG. 27B is a cross sectional view taken along a line I-I' of FIG. 27A. FIG. 27C is an enlarged view illustrating a portion 'F' of FIG. 27B.

Referring to FIGS. 27A, 27B, and 27C, the first outer sidewalls S1a' and S2a' of the first and second string selection electrodes SSE1 and SSE2 may laterally protrude more than the first outer sidewall of the uppermost insulating pattern 105Ua adjacent to the non sacrificial pattern 150a. The first outer sidewall of the next uppermost insulating pattern 105nUa adjacent to the non sacrificial pattern 150a may laterally protrude more than the first outer sidewall of the uppermost insulating pattern 105Ua adjacent to the non sacrificial pattern 150a. The electrode-dielectric layer 170 between the vertical active patterns 120 and the first string selection electrode SSE1 may extend to cover the first outer sidewall S1a' of the first string selection electrode SSE1. Similarly, the electrode-dielectric layer 170 between the vertical active patterns 120 and the second string selection electrode SSE2 may extend to cover the first outer sidewall S2a' of the second string selection electrode SSE2. The electrode-dielectric layer 170 covering the first outer sidewall S1a' of the first string selection electrode SSE1 may be separated from the electrode-dielectric layer 170 covering the first outer sidewall S2a' of the second string selection electrode SSE2. In addition, the second string selection electrode SSE2 may be separated from the first string selection electrode SSE1 stacked on the second string selection electrode SSE2.

A portion of the first string selection electrode SSE1 adjacent to the first outer sidewall S1a' may extend upwardly to cover the first outer sidewall of the uppermost insulating pattern 105Ua. That is, the first string selection electrode SSE1 may extend onto the first outer sidewall of the uppermost insulating pattern 105Ua.

A guide opening 300 may be defined between the adjacent uppermost insulating patterns 105Ua in each mold pattern (or in each electrode structure). The capping dielectric pattern 135a may be disposed on the uppermost insulating patterns 105Ua. Each of the guide openings 300 may extend upwardly to penetrate the capping dielectric pattern 135a. The non sacrificial pattern 150a may extend into the guide opening 300. As illustrated in FIG. 27A, residual sacrificial patterns 345R may be disposed at end portions of the guide openings 300, respectively. The residual sacrificial patterns 345R may be formed of the same material as the residual sacrificial spacers 145r described in the first embodiment. The first string selection electrode SSE1 disposed at one side of the guide opening 300 may be separated from the first string selection electrode SSE1 disposed at the other side of the guide opening 300 by the residual sacrificial pattern 345R.

According to the three dimensional semiconductor memory device described above, the first outer sidewalls S1a' and S2a' of the first and second string selection electrodes SSE1 and SSE2 may laterally protrude more than the first outer sidewall of the uppermost insulating pattern 105Ua. As such, the electrical resistance of the first and second string selection electrodes SSE1 and SSE2 may be significantly reduced, thereby realizing a high reliable three dimensional semiconductor memory device.

Hereinafter, some modified embodiments of the third embodiment will be described with reference to the drawings.

Figure 28A:
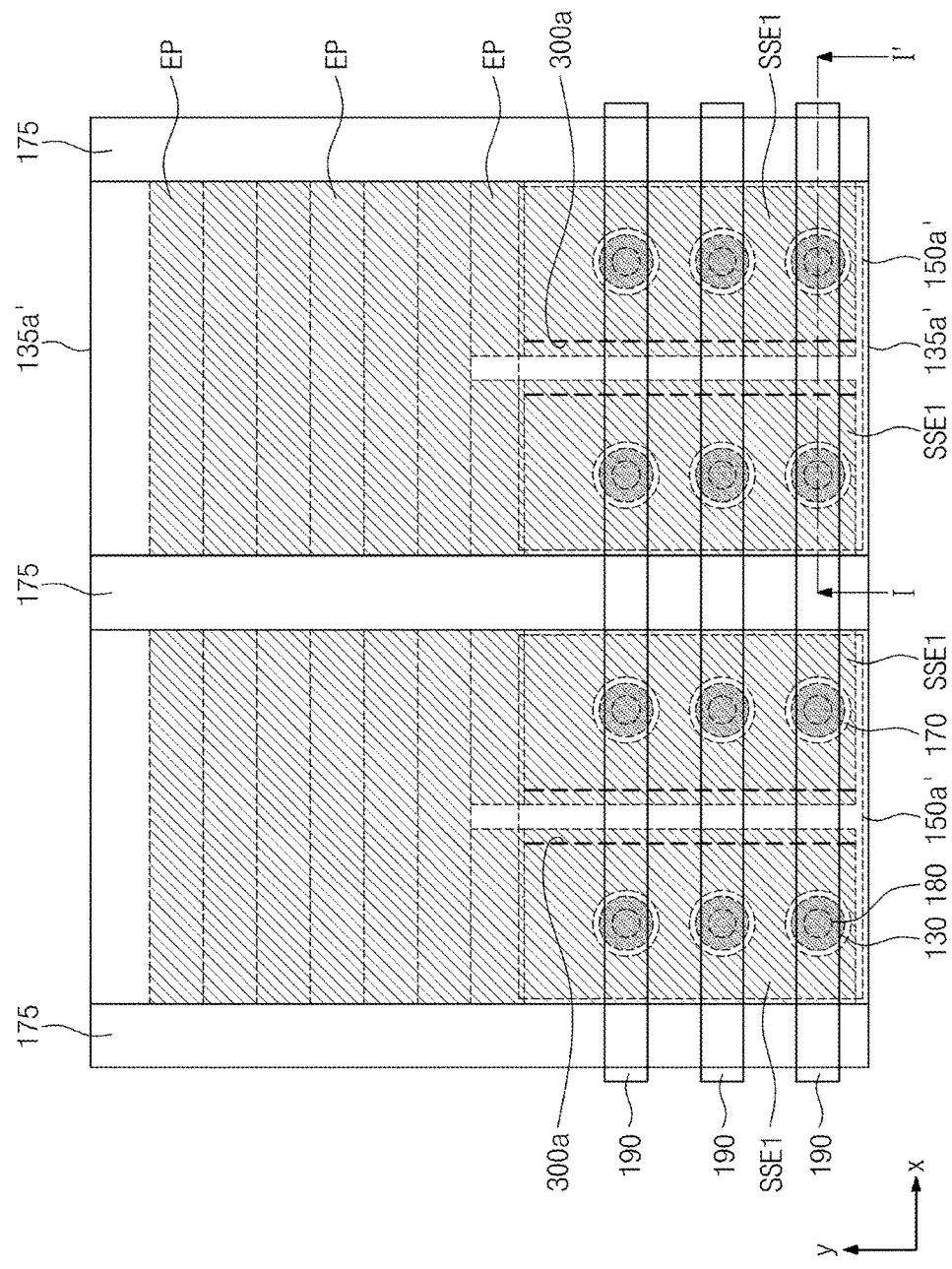
FIG. 28A illustrates a plan view of a modified embodiment of a three dimensional semiconductor memory device according to a third embodiment of the inventive concept.
Figure 28B:
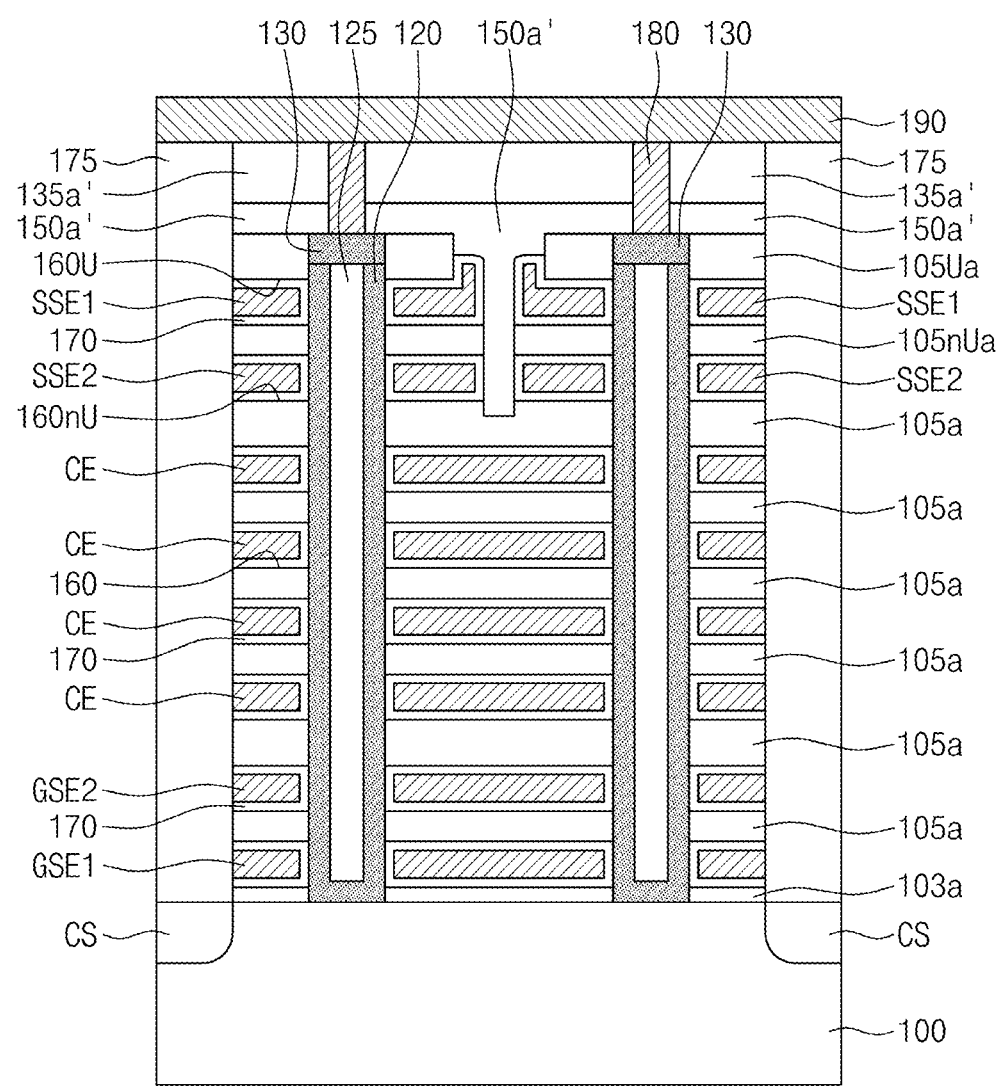
FIG. 28B illustrates a cross sectional view taken along a line I-I' of FIG. 28A.

FIG. 28A illustrates a plan view of a modified embodiment of a three dimensional semiconductor memory device according to a third embodiment of the inventive concept. FIG. 28B is a cross sectional view taken along a line I-I' of FIG. 28A.

Referring to FIGS. 28A and 28B, end portions of guide openings 300a may be removed when viewed from a plan view of FIG. 28A. Thus, the residual sacrificial patterns 345R illustrated in FIG. 27A may be removed in this modified embodiment. In this case, each of the guide openings 300a may be defined between the pair of adjacent uppermost insulating patterns 105Ua in each mold pattern (or in each electrode structure). The capping dielectric pattern 135a' may be disposed on the uppermost insulating patterns 105Ua and the non sacrificial patterns 150a'.

Figure 29:
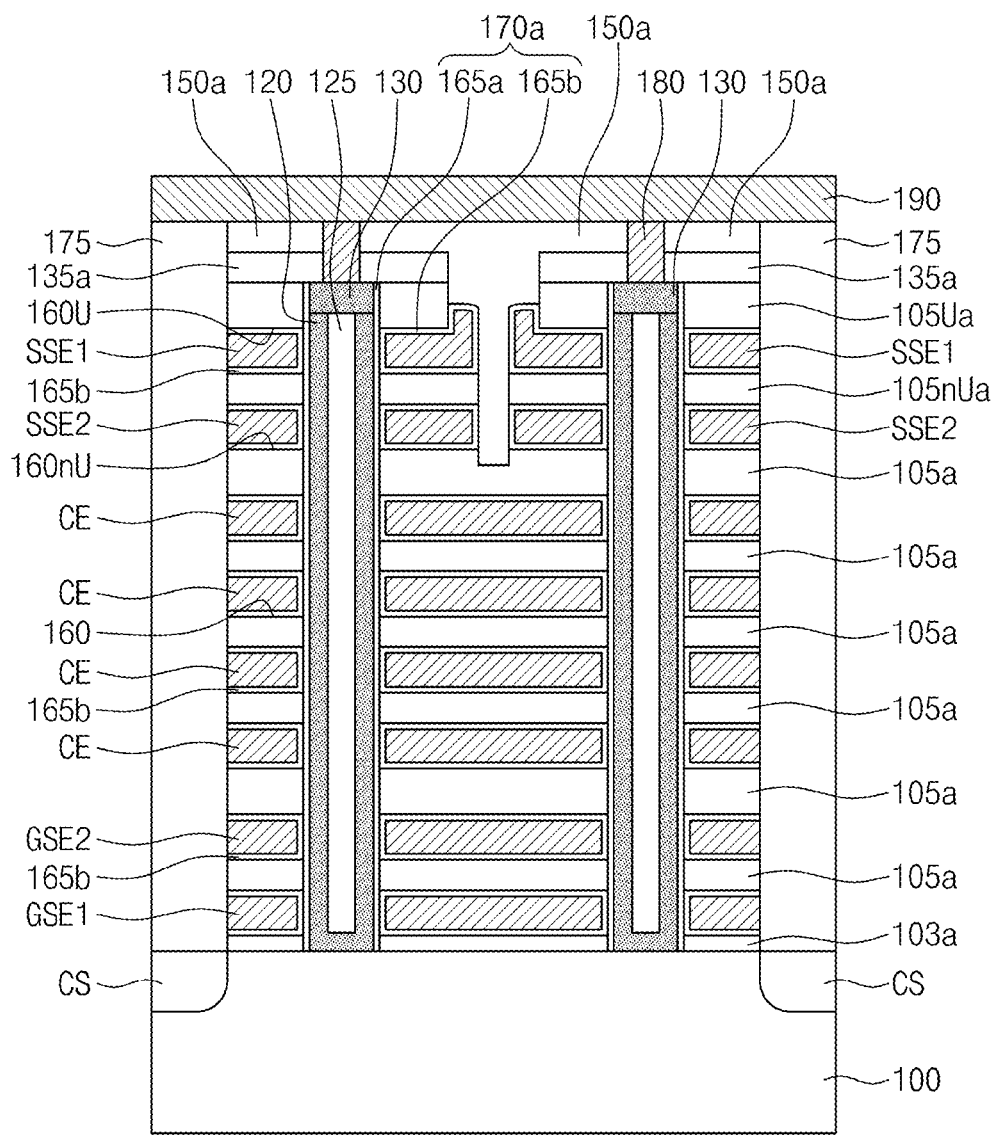
FIG. 29 illustrates a cross sectional view taken along a line I-I' of FIG. 27A to illustrate another modified embodiment of a three dimensional semiconductor memory device according to a third embodiment of the inventive concept.

FIG. 29 is a cross sectional view taken along a line I-I' of FIG. 27A to illustrate another modified embodiment of a three dimensional semiconductor memory device according to a third embodiment of the inventive concept.

Referring to FIG. 29, the electrode-dielectric layer 170a between the respective vertical active patterns 120 and the respective electrodes GSE1, GSE2, CE, SSE2, SSE1 may include a first portion 165a and a second portion 165b. The second portion 165b of the electrode-dielectric layer 170a between the respective vertical active patterns 120 and the respective first string selection electrodes SSE1 may extend to cover a bottom surface, a top surface and a first outer sidewall of the respective first string selection electrodes SSE1. Similarly, the second portion 165b of the electrode-dielectric layer 170a between the respective vertical active patterns 120 and the respective second string selection electrodes SSE2 may extend to cover a bottom surface, a top surface, and a first outer sidewall of the respective second string selection electrodes SSE2.

Figure 30A:
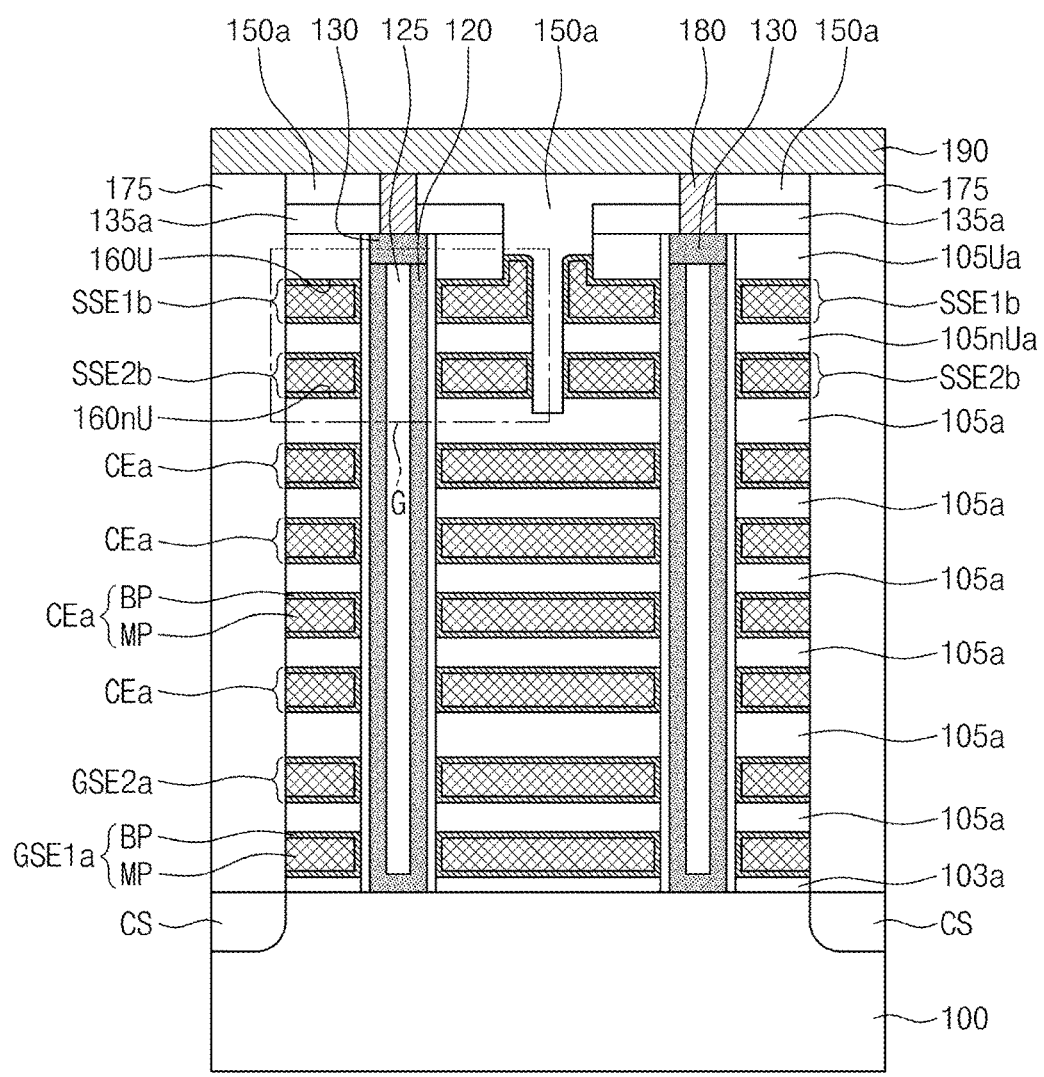
FIG. 30A illustrates a cross sectional view taken along a line I-I' of FIG. 27A of still another modified embodiment of a three dimensional semiconductor memory device according to a third embodiment of the inventive concept.
Figure 30B:
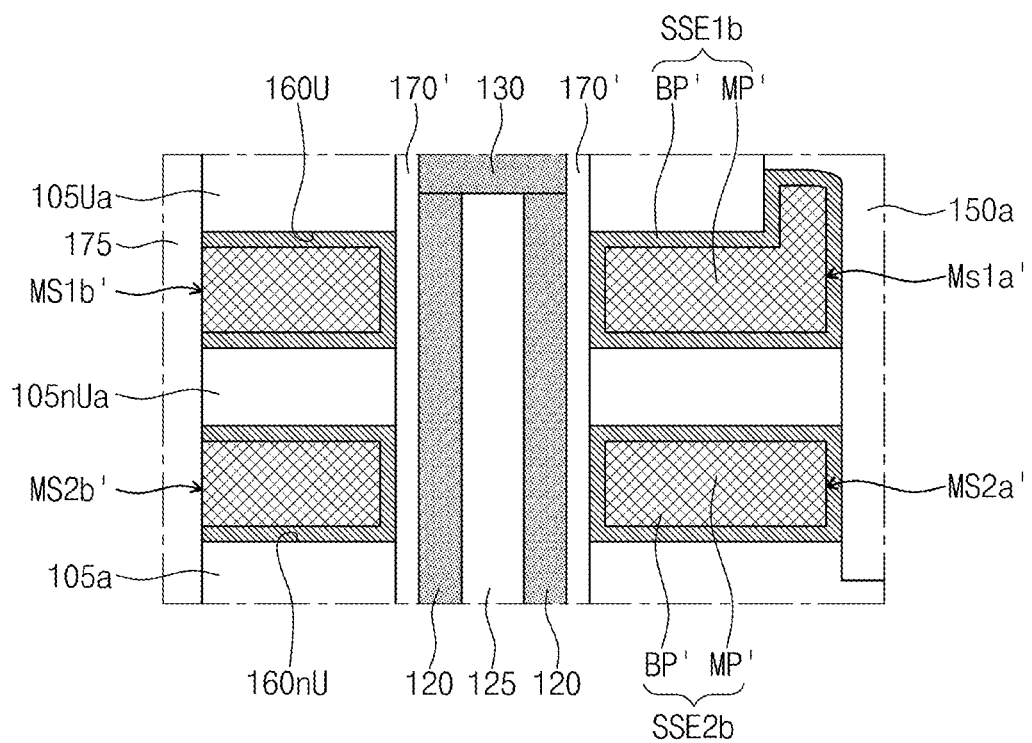
FIG. 30B illustrates an enlarged view of a portion 'G' of FIG. 30A.

FIG. 30A is a cross sectional view taken along a line I-I' of FIG. 27A to illustrate still another modified embodiment of a three dimensional semiconductor memory device according to a third embodiment of the inventive concept, and FIG. 30B is an enlarged view illustrating a portion 'G' of FIG. 30A.

Referring to FIGS. 30A and 30B, each of the first and second string selection electrodes SSE1b and SSE2b may include a metal pattern MP' and a barrier conductive pattern BP'. The metal pattern MP' of the first string selection electrode SSE1b may have a first outer sidewall MS1a' and a second outer sidewall MS1b' that face each other. The barrier conductive pattern BP' of the second string selection electrode SSE2b may also have a first outer sidewall MS2a' and a second outer sidewall MS2b' that face each other. The first and second outer sidewalls MS2a' and MS2b' of the metal pattern MP' in the second string selection electrode SSE2b may be vertically aligned with the first and second outer sidewalls MS1a' and MS1b' of the metal pattern MP' in the first string selection electrode SSE1b.

The barrier pattern BP' in the first string selection electrode SSE1b may be in contact with a bottom surface, a top surface, and the first outer sidewall MS1a' of the metal pattern MP' in the first string selection electrode SSE1b. The second outer sidewall MS1b' of the metal pattern MP' in the first string selection electrode SSE1b may not be in contact with the barrier conductive pattern BP' in the first string selection electrode SSE1b. Similarly, the barrier pattern BP' in the second string selection electrode SSE2b may be in contact with a bottom surface, a top surface, and the first outer sidewall MS2a' of the metal pattern MP' in the second string selection electrode SSE2b. The second outer sidewall MS2b' of the metal pattern MP' in the second string selection electrode SSE2b may not be in contact with the barrier conductive pattern BP' in the second string selection electrode SSE2b.

The metal pattern MP' in the first string selection electrode SSE1b may be separated from the metal pattern MP' in the second string selection electrode SSE2b. The barrier conductive pattern BP' in the first string selection electrode SSE1b may also be separated from the barrier conductive pattern BP' in the second string selection electrode SSE2b.

The metal patterns MP' of the string selection electrodes SSE1b and SSE2b may be formed of the same material as metal patterns MP of the cell electrodes CEa. Similarly, the barrier conductive patterns BP' of the string selection electrodes SSE1b and SSE2b may be formed of the same material as barrier conductive patterns BP of the cell electrodes CEa.

In the meantime, the non sacrificial pattern 150a between the second string selection electrodes SSE2 in FIG. 27B may extend further downwardly. As a result, the non sacrificial pattern 150a may penetrate at least the uppermost cell electrode CE, as illustrated in FIG. 44 of a fourth embodiment to be described hereinafter. In this case, each of the electrode structures may include a plurality of uppermost cell electrodes which are laterally separated from each other. The plurality of uppermost cell electrodes may be located at a same level from a top surface of the substrate 100. In this case, one outer sidewall of each of the plurality of uppermost cell electrodes adjacent to the non sacrificial pattern 150a may be covered with an extension of electrode-dielectric layer 170. In an embodiment, the non sacrificial pattern 150a may further extend downwardly to penetrate the next uppermost cell electrode in addition to the uppermost cell electrode.

FIGS. 31A to 35A illustrate plan views of stages in a method of fabricating a three dimensional semiconductor memory device according to a third embodiment of the inventive concept. FIGS. 31B to 35B are cross sectional views taken along lines I-I' of FIGS. 31A to 35A, respectively.

Figure 31A:
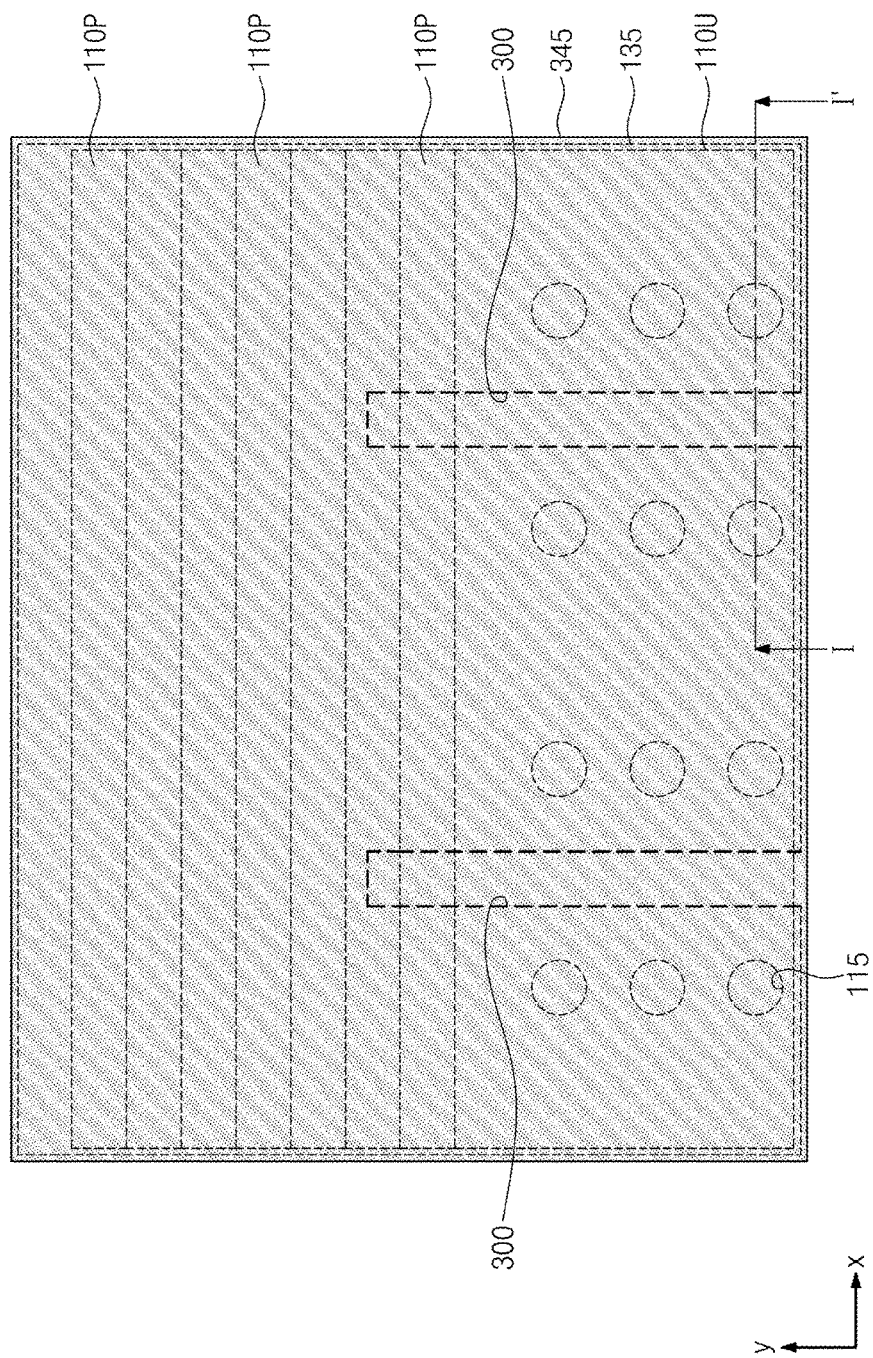
Figure 31B:
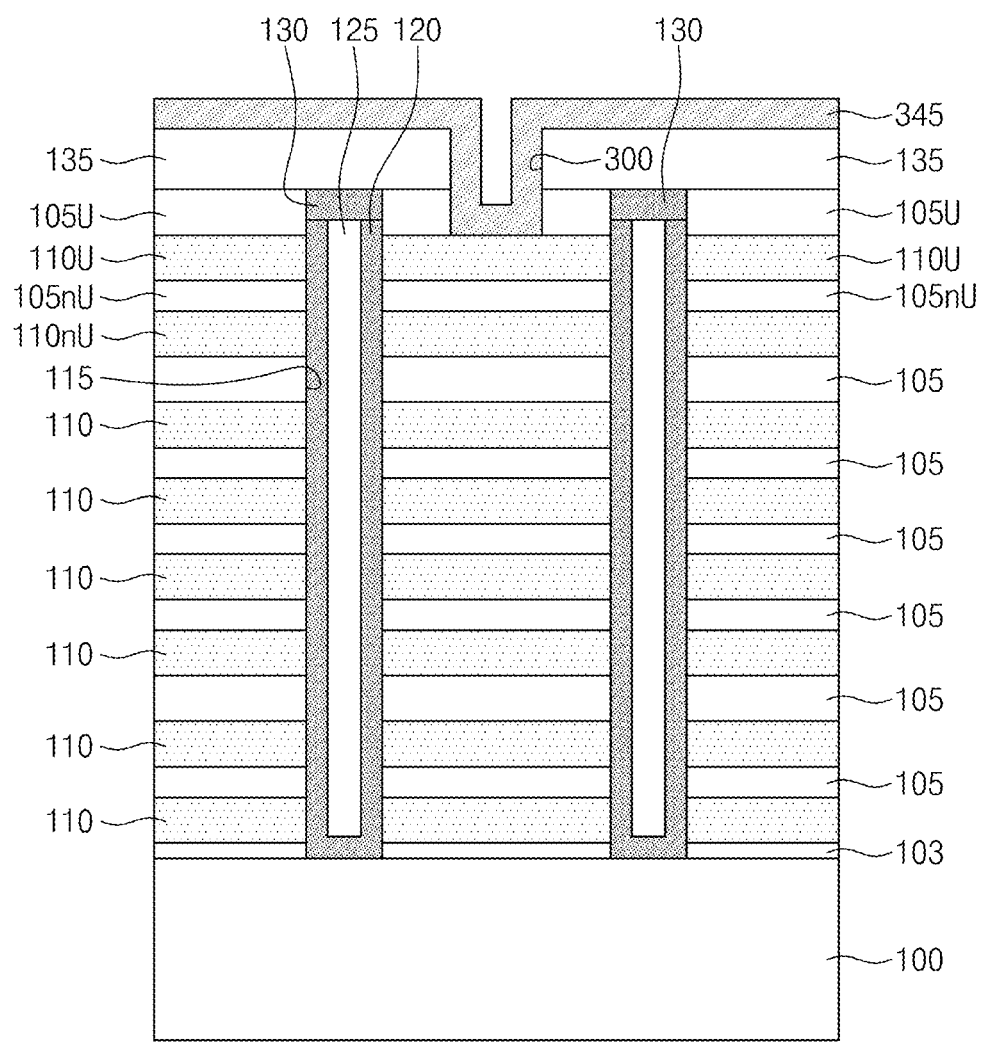

Referring to FIGS. 31A and 31B, the insulating layers 105U, 105nU, 105 and the sacrificial layers 110U, 110nU, 110 may be patterned to form sacrificial pads 110P exhibiting a stepped structure. The capping dielectric layer 135 may be formed on the substrate having the sacrificial pads 110P.

The capping dielectric layer 135 and the uppermost insulating layer 105U may be patterned to form guide openings 300. The guide openings 300 may expose the uppermost sacrificial layer 110U. As illustrated in FIG. 31A, each of the guide openings 300 may have a groove shape extending in a y-axis direction.

The holes 115 and the vertical active patterns 120 may be formed after formation of the sacrificial pads 110P. The holes 115 and the vertical active patterns 120 may be formed prior to formation of the guide openings 300.

A spacer layer 345 may be conformably formed on the substrate including the guide openings 300. The spacer layer 345 may be formed of the same material as the spacer layer 145 of the first embodiment described above.

Figure 32A:
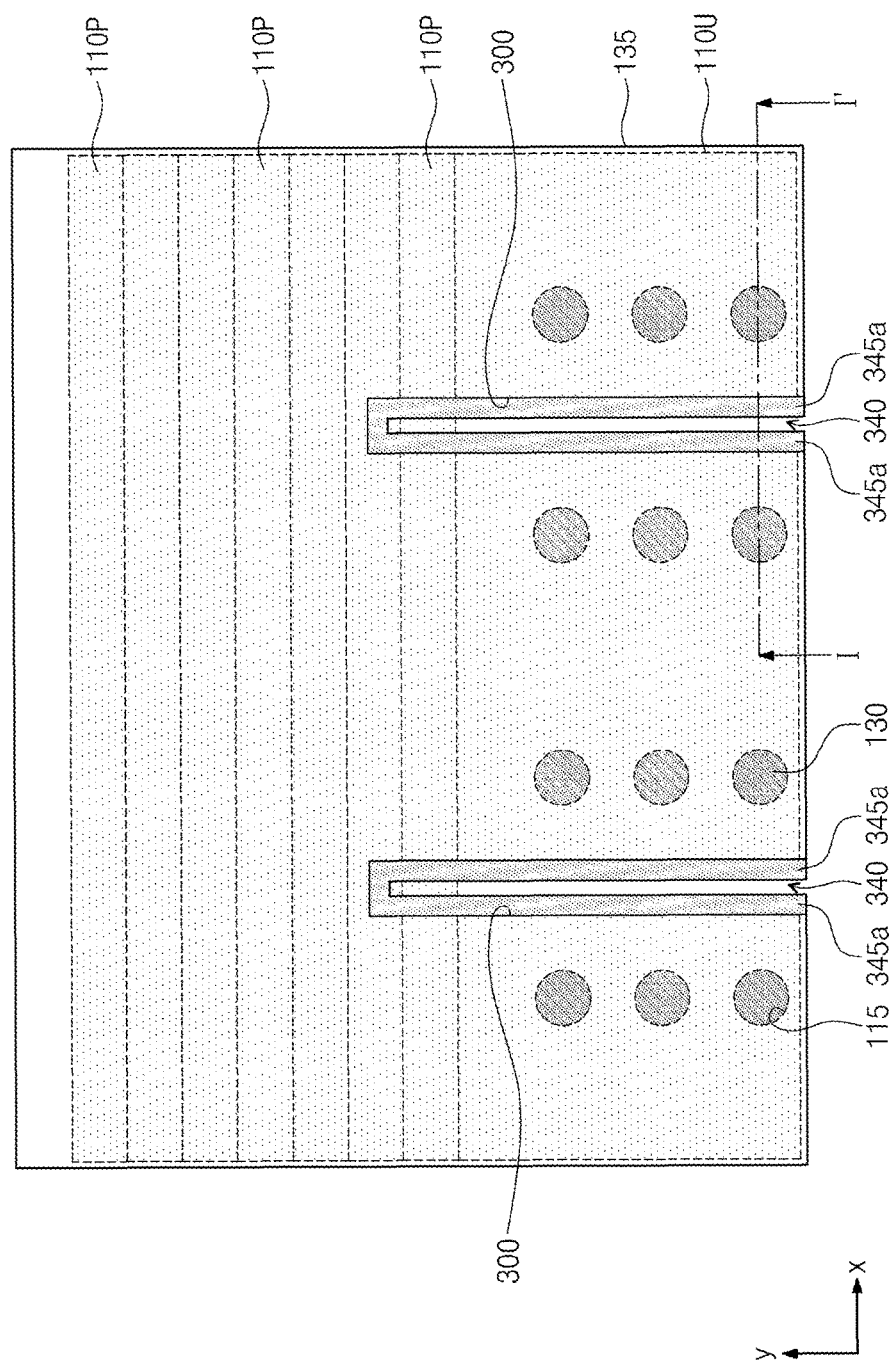
Figure 32B:
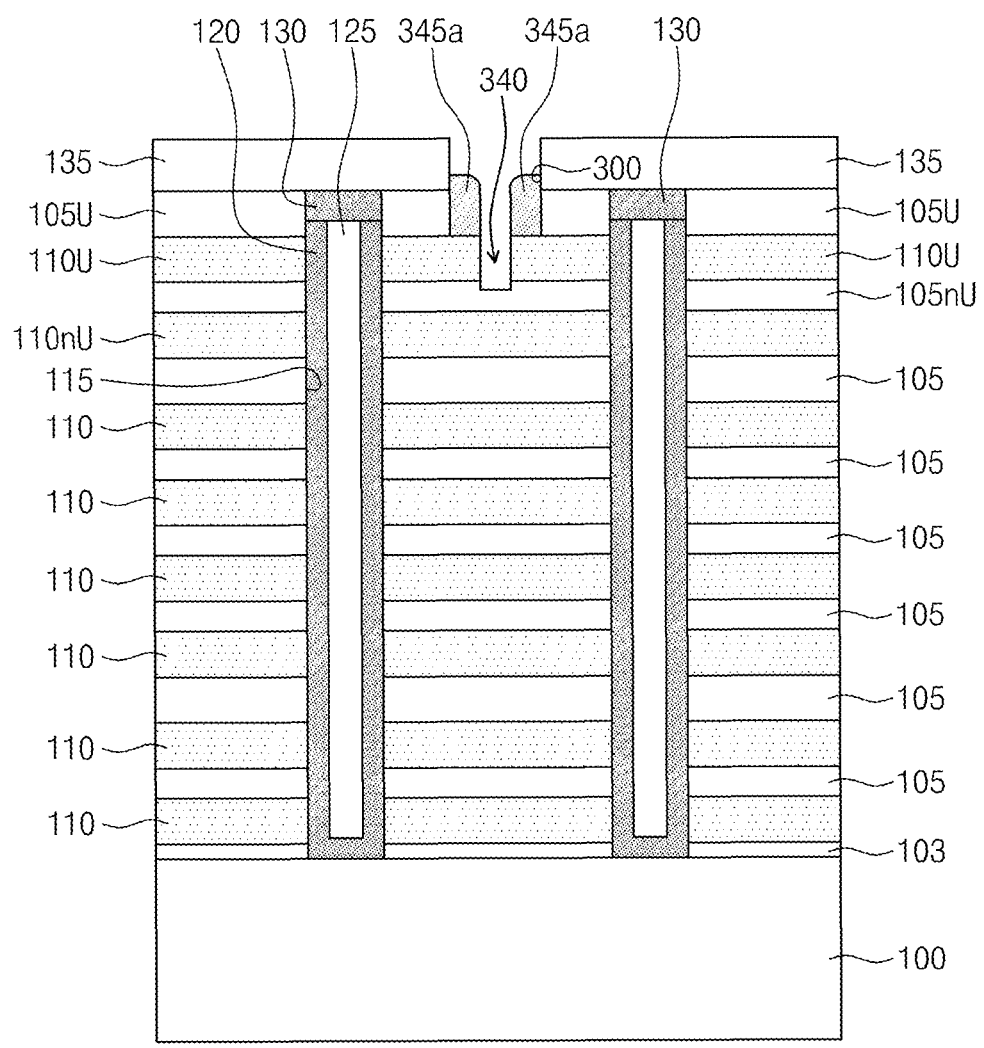

Referring to FIGS. 32A and 32B, the spacer layer 345 and the uppermost sacrificial layer 110U may be etched using a blanket anisotropic etching technique, thereby forming cutting regions 340. As a result, a pair of sacrificial spacers 345a may be formed on both inner sidewalls of each of the guide openings 300. Each of the cutting regions 340 may be formed under a region between the pair of adjacent sacrificial spacers 345a in each of the guide openings 300. While the uppermost sacrificial layer 110U is etched, portions of the spacer layer 345 on the inner sidewalls of the guide openings 300 may be etched. As such, upper ends of the sacrificial spacers 345a may be located at a lower level than a top surface of the capping dielectric layer 135. The cutting regions 340 may cut the uppermost sacrificial layer 110U.

As illustrated in FIG. 32A, the pair of sacrificial spacers 345a in each of the guide openings 300 may be connected to each other at an end portion of the guide opening 300. In the event that the sacrificial spacers 345a are formed after formation of the sacrificial pads 110F, the connections of the sacrificial spacers 345a may be formed in the capping dielectric layer 135 on any one of the sacrificial pads 110P which will be replaced with electrode pads of the cell electrodes and the ground selection electrodes in a subsequent process.

Figure 33A:
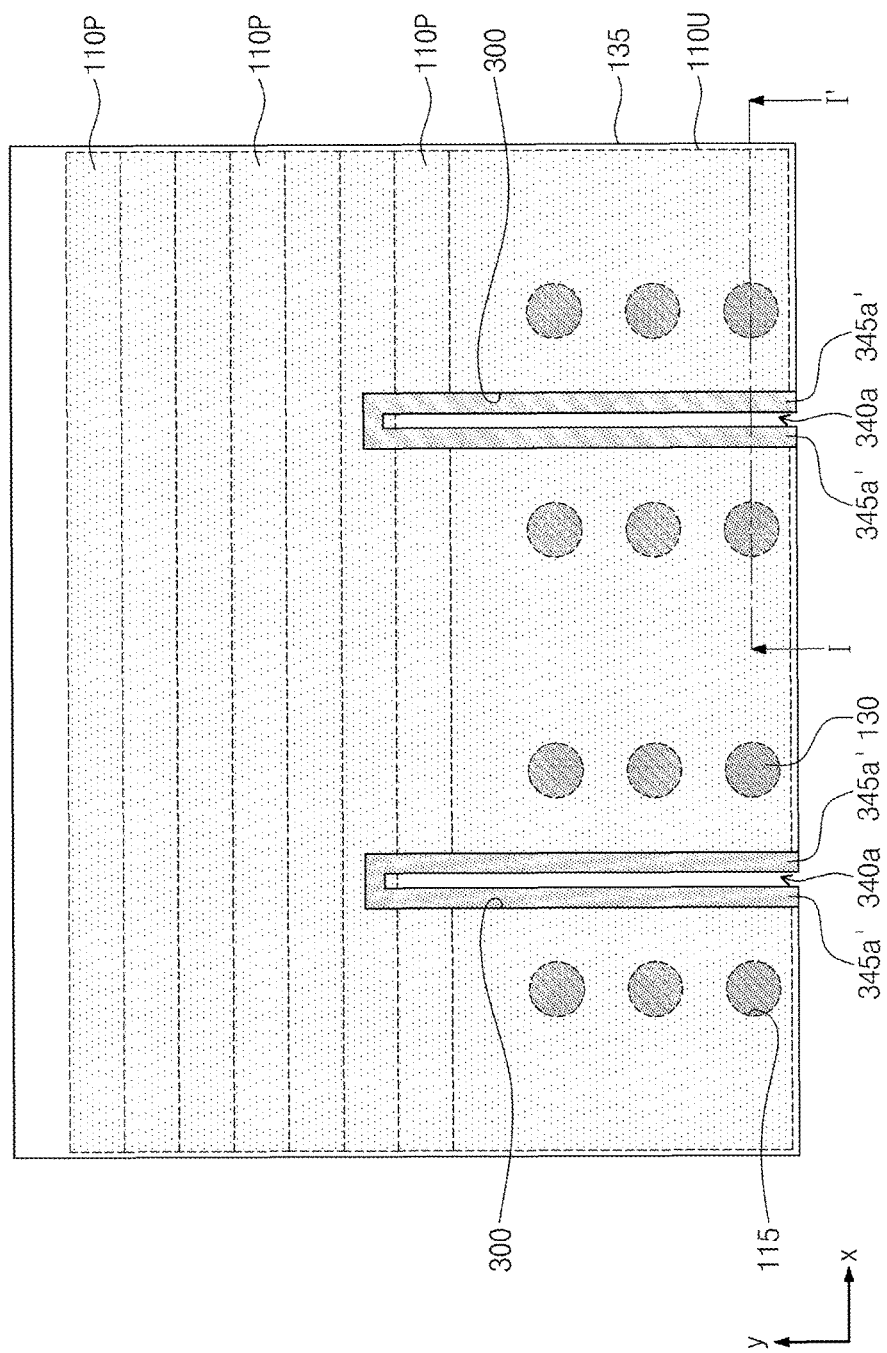
Figure 33B:
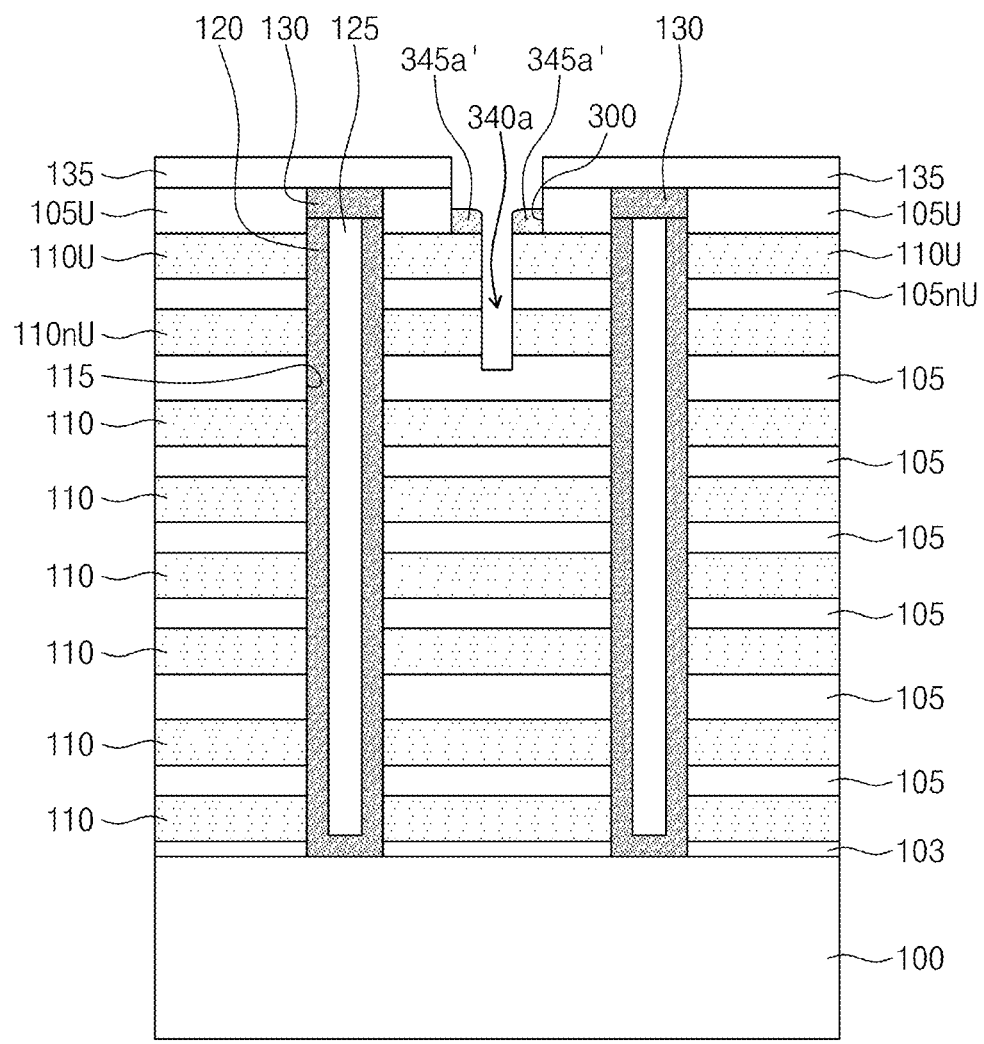

Referring to FIGS. 33A and 33B, the next uppermost insulating layer 105nU and the next uppermost sacrificial layer 110nU under the cutting regions 340 may be successively etched using the sacrificial spacers 345a as etching masks, thereby forming cutting regions 340a. The cutting regions 340a may be formed to cut the uppermost sacrificial layer 110U and the next uppermost sacrificial layer 110nU. In an embodiment, while the next uppermost sacrificial layer 110nU is etched, portions of the sacrificial spacers 345a may also be etched to form recessed sacrificial spacers 345a'. Thus, the recessed sacrificial spacers 345a' may become lower than the sacrificial spacers 345a. The recessed sacrificial spacers 345a' may be referred to as etched sacrificial spacers hereinafter.

Figure 34A:
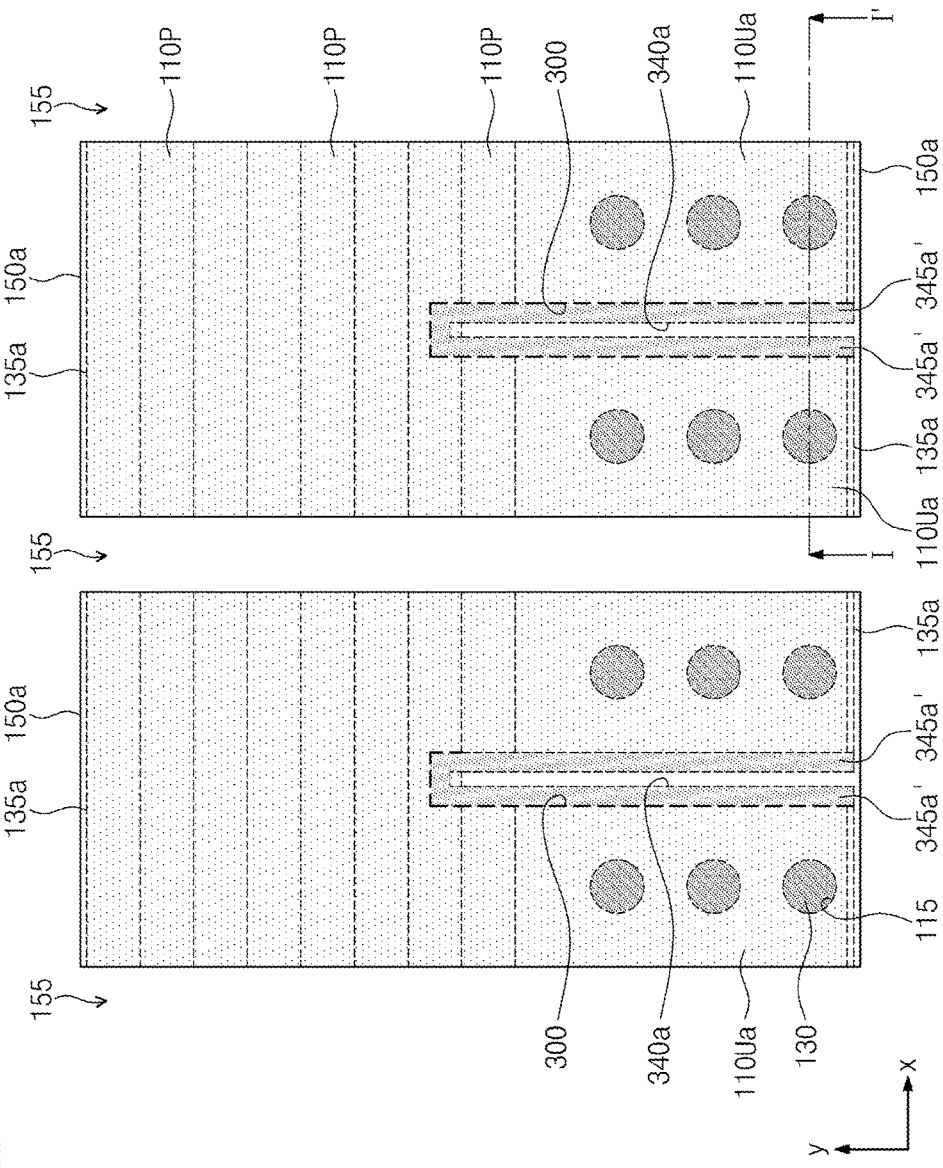
Figure 34B:
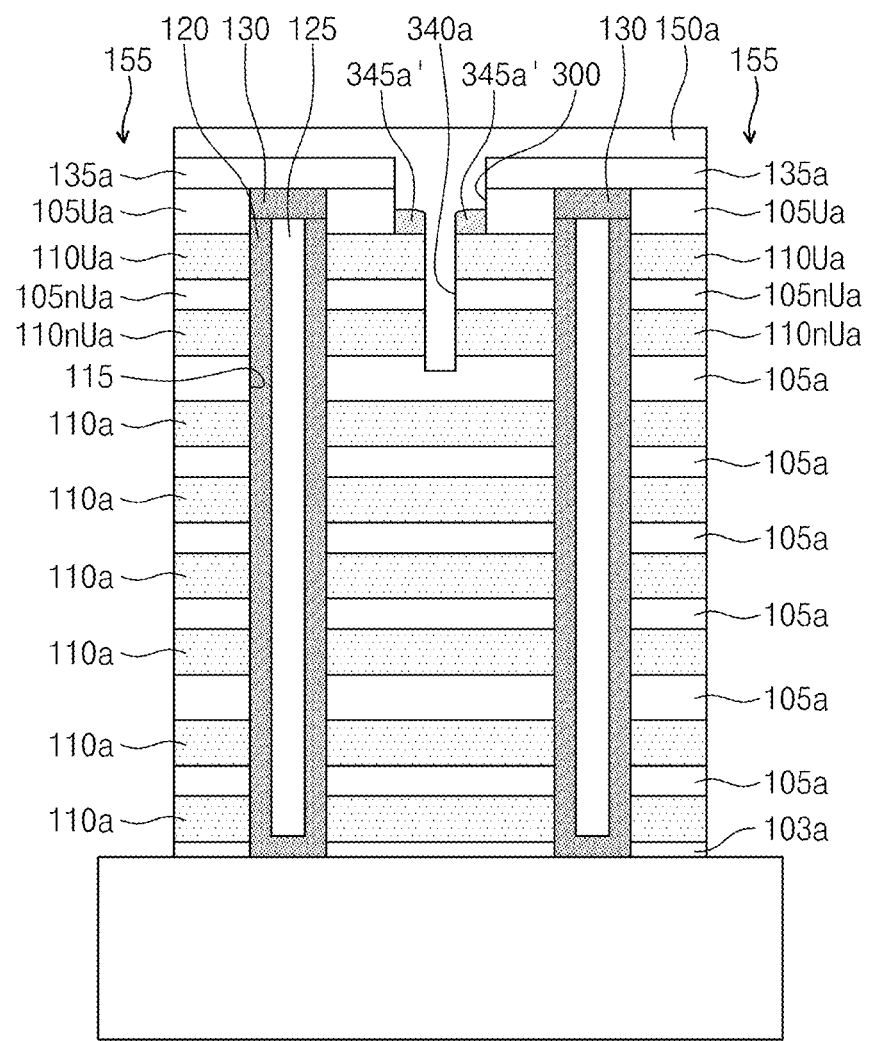

Referring to FIGS. 34A and 34B, a non sacrificial layer filling the cutting regions 340a and the guide openings 300 may be formed on the substrate. The non sacrificial layer, the capping dielectric layer 135, the insulating layers 105U, 105nU, 105, the sacrificial layers 110U, 110nU, 110, and the buffer dielectric layer 103 may be patterned to form trenches 155 defining a plurality of mold patterns. As a result, each of the mold patterns may include insulating patterns 105a, 105nUa, 105Ua, sacrificial patterns 110a, 110nUa, 110Ua, a capping dielectric pattern 135a, a non sacrificial pattern 150a, and a buffer dielectric pattern 103a which are stacked.

In each of the mold patterns, the non sacrificial pattern 150a may be in contact with the uppermost sacrificial patterns 110Ua and the next uppermost sacrificial patterns 110nUa which constitute both inner sidewalls of the cutting region 340a.

Figure 35A:
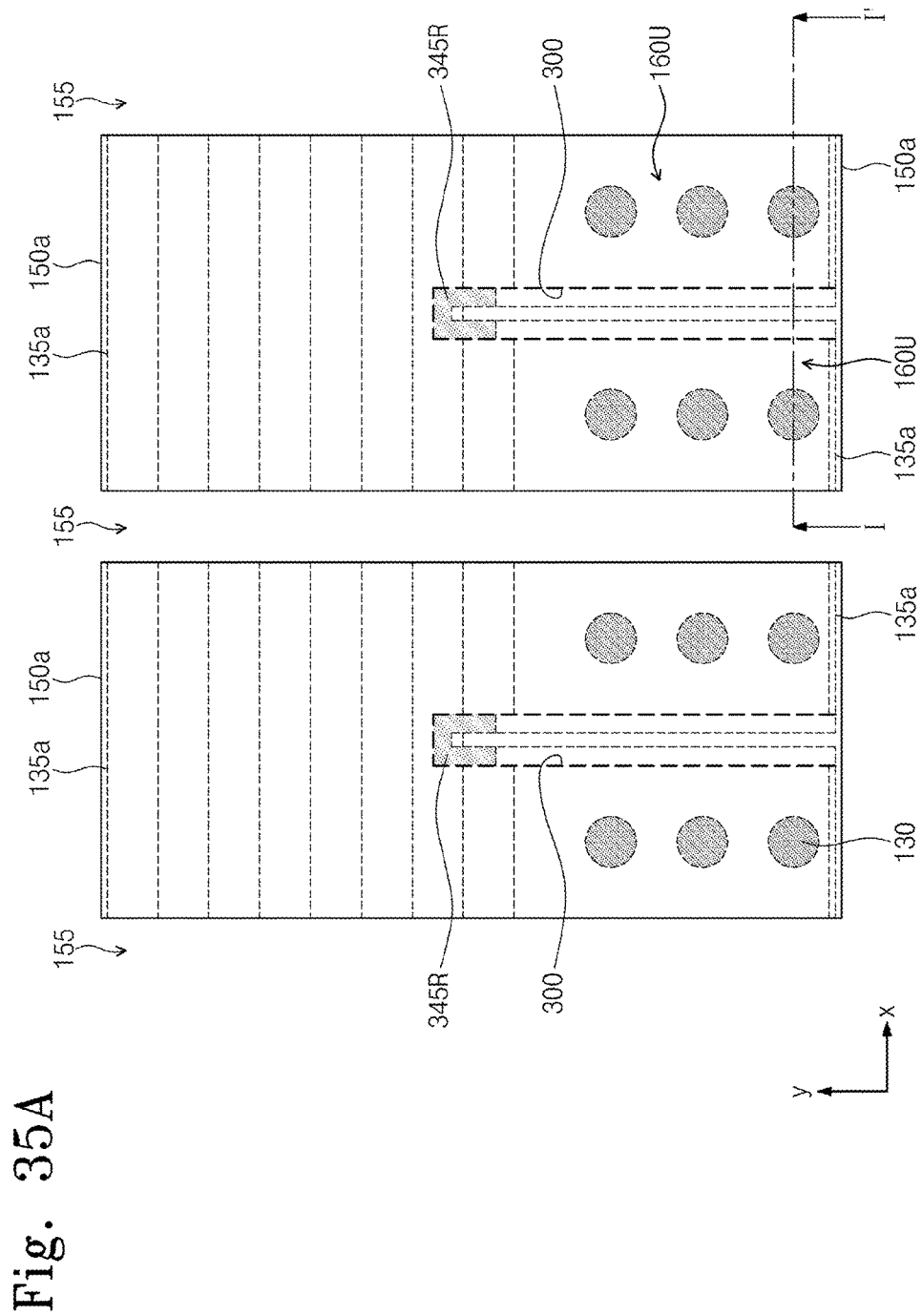
Figure 35B:
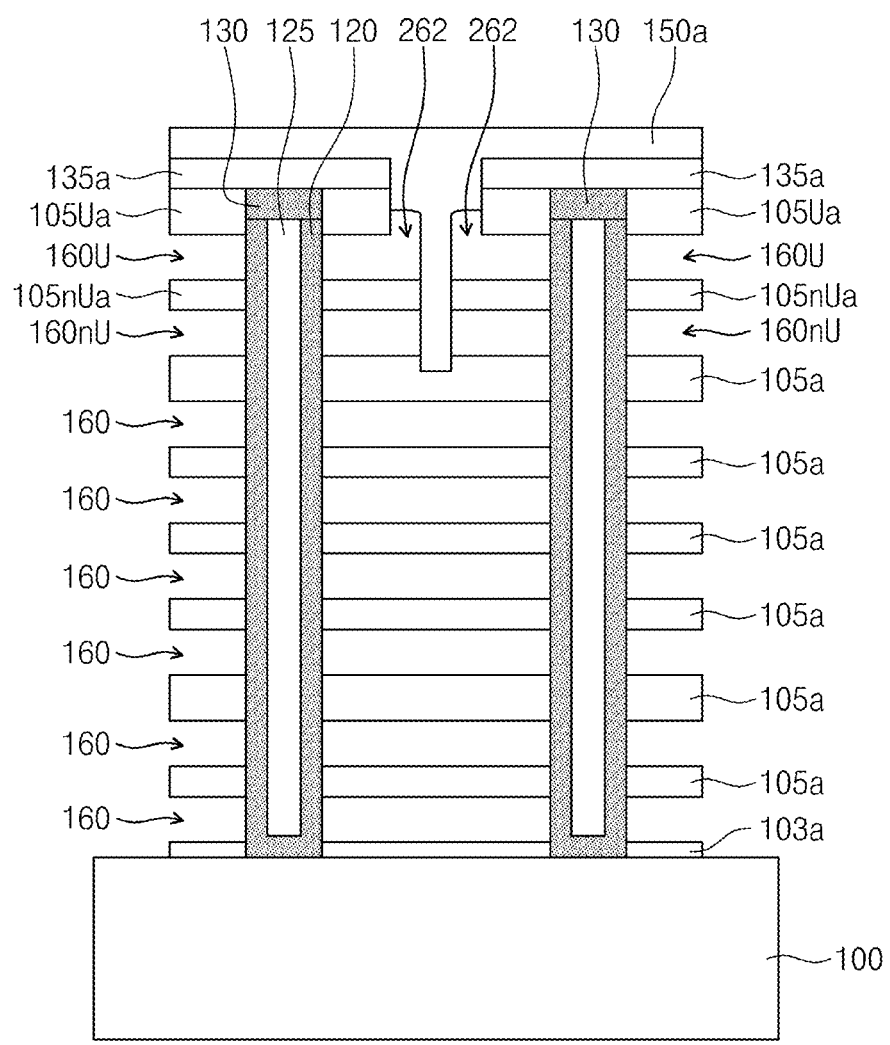

Referring to FIGS. 35A and 35B, the sacrificial patterns 110a, 110nUa, 110Ua may be removed to form empty regions 160, 160nU, 160U. While the sacrificial patterns 110a, 110nUa, 110Ua are removed, the etched sacrificial spacers 345a' may also be removed. In this case, the connections 345R of the sacrificial spacers 345a' located at the end portions of the guide openings 300 may be left, as illustrated in FIG. 35A. The connections 345R may be referred to as residual sacrificial patterns 345R. In each of the mold patterns, the residual sacrificial pattern 345R may separate a first region where the sacrificial spacer 345a' on one inner sidewall of the guide opening 300 is removed from a second region where the sacrificial spacer 345a' on the other inner sidewall of the guide opening 300 is removed.

Subsequently, an electrode-dielectric layer 170 may be conformably formed on the substrate having the empty regions 160, 160nU, 160U, and a conductive layer filling the empty regions 160, 160nU, 160U may be formed on the electrode-dielectric layer 170. The conductive layer may be etched to form the electrodes GSE1, GSE2, CE, SSE2, SSE1 illustrated in FIGS. 27A, 27B, and 27C. The following processes may be performed using the same manners as described in the previous embodiments. As such, the three dimensional semiconductor memory device illustrated in FIGS. 27A, 27B, and 27C may be realized.

According to the fabrication method described above, the cutting regions 345a and the non sacrificial layer 150 may be formed prior to formation of the trenches 155. Thus, the first outer sidewalls S1a' and S2a' of the string selection electrodes SSE1 and SSE2 may be protected from an etching process. That is, physical loss of the string selection electrodes SSE1 and SSE2 due to an etching process may be minimized to prevent the electrical resistance of the string selection electrodes SSE1 and SSE2 from increasing.

Moreover, the cutting regions 340a may be formed using the sacrificial spacers 345a in the guide openings 300 as etching masks, thereby increasing lateral widths of the uppermost empty regions 160U and the next uppermost empty regions 160nU. As such, widths of the string selection electrodes SSE1 and SSE2 may increase to reduce the electrical resistance of the string selection electrodes SSE1 and SSE2. As a result, a high reliable and highly integrated three dimensional semiconductor memory device may be realized.

According to the fabrication method described above, the guide openings 300 may be formed after formation of the sacrificial pads 110P. Alternatively, the sacrificial pads 110P may be formed after formation of the guide openings 300. This modified embodiment will be described with reference to FIGS. 36 and 37 hereinafter.

Figure 36:
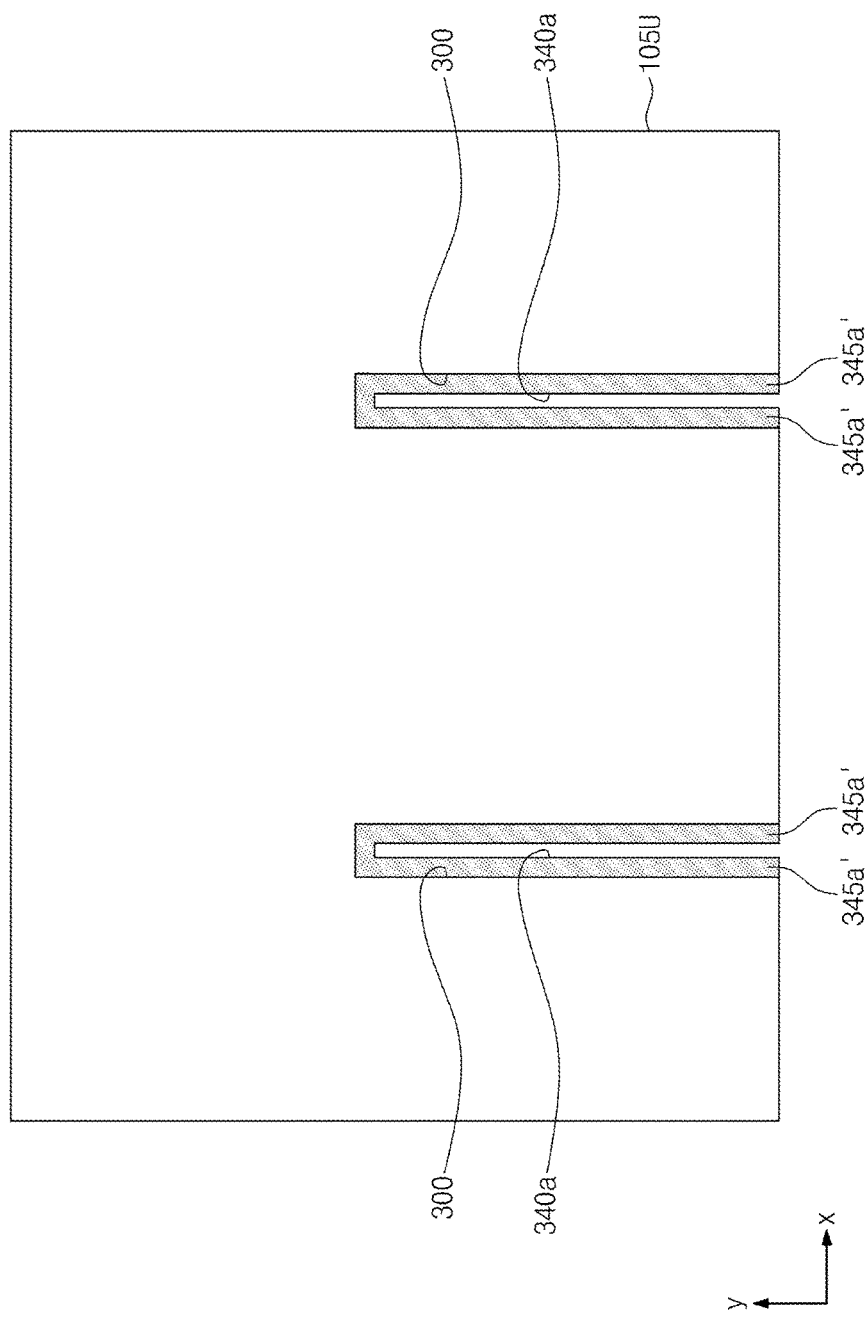
FIGS. 36 and 37 illustrate plan views of a modified embodiment of a three dimensional semiconductor memory device according to a third embodiment of the inventive concept.
Figure 37:
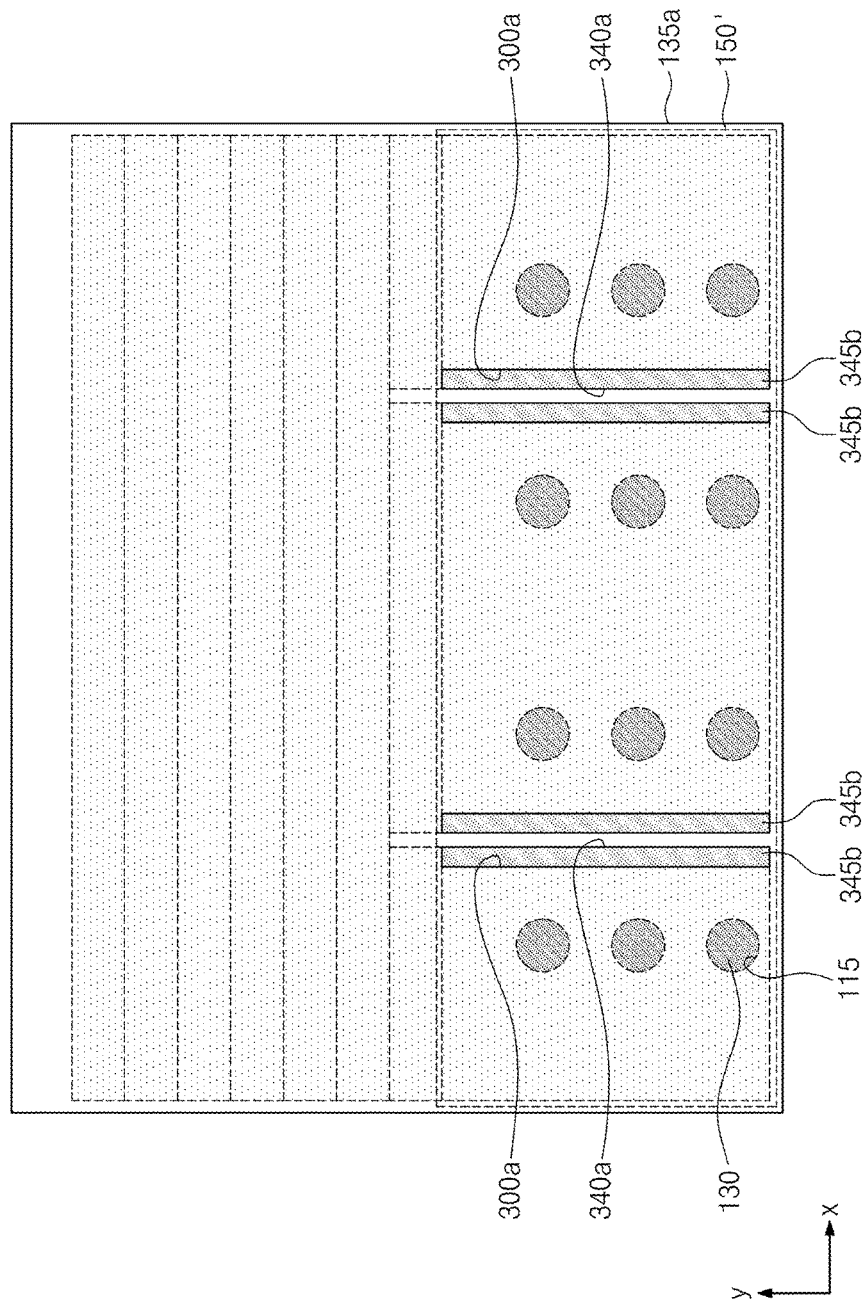

FIGS. 36 and 37 illustrate plan views of a modified embodiment of a three dimensional semiconductor memory device according to a third embodiment of the inventive concept.

Referring to FIG. 36, prior to formation of the sacrificial pads 110P, the uppermost insulating layer 105U may be patterned to form the guide openings 300. Subsequently, the processes described with reference to FIGS. 31A to 33A and FIGS. 31B to 33B may be performed. As such, the sacrificial spacers 345a' may be formed on the inner sidewalls of the guide openings 300, and each of the cutting regions 340 may be formed under a region between the pair of adjacent sacrificial spacers 345a in each of the guide openings 300.

Referring to FIG. 37, the non sacrificial layer filling the cutting regions 340a may be formed on the substrate. The non sacrificial layer, the insulating layers, and the sacrificial layers may be patterned to form sacrificial pads 110P exhibiting a stepped structure. During formation of the sacrificial pads 110P, end portions of the guide openings 300 and connections of the sacrificial spacers 345a' may be simultaneously removed to form sacrificial spacers 345b on inner sidewalls of the guide openings 300 and separated from each other. The following processes may be performed using the same manners as described with reference to FIGS. 34A and 34B and FIGS. 35A and 35B. As such, the three dimensional semiconductor memory device illustrated in FIGS. 28A and 28B may be realized.

Figure 38:
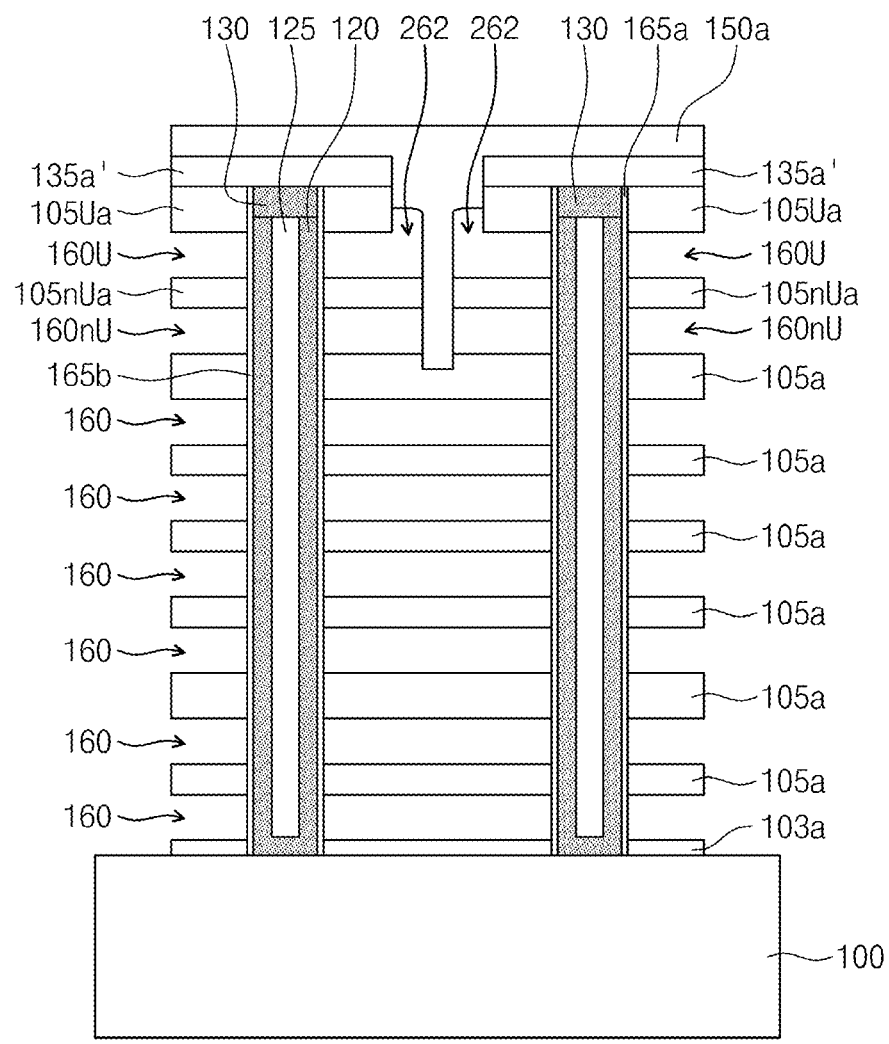
FIG. 38 illustrates a cross sectional view of another modified embodiment of a three dimensional semiconductor memory device according to a third embodiment of the inventive concept.

FIG. 38 illustrates a cross sectional view of another modified embodiment of a three dimensional semiconductor memory device according to a third embodiment of the inventive concept.

First, prior to formation of the vertical active patterns 120 described with reference to FIGS. 31A and 31B, a first portion 165a of an electrode-dielectric layer may be formed on inner sidewalls of the holes 115. As such, empty regions 160, 160nU, 160U exposing the first portion 165a of the electrode-dielectric layer may be formed, as illustrated in FIG. 38. A second portion 165b of the electrode-dielectric layer may be conformably formed on the substrate having the empty regions 160, 160nU, 160U. Electrodes GSE1, GSE2, CE, SSE2, SSE1 filling the empty regions 160, 160nU, 160U may be then formed. As such, the three dimensional semiconductor memory device illustrated in FIG. 29 may be realized.

In the meantime, an entire portion of an electrode-dielectric layer 170' may be formed on the inner sidewalls of the holes 115 prior to formation of the vertical active patterns 120. In this case, the empty regions 160, 160nU, 160U may expose the electrode-dielectric layer 170' located on the sidewalls of the vertical active patterns 120. A conductive layer may be then formed to fill the empty regions 160, 160nU, 160U exposing the electrode-dielectric layer 170', and the conductive layer may be etched to form electrodes in the empty regions 160, 160nU, 160U. In an embodiment, the conductive layer may be formed to include a barrier conductive layer and a metal layer. In this case, the three dimensional semiconductor memory device illustrated in FIGS. 30A and 30B may be realized.

Fourth Embodiment

Figure 39A:
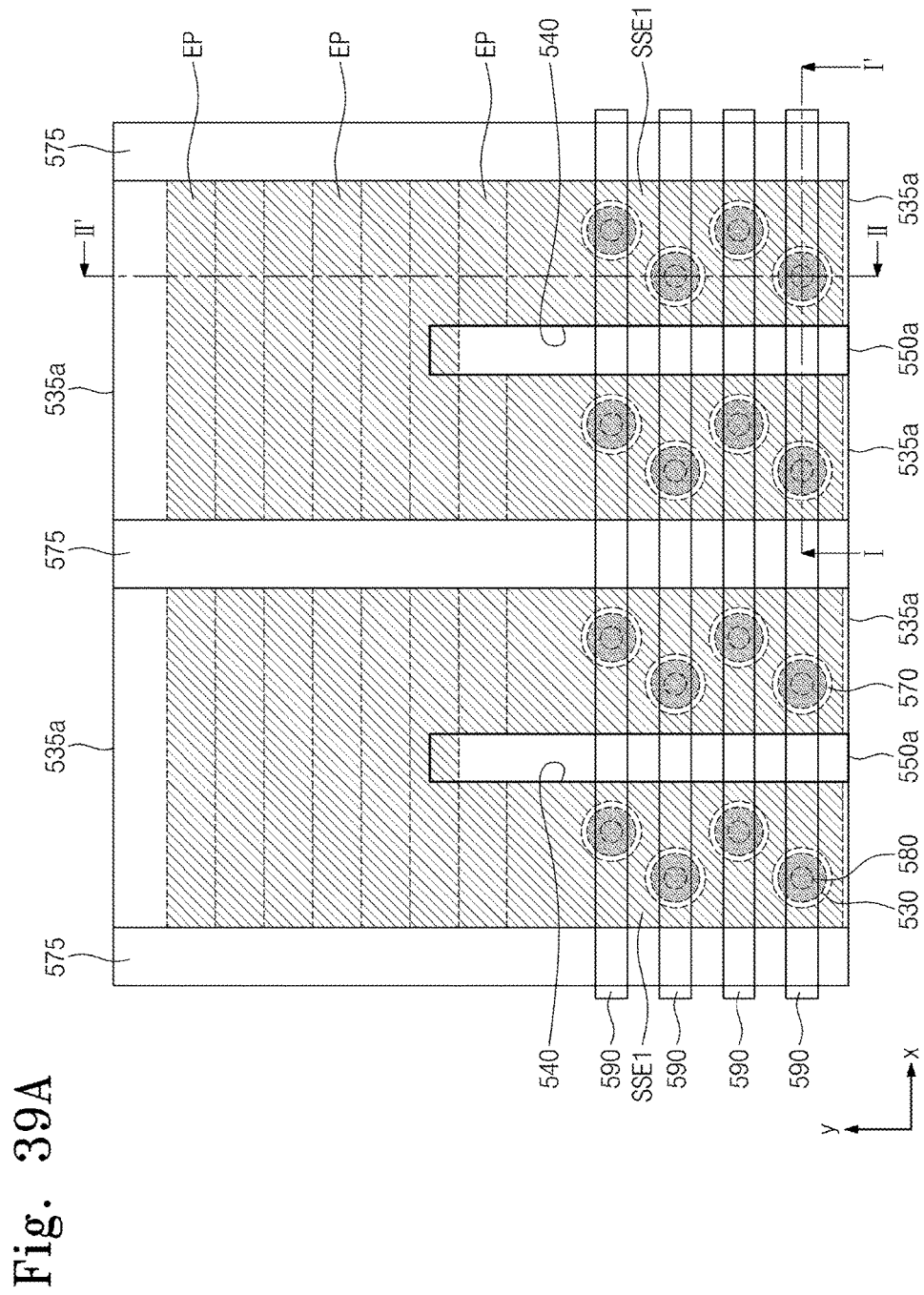
FIG. 39A illustrates a plan view of a three dimensional semiconductor memory device according to a fourth embodiment of the inventive concept.
Figure 39B:
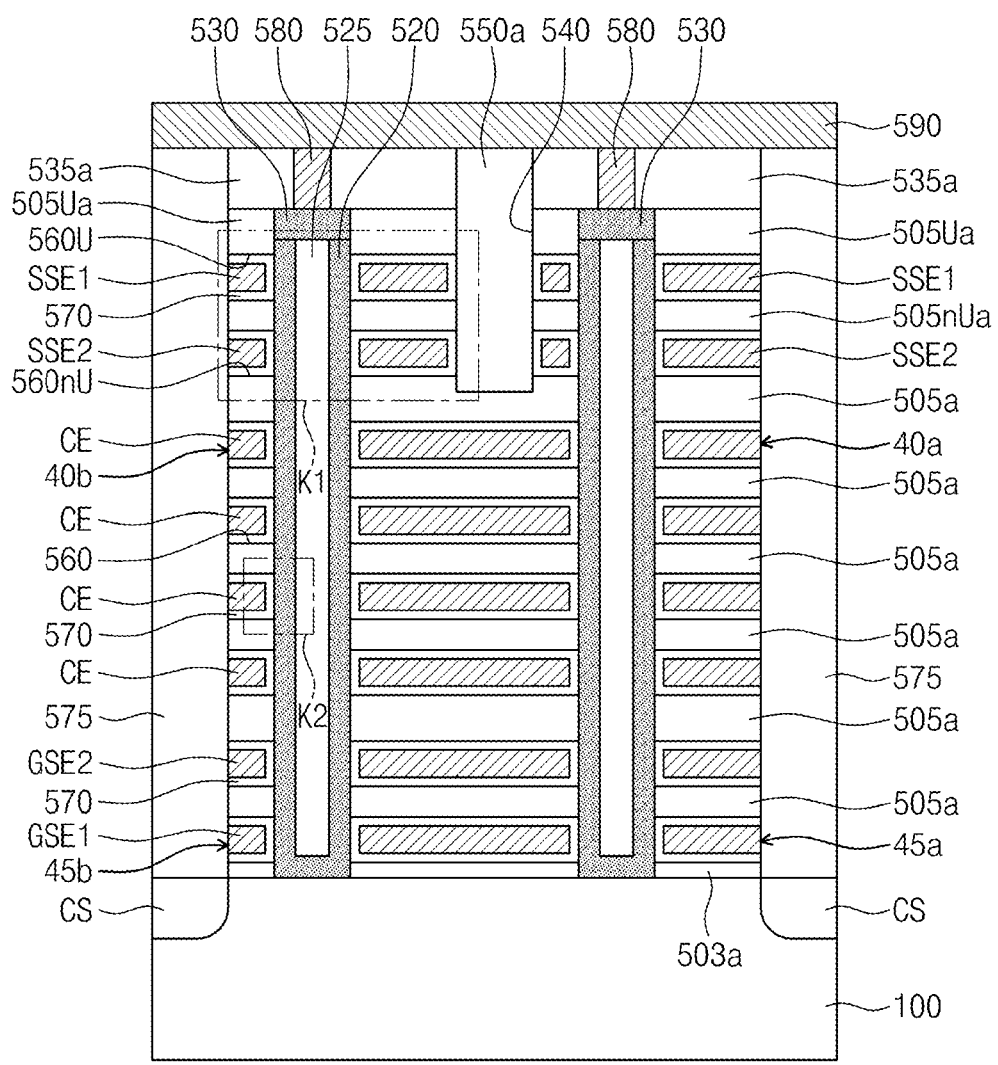
FIG. 39B illustrates a cross sectional view taken along a line I-I' of FIG. 39A.
Figure 39C:
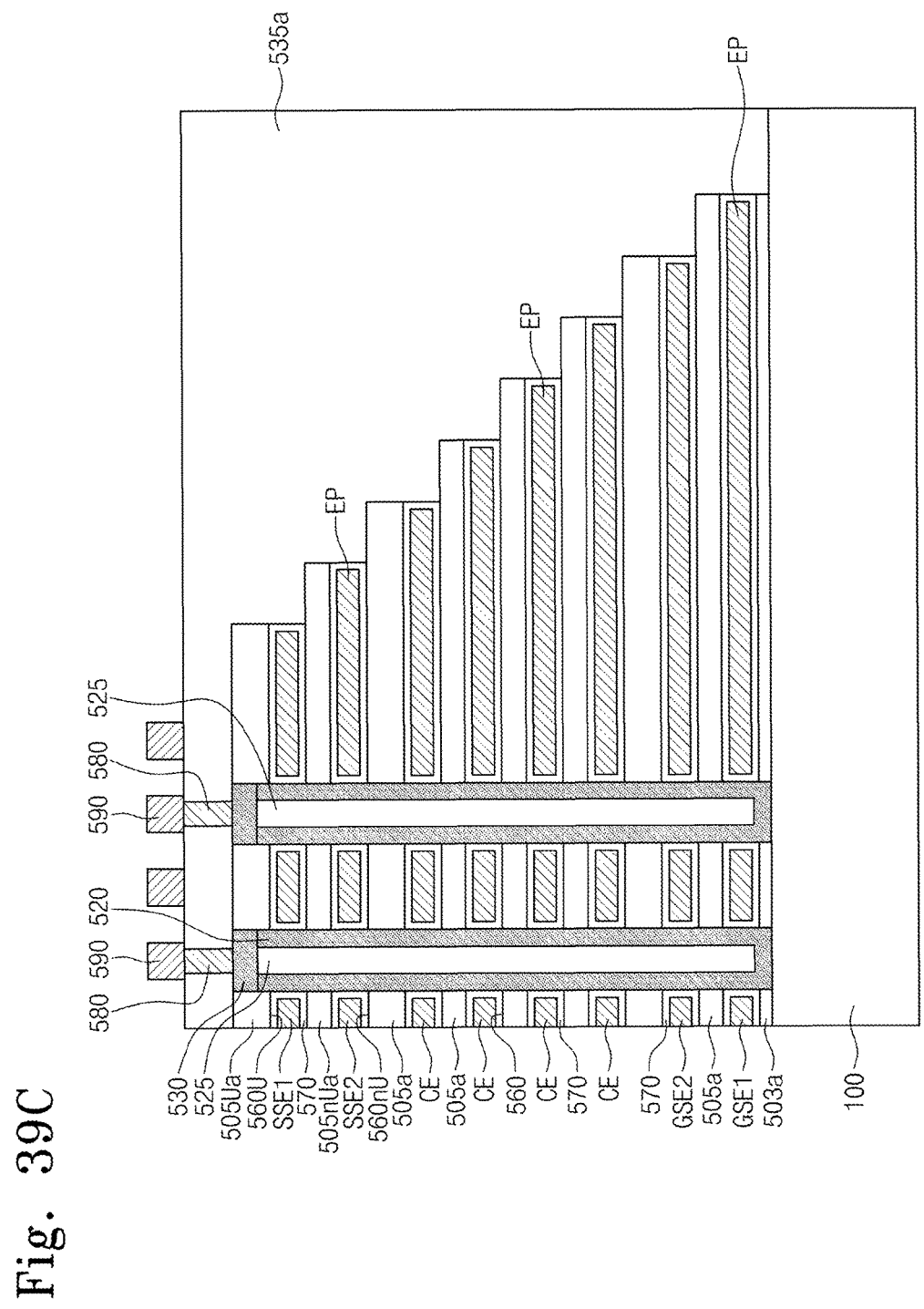
FIG. 39C illustrates a cross sectional view taken along a line II-IF of FIG. 39A.
Figure 39D:
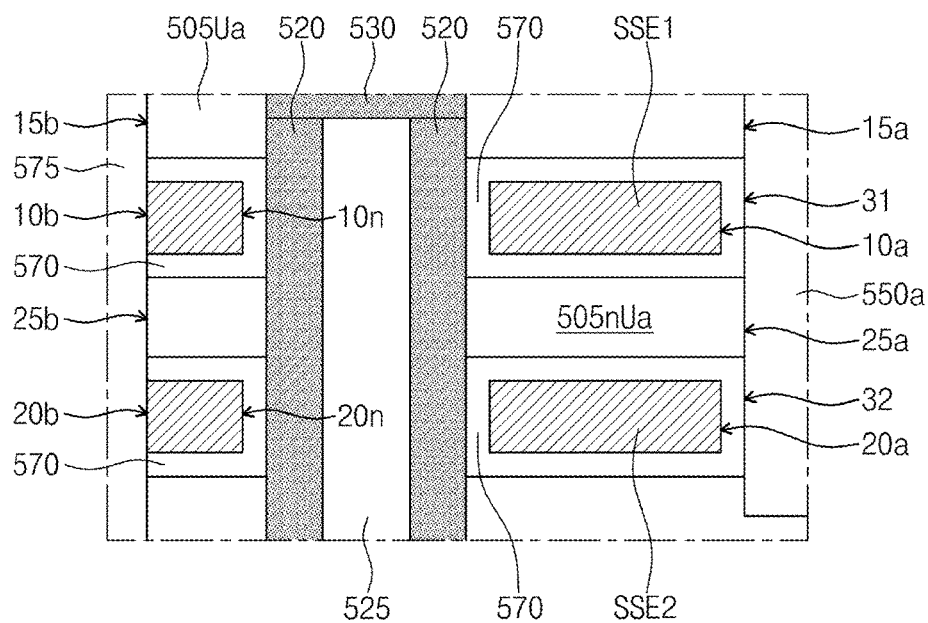
FIG. 39D illustrates an enlarged view of a portion 'K1' of FIG. 39B.
Figure 39E:
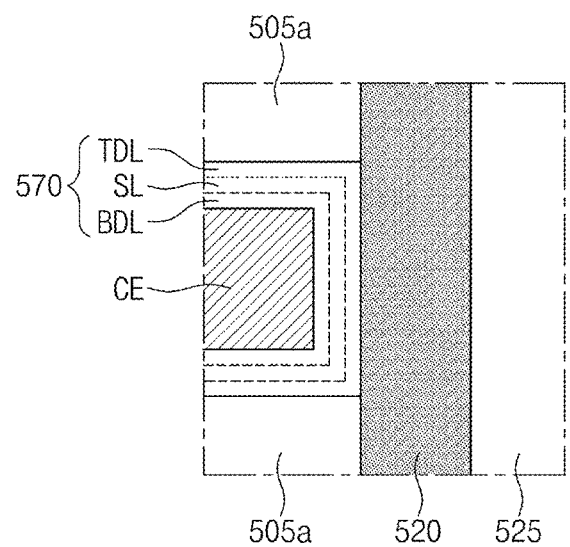
FIG. 39E illustrates an enlarged view of a portion 'K2' of FIG. 39B.

FIG. 39A illustrates a plan view of a three dimensional semiconductor memory device according to a fourth embodiment of the inventive concept. FIG. 39B is a cross sectional view taken along a line I-I' of FIG. 39A. FIG. 39C is a cross sectional view taken along a line II-II' of FIG. 39A. Further, FIG. 39D is an enlarged view illustrating a portion 'K1' of FIG. 39B and FIG. 39E is an enlarged view illustrating a portion 'K2' of FIG. 39B.

Referring to FIGS. 39A, 39B, and 39C, a plurality of electrode structures may be disposed on the semiconductor substrate 100 (hereinafter, referred to as a substrate). Each of the electrode structures may include a plurality of electrodes GSE1, GSE2, CE, SSE2, SSE1 and a plurality of insulating patterns 505a, 505nUa, 505Ua that are alternately and repeatedly stacked. The electrode structures may extend in parallel in a first direction, e.g., a y-axis direction, as illustrated in FIG. 39A. Further, the electrode structures may be spaced apart from each other in a second direction perpendicular to the first direction, e.g., an x-axis direction. Isolation patterns 575 may be disposed between the electrode structures. That is, two of the isolation patterns 575 may be disposed at both sides of each of the electrode structures, respectively. The isolation patterns 575 may also extend in parallel in the first direction when viewed from a plan view. The isolation patterns 575 may include an oxide layer, a nitride layer, and/or an oxynitride layer.

The electrodes in each electrode structure may include a plurality of cell electrodes CE that are sequentially stacked. Moreover, the electrodes in each electrode structure may include at least one floor of ground selection electrode GSE1 and/or GSE2 disposed between the substrate 100 and the lowermost cell electrode of the cell electrodes CE. In an embodiment, the first ground selection electrode GSE1 may be disposed between the substrate 100 and the lowermost cell electrode CE, and the second ground selection electrode GSE2 may be disposed between the lowermost cell electrode CE and the first ground selection electrode GSE1. However, the inventive concept is not limited to the above descriptions. For example, a single floor of ground selection electrode, three floors of ground selection electrodes, or more than three floors of ground selection electrodes may be disposed between the lowermost cell electrode and the substrate 100. In each of the electrode structures, the number of the first ground selection electrode GSE1 may be one, and the number of the second ground selection electrode GSE2 may also be one. Similarly, in each of the electrode structures, the number of the cell electrode CE disposed in each of floors may be one. For example, in each of the electrode structures, the number of the lowermost cell electrode may be one, and the number of an uppermost cell electrode among the cell electrodes CE may also be one.

The electrodes in each electrode structure may further include a plurality of first string selection electrodes SSE1. The plurality of first string selection electrodes SSE1 may be disposed at a same level, e.g., along a z-axis direction, from a top surface of the substrate 100. That is, the plurality of first string selection electrodes SSE1 may be disposed in a same floor. Thus, the plurality of first string selection electrodes SSE1 may be horizontally spaced apart from each other, e.g., along an x-axis direction. The plurality of first string selection electrodes SSE1 may extend in parallel in the first direction. The plurality of first string selection electrodes SSE1 may be controlled independently of each other.

In each electrode structure, the plurality of first string selection electrodes SSE1 may be disposed over the uppermost cell electrode. Thus, in each electrode structure, the plurality of first string selection electrodes SSE1 may be disposed over a single first ground selection electrode GSE1. The cell electrodes CE sequentially stacked may be disposed between the plurality of first string selection electrodes SSE1 and the first ground selection electrode GSE1.

Each of the electrode structures may include at least one floor of string selection electrodes. That is, each of the electrode structures may include a single floor of first string selection electrodes or plural floors of string selection electrodes. The plural floors of string selection electrodes may be sequentially stacked and vertically separated from each other. For example, second string selection electrodes SSE2 may be disposed between the first string selection electrodes SSE1 and the uppermost cell electrode CE. The second string selection electrodes SSE2 under the first string selection electrodes SSE1 may be disposed at a same level from the top surface of the substrate 100. That is, the second string selection electrodes SSE2 may be horizontally spaced apart from each other. The second string selection electrodes SSE2 may also be controlled independently from each other.

The first ground selection electrode GSE1 may correspond to a lowermost electrode among the electrodes GSE1, GSE2, CE, SSE2, SSE1 stacked in each electrode structure. The first string selection electrodes SSE1 may correspond to uppermost electrodes among the electrodes GSE1, GSE2, CE, SSE2, SSE1 stacked in each electrode structure. The second string selection electrodes SSE2 may correspond to next uppermost electrodes among the electrodes GSE1, GSE2, CE, SSE2, SSE1 stacked in each electrode structure.

The insulating patterns 505a, 505nUa, 505Ua in each electrode structure may include uppermost insulating patterns 505Ua stacked on the first string selection electrodes SSE1, next uppermost insulating patterns 505nUa disposed between the first string selection electrodes SSE1 and the second string selection electrodes SSE2, and insulating patterns 505a isolating the cell electrode CE and the ground string selection electrodes GSE1 and GSE2 from each other.

In each electrode structure, the uppermost insulating pattern 505Ua may be plural in number and may be disposed on the plurality of first string selection electrode SSE1, respectively. The plurality of uppermost insulating patterns 505Ua may be disposed at a same level from a top surface of the substrate 100 and horizontally spaced apart from each other. Further, the next uppermost insulating pattern 505nUa may be plural in number and may be disposed between the respective first string selection electrodes SSE1 and the respective second string selection electrodes SSE2. The plurality of next uppermost insulating patterns 505nUa may be disposed at a same level from a top surface of the substrate 100 and may also be horizontally spaced apart from each other.

In each electrode structure, a cutting region 540 may be defined and provided between the uppermost insulating patterns 505Ua. The cutting region 540 may extend downwardly between the adjacent first string selection electrodes SSE1, between the adjacent next uppermost insulating patterns 505nUa, and between the adjacent second string selection electrodes SSE2. The cutting region 540 may have a groove shape extending in the first direction when viewed from a plan view. Non sacrificial patterns 550a may be disposed in the cutting regions 540, respectively. In an embodiment, each of the non sacrificial patterns 550a may be in contact with first outer sidewalls of the uppermost insulating patterns 505Ua and the next uppermost insulating patterns 505nUa, which constitute both inner sidewalls of the cutting region 540a, in each electrode structure.

According to an embodiment, the respective first string selection electrodes SSE1 may be disposed in the respective uppermost empty regions 560U which is surrounded by the uppermost insulating pattern 505Ua, the next uppermost insulating pattern 505nUa, and the non sacrificial pattern 550a. The respective second string selection electrode SSE2 may be disposed in the respective next uppermost empty regions 560nU which is surrounded by the next uppermost insulating pattern 505nUa, the insulating pattern 505a directly under the next uppermost insulating pattern 505nUa, and the non sacrificial pattern 550a. First side openings of the uppermost empty regions 560U and the next uppermost empty regions 560nU may be closed by the non sacrificial pattern 550a. The cell electrodes CE and the ground selection electrodes GSE1 and GSE2 may be respectively disposed in the empty regions 560 provided between the insulating patterns 505a under the next uppermost insulating patterns 505nUa.

Each of the electrodes GSE1, GSE2, CE, SSE2, SSE1 may include a conductive material. For example, each of the electrodes GSE1, GSE2, CE, SSE2, SSE1 may include at least one of a doped semiconductor layer (e.g., a doped silicon layer), a metal layer (e.g., a tungsten layer, a copper layer or an aluminum layer), a conductive metal nitride layer (e.g., a titanium nitride layer, a tantalum nitride layer or a tungsten nitride layer), a conductive metal-semiconductor compound layer (e.g., a metal silicide layer) and a transition metal layer (e.g., a titanium layer or a tantalum layer). Each of the insulating patterns 505a, 505nUa, 505Ua may include an oxide material such as a high density plasma (HDP) oxide layer and/or a high temperature oxide (HTO) layer. The non sacrificial pattern 550a may include an insulating material. The HTO layer may be an oxide material which is formed at a process temperature higher than about 600° C. For example, the non sacrificial pattern 550a may include an oxide material and/or an undoped semiconductor material (e.g., an undoped silicon layer).

In an embodiment, a buffer dielectric pattern 503a may be disposed between the first ground selection electrode GSE1 and the substrate 100 in each electrode structure. The buffer dielectric pattern 503a may be thinner than the insulating patterns 505a, 505nUa, 505Ua. The buffer dielectric pattern 503a may include an oxide material.

A plurality of vertical active patterns 520 may vertically penetrate each of the electrode structures. Each of the vertical active patterns 520 may successively penetrate one of the first string selection electrodes SSE1 and the electrodes SSE2, CE, GSE2, GSE1 under the first string selection electrodes SSE1. Each of the vertical active patterns 520 may further penetrate the buffer dielectric pattern 503a. Each of the vertical active patterns 520 may have may have a hollow cylinder shape. An inner space surrounded by the vertical active pattern 520 may be filled with a filling dielectric pattern 525. A landing pad 530 may be disposed on the respective vertical active patterns 520 and the filling dielectric pattern 525 in the respective vertical active patterns 520. The landing pad 530 may be in contact with the vertical active pattern 520.

The vertical active patterns 520 may contact the substrate 100. The substrate 100 may be doped with dopants of a first conductivity type. For example, the substrate 100 may include a well region of the first conductivity type. The vertical active patterns 520 may contact the well region formed in the substrate 100. The vertical active patterns 520 may include the same semiconductor material as the substrate 100. For example, when the substrate 100 is a silicon substrate, the vertical active patterns 520 may include silicon. The vertical active patterns 520 may have a single crystalline state or a polycrystalline state. The vertical active patterns 520 may be doped with dopants of the first conductivity type or may be undoped. The landing pads 530 may include the same semiconductor material as the vertical active patterns 520. Drain regions may be formed in the landing pads 530, respectively. The drain regions may have a second conductivity type opposite to the first conductivity type. The filling dielectric patterns 525 may include an oxide layer, a nitride layer, and/or an oxynitride layer.

The plurality of vertical active patterns 520 may successively penetrate each of the first string selection electrodes SSE1 as well as the electrodes SSE2, CE, GSE2 and GSE1 below the first string selection electrode SSE1. In a plan view, the plurality of vertical active patterns 520 penetrating each of the first string selection electrodes SSE1 may be arrayed zigzag in the first direction. However, the inventive concept is not limited to the above descriptions. For example, the plurality of vertical active patterns 520 penetrating each first string selection electrode SSE1 may be arrayed in the first direction to constitute a single column when viewed from a plan view.

An electrode-dielectric layer 570 may be disposed between a sidewall of the respective vertical active patterns 520 and the respective electrodes GSE1, GSE2, CE, SSE2, or SSE1. In an embodiment, at least a portion of the electrode-dielectric layer 570 may extend to cover top and bottom surfaces of the respective electrodes GSE1, GSE2, CE, SSE2, or SSE1. In this case, at least a portion of the electrode-dielectric layer 570 between the vertical active pattern 520 and the first string selection electrode SSE1 may further extend to cover the top surface, the bottom surface and an outer sidewall of the first string selection electrode SSE1. In an embodiment, all the electrode-dielectric layers 570 between the vertical active patterns 520 and the electrodes GSE1, GSE2, CE, SSE2, SSE1 may extend to cover the top surfaces and the bottom surfaces of all the electrodes GSE1, GSE2, CE, SSE2, SSE1, as illustrated in FIG. 39B.

The string selection electrodes SSE1 and SSE2 will be described hereinafter with reference to FIG. 39D in more detail.

Referring to FIGS. 39B and 39D, each of the first string selection electrodes SSE1 may include a first outer sidewall 10a and a second outer sidewall 10b that face each other. In this case, the electrode-dielectric layer 570 between the vertical active pattern 520 and the first string selection electrode SSE1 may extend to cover a bottom surface, a top surface, and the first outer sidewall 10a of the first string selection electrode SSE1. The extension of the electrode-dielectric layer 570 between the vertical active pattern 520 and the first string selection electrode SSE1 may be referred to as a first extension hereinafter. The first extension may be in contact with the bottom surface, the top surface and the first outer sidewall 10a of the first string selection electrode SSE1. The first extension may include first plate portions covering the top and bottom surfaces of the first string selection electrode SSE1 and a first wall portion covering the first outer sidewall 10a of the first string selection electrode SSE1. The first wall portion may include a first sidewall 31 adjacent to the non sacrificial pattern 550a and a second sidewall adjacent to the first outer sidewall 10a. In an embodiment, the first sidewall 31 of the first wall portion may be in contact with the non sacrificial pattern 550a.

The first extension may not cover the second outer sidewall 10b of the first string selection electrodes SSE1. In an embodiment, the first outer sidewall 10a of the first string selection electrode SSE1 may be adjacent to the non sacrificial pattern 550a, and the second outer sidewall 10b of the first string selection electrode SSE1 may be in contact with the isolation pattern 575. The first string selection electrode SSE1 may include a plurality of inner sidewalls 10n adjacent to the sidewalls of the vertical active patterns 520. The inner sidewalls 10n of the first string selection electrode SSE1 may have a hole shape surrounding the sidewalls of the vertical active patterns 520.

Each of the uppermost insulating patterns 505Ua may include a first outer sidewall 15a and a second outer sidewall 15b that face each other. The first outer sidewall 15a of the uppermost insulating pattern 505Ua may be in contact with the non sacrificial pattern 550a. The second outer sidewall 15b of the uppermost insulating pattern 505Ua may be in contact with the isolation pattern 575. The first outer sidewall 15a of the uppermost insulating pattern 505Ua may be vertically aligned with the first sidewall 31 of the first wall portion covering the first outer sidewall 10a of the first string selection electrodes SSE1. In an embodiment, the first outer sidewall 15a of the uppermost insulating patterns 505Ua may be vertically coplanar with the first sidewall 31 of the first wall portion.

Similarly, each of the second string selection electrodes SSE2 may include a first outer sidewall 20a and a second outer sidewall 20b that face each other. The first outer sidewall 20a of the second string selection electrode SSE2 may be adjacent to the non sacrificial pattern 550a, and the second outer sidewall 20b of the second string selection electrode SSE2 may be in contact with the isolation pattern 575. The electrode-dielectric layer 570 between the vertical active pattern 520 and the second string selection electrode SSE2 may extend to cover a bottom surface, a top surface, and the first outer sidewall 20a of the second string selection electrode SSE2. The extension of the electrode-dielectric layer 570 between the vertical active pattern 520 and the second string selection electrode SSE2 may be referred to as a second extension hereinafter.

The second extension may be in contact with the bottom surface, the top surface and the first outer sidewall 20a of the second string selection electrode SSE2. The second extension may include second plate portions covering the top and bottom surfaces of the second string selection electrode SSE2 and a second wall portion covering the first outer sidewall 20a of the second string selection electrode SSE1. The second wall portion of the second extension may include a first sidewall 32 adjacent to the non sacrificial pattern 550a and a second sidewall adjacent to the first outer sidewall 20a of the second string selection electrode SSE2. In an embodiment, the first sidewall 32 of the second wall portion may be in contact with the non sacrificial pattern 550a. The second outer sidewall 20b of the second string selection electrode SSE2 may not be covered with the second extension. The second outer sidewall 20b of the second string selection electrode SSE2 may be in contact with the isolation pattern 575. The second string selection electrode SSE2 may also include a plurality of inner sidewalls 20n adjacent to the sidewalls of the vertical active patterns 520. The inner sidewalls 20n of the second string selection electrode SSE2 may have a hole shape surrounding the sidewalls of the vertical active patterns 520.

Each of the next uppermost insulating patterns 505nUa may also include a first outer sidewall 25a contacting the non sacrificial pattern 550a and a second outer sidewall 25b adjacent to the isolation pattern 575. The first outer sidewall 25a of the next uppermost insulating pattern 505nUa may be vertically aligned with the first sidewall 32 of the second wall portion. The first sidewall 32 of the second wall portion may be vertically and substantially coplanar with the first outer sidewall 25a of the next uppermost insulating pattern 505nUa.

In an embodiment, the first outer sidewall 15a of the uppermost insulating pattern 505Ua may be vertically and substantially coplanar with the first sidewall 31 of the first wall portion, the first outer sidewall 25a of the next uppermost insulating pattern 505nUa, and the first sidewall 32 of the second wall portion.

Subsequently, referring to FIG. 39B, each of the cell electrodes CE may include a first outer sidewall 40a and a second outer sidewall 40b that face each other, and each of the ground selection electrodes GSE1 and GSE2 may also include a first outer sidewall 45a and a second outer sidewall 45b that face each other. Unlike the string selection electrodes SSE1 and SSE2, the first and second outer sidewalls 40a and 40b of the respective cell electrodes CE may be in contact with the isolation patterns 575 disposed at both sides of the electrode structure, respectively. Further, the first and second outer sidewalls 45a and 45b of each of the ground selection electrodes GSE1 and GSE2 may be in contact with the isolation patterns 575 disposed at both sides of the electrode structure, respectively. Each of the cell electrodes CE may include a plurality of inner sidewalls surrounding the sidewalls of the vertical active patterns 520 that penetrate the first string selection electrodes SSE1 in each electrode structure. Moreover, each of the ground selection electrodes GSE1 and GSE2 may also include a plurality of inner sidewalls surrounding the sidewalls of the vertical active patterns 520 that penetrate the first string selection electrodes SSE1 in each electrode structure.

The electrode-dielectric layer 570 will be described hereinafter with reference to FIG. 39E in more detail.

Referring to FIGS. 39B and 39E, each of the electrode-dielectric layers 570 may include a tunneling dielectric layer TDL, a charge storing layer SL, and a blocking dielectric layer BDL. The tunneling dielectric layer TDL may be adjacent the vertical active patterns 520. The blocking dielectric layer BDL may be adjacent to the respective electrodes GSE1, GSE2, CE, SSE2, SSE1. In addition, the charge storing layer SL may be disposed between the tunneling dielectric layer TDL and the blocking dielectric layer BDL. The tunneling dielectric layer TDL may include an oxide layer and/or an oxynitride layer. The charge storing layer SL may include a dielectric layer having traps capable of storing charges. For example, the charge storing layer SL may include a nitride layer and/or a metal oxide layer (e.g., a hafnium oxide layer). The blocking dielectric layer BDL may include a high-k dielectric layer having a dielectric constant which is higher than that of the tunneling dielectric layer TDL. In an embodiment, the high-k dielectric layer may include a metal oxide layer such as a hafnium oxide layer and/or an aluminum oxide layer. Moreover, the blocking dielectric layer BDL may further include a barrier dielectric layer (e.g., an oxide layer) having an energy band gap which is greater than that of the high-k dielectric layer. The barrier dielectric layer may be disposed between the high-k dielectric layer and the charge storing layer SL.

In an embodiment, the extension of the electrode-dielectric layer 570 covering the top and bottom surfaces of each of the electrodes GSE1, GSE2, CE, SSE2, SSE1 may include extensions of the tunneling dielectric layers TDL, the charge storing layers SL, and the blocking dielectric layers BDL, as illustrated in FIGS. 39A to 39E. In addition, each of the first and second wall portions covering the first outer sidewalls 10a and 20a of the string selection electrodes SSE1 and SSE2 may also include the extensions of the tunneling dielectric layers TDL, the charge storing layers SL, and the blocking dielectric layers BDL.

Subsequently, referring to FIGS. 39A, 39B, and 39C, common source regions CS may be disposed in the substrate 100 between the electrode structures. The common source regions CS may be formed in a well region of the substrate 100. The common source regions CS may be doped with dopants of the second conductivity type. That is, the common source regions CS may be doped with dopants having a different conductivity type from the well region. The isolation patterns 575 may be disposed on the common source regions CS, respectively.

As illustrated in FIGS. 39A and 39C, each of the electrodes GSE1, GSE2, CE, SSE2, SSE1 stacked in each of the electrode structures may include an electrode pad EP at an edge thereof. The electrode pads EP of the electrodes GSE1, GSE2, CE, SSE2, SSE1 in each of the electrode structures may constitute a stepped structure. The electrode pads EP of the electrodes GSE1, GSE2, CE, SSE2, SSE1 in each of the electrode structures may exhibit a configuration stepped down in the first direction (e.g., a positive y-axis direction). Electrical signals, e.g., operation voltages, may be applied to the electrodes GSE1, GSE2, CE, SSE2, SSE1 through the electrode pads EP. For example, electrical signals may be applied to the electrodes GSE1, GSE2, CE, SSE2, SSE1 through conductive plugs (not shown) contacting the electrode pads EP.

Each of the vertical active patterns 520 and the electrodes GSE1, GSE2, CE, SSE2, SSE1 adjacent thereto may constitute a single vertical cell string. That is, the vertical cell string may include a plurality of cell transistors serially connected to each other. Moreover, the vertical cell string may further include at least one ground selection transistor and at least one string selection transistor. The at least one ground selection transistor may be serially connected to one end of the cell transistors serially connected and the at least one string selection transistor may be serially connected to the other end of the cell transistors serially connected. That is, the at least one ground selection transistor may be serially connected to the lowermost cell transistor and the at least one string selection transistor may be serially connected to the uppermost cell transistor. In the event that the at least one ground selection transistor includes a plurality of ground selection transistors, the plurality of ground selection transistors in the vertical cell string may be serially connected to each other. Similarly, in the event that the at least one string selection transistor includes a plurality of string selection transistors, the plurality of string selection transistors in the vertical cell string may be serially connected to each other.

The cell transistors may be defined at intersections of the vertical active patterns 520 and the cell electrodes CE, respectively. Further, the ground selection transistors may be defined at intersections of the vertical active patterns 520 and the ground section electrodes GSE1 and GSE2, respectively. Similarly, the string selection transistors may be defined at intersections of the vertical active patterns 520 and the string section electrodes SSE1 and SSE2, respectively. The electrode-dielectric layer 570 between the cell electrodes CE and the vertical active patterns 520 may correspond to a data storage layer of the cell transistors. The electrode-dielectric layer 570 between the string selection electrodes SSE1 and SSE2 and the vertical active patterns 520 may correspond to a gate dielectric layer of the string selection transistors, and the electrode-dielectric layer 570 between the ground selection electrodes GSE1 and GSE2 and the vertical active patterns 520 may correspond to a gate dielectric layer of the ground selection transistors. The ground selection transistors, the cell transistors, and the string selection transistors in each of the vertical cell strings may be sequentially stacked. Therefore, the ground selection transistors, the cell transistors and the string selection transistors in each of the vertical cell strings may include vertical channel regions defined at the sidewall of the respective vertical active patterns 520. During operation of the three dimensional semiconductor memory device, inversion layers may be generated at portions of the sidewalls of the vertical active patterns 520 adjacent to the insulating patterns 505a, 505nUa, 505Ua. This may be due to the fringe field of the electrodes GSE1, GSE2, CE, SSE2, SSE1. The inversion layers may act as source/drain regions of the cell transistors, the string selection transistors and the ground selection transistors.

Referring again to FIGS. 39A, 39B, and 39C, capping dielectric patterns 535a may be disposed on the uppermost insulating patterns 505Ua. Further, each of the capping dielectric patterns 535a may extend to cover the electrode pads EP in each electrode structure. Both outer sidewalls of each of the capping dielectric patterns 535a may be in contact with the pair of isolation patterns 575 disposed at both sides of the electrode structure, respectively. The cutting regions 540 may extend upwardly to penetrate the capping dielectric patterns 535a. As illustrated in FIG. 39A, the electrode pads EP of the first string selection electrodes SSE1 in each electrode structure may be disposed at both sides of the cutting region 540 to be spaced apart from each other, when viewed from a plan view. In addition, the electrode pads EP of the second string selection electrodes SSE2 in each electrode structure may be disposed at both sides of the cutting region 540 to be spaced apart from each other, when viewed from a plan view. End portions of the cutting regions 540 may overlap with the electrode pads EP of the cell electrodes CE or the electrode pads EP of the ground selection electrodes GSE1 and GSE2. The non sacrificial patterns 550a may also extend upwardly to fill the cutting regions 540. Top surfaces of the non sacrificial patterns 550a may be substantially coplanar with top surfaces of the capping dielectric patterns 535a. The capping dielectric patterns 535a may include an oxide layer such as a high density plasma (HDP) oxide layer, and/or a high temperature oxide (HTO) layer.

A plurality of interconnections 590 may be disposed on the capping dielectric patterns 535a. The interconnections 590 may extend in parallel in the second direction. Each of the interconnections 590 may be electrically connected to the upper portions of the vertical active patterns 520 arrayed in the second direction to constitute a single row. The interconnections 590 may be electrically connected to the upper portions of the vertical active patterns 520 through contact plugs 580 penetrating the capping dielectric patterns 535a and/or landing pads 530. The interconnections 590 may be electrically connected to the drain regions formed in at least the landing pads 530. In an embodiment, the interconnections 590 may correspond to bit lines. Each of the interconnections 190 may include at least one of a metal layer (e.g., a tungsten layer, a copper layer or an aluminum layer), a conductive metal nitride layer (e.g., a titanium nitride layer, a tantalum nitride layer or a tungsten nitride layer), and a transition metal layer (e.g., a titanium layer or a tantalum layer). Each of the contact plugs 580 may also include at least one of a metal layer (e.g., a tungsten layer, a copper layer or an aluminum layer), a conductive metal nitride layer (e.g., a titanium nitride layer, a tantalum nitride layer or a tungsten nitride layer), and a transition metal layer (e.g., a titanium layer or a tantalum layer).

According to the three dimensional semiconductor memory device as set forth above, the first outer sidewalls 10a and 20a of the string selection electrodes SSE1 and SSE2 may be covered with the electrode-dielectric layer 570. As such, the first outer sidewalls 10a and 20a of the string selection electrodes SSE1 and SSE2 may be protected from an etching process. Thus, a high reliable and highly integrated three dimensional semiconductor memory device may be realized.

Hereinafter, modified embodiments of the three dimensional semiconductor memory device according to the fourth embodiment of the inventive concept will be described with reference to the drawings.

Figure 40A:
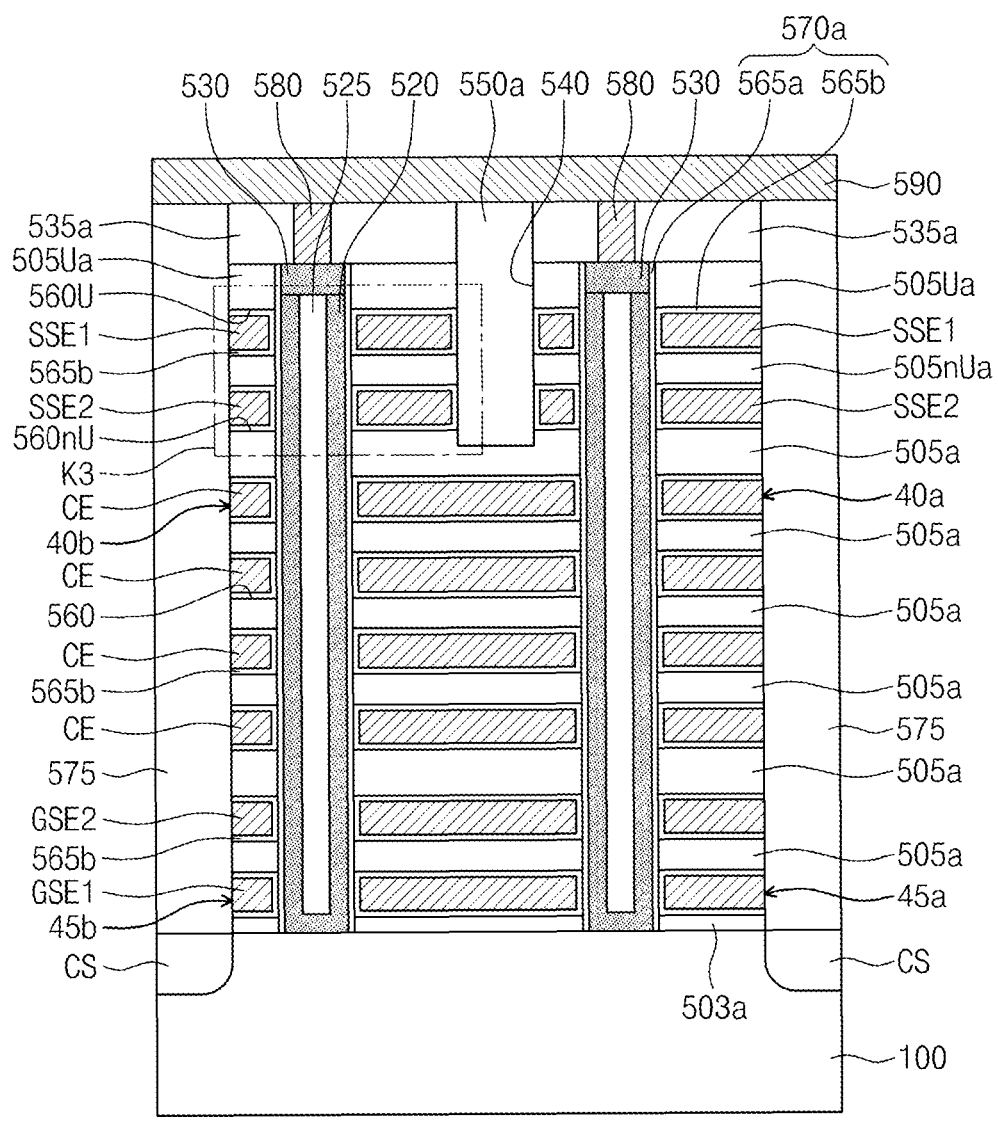
FIG. 40A illustrates a cross sectional view taken along a line I-I' of FIG. 39A of a modified embodiment of a three dimensional semiconductor memory device according to a fourth embodiment of the inventive concept.
Figure 40B:
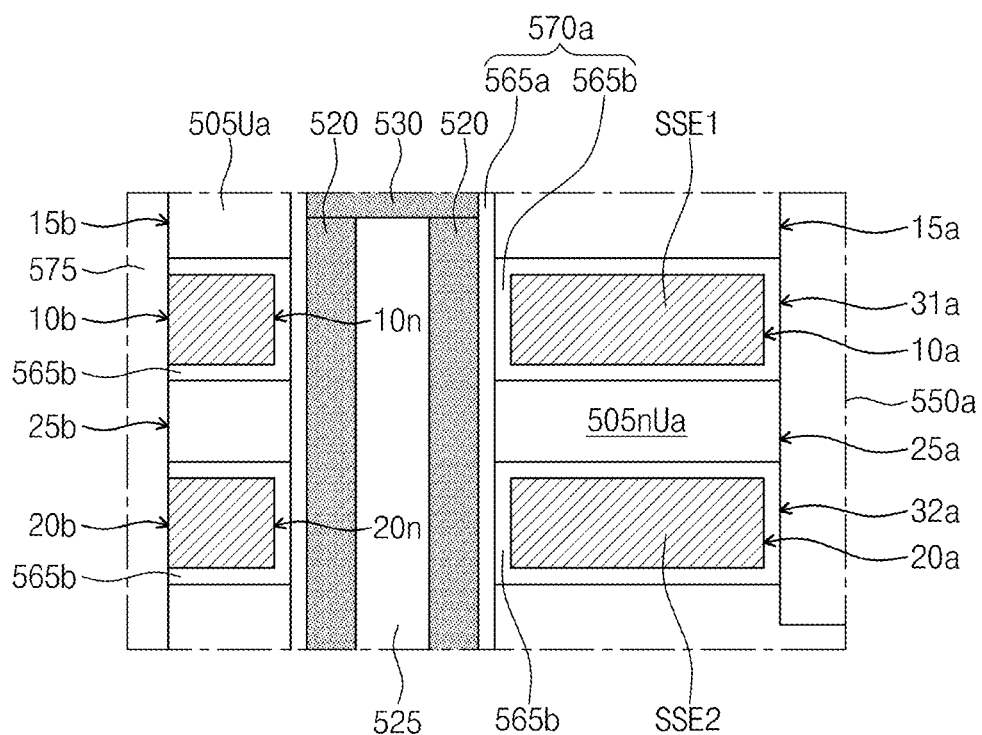
FIG. 40B illustrates an enlarged view illustrating a portion 'K3' of FIG. 40A.

FIG. 40A is a cross sectional view taken along a line I-I' of FIG. 39A to illustrate a modified embodiment of a three dimensional semiconductor memory device according to a fourth embodiment of the inventive concept. FIG. 40B is an enlarged view illustrating a portion 'K3' of FIG. 40A.

Referring to FIGS. 40A and 40B, an electrode-dielectric layer 570a between the vertical active patterns 520 and the electrodes GSE1, GSE2, CE, SSE2, SSE1 may include a first portion 565a and a second portion 565b. The first portion 565a of the electrode-dielectric layer 570a may extend vertically between sidewalls of the vertical active patterns 520 and the insulating patterns 505a, 505nUa, 505Ua. The second portion 565b of the electrode-dielectric layer 570a may extend horizontally to cover top and bottom surfaces of the electrodes GSE1, GSE2, CE, SSE2, SSE1. As illustrated in FIG. 40B, the second portion 565b of the electrode-dielectric layer 570a between the sidewall of the vertical active pattern 520 and an inner sidewall 10n of the first string selection electrodes SSE1 may extend to cover a top surface, a bottom surface and a first outer sidewall 10a of the first string selection electrodes SSE1. A portion of the extension of the second portion 565b covering the first outer sidewall 10a of the first string selection electrodes SSE1 may have a sidewall 31a which is vertically aligned with a first outer sidewall 15a of the uppermost insulating pattern 505Ua. The sidewall 31a may be substantially and vertically coplanar with the first outer sidewall 15a of the uppermost insulating pattern 505Ua.

The second portion 565b of the electrode-dielectric layer 570a between the sidewall of the vertical active pattern 520 and an inner sidewall 20n of the second string selection electrode SSE2 may extend to cover a top surface, a bottom surface and a first outer sidewall 20a of the second string selection electrodes SSE2. A portion of the extension of the second portion 565b covering the first outer sidewall 20a of the second string selection electrodes SSE2 may have a sidewall 32a vertically aligned with a first outer sidewall 25a of the next uppermost insulating pattern 505nUa. The sidewall 32a may be substantially and vertically coplanar with the first outer sidewall 25a of the next uppermost insulating pattern 505nUa.

The first portion 565a of the electrode-dielectric layer 570a may include at least a portion of the tunneling dielectric layer TDL described with reference to FIG. 39E. The second portion 565b of the electrode-dielectric layer 570a may include at least a portion of the blocking dielectric layer BDL described with reference to FIG. 39E. In this case, any one of the first and second portions 565a and 565b may include the charge storing layer SL described with reference to FIG. 39E. For example, the first portion 565a may include the tunneling dielectric layer TDL, the charge storing layer SL, and a barrier dielectric layer of the blocking dielectric layer BDL, and the second portion 565b may include a high-k dielectric layer of the blocking dielectric layer BDL.

Figure 41A:
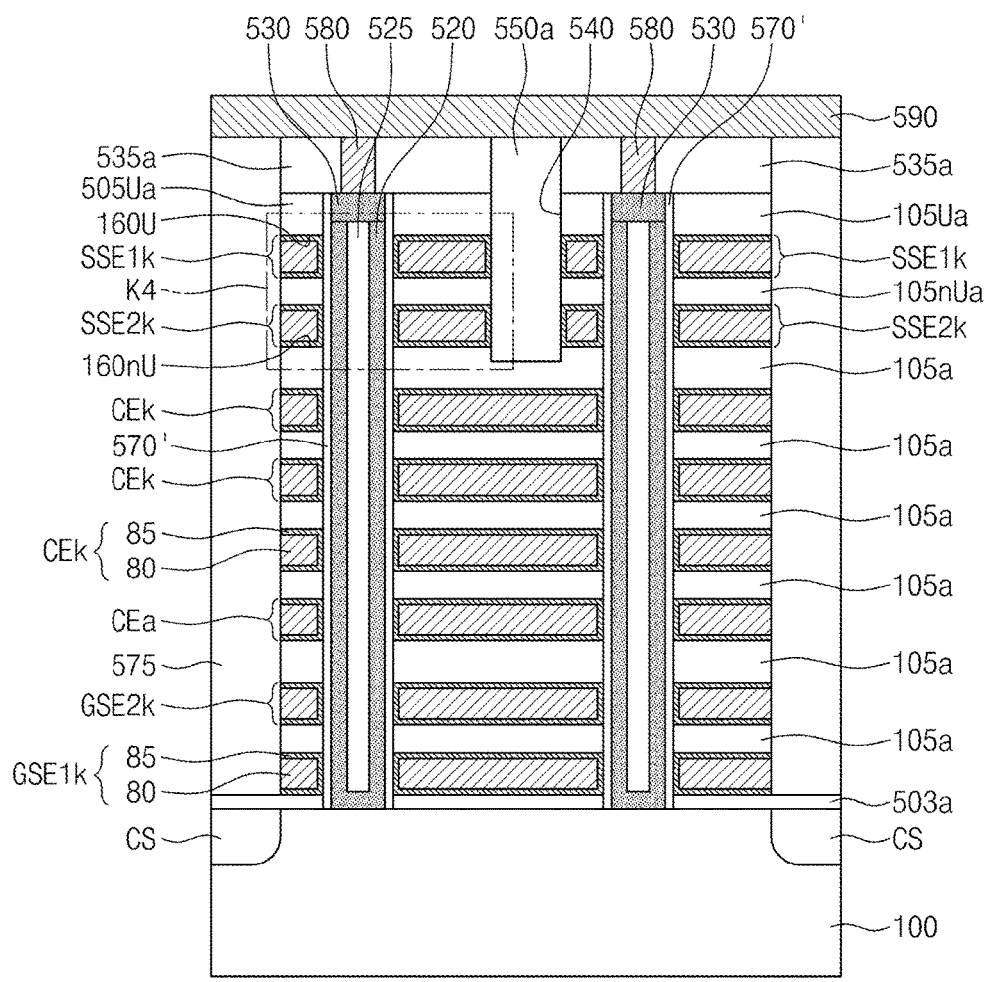
FIG. 41A illustrates a cross sectional view taken along a line I-I' of FIG. 39A of another modified embodiment of a three dimensional semiconductor memory device according to a fourth embodiment of the inventive concept.
Figure 41B:
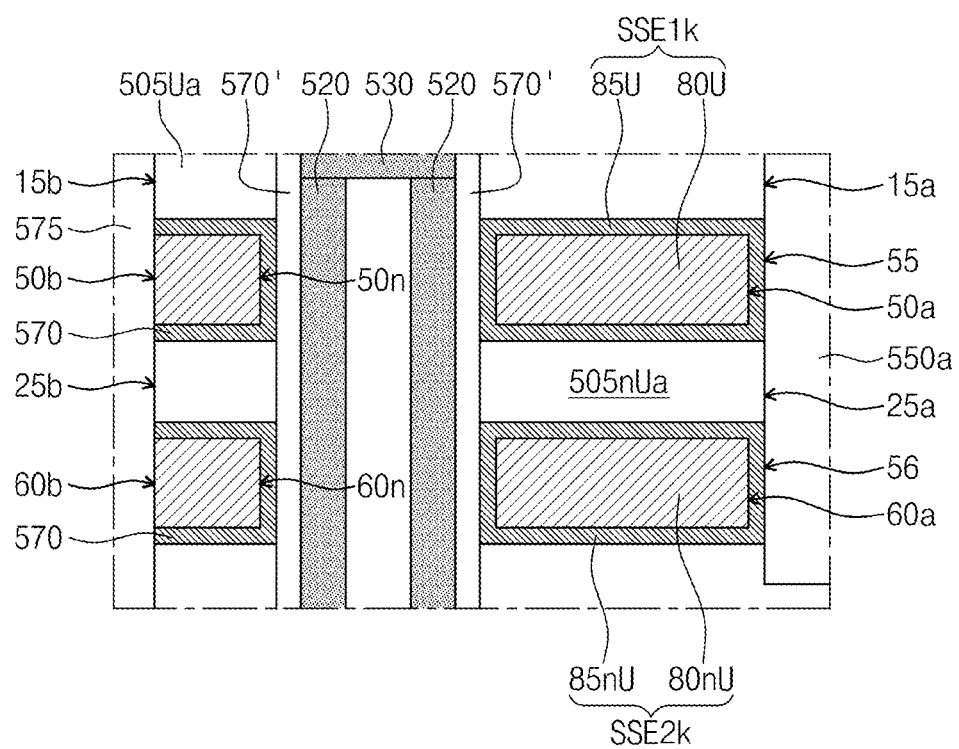
FIG. 41B illustrates an enlarged view of a portion 'K4' of FIG. 41A.

FIG. 41A is a cross sectional view taken along a line I-I' of FIG. 39A to illustrate another modified embodiment of a three dimensional semiconductor memory device according to a fourth embodiment of the inventive concept. FIG. 41B is an enlarged view illustrating a portion 'K4' of FIG. 41A.

Referring to FIGS. 41A and 41B, an entire portion of an electrode-dielectric layer 570' between the sidewall of the vertical active pattern 520 and electrodes GSE1k, GSE2k, CEk, SSE2k, SSE1k may extend vertically between the sidewall of the vertical active pattern 520 and the insulating patterns 505a, 505nUa, 505Ua. In this case, each of the electrodes GSE1k, GSE2k, CEk, SSE2k, SSE1k may include a metal pattern 80, 80nU, or 80U and a barrier conductive pattern 85, 85nU, or 85U.

In each of the electrodes GSE1k, GSE2k, CEk, SSE2k, SSE1k, the barrier conductive pattern 85, 85nU or 85U may be in contact with a top surface and a bottom surface of the metal pattern 80, 80nU or 80U. Hereinafter, the metal pattern 80U and the barrier conductive pattern 85U in the first string selection electrode SSE1k may be referred to as an uppermost metal pattern and an uppermost barrier conductive pattern, respectively. As disclosed in FIG. 41B, the uppermost metal pattern 80U may include a first outer sidewall 50a and a second outer sidewall 50b that face each other. The first and second outer sidewalls 50a and 50b of the uppermost metal pattern 80U may be adjacent to the non sacrificial pattern 550a and the isolation pattern 575, respectively. The uppermost barrier conductive pattern 85U may be in contact with the first outer sidewall 50a of the uppermost metal pattern 80U. A portion of the uppermost barrier conductive pattern 85U contacting the first outer sidewall 50a of the uppermost metal pattern 80U may include a first sidewall 55 adjacent to the non sacrificial pattern 550a and a second sidewall contacting the first outer sidewall 50a of the uppermost metal pattern 80U. The first sidewall 55 of the uppermost barrier conductive pattern 85U may be vertically aligned with the first outer sidewall 15a of the uppermost insulating pattern 505Ua. The first sidewall 55 of the uppermost barrier conductive pattern 85U may be vertically and substantially coplanar with the first outer sidewall 15a of the uppermost insulating pattern 505Ua. The second outer sidewall 50b of the uppermost metal pattern 80U may not be covered with the uppermost barrier conductive pattern 85U. The second outer sidewall 50b of the uppermost metal pattern 80U may be in contact with the isolation pattern 575. The uppermost metal pattern 80U may include an inner sidewall 50n having a hole shape that surrounds the sidewall of the vertical active pattern 520. The uppermost barrier conductive pattern 85U may be in contact with the inner sidewall 50n of the uppermost metal pattern 80U.

Similarly, the metal pattern 80nU and the barrier conductive pattern 85nU in the second string selection electrode SSE2k may be referred to as a next uppermost metal pattern and a next uppermost barrier conductive pattern, respectively. The next uppermost metal pattern 80nU may also include a first outer sidewall 60a and a second outer sidewall 60b that face each other. The first and second outer sidewalls 60a and 60b of the next uppermost metal pattern 80nU may be adjacent to the non sacrificial pattern 550a and the isolation pattern 575, respectively. The next uppermost barrier conductive pattern 85nU may be in contact with the first outer sidewall 60a of the next uppermost metal pattern 80nU. A portion of the next uppermost barrier conductive pattern 85nU contacting the first outer sidewall 60a of the next uppermost metal pattern 80nU may include a first sidewall 56 adjacent to the non sacrificial pattern 550a and a second sidewall contacting the first outer sidewall 60a of the next uppermost metal pattern 80nU. The first sidewall 56 of the next uppermost barrier conductive pattern 85nU may be vertically aligned with the first outer sidewall 25a of the next uppermost insulating pattern 505nUa. The first sidewall 56 of the next uppermost barrier conductive pattern 85nU may be vertically and substantially coplanar with the first outer sidewall 25a of the next uppermost insulating pattern 505nUa. The second outer sidewall 60b of the next uppermost metal pattern 80nU may not be covered with the next uppermost barrier conductive pattern 85nU. The second outer sidewall 60b of the next uppermost metal pattern 80nU may be in contact with the isolation pattern 575. The next uppermost metal pattern 80nU may include an inner sidewall 60n having a hole shape that surrounds the sidewall of the vertical active pattern 520. The next uppermost barrier conductive pattern 85nU may be in contact with the inner sidewall 60n of the next uppermost metal pattern 80nU.

Unlike the string selection electrodes SSE1k and SSE2k, both outer sidewalls of the metal pattern 80 in each of the cell electrodes CEk and the ground selection electrodes GSE1k and GSE2k may not be covered with the barrier conductive pattern 85 of each of the cell electrodes CEk and the ground selection electrodes GSE1k and GSE2k, as illustrated in FIG. 41A. For example, both outer sidewalls of the metal pattern 80 in each of the cell electrodes CEk and the ground selection electrodes GSE1k and GSE2k may be in contact with the isolation patterns 575 disposed at both sides of the electrode structure, respectively.

Each of the metal patterns 80, 80nU and 80U may include a tungsten layer, a copper layer or an aluminum layer. Each of the barrier conductive patterns 85, 85nU and 85U may include a conductive metal nitride layer (e.g., a titanium nitride layer, a tantalum nitride layer, a tungsten nitride layer or the like) and/or a transition metal layer (e.g., a titanium layer, a tantalum layer or the like).

Figure 42:
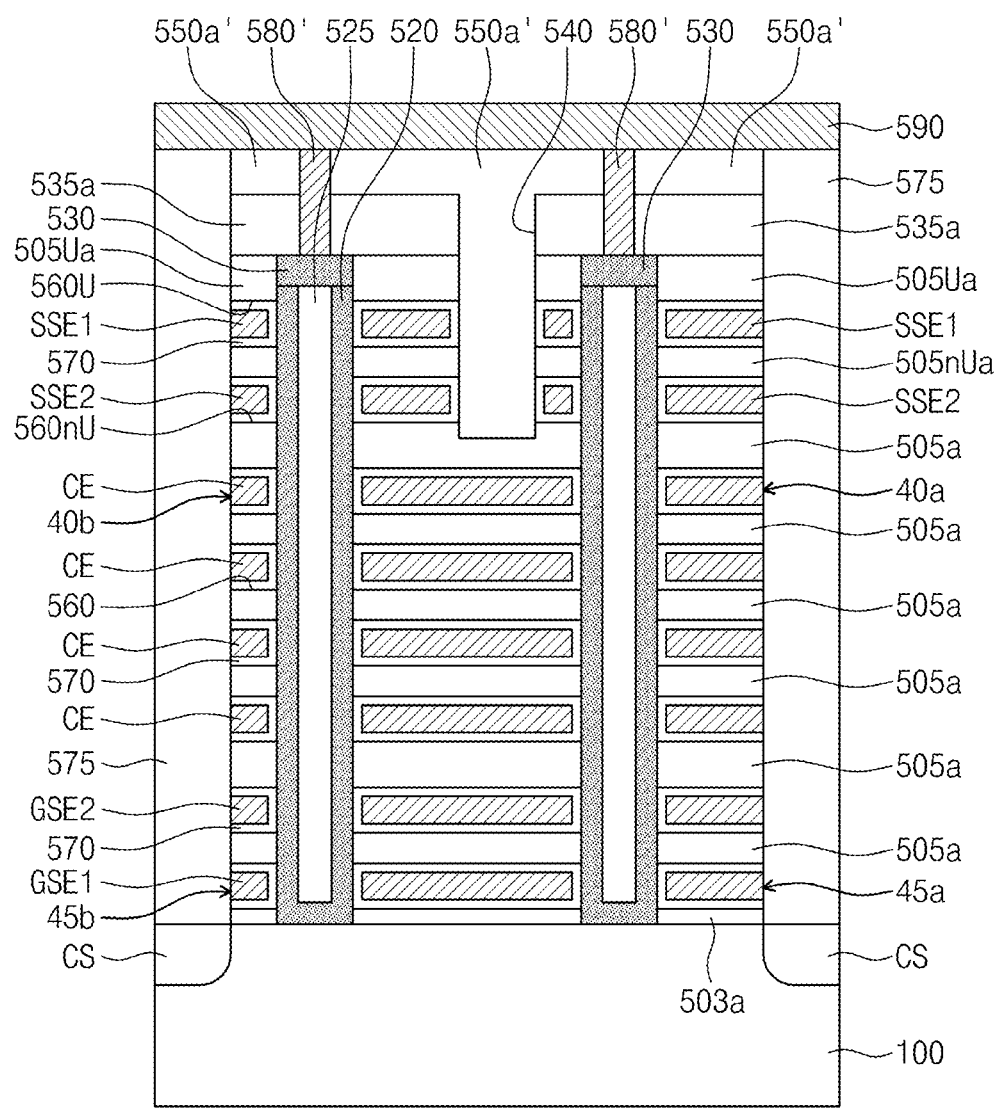
FIG. 42 illustrates a cross sectional view taken along a line I-I' of FIG. 39A of still another modified embodiment of a three dimensional semiconductor memory device according to a fourth embodiment of the inventive concept.

FIG. 42 is a cross sectional view taken along a line I-I' of FIG. 39A to illustrate still another modified embodiment of a three dimensional semiconductor memory device according to a fourth embodiment of the inventive concept.

Referring to FIG. 42, the cutting region 540 may be filled with a non sacrificial pattern 550a'. The non sacrificial pattern 550a' may extend onto the top surface of the capping dielectric pattern 535a. In this case, the non sacrificial pattern 550a' may include both sidewalls vertically aligned with both sidewalls of the capping dielectric pattern 535a. Contact plugs 580' may penetrate the capping dielectric pattern 535a and the non sacrificial pattern 550a' to be connected to the landing pads 530. Top surfaces of the isolation patterns 575 may be substantially coplanar with the top surface of the non sacrificial pattern 550a'.

Figure 43A:
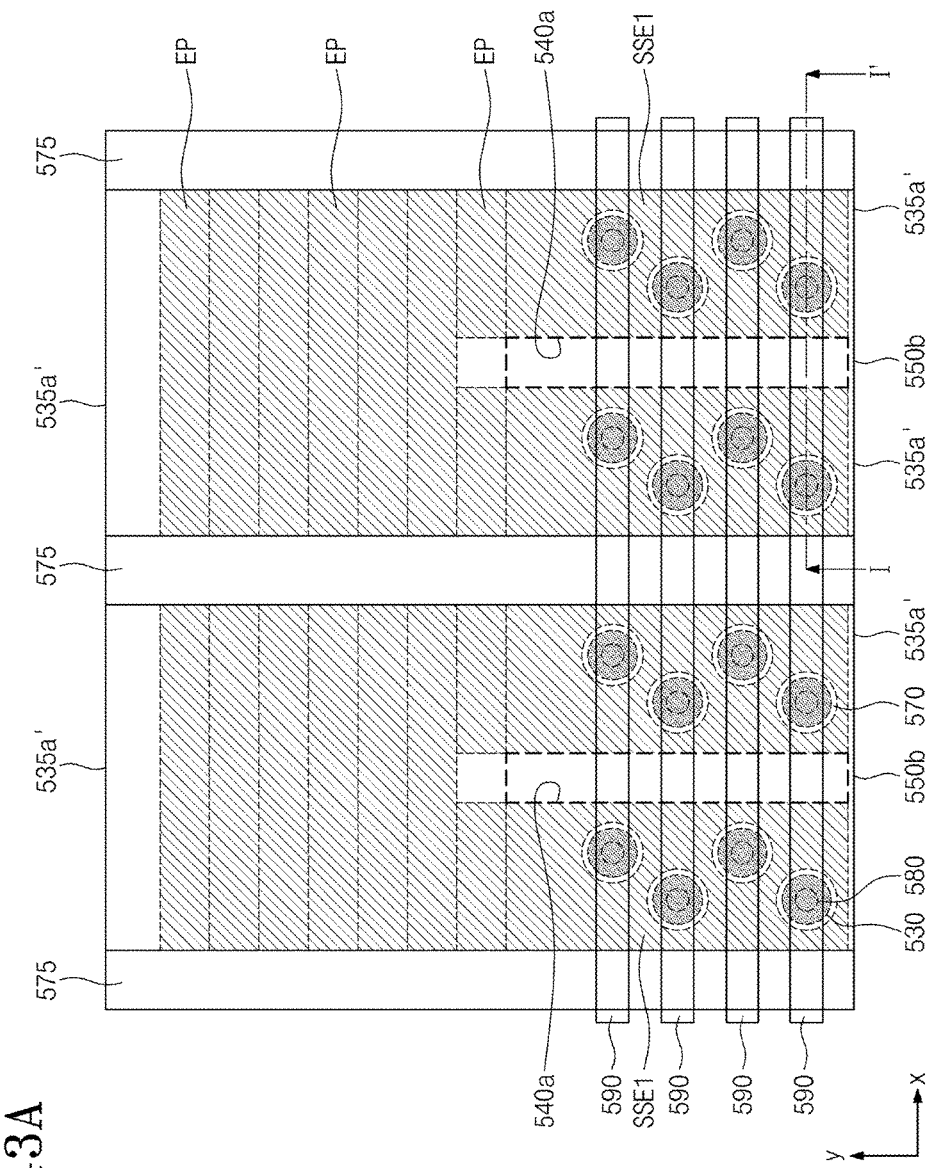
FIG. 43A illustrates a plan view of yet another modified embodiment of a three dimensional semiconductor memory device according to a fourth embodiment of the inventive concept.
Figure 43B:
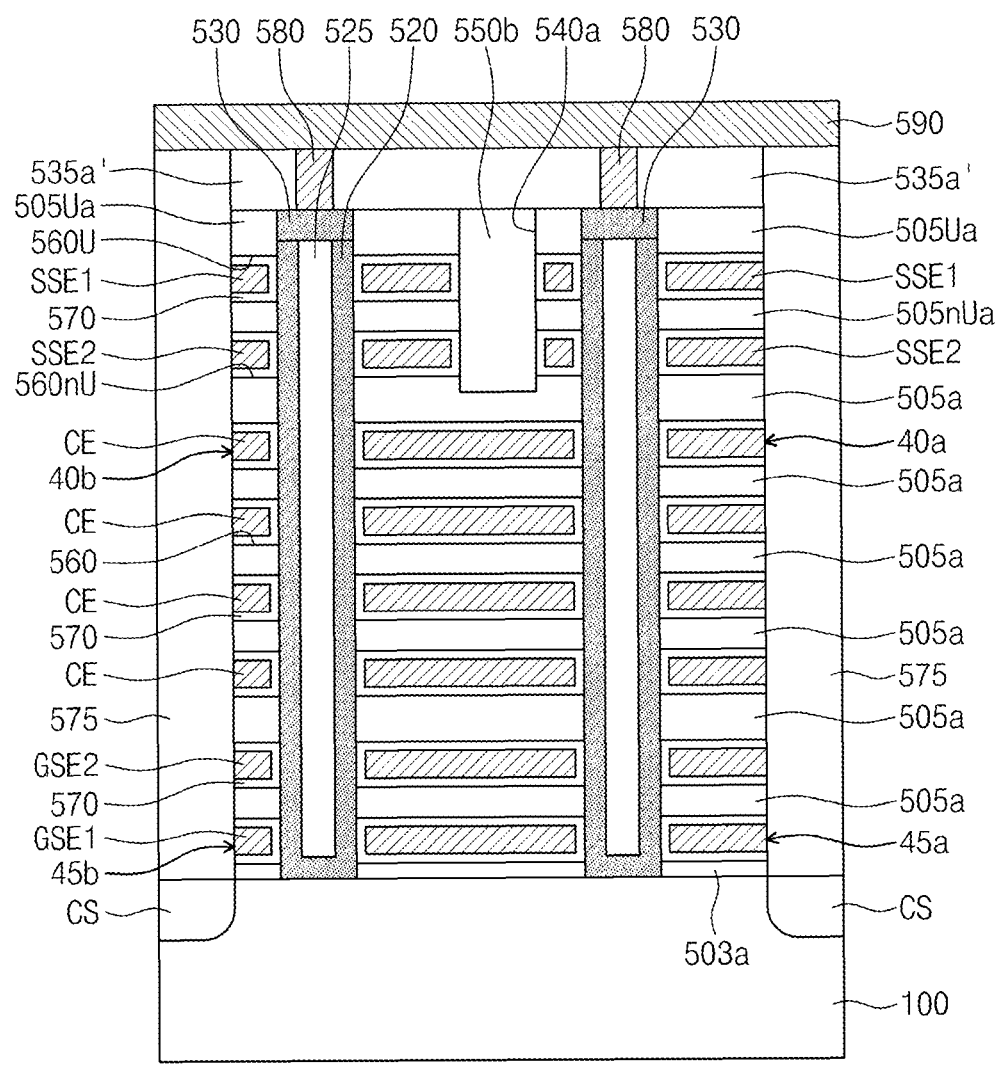
FIG. 43B illustrates a cross sectional view taken along a line I-I' of FIG. 43A.

FIG. 43A is a plan view illustrating yet another modified embodiment of a three dimensional semiconductor memory device according to a fourth embodiment of the inventive concept. FIG. 43B is a cross sectional view taken along a line I-I' of FIG. 43A.

Referring to FIG. 43A, an edge of a top surface of the non sacrificial pattern 550b disposed in each of the cutting regions 540a may be aligned with an edge of a top surface of the first string selection electrode SSE1 along the first direction. In this case, as illustrated in FIG. 43B, the top surface of the non sacrificial pattern 550b may be substantially coplanar with the top surfaces of the uppermost insulating patterns 505Ua. In each electrode structure, a capping dielectric pattern 535a' may be disposed on the uppermost insulating patterns 505Ua and the non sacrificial pattern 550b. That is, the cutting regions 540a may be disposed under the capping dielectric patterns 535a'.

FIG. 44 is a cross sectional view illustrating still yet another modified embodiment of a three dimensional semiconductor memory device according to a fourth embodiment of the inventive concept.

Referring to FIG. 44, a cutting region 540' may extend downwardly further than in previous embodiments. Further, as opposed to previous embodiment, the cutting region illustrated in FIG. 44 is not symmetrically disposed between adjacent vertical active patterns 520 in order to compensate for a difference in lateral widths of the first string selection electrode SSE1 between the different vertical active patterns and adjacent isolation patterns, i.e., such that the lateral widths of the first string selection electrode SSE1 adjacent the vertical active patterns are equal.

The cutting region 540' may be filled with the non sacrificial pattern 550a. Each of the electrode structure may include a plurality of uppermost cell electrodes CEs due to of the presence of the cutting region 540' and the non sacrificial pattern 550a. The plurality of uppermost cell electrodes CEs may be disposed at a same level from a top surface of the substrate 100. The cutting region 540' and the non sacrificial pattern 550a may be disposed between the plurality of uppermost cell electrodes CEs. That is, the plurality of uppermost cell electrodes CEs may be separated by the cutting region 540' and the non sacrificial pattern 550a.

According to the above modified embodiment, each of the uppermost cell electrodes CEs may include a first outer sidewall 41a adjacent to the non sacrificial pattern 550a and a second outer sidewall 41b adjacent to the isolation pattern 575. In this case, the electrode-dielectric layer 570 between the sidewall of the vertical active pattern 520 and the uppermost cell electrode CEs may extend to cover the first outer sidewall 41a of the uppermost cell electrode CEs. The second outer sidewall 41b of the uppermost cell electrode CEs may not be covered with the extension of the electrode-dielectric layer 570. For example, the second outer sidewall 41b of the uppermost cell electrode CEs may be in contact with the isolation pattern 575. The present modified embodiment discloses the uppermost cell electrodes CEs separated from each other by the cutting region 540'. However, the inventive concept is not limited to the present modified embodiment. For example, the cutting region 540' may extend further downwardly to reach a lower region than the uppermost cell electrode CEs. As such, at least one of the plurality of cell electrodes CE disposed under the uppermost cell electrode CEs may be divided into a plurality of segments. In addition, the cutting region 540' may further extend to separate each of the cell electrodes CE and the ground selection electrodes GSE1 and GSE2 disposed under the uppermost cell electrodes CEs into a plurality of segments.

Figure 45A:
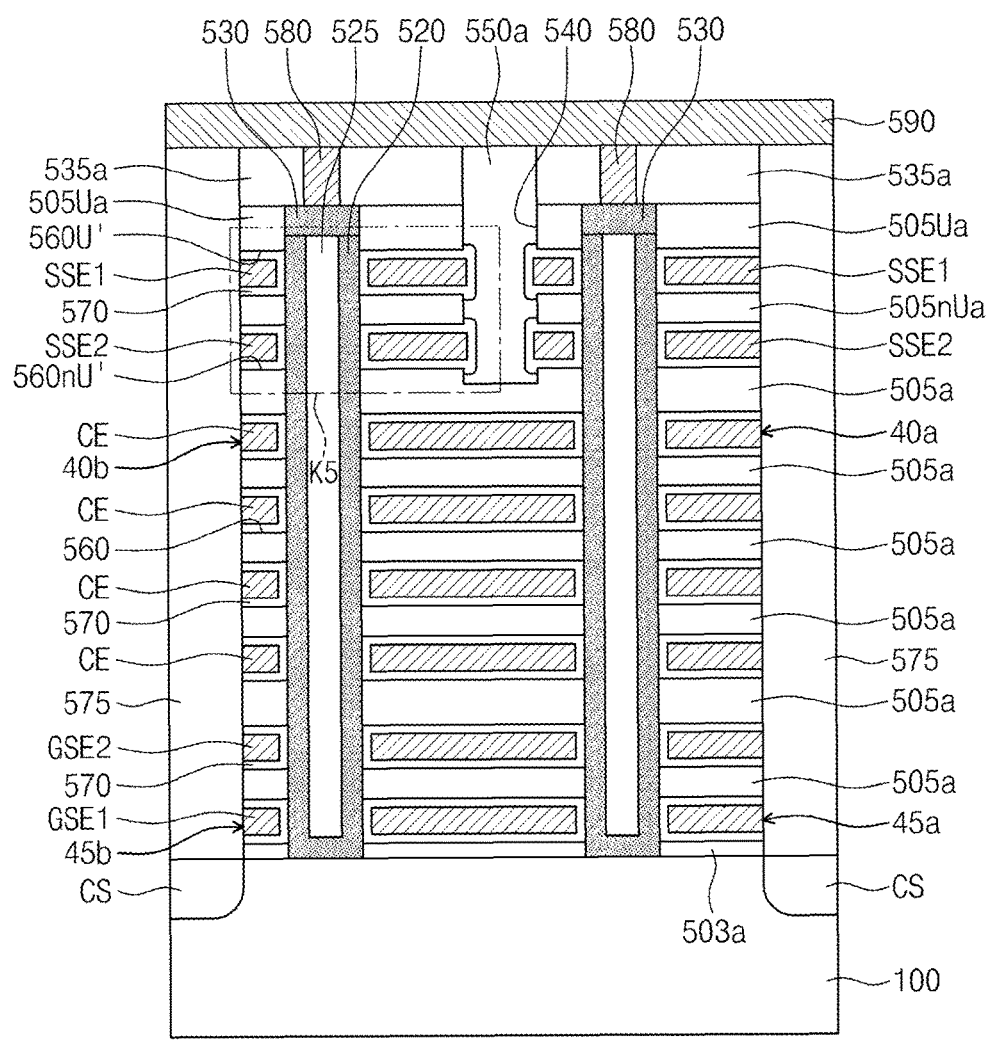
FIG. 45A illustrates a cross sectional view of a further modified embodiment of a three dimensional semiconductor memory device according to a fourth embodiment of the inventive concept.
Figure 45B:
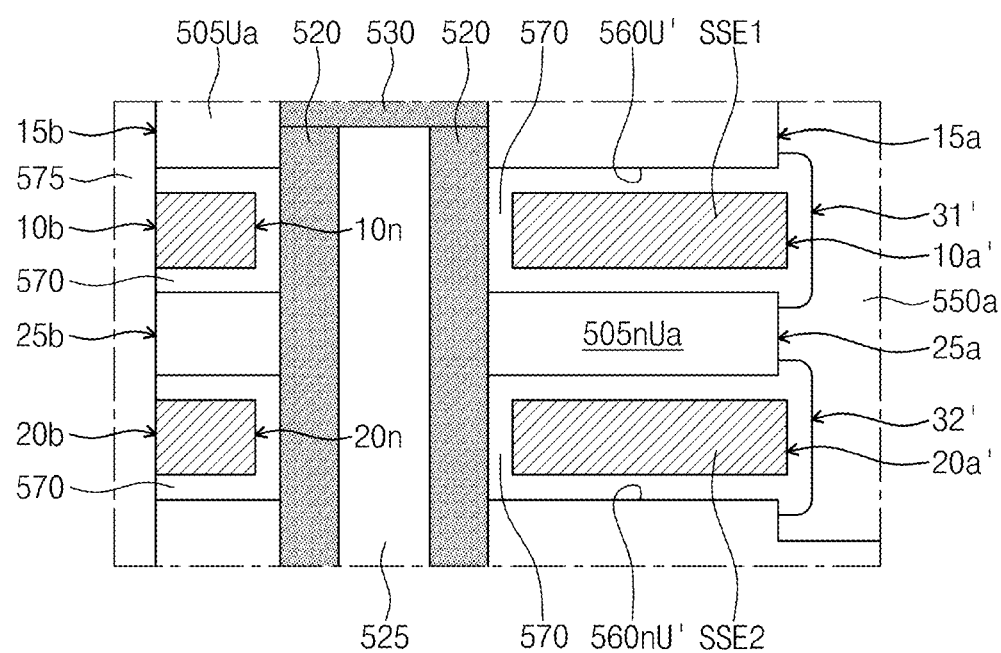
FIG. 45B illustrates an enlarged view of a portion 'K5' of FIG. 45A.

FIG. 45A illustrates a cross sectional view of a further modified embodiment of a three dimensional semiconductor memory device according to a fourth embodiment of the inventive concept. FIG. 45B is an enlarged view illustrating a portion 'K5' of FIG. 45A.

Referring to FIGS. 45A and 45B, each of uppermost empty regions 560U' may extend horizontally, e.g., along an x-axis direction, into the non sacrificial pattern 550a filling the cutting region 540. Thus, the width of each of the first string selection electrodes SSE1 formed in the uppermost empty regions 560U' may be increased. That is, a horizontal distance between the first and second outer sidewalls 10a' and 10b of each of the first string selection electrodes SSE1 may be increased. As a result, a first sidewall 31' of a first wall portion of a first extension of the electrode-dielectric layer 570 covering the first outer sidewall 10a' of the first string selection electrodes SSE1 may be offset from the first outer sidewall 15a of the uppermost insulating pattern 505Ua stacked on the first string selection electrodes SSE1. For example, the first sidewall 31' of the first wall portion may horizontally protrude more than the first outer sidewall 15a of the uppermost insulating pattern 505Ua. As described with reference to FIGS. 39A and 39B, the first extension may correspond to an extended portion of the electrode-dielectric layer 570 between the sidewall of the vertical active pattern 520 and the first string selection electrodes SSE1.

Similarly, each of next uppermost empty regions 560nU' may extend horizontally into the non sacrificial pattern 550a filling the cutting region 540. Thus, the width of each of the second string selection electrodes SSE2 formed in the next uppermost empty regions 560nU' may be increased. As a result, a first sidewall 32' of a second wall portion of a second extension of the electrode-dielectric layer 570 covering the first outer sidewall 20a' of the second string selection electrodes SSE2 may horizontally protrude more than the first outer sidewall 25a of the next uppermost insulating pattern 505nUa. The second extension may correspond to an extended portion of the electrode-dielectric layer 570 between the sidewall of the vertical active pattern 520 and the second string selection electrodes SSE1.

According to the above modified embodiment, the non sacrificial pattern 550a may include a dielectric material having an etch selectivity with respect to the insulating patterns 505a, 505nUa, 505Ua. In an embodiment, an etch rate of the non sacrificial pattern 550a may be faster than that of the insulating patterns 505a, 505nUa, 505Ua in a certain etchant such as an oxide etchant. For example, the insulating patterns 505a, 505nUa, 505Ua may include a relatively dense oxide material such as a high density plasma (HDP) oxide layer and/or a high temperature oxide (HTO) layer, and the non sacrificial pattern 550a may include a relatively porous oxide material such as a low temperature oxide (LTO) layer and/or a plasma enhanced chemical vapor deposition (PE-CVD) oxide layer. The LTO layer may correspond to an oxide layer which is formed at a process temperature within the range of about room temperature to about 600° C.

The uppermost empty region 560U' and the next uppermost empty region 560nU' may be applied to the three dimensional semiconductor memory device disclosed in FIGS. 41A and 41B. In this case, the widths of the first and second string selection electrodes SSE1k and SSE2k of FIGS. 41A and 41B may be increased. For example, in FIGS. 41A and 41B, the first sidewalls 55 and 56 of the uppermost barrier conductive pattern 85U and the next uppermost barrier conductive pattern 85nU may be offset from the first outer sidewalls 15a and 25a of the uppermost insulating pattern 505Ua and the next uppermost insulating pattern 505nUa. The first sidewalls 55 and 56 of the uppermost barrier conductive pattern 85U and the next uppermost barrier conductive pattern 85nU may laterally protrude toward the non sacrificial pattern 550a more than the first outer sidewalls 15a and 25a of the uppermost insulating pattern 505Ua and the next uppermost insulating pattern 505nUa.

Hereinafter, methods of fabricating three dimensional semiconductor memory devices according to embodiments of the inventive concept will be described with reference to the drawings.

FIGS. 46A to 50A illustrate plan views of stages in a method of fabricating a three dimensional semiconductor memory device according to a fourth embodiment of the inventive concept. FIGS. 46B to 50B are cross sectional views taken along lines I-I' of FIGS. 46A to 50A, respectively.

Figure 46A:
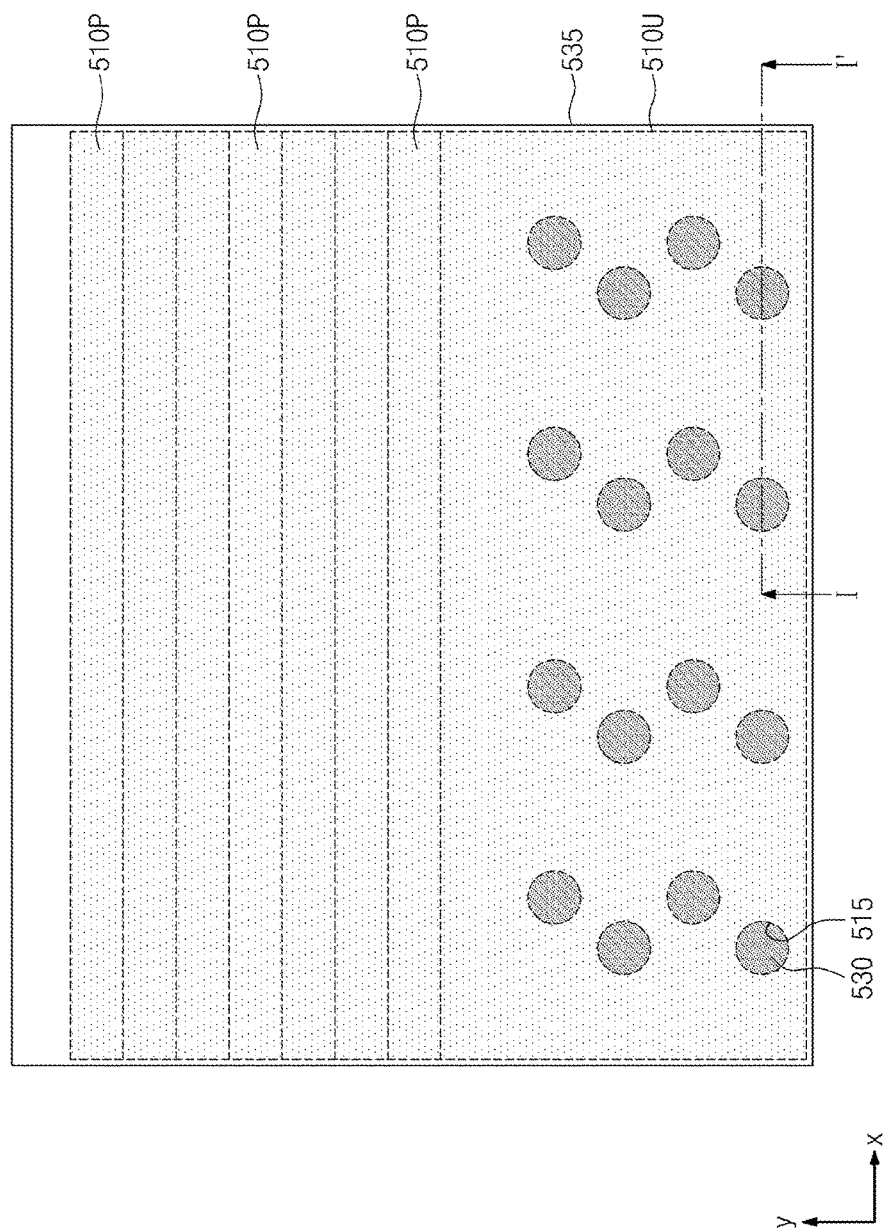
Figure 46B:
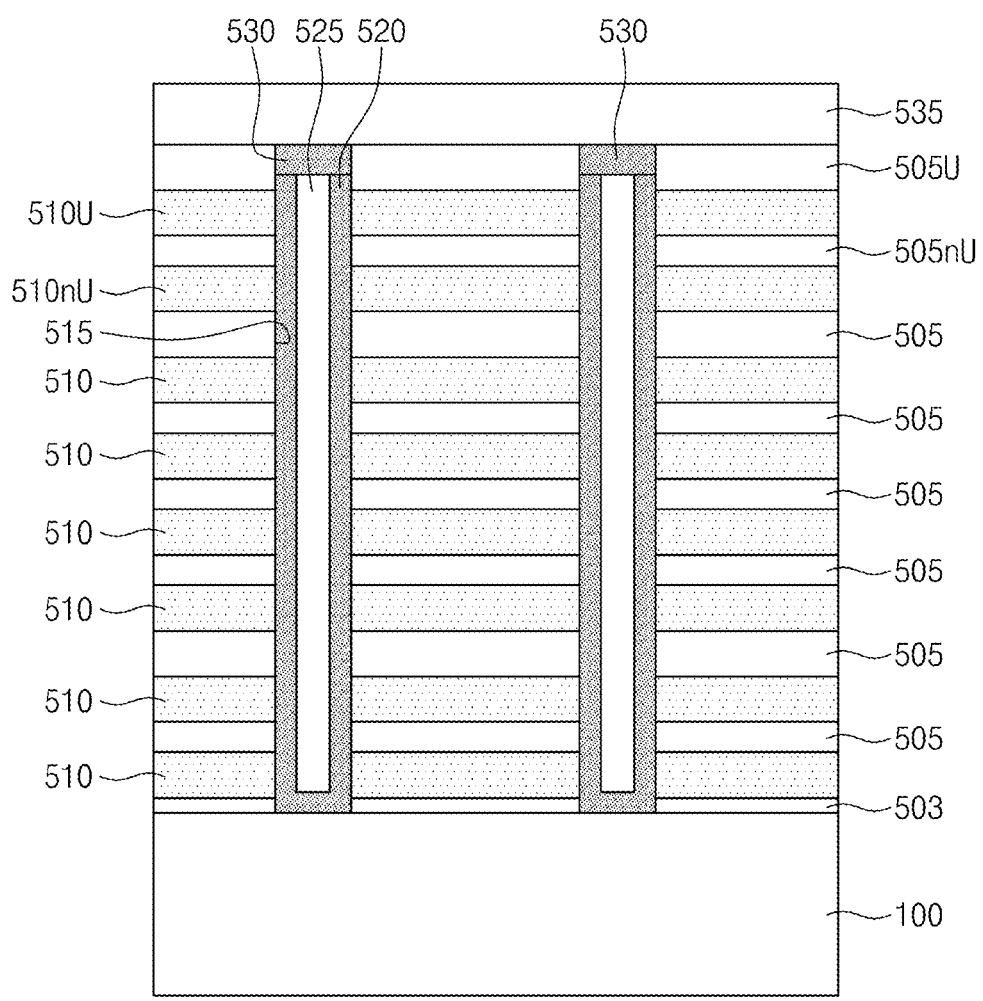

Referring to FIGS. 46A and 46B, a buffer dielectric layer 503 may be formed on the substrate 100 doped with dopants of a first conductivity type. A well region doped with dopants of the first conductivity type may be formed in the substrate 100. The sacrificial layers 510, 510nU, 510U and insulating layers 505, 505nU, 505U may be alternately and repeatedly stacked on the buffer dielectric layer 503. The uppermost insulating layer 505U may be disposed on the uppermost sacrificial layer 510U. The next uppermost insulating layer 505nU may be disposed between the uppermost sacrificial layer 510U and the next uppermost sacrificial layer 510nU. The sacrificial layer 510, 510nU, 510U may be formed of a material having an etch selectivity with respect to the insulating layers 505, 505nU, 505U. For example, each of the insulating layers 505, 505nU, 505U may be formed of an oxide layer such as a high density plasma (HDP) oxide layer and/or a high temperature oxide (HTO) layer, and each of the sacrificial layer 510, 510nU, 510U may be formed of a nitride layer.

The insulating layers 505, 505nU, 505U and the sacrificial layer 510, 510nU, 510U may be patterned to form sacrificial pads 510P of the sacrificial layers 510, 510nU, 510U. For example, a mask pattern may be formed to define the sacrificial pad 110P of the lowermost sacrificial layer among the sacrificial layers 510, 510nU, 510U. The insulating layers 505, 505nU, 505U and the sacrificial layers 510, 510nU, 510U may then be etched using the mask pattern as an etch mask. As such, the sacrificial pad 510P of the lowermost sacrificial layer may be formed. The mask pattern may be then recessed or shrunken to reduce a width of the mask pattern. The insulating layers 505, 505nU, 505U and the sacrificial layers 510, 510nU, 510U on the lowermost sacrificial layer may be etched using the recessed mask pattern as an etch mask. As such, the sacrificial pad 510P of the sacrificial layer 510 secondly stacked on the substrate 100 may be formed, and the sacrificial pad 510P of the lowermost sacrificial layer may be exposed. The recess process of the mask pattern and the etch process of the insulating layers 505, 505nU, 505U and the sacrificial layers 510, 510nU, 510U may be repeatedly performed to form the sacrificial pads 510P exhibiting a stepped shape.

Holes 515 penetrating the insulating layers 505, 505nU, 505U, the sacrificial layers 510, 510nU, 510U and the buffer dielectric layer 503 may be formed. A vertical active pattern 520, a filling dielectric pattern 525, and a landing pad 530 may be formed in each of the holes 515. A capping dielectric layer 535 may be formed on an entire surface of the substrate having the vertical active patterns 520, the filling dielectric patterns 525 and the landing pads 530. The capping dielectric layer 535 may be formed to include a dielectric material having an etch selectivity with respect to the sacrificial layers 510, 501nU, 510U. For example, the capping dielectric layer 535 may be formed of an oxide layer.

Figure 47A:
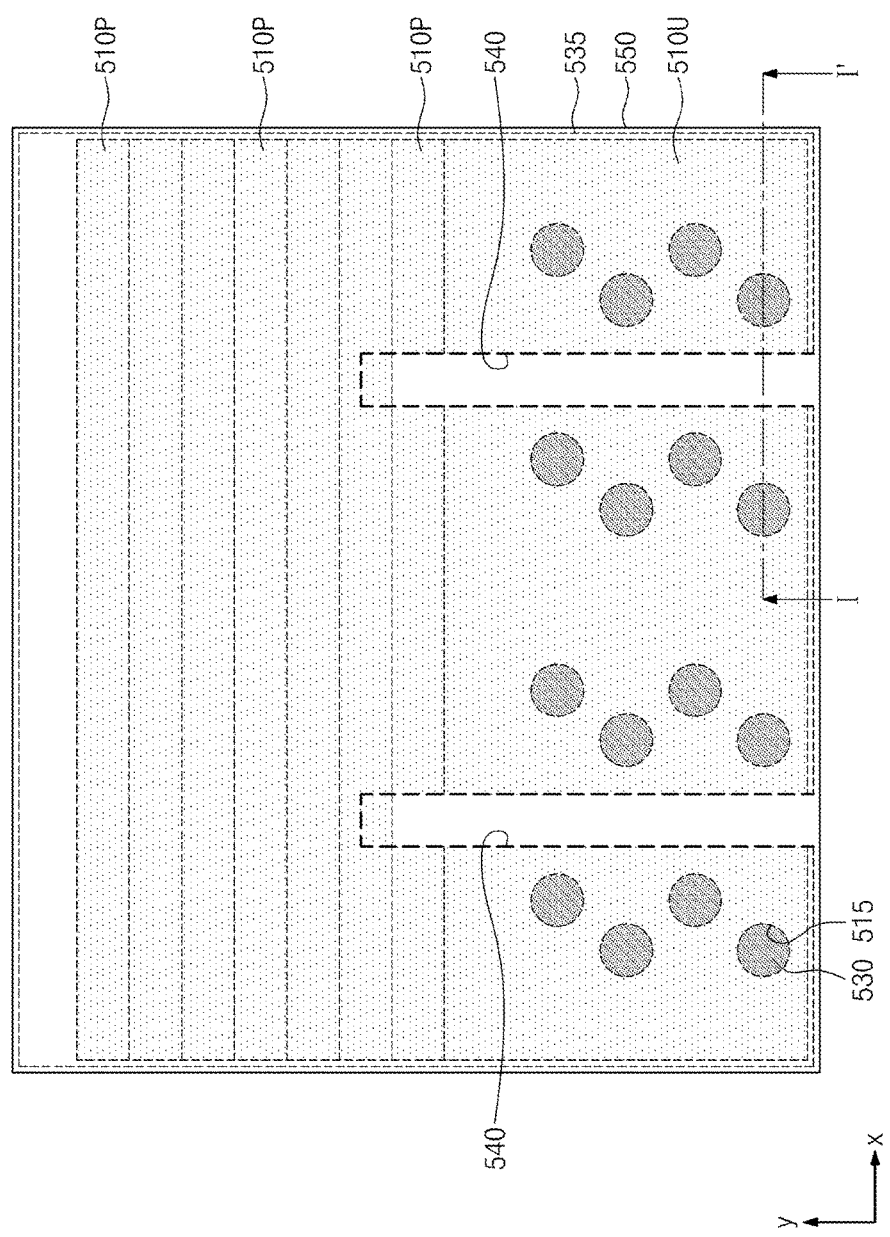
Figure 47B:
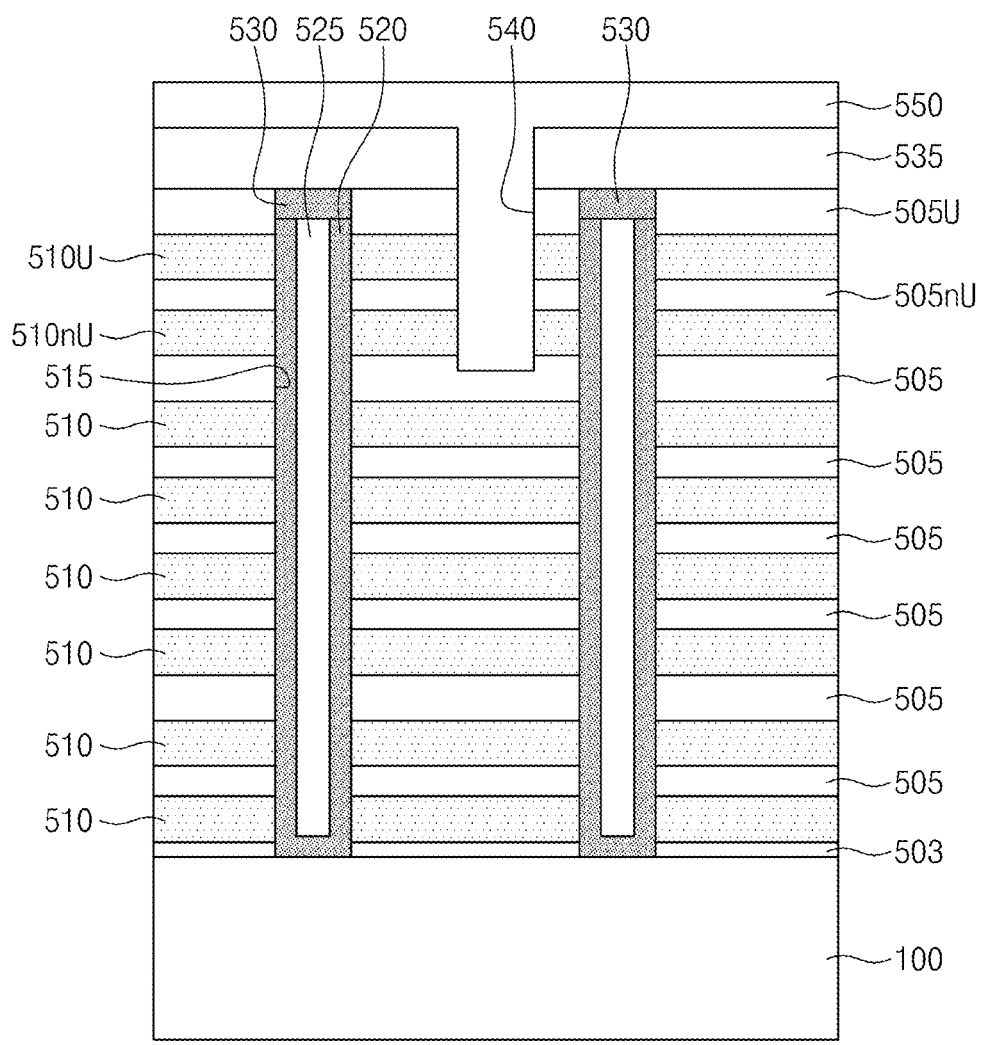

Referring to FIGS. 47A and 47B, the capping dielectric layer 535, at least the uppermost insulating layer 505U and at least the uppermost sacrificial layer 510U may be successively patterned to form cutting regions 540. In an embodiment, the cutting regions 540 may be formed by successively patterning the capping dielectric layer 535, the uppermost insulating layer 505U, the uppermost sacrificial layer 510U, the next uppermost insulating layer 505nU, and the next uppermost sacrificial layer 510nU. As disclosed in FIG. 47A, the cutting regions 540 may separate each of the sacrificial pads 510P of the uppermost sacrificial layer 510U and the next uppermost sacrificial layer 510nU into a plurality of segments. In a plan view, end portions of the cutting regions 540 may overlap with any one of the sacrificial pads 510P of the sacrificial layers which are replaced with cell electrodes or string selection electrodes in a subsequent process.

A non sacrificial layer 550 contacting inner surfaces of the cutting regions 540 may be formed on the substrate having the cutting regions 540. The non sacrificial layer 550 may fill the cutting regions 540. The non sacrificial layer 550 may be in contact with entire surfaces of both inner sidewalls of the respective cutting regions 540. At least a portion of the non sacrificial layer 550 contacting both inner sidewalls of the respective cutting regions 540 may include an insulating material having an etch selectivity with respect to the sacrificial layers 510, 510nU, 510U. In an embodiment, at least the portion of the non sacrificial layer 550 contacting both inner sidewalls of the respective cutting regions 540 may include an insulating material having an etch rate which is less than 0.1 times that of the sacrificial layers 510, 510nU, 510U. For example, when the sacrificial layers 510, 510nU, 510U are formed of a nitride layer, the non sacrificial layer 550 may be formed of an oxide layer and/or an undoped semiconductor layer (e.g., an undoped silicon layer).

Figure 48A:
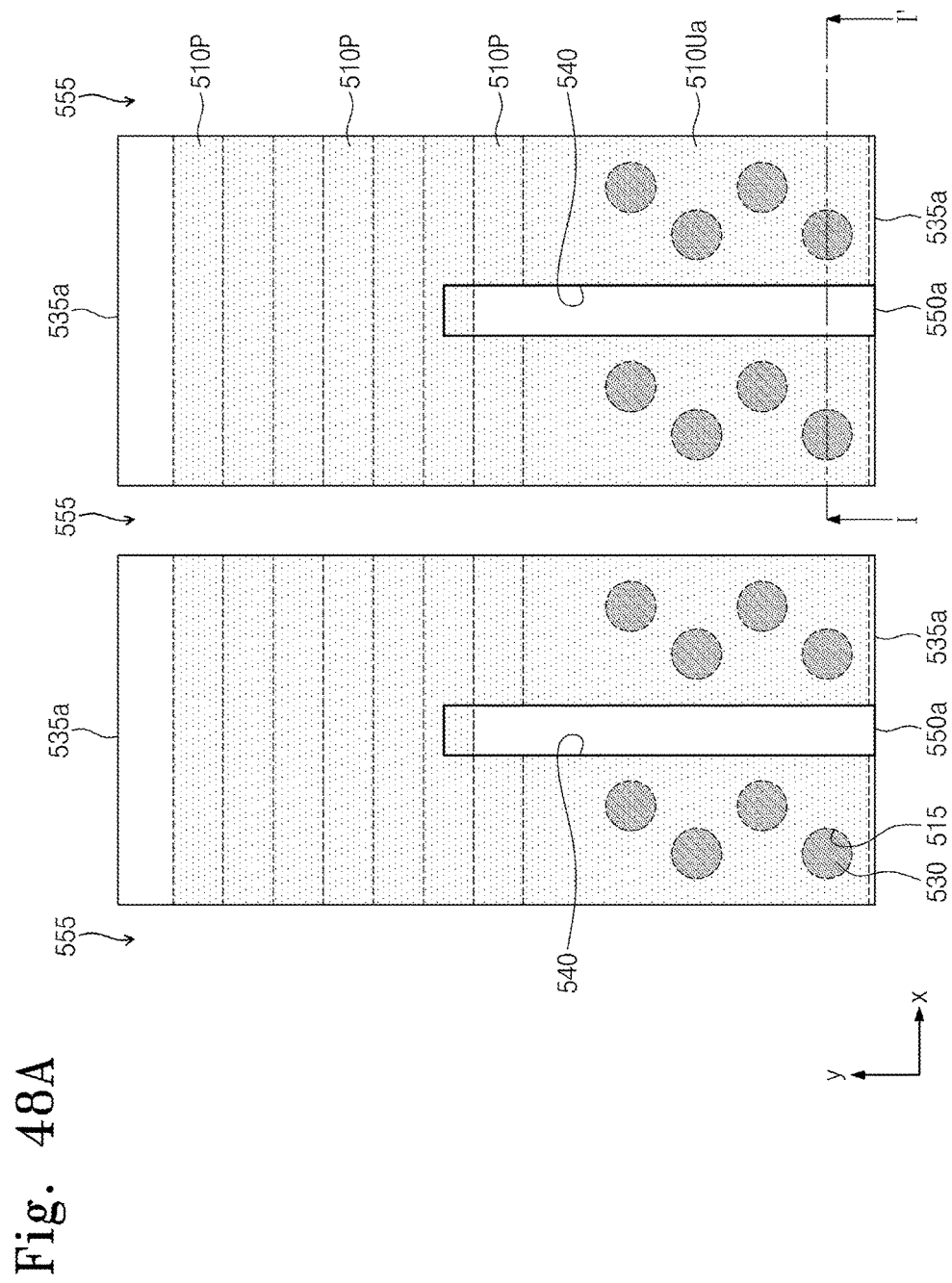
Figure 48B:
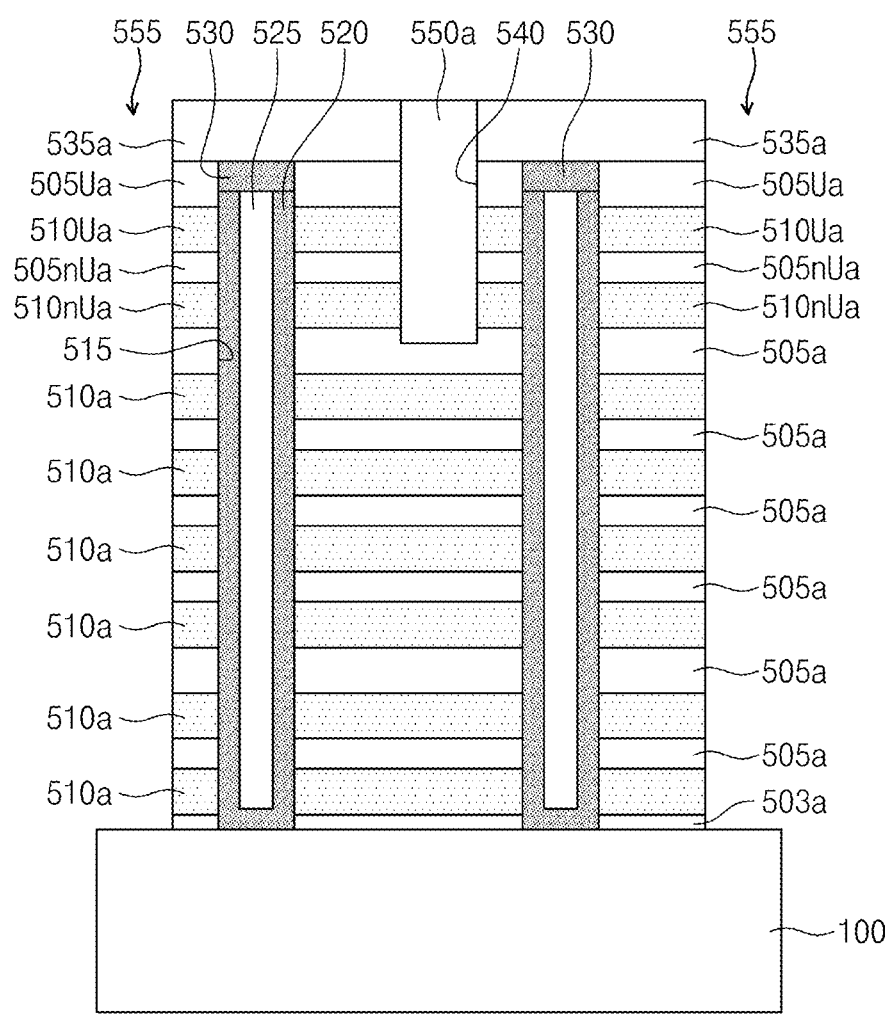

Referring to FIGS. 48A and 48B, the non sacrificial layer 550 may be planarized to expose the capping dielectric layer 535 and to form non sacrificial patterns 550a in the cutting regions 540 respectively. As such, top surfaces of the non sacrificial patterns 550a may be substantially coplanar with a top surface of the capping dielectric layer 535.

The capping dielectric layer 535, the insulating layers 505, 505nU, 505U, and the sacrificial layers 510, 510nU, 510U may be successively patterned to form trenches 555. The trenches 555 may extend in parallel in a first direction. The trenches 555 may define a plurality of mold patterns separated from each other. Each of the mold patterns may be formed between the pair of adjacent mold patterns. Further, each of the cutting regions 540 may be disposed between the pair of adjacent trenches 555. The mold patterns may be completely separated from each other by the trenches 555. Each of the mold patterns may include sacrificial patterns 510a, 510nUa, 510Ua and insulating patterns 505a, 505nUa, 505Ua which are alternately and repeatedly stacked. Moreover, each of the mold patterns may further include the cutting region 540 and the non sacrificial pattern 550a. As such, each of the mold patterns may include a plurality of uppermost insulating patterns 505Ua separated from each other by the cutting region 540. In addition, each of the mold patterns may include a plurality of uppermost sacrificial patterns 510Ua separated from each other by the cutting region 540. Similarly, each of the mold patterns may include a plurality of next uppermost insulating patterns 505nUa and a plurality of next uppermost sacrificial patterns 510nUa. In each mold pattern, a single sacrificial pattern 510a may be disposed in each level under the cutting region 540.

As mentioned above, the mold patterns may be completely separated from each other by the trenches 555. Thus, the sacrificial pads 510P of the sacrificial patterns 510a, 510nUa, 510Ua in each mold pattern may be separated from the sacrificial pads 510P of the sacrificial patterns 510a, 510nUa, 510Ua in the adjacent mold pattern. Each of the mold patterns may further include a capping dielectric pattern 535a. The capping dielectric pattern 535a may cover the uppermost insulating patterns 505Ua and the sacrificial pads 510P in each of the mold patterns.

While the trenches 555 are formed, the buffer dielectric layer 503 may also be etched to form a buffer dielectric pattern 503a in each mold pattern. Alternatively, at least a portion of the buffer dielectric layer 503 may remain under the respective trenches 555.

Figure 49A:
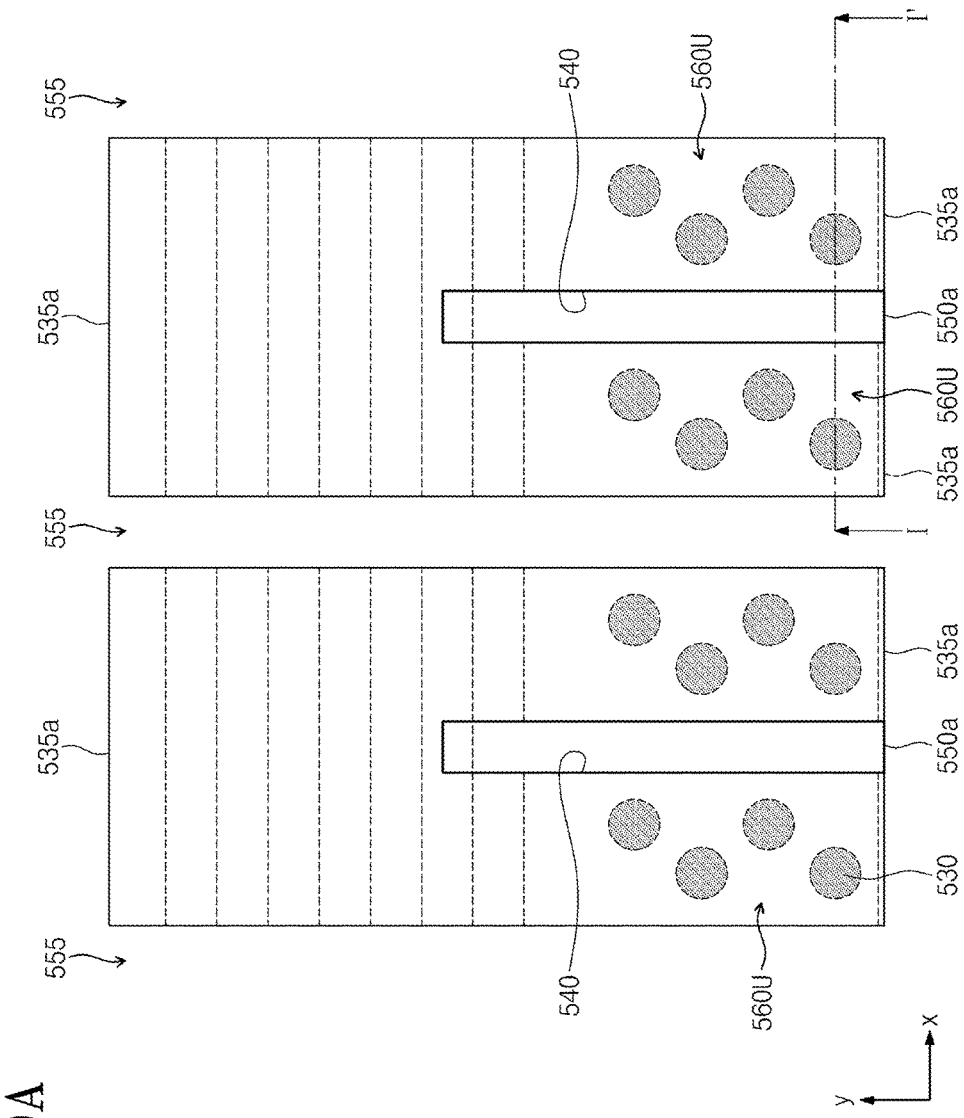
Figure 49B:
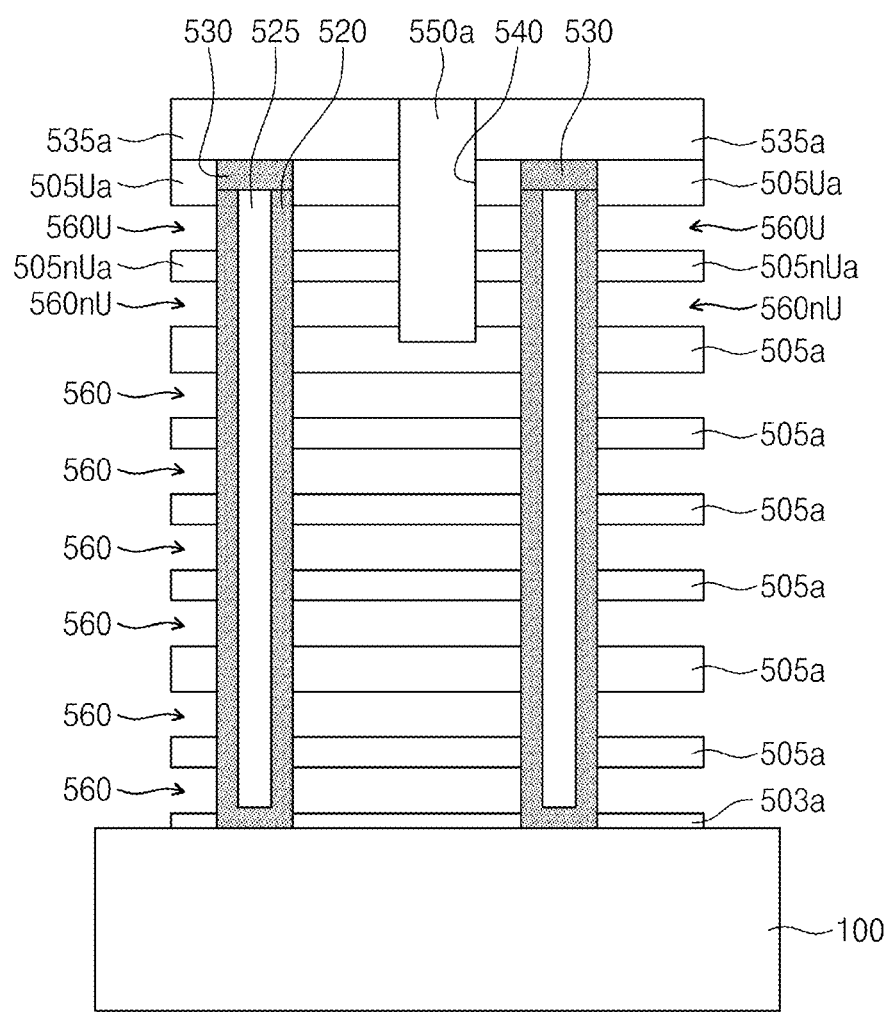

Referring to FIGS. 49A and 49B, the sacrificial patterns 510a, 510nUa, 510Ua exposed by the trenches 555 may be removed to form empty regions 560, 560nU, 560U. In each mold pattern, the pair of uppermost empty regions 560U may be formed at both sides of the non sacrificial pattern 550a respectively, and the pair of next uppermost empty regions 560nU may be formed at both sides of the non sacrificial pattern 550a respectively. One side of the uppermost empty region 560U may be closed by the non sacrificial pattern 550a, and the other side of the uppermost empty region 560U may be opened by the trench 555. Similarly, one side of the next uppermost empty region 560nU may be closed by the non sacrificial pattern 550a, and the other side of the next uppermost empty region 560nU may be opened by the trench 555. Each of the empty regions 560 under the cutting region 540 may include both sides opened by the trenches 555.

Figure 50A:
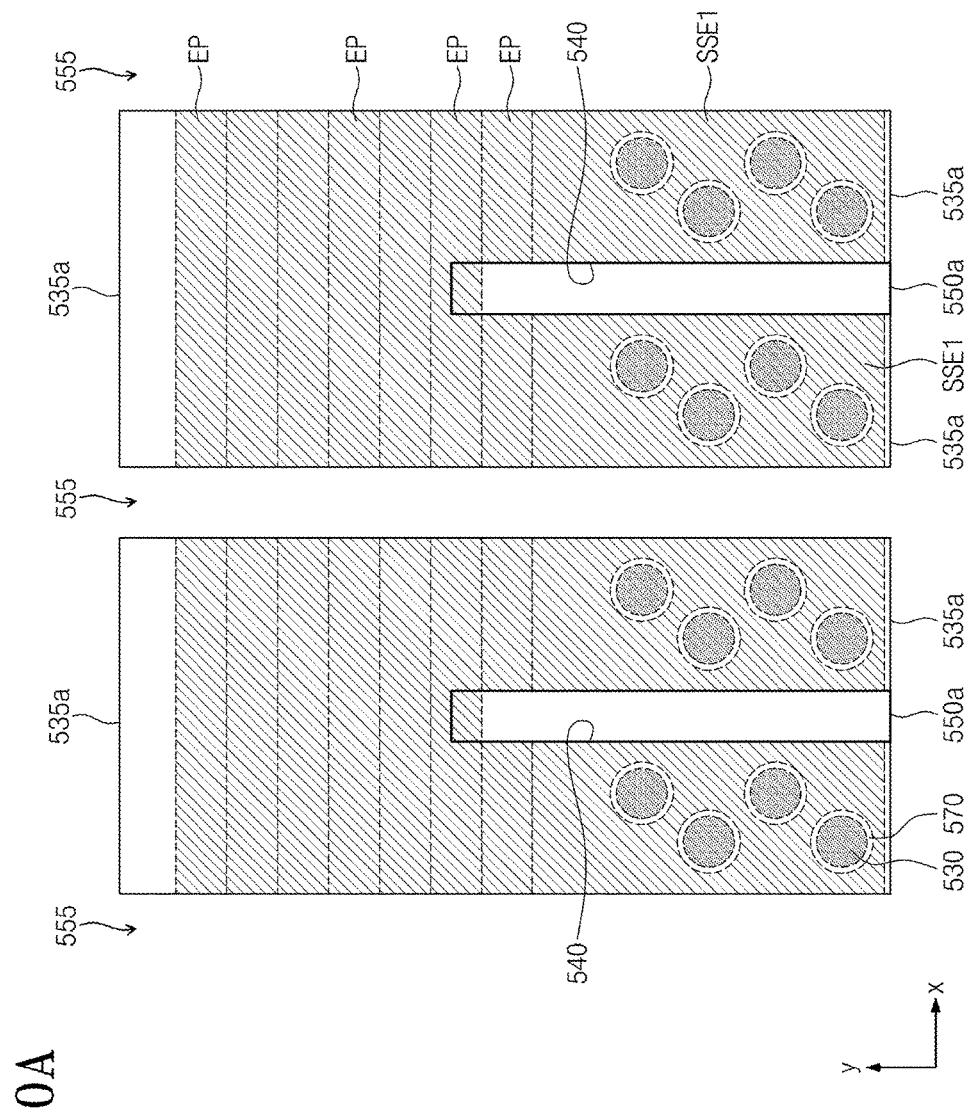
Figure 50B:
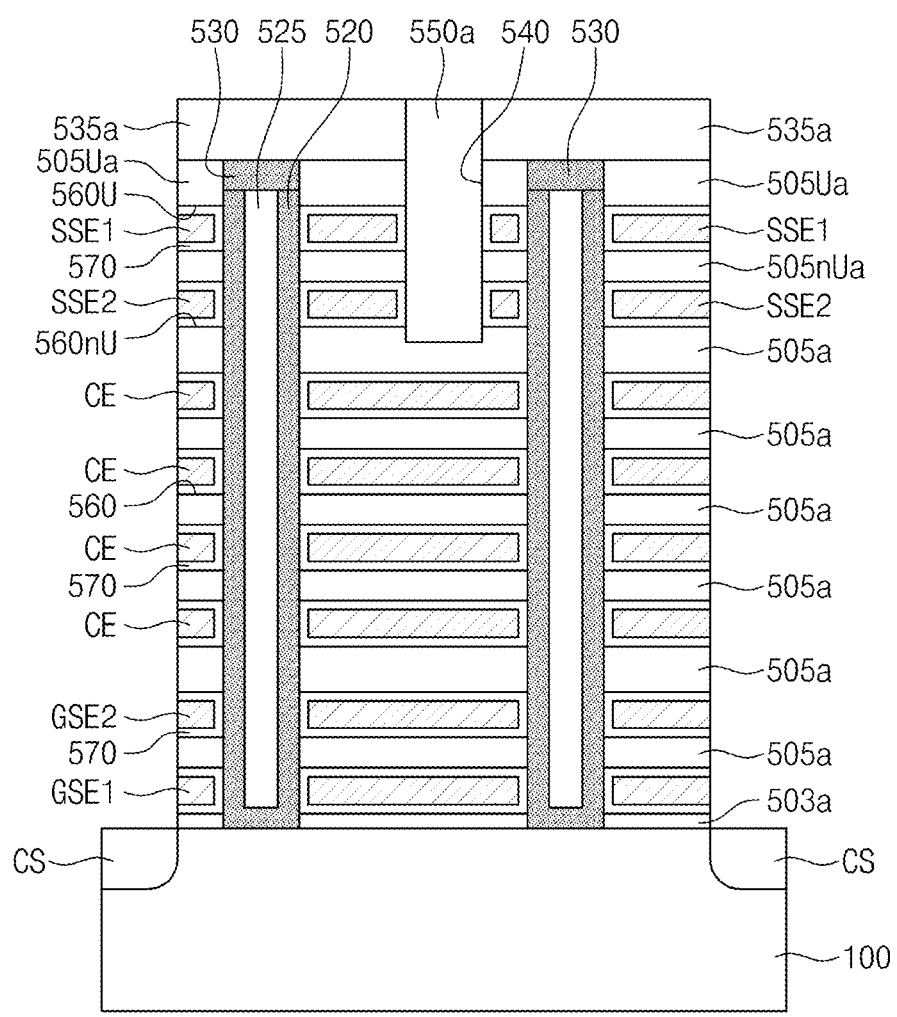

Referring to FIGS. 50A and 50B, an electrode-dielectric layer 570 may be conformably formed on the substrate including the empty regions 560, 560nU, 560U. The electrode-dielectric layer 570 may be formed to a substantially uniform thickness on inner surfaces of the empty regions 560, 560nU, 560U.

Subsequently, a conductive layer filling the empty regions 560, 560nU, 560U may be formed on the substrate including the electrode-dielectric layer 570. The conductive layer formed outside the empty regions 560, 560nU, 560U may be removed to form electrodes GSE1, GSE2, CE, SSE2, SSE1 in the empty regions 560, 560nU, 560U respectively. As such, the electrode structures described with reference to FIGS. 39A to 39E may be formed. After formation of the electrodes GSE1, GSE2, CE, SSE2, SSE1, the electrode-dielectric layer 570 outside the empty regions 560, 560nU, 560U may be removed.

Dopant ions of a second conductivity type may be implanted into the substrate 100 under the trenches 555, thereby forming common source regions CS. The common source regions CS may be formed after forming the electrodes GSE1, GSE2, CE, SSE2, SSE1. Alternatively, the common source regions CS may be formed prior to formation of the empty regions 560, 560nU, 560U.

Subsequently, isolation patterns (575 of FIGS. 39A to 39E) may be formed to fill the trenches 555, respectively. Contact plugs (580 of FIGS. 39A to 39E) and interconnections (590 of FIGS. 39A to 39E) may be then formed. As such, the three dimensional semiconductor memory device disclosed in FIGS. 39A to 39E may be realized.

According to the fabrication methods described above, after formation of the cutting regions 540 and the non sacrificial layer 550, the trenches 555, the sacrificial patterns 510a, 510nUa, 510Ua and the empty regions 560, 560nU, 560U may be formed. That is, the uppermost empty regions 560U separated by the non sacrificial pattern 550a may be formed, and the next uppermost empty regions 560nU separated by the non sacrificial pattern 550a may also be formed. As such, in each electrode structure, the first string selection electrodes SSE1 separated from each other and the second string selection electrodes SSE2 separated from each other may be simultaneously formed together with the cell electrodes CE and the ground selection electrodes GSE1 and GSE2.

As a result, the first outer sidewalls (adjacent to the non sacrificial pattern 550a) of the string selection electrodes SSE1 and SSE2 may be protected from an etching process. That is, physical loss of the string selection electrodes SSE1 and SSE2 by an etching process may be minimized to prevent the electrical resistance of the string selection electrodes SSE1 and SSE2 from increasing. As such, a high reliable and highly integrated three dimensional semiconductor memory device may be realized.

Figure 51:
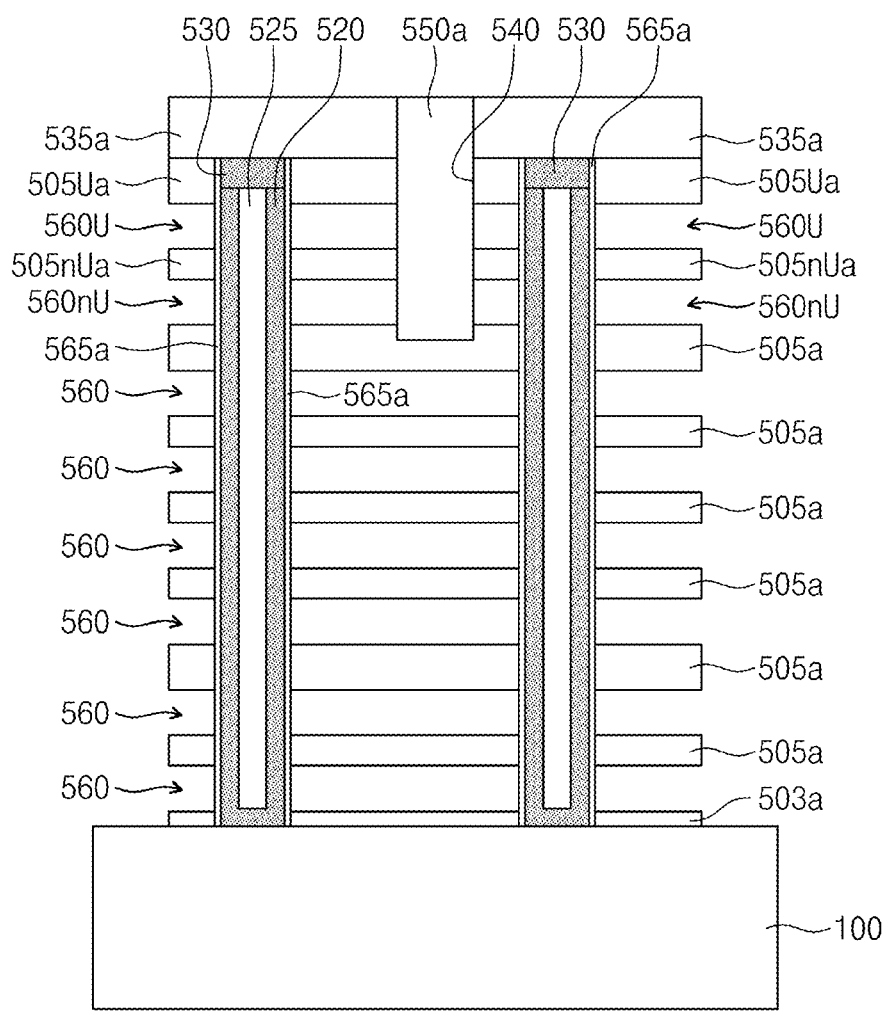
FIG. 51 illustrates a cross sectional view of a modified embodiment of a method of fabricating a three dimensional semiconductor memory device according to a fourth embodiment of the inventive concept.

FIG. 51 is a cross sectional view illustrating a modified embodiment of a method of fabricating a three dimensional semiconductor memory device according to a fourth embodiment of the inventive concept.

Prior to formation of the vertical active patterns 520 disclosed in FIGS. 46A and 46B, a first portion 565a of an electrode-dielectric layer may be formed on inner sidewalls of the holes 515. Subsequently, the same processes as described with reference to FIGS. 47A to 49A and FIGS. 47B to 49B may be performed. As such, empty regions 560, 560nU, 560U may be formed, as illustrated in FIG. 51. The empty regions 560, 560nU, 560U of FIG. 51 may expose the first portion 565a of the electrode-dielectric layer formed on the sidewalls of the vertical active patterns 520. A second portion (565b of FIGS. 40A and 40B) of the electrode-dielectric layer may be then formed on inner surfaces of the empty regions 560, 560nU, 560U, and electrodes GSE1, GSE2, CE, SSE2, SSE1 filling the empty regions 560, 560nU, 560U may be then formed. As such, the electrode structures disclosed in FIGS. 40A and 40B may be formed.

Prior to formation of the vertical active patterns 520 disclosed in FIGS. 46A and 46B, the electrode-dielectric layer 570' of FIGS. 41A and 41B may be formed on the inner sidewalls of the holes 515. Subsequently, the same processes as described with reference to FIGS. 47A to 49A and FIGS. 47B to 49B may be performed. In this case, the empty regions 560, 560nU, 560U may expose the electrode-dielectric layer 570' formed on the sidewalls of the vertical active patterns 520. After a barrier conductive layer is conformably formed in the empty regions 560, 560nU, 560U, a metal layer filling the empty regions 560, 560nU, 560U may be formed. The barrier conductive layer and the metal layer outside the empty regions 560, 560nU, 560U may be removed to form the electrodes GSE1k, GSE2k, CEk, SSE2k, SSE1k. As such, the electrode structures described with reference to FIGS. 41A and 41B may be formed.

In the fabrication methods described with reference to FIGS. 47A, 47B, 48A, and 48B, the non sacrificial layer 550 may not be planarized. Subsequently, the same processes as described with reference to FIGS. 49A, 49B, 50A, and 50B may be performed. As a result, the three dimensional semiconductor memory device disclosed in FIG. 42 may be realized.

According to the fabrication methods described with reference to FIGS. 46A to 50A and FIGS. 46B to 50B, the cutting regions 540 and the non sacrificial layer 550 may be formed after formation of the sacrificial pads 510P. Alternatively, the sacrificial pads 510P may be formed after formation of the cutting regions 540 and the non sacrificial layer 550. This method will be described with reference to the drawings, hereinafter.

Figure 52A:
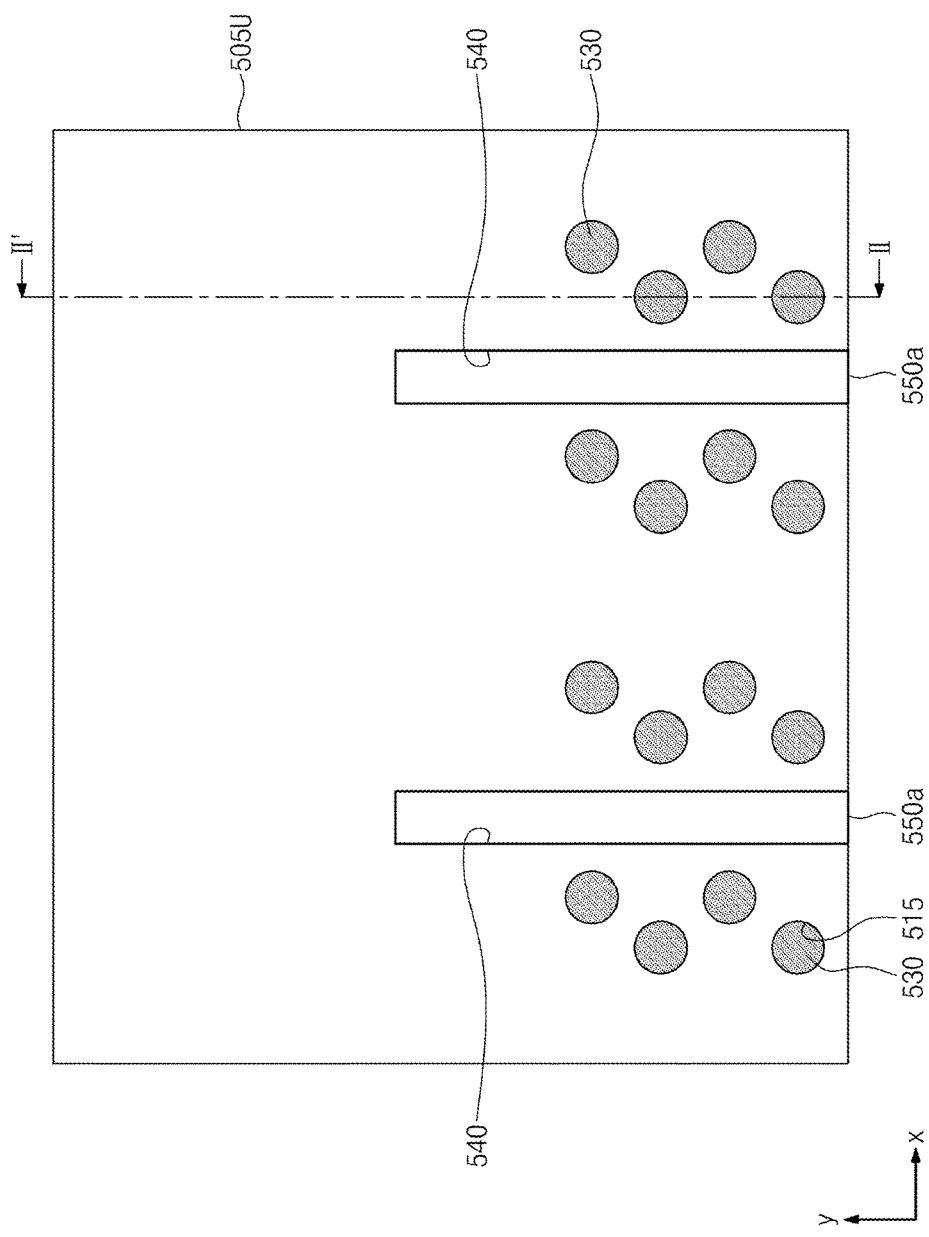
FIGS. 52A and 53A illustrate plan views of another modified embodiment of a method of fabricating a three dimensional semiconductor memory device according to a fourth embodiment of the inventive concept.
Figure 52B:
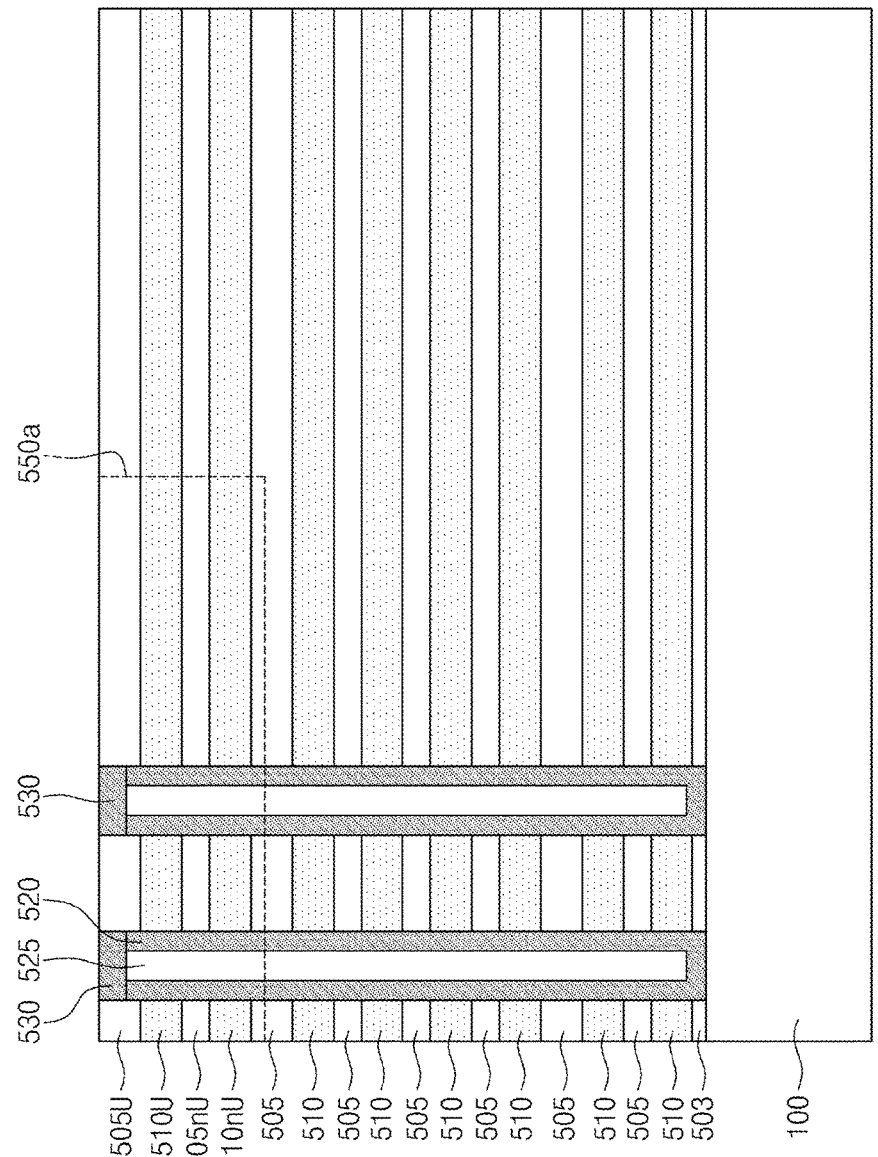
FIGS. 52B and 53B illustrate cross sectional views taken along lines I-I' of FIGS. 52A to 53A, respectively.
Figure 53A:
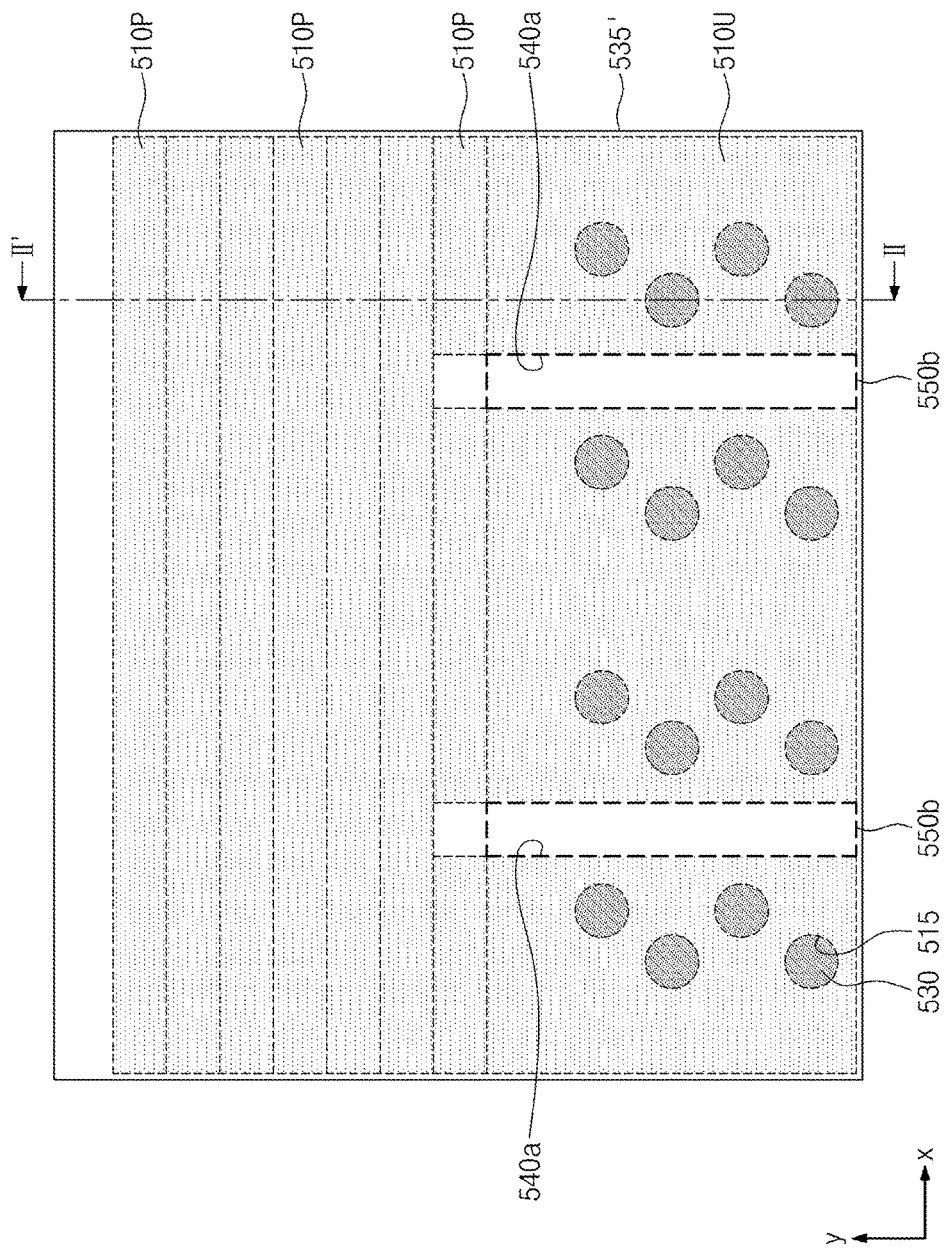
Figure 53B:
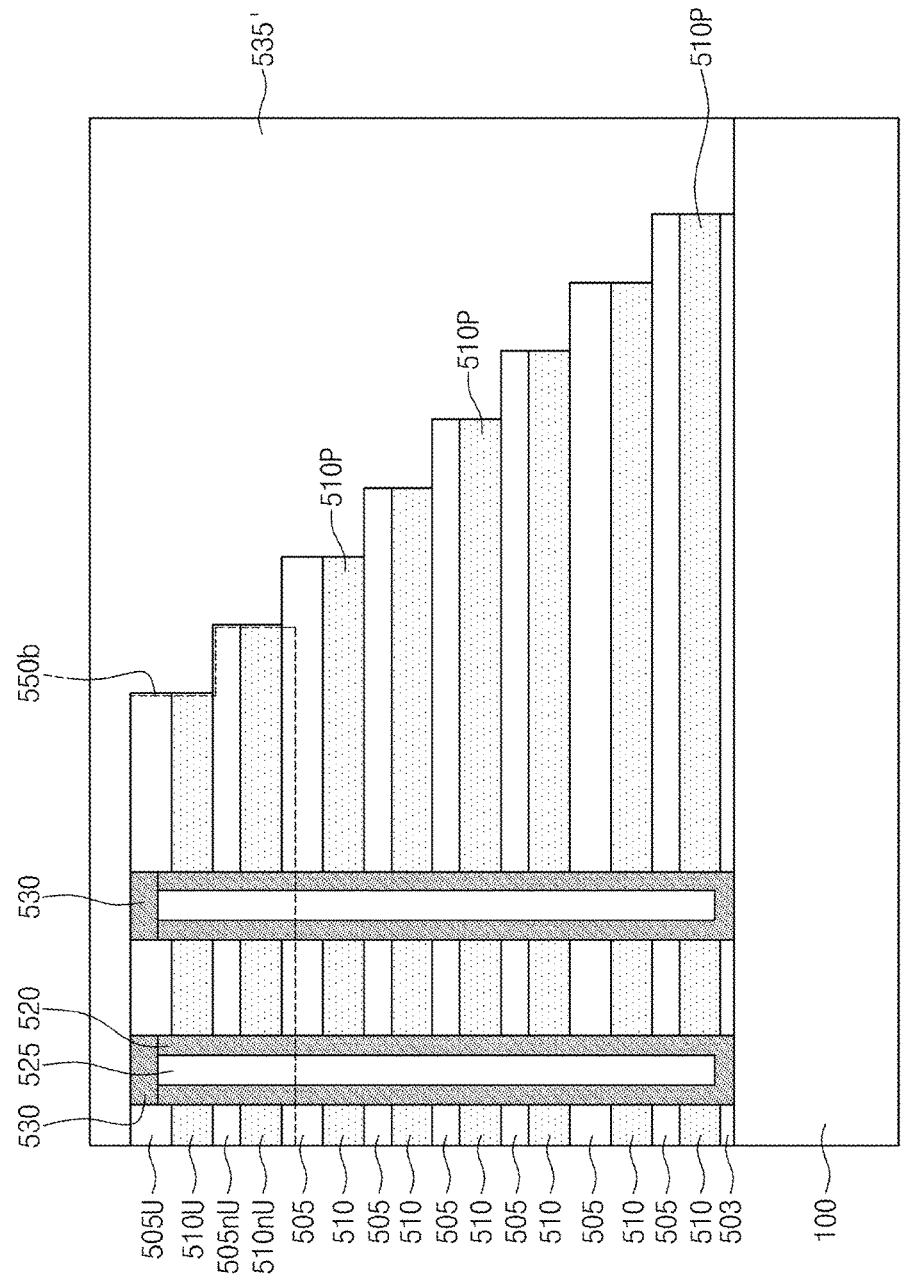

FIGS. 52A and 53A are plan views illustrating another modified embodiment of a method of fabricating a three dimensional semiconductor memory device according to a fourth embodiment of the inventive concept. FIGS. 52B and 53B are cross sectional views taken along lines I-I' of FIGS. 52A to 53A, respectively.

Referring to FIGS. 52A and 52B, prior to formation of the sacrificial pads, the uppermost insulating layer 505U, the uppermost sacrificial layer 510U, the next uppermost insulating layer 505nU and the next uppermost sacrificial layer 510nU may successively patterned to form the cutting regions 540. The non sacrificial layer contacting inner surfaces of the cutting regions 540 may be then formed on the substrate including the cutting regions 540, and the non sacrificial layer may be planarized to form the non sacrificial patterns 550a in the cutting regions 540.

Referring to FIGS. 53A and 53B, after formation of the non sacrificial patterns 550a, the insulating layers 505U, 505nU, 505 and the sacrificial layers 510U, 510nU, 510 may be patterned to form the sacrificial pads 510P. While the insulating layers 505U, 505nU, 505 and the sacrificial layers 510U, 510nU, 510 are patterned to form the sacrificial pads 510P, end portions of the non sacrificial patterns 550a may also be etched when viewed from a plan view. As such, each of the end portions of the etched non sacrificial patterns 550b may have a stepped structure, as illustrated in FIG. 53B. As illustrated in FIG. 53A, ends of the uppermost surfaces of the etched non sacrificial patterns 550b may be aligned with ends of the uppermost sacrificial layers 510U having the sacrificial pads 510P in the second direction. The following processes may be performed using the same manners as described with reference to FIGS. 48A to 50A and FIGS. 48B to 50B. As such, the three dimensional semiconductor memory device illustrated in FIGS. 43A and 43B may be realized.

When the cutting regions 540 disclosed in FIGS. 47A and 47B are formed, at least one sacrificial layer 510 located under the bottom surfaces of the cutting regions 540 may be further etched. As such, each of the cutting regions may penetrate the uppermost sacrificial layer 510U, the next uppermost sacrificial layer 510nU and at least one sacrificial layer 510 disposed under the next uppermost sacrificial layer 510nU. Subsequently, the non sacrificial layer 550 may be formed, and the methods described with reference to FIGS. 48A to 50A and FIGS. 48B to 50B may be performed. As a result, the three dimensional semiconductor memory device including the cutting regions 540' illustrated in FIG. 44 may be realized.

Figure 54:
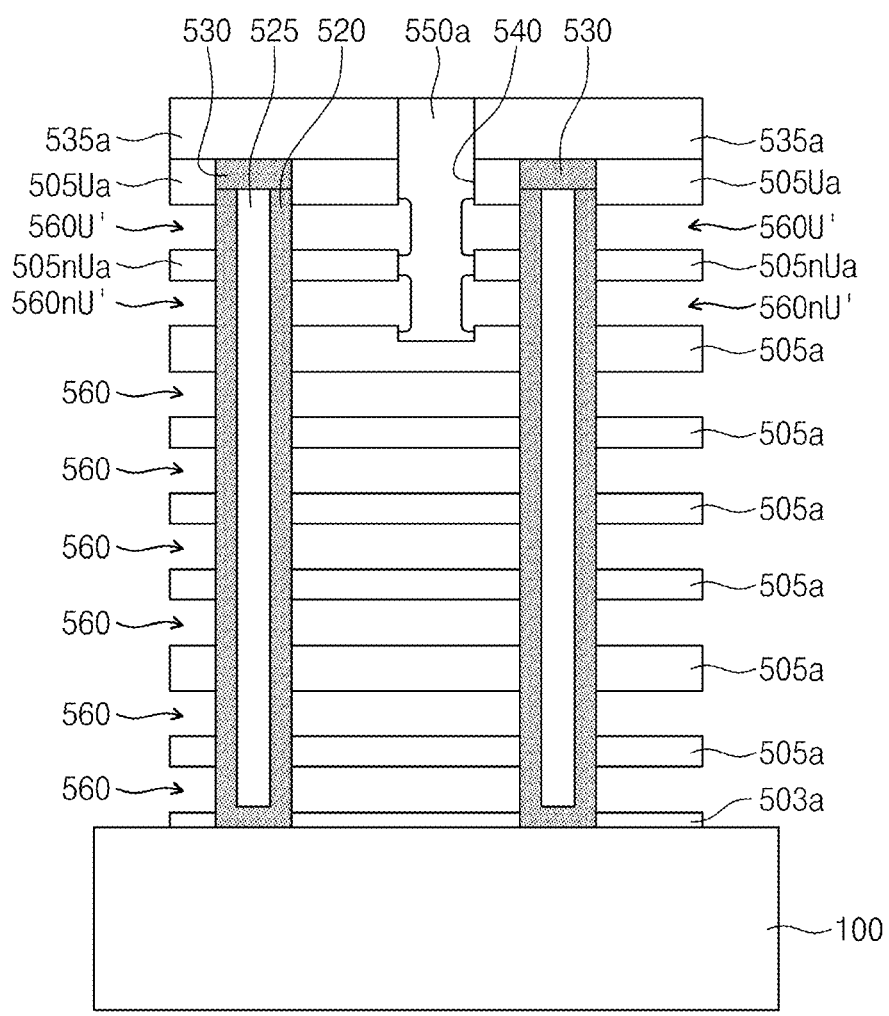
FIG. 54 illustrates a cross sectional view of still another modified embodiment of a method of fabricating a three dimensional semiconductor memory device according to a fourth embodiment of the inventive concept.

FIG. 54 is a cross sectional view illustrating still another modified embodiment of a method of fabricating a three dimensional semiconductor memory device according to a fourth embodiment of the inventive concept.

While the sacrificial patterns 510a, 510nUa, 510Ua disclosed in FIGS. 48A and 48B are removed, the non sacrificial pattern 550a contacting the uppermost sacrificial patterns 510Ua and the next uppermost sacrificial patterns 510nUa may be partially recessed. As a result, uppermost empty regions 560U', next uppermost empty regions 560nU' and empty regions 560 may be formed, as illustrated in FIG. 54. In this case, the non sacrificial pattern 550a may include a dielectric layer having an etch selectivity with respect to the sacrificial patterns 510a, 510nUa, 510Ua. Further, the non sacrificial pattern 550a may also include a dielectric layer having an etch selectivity with respect to the insulating patterns 505a, 505nUa, 505Ua.

In an embodiment, during removal of the sacrificial patterns 510a, 510nUa, 510Ua, the sacrificial patterns 510a, 510nUa, 510Ua may exhibit a highest (e.g., fastest) etch rate and the insulating patterns 505a, 505nUa, 505Ua may exhibit a lowest (e.g., slowest) etch rate. In this case, the non sacrificial pattern 550a may have an etch rate which is less than an etch rate of the sacrificial patterns 510a, 510nUa, 510Ua and is greater than an etch rate of the insulating patterns 505a, 505nUa, 505Ua. For example, the sacrificial patterns 510a, 510nUa, 510Ua may be formed of a nitride layer, and the insulating patterns 505a, 505nUa, 505Ua may be formed of an oxide layer such as a high density plasma (HDP) oxide layer and/or a high temperature oxide (HTO) layer. Further, the non sacrificial pattern 550a may be formed of a low temperature oxide (LTO) layer and/or a plasma enhanced chemical vapor deposition (PE-CVD) oxide layer. The LTO layer may correspond to an oxide layer which is formed at a process temperature within the range of about room temperature to about 600° C.

Subsequently, the same processes as described with reference to FIGS. 50A and 50B may be performed. As a result, the three dimensional semiconductor memory device illustrated in FIGS. 45A and 45B may be realized.

Elements (or components) of the three dimensional semiconductor memory devices according to the first, second, third and fourth embodiments described above may be combined with each other in various forms under a non-contradictable condition.

The three dimensional semiconductor memory devices described above may be encapsulated using various packaging techniques. For example, the three dimensional semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique, and a wafer-level processed stack package (WSP) technique.

The package in which the three dimensional semiconductor memory device according to one of the above embodiments is mounted may further include at least one semiconductor device (e.g., a controller and/or a logic device) that controls the three dimensional semiconductor memory device.

Figure 55:
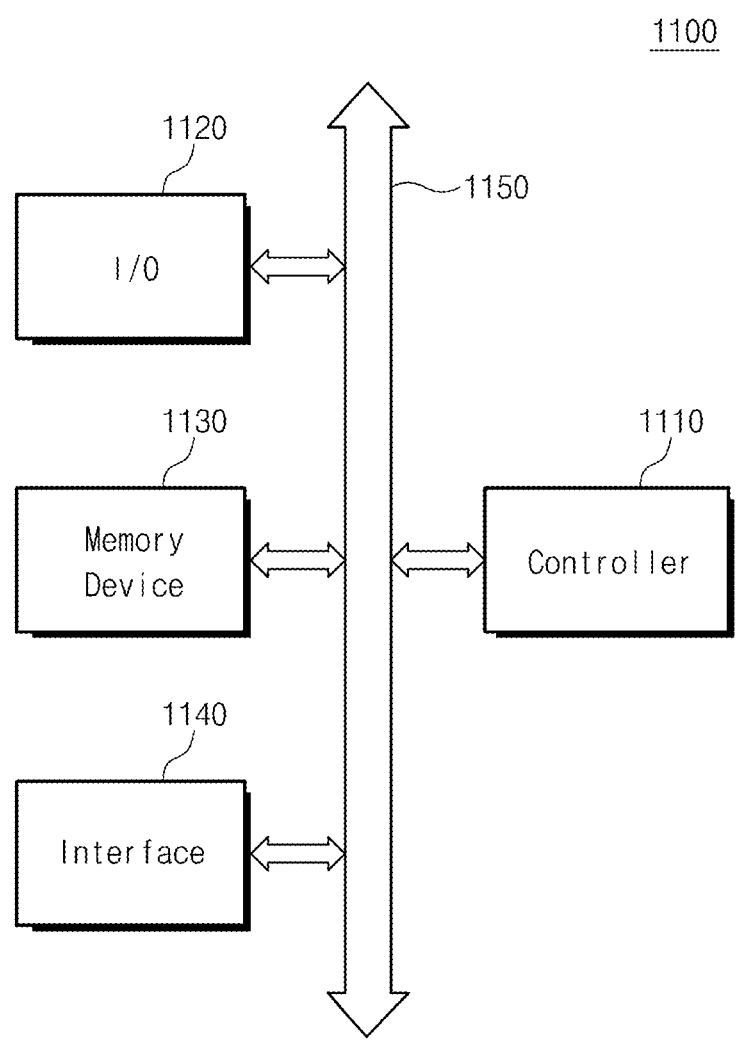
FIG. 55 illustrates a schematic block diagram of an example of electronic systems including three dimensional semiconductor memory devices according to embodiments of the inventive concept.

FIG. 55 illustrates a schematic block diagram of an example of electronic systems including three dimensional semiconductor memory devices according to embodiments of the inventive concept.

Referring to FIG. 55, an electronic system 1100 according to an embodiment may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or another logic device. The other logic device may have a similar function to any one of the microprocessor, the digital signal processor, and the microcontroller. The I/O unit 1120 may include a keypad, a keyboard, or a display unit. The memory device 1130 may store data and/or commands. The memory device 1130 may include at least one of the three dimensional semiconductor memory devices according to the embodiments described above. The memory device 1130 may further include another type of semiconductor memory devices different from the three dimensional semiconductor memory devices described above. For example, the memory device 1130 may further include a magnetic memory device, a phase change memory device, a dynamic random access memory (DRAM) device and/or a static random access memory (SRAM) device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or another electronic product. The other electronic product may receive or transmit information data by wireless.

Figure 56:
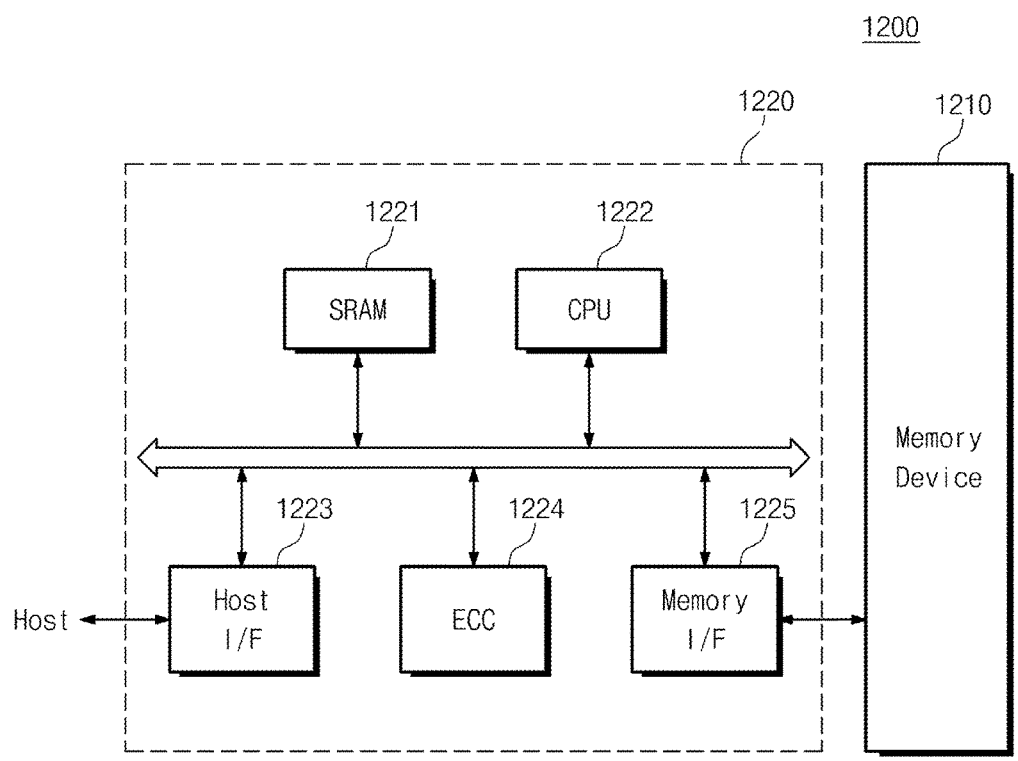
FIG. 56 illustrates a schematic block diagram of an example of memory cards including three dimensional semiconductor memory devices according to embodiments of the inventive concept.

FIG. 56 illustrates a schematic block diagram of an example of memory cards including the three dimensional semiconductor memory devices according to the embodiments of the inventive concept.

Referring to FIG. 56, a memory card 1200 according to an embodiment of the inventive concept may include a memory device 1210. The memory device 1210 may include at least one of the three dimensional semiconductor memory devices according to the various embodiments mentioned above. In other embodiments, the memory device 1210 may further include another type of semiconductor memory devices different from the three dimensional semiconductor memory devices according to the embodiments described above. For example, the memory device 1210 may further include a magnetic memory device, a phase change memory device, a dynamic random access memory (DRAM) device and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may replace hard disks of computer systems as solid state disks of the computer systems.

According to the embodiments set forth above, a first outer sidewall of an uppermost electrode may be covered with an extension of an electrode-dielectric layer. As such, the first outer sidewall of the uppermost electrode may be protected from an etching process. As a result, physical loss of the uppermost electrode during the etching process may be minimized to prevent electrical resistance of the uppermost electrode from increasing. Thus, high reliable and highly integrated three dimensional semiconductor memory devices may be realized.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of fabricating a three dimensional semiconductor memory device, the method comprising:
    alternately and repeatedly stacking replacement layers and insulating layers on a substrate;
    forming a vertical active pattern penetrating the insulating layers and the replacement layers;
    forming a cutting region penetrating at least an uppermost replacement layer of the replacement layers, the cutting region extending along a first direction;
    forming a non sacrificial layer in the cutting region; and
    replacing the replacement layers with electrodes, respectively, after forming the non sacrificial layer in the cutting region, wherein the electrodes extend in parallel with the cutting region in the first direction.

2. The method as claimed in claim 1, wherein forming the cutting region is after forming the vertical active pattern.

3. The method as claimed in claim 1, further comprising, before forming the electrodes, forming an electrode-dielectric layer between a sidewall of the vertical active pattern and the electrodes.

4. A method of fabricating a three dimensional semiconductor memory device, the method comprising:
    alternately and repeatedly stacking replacement layers and insulating layers on a substrate;
    forming a vertical active pattern penetrating the insulating layers and the replacement layers;
    forming a cutting region penetrating at least an uppermost replacement layer of the replacement layers;
    forming a non sacrificial layer in the cutting region; and
    conformally forming an electrode-dielectric layer in the replacement layers and a sidewall of the non sacrificial layer in the cutting region exposed by an uppermost replacement layer.

5. A method of fabricating a three dimensional semiconductor memory device, the method comprising:
    alternately and repeatedly stacking replacement layers and insulating layers on a substrate;
    forming a vertical active pattern penetrating the insulating layers and the replacement layers;
    forming a cutting region penetrating at least an uppermost replacement layer of the replacement layers;
    forming a non sacrificial layer in the cutting region; and
    before forming the non sacrificial layer in the cutting region, forming a spacer on sidewalls of the cutting region.

6. The method as claimed in claim 5, further comprising, before forming the electrodes, removing a portion of the spacer extending from above the uppermost replacement layer to a bottom of the cutting region.

7. The method as claimed in claim 6, further comprising conformally forming an electrode-dielectric layer in the replacement layers and along a sidewall of the non sacrificial layer in the cutting region exposed due to removal of the spacer.

8. The method as claimed in claim 6, wherein forming the electrodes includes conformally forming a barrier conductive pattern in the replacement layers and along a sidewall of the non sacrificial layer in the cutting region exposed due to removal of the spacer.

9. The method as claimed in claim 5, further comprising, before forming the non sacrificial layer in the cutting region, etching the spacer so that an upper surface of the space is below an upper surface of the cutting region, the spacer remaining above the uppermost replacement layer.

10. The method as claimed in claim 9, further comprising, after forming the non sacrificial layer in the cutting region and before forming the electrodes, removing the spacer.

11. The method as claimed in claim 10, further comprising conformally forming an electrode-dielctric layer in the replacement layers and along a sidewall of the non sacrificial layer in the cutting region exposed due to removal of the spacer.

12. The method as claimed in claim 10, wherein forming the electrodes includes conformally forming a barrier conductive pattern in the replacement layers and along a sidewall of the non sacrificial layer in the cutting region exposed due to removal of the spacer.

13. The method as claimed in claim 1, wherein the cutting region penetrates below an uppermost replacement layer.

14. The method as claimed in claim 13, wherein the cutting region penetrates a next uppermost replacement layer.

15. The method as claimed in claim 1, wherein forming the cutting region includes:
    forming a guide opening in an uppermost insulating layer, the guide opening extending to an upper surface of the uppermost replacement layer;
    forming a spacer in the guide opening; and
    etching the guide opening with the spacer therein to form the cutting region and to remove the spacer such that an upper surface of the spacer is below an upper surface of the uppermost insulating layer.

16. The method as claimed in claim 15, further comprising, after forming the non sacrificial layer in the cutting region and before forming the electrodes, removing the spacer.

17. The method as claimed in claim 16, further comprising conformally forming an electrode-dielectric layer in the replacement layers and along a sidewall of the non sacrificial layer in the cutting region exposed due to removal of the spacer.

18. The method as claimed in claim 16, wherein forming the electrodes includes conformally forming a barrier conductive pattern in the replacement layers and along a sidewall of the non sacrificial layer in the cutting region exposed due to removal of the spacer.

19. The method as claimed in claim 1, wherein forming the alternately stacking replacement layers and insulating layers includes:
    alternately and repeatedly stacking sacrificial layers and insulating layers on the substrate; and
    before forming electrodes, removing the sacrificial layers to form empty regions.

20. The method as claimed in claim 19, wherein removing the sacrificial layers includes removing a portion of the non sacrificial layer adjacent an uppermost sacrificial layer.

21. The method as claimed in claim 1, wherein forming the vertical active pattern includes:
    forming a hole penetrating the insulating layers and the replacement layers; and
    forming the vertical active pattern in the hole.

22. The method as claimed in claim 21, further comprising, before forming the vertical active pattern, forming an electrode-dielectric layer on an inner sidewall of the hole.

23. The method as claimed in claim 22, wherein forming the electrodes includes conformally forming a barrier conductive pattern in the replacement layers.

24. The method as claimed in claim 1, further comprising:
    forming another vertical active pattern penetrating the insulating layers and the replacement layers, the another vertical active pattern being in an opposite side of the cutting region to the vertical active pattern.

25. The method as claimed in claim 24, wherein the cutting region is centered between the vertical active pattern and the another vertical active pattern.

26. The method as claimed in claim 24, wherein the cutting region is closer to one of the vertical active pattern and the another vertical active pattern than to another of the vertical active pattern and the another vertical active pattern.

27. The method as claimed in claim 1, wherein the cutting region extends in parallel to the vertical active pattern.

* * * * *